US012720725B2

(12) United States Patent
Liu et al.

(10) Patent No.: US 12,720,725 B2
(45) Date of Patent: Aug. 25, 2026

(54) MEMORY DEVICES HAVING VERTICAL TRANSISTORS AND METHODS FOR FORMING THE SAME

(71) Applicant: YANGTZE MEMORY TECHNOLOGIES CO., LTD., Wuhan (CN)

(72) Inventors: Wei Liu, Wuhan (CN); Hongbin Zhu, Wuhan (CN); Yanhong Wang, Wuhan (CN); Bingjie Yan, Wuhan (CN); Wenyu Hua, Wuhan (CN); Fandong Liu, Wuhan (CN); Ya Wang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 411 days.

(21) Appl. No.: 18/222,898

(22) Filed: Jul. 17, 2023

(65) Prior Publication Data

US 2023/0380137 A1 Nov. 23, 2023

Related U.S. Application Data

(63) Continuation of application No. PCT/CN2023/094159, filed on May 15, 2023.

(Continued)

(51) Int. Cl.
*H10B 12/00* (2023.01)

(52) U.S. Cl.
CPC ......... *H10B 12/0383* (2023.02); *H10B 12/50* (2023.02)

(58) Field of Classification Search
CPC ........ H10B 80/00; H10B 12/30; H10B 12/50; H10B 43/27; H10B 43/40; H10B 43/50;

(Continued)

(56) References Cited

U.S. PATENT DOCUMENTS

| | | | |
|---|---|---|---|
| 5,940,707 | A | 8/1999 | Gardner et al. |
| 2003/0082876 | A1 | 5/2003 | Mandelman et al. |

(Continued)

FOREIGN PATENT DOCUMENTS

| | | | |
|---|---|---|---|
| CN | 102544013 A | | 7/2012 |
| CN | 103311249 A | | 9/2013 |

OTHER PUBLICATIONS

International Search Report issued in corresponding International Application No. PCT/CN2023/094159, mailed Aug. 8, 2023, 3 pages.

(Continued)

*Primary Examiner* — Edward Chin
(74) *Attorney, Agent, or Firm* — BAYES PLLC

(57) ABSTRACT

A semiconductor device and methods for forming the same are provided. The semiconductor device includes an array of vertical transistors. Each transistor includes a semiconductor body extending in a vertical direction, and a gate structure located adjacent to a sidewall of the semiconductor body. The gate structures of each row of vertical transistors are connected with each other and extend along a first lateral direction to form a word line. A first word line of a first row of vertical transistors is located at a first side of the semiconductor bodies of the first row of vertical transistors along a second lateral direction perpendicular to the first lateral direction; and a second word line of a second row of vertical transistors adjacent to the first row of vertical transistors is located at a second side of the semiconductor bodies of the second row of vertical transistors along the second lateral direction.

20 Claims, 70 Drawing Sheets

Related U.S. Application Data

(60) Provisional application No. 63/351,604, filed on Jun. 13, 2022, provisional application No. 63/343,848, filed on May 19, 2022.

(58) Field of Classification Search
CPC .......... H10D 1/665; H10D 88/00; H10D 1/20; H10D 1/68; H10D 1/716; H10D 62/115; H10D 62/117; H10D 86/85
See application file for complete search history.

(56) References Cited

U.S. PATENT DOCUMENTS

| | | | | |
|---|---|---|---|---|
| 2014/0138609 | A1 | 5/2014 | Satoh et al. | |
| 2015/0243748 | A1* | 8/2015 | Pulugurtha .......... | H10B 12/053 257/329 |
| 2015/0348976 | A1 | 12/2015 | Moon et al. | |
| 2022/0102352 | A1* | 3/2022 | Lee ...................... | H10B 12/315 |
| 2024/0274662 | A1* | 8/2024 | Lin ...................... | H10D 62/121 |

OTHER PUBLICATIONS

Supplementary European Search Report issued in corresponding European Application No. EP 23806867.0, mailed on Jun. 5, 2025, 13 pages.

* cited by examiner

300

400'

4054
4050
4052
4048
4046
4047
4028
4044
4042
4026
4038
4030
4060
4032
4034
4036
104
4024
4038
4022
4023
4021
4020
4018
4019
4016
106
4014
102
4012
4010

1200

1400

MEMORY DEVICES HAVING VERTICAL TRANSISTORS AND METHODS FOR FORMING THE SAME

CROSS-REFERENCE TO RELATED APPLICATIONS

This application is a continuation of Internal Application No. PCT/CN2023/094159, filed May 15, 2023, entitled "MEMORY DEVICES HAVING VERTICAL TRANSISTORS AND METHODS FOR FORMING THE SAME," which claims the benefit of priorities to U.S. Provisional Application No. 63/343,848, filed on May 19, 2022, and to U.S. Provisional Application No. 63/351,604, filed on Jun. 13, 2022, all of which are hereby incorporated by reference in their entireties.

BACKGROUND

The present disclosure relates to memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral circuits for facilitating operations of the memory array.

SUMMARY

In one aspect, a semiconductor device includes an array of vertical transistors. Each transistor includes a semiconductor body extending in a vertical direction, and a gate structure located adjacent to a sidewall of the semiconductor body. The gate structures of each row of vertical transistors are connected with each other and extend along a first lateral direction to form a word line. A first word line of a first row of vertical transistors is located at a first side of the semiconductor bodies of the first row of vertical transistors along a second lateral direction perpendicular to the first lateral direction; and a second word line of a second row of vertical transistors adjacent to the first row of vertical transistors is located at a second side of the semiconductor bodies of the second row of vertical transistors along the second lateral direction.

In another aspect, a method for forming a semiconductor device is disclosed. The method includes: forming a plurality of spacers extending along a first lateral direction, each spacer vertically extending in an upper portion of a semiconductor layer; forming a plurality of first trenches extending along the first lateral direction, each first trench vertically extending in the upper portion of the semiconductor layer and being sandwiched, along a second lateral direction, by two adjacent spacers; and forming two disconnected conductive structures in each first trench, the two disconnected conductive structures laterally extending along the first lateral direction, each conductive structure vertically extending along one sidewall of the corresponding first trench.

In yet another aspect, another method for forming a semiconductor device is disclosed. The method includes: forming a plurality of first trenches extending along a first lateral direction, each first trench vertically extending in an upper portion of a semiconductor layer; forming a plurality of spacers extending along the first lateral direction, each spacer vertically extending in the upper portion of the semiconductor layer and being sandwiched, along a second lateral direction, by two adjacent first trenches; and forming two disconnected conductive structures in each first trench, the two disconnected conductive structures laterally extending along the first lateral direction, each conductive structure vertically extending along one sidewall of the corresponding first trench.

In still another aspect, another method for forming a semiconductor device is disclosed. The method includes: forming a plurality of spacers and a plurality of first trenches in an upper portion of a semiconductor layer, each spacer and each first trench laterally extending along a first lateral direction, wherein the plurality of first trenches and the plurality of spacers are alternatively arranged along a second lateral direction; forming a gate dielectric layer in each first trench by oxidizing sidewalls of each first trench; forming two disconnected conductive structures in each first trench, the two disconnected conductive structures each laterally extending along the first lateral direction and vertically covering the gate dielectric layer on one sidewall of the corresponding first trench respectively; and removing the plurality of spacers to form a plurality of second trenches.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1:
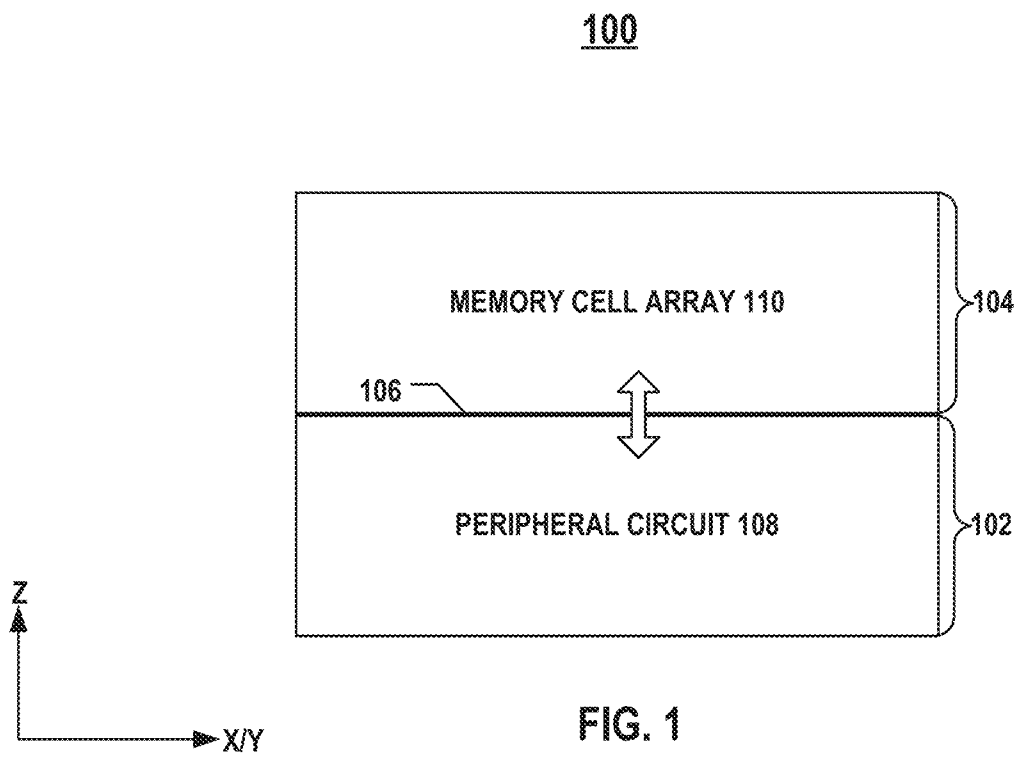
FIG. 1 illustrates a schematic view of a cross-section of a 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (e.g., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (VIA) contacts are formed) and one or more dielectric layers.

Transistors are used as the switch or selecting devices in the memory cells of some memory devices, such as DRAM, PCM, and ferroelectric DRAM (FRAM). However, the planar transistors commonly used in existing memory cells usually have a horizontal structure with buried word lines in the substrate and bit lines above the substrate. Since the source and drain of a planar transistor are disposed laterally at different locations, which increases the area occupied by the transistor. The design of planar transistors also complicates the arrangement of interconnected structures, such as word lines and bit lines, coupled to the memory cells, for example, limiting the pitches of the word lines and/or bit lines, thereby increasing the fabrication complexity and reducing the production yield. Moreover, because the bit lines and the storage units (e.g., capacitors or PCM elements) are arranged on the same side of the planar transistors (above the transistors and substrate), the bit line process margin is limited by the storage units, and the coupling capacitance between the bit lines and storage units, such as capacitors, are increased. Planar transistors may also suffer from a high leakage current as the saturated drain current keeps increasing, which is undesirable for the performance of memory devices.

On the other hand, the memory cell array and the peripheral circuits for controlling the memory cell array are usually arranged side-by-side in the same plane. As the number of memory cells keeps increasing, to maintain the same chip size, the dimensions of the components in the memory cell array, such as transistors, word lines, and/or bit lines, need to keep decreasing in order not to significantly reduce the memory cell array efficiency.

To address one or more of the aforementioned issues, the present disclosure introduces a solution in which vertical transistors replace the conventional planar transistors as the switch and selecting devices in a memory cell array of memory devices (e.g., DRAM, PCM, and FRAM). Compared with planar transistors, the vertically arranged transistors (e.g., the drain and source are overlapped in the plan view) can reduce the area of the transistor as well as simplify the layout of the interconnect structures, e.g., metal wiring the word lines and bit lines, which can reduce the fabrication complexity and improve the yield. For example, the pitches of word lines and/or bit lines can be reduced for ease of fabrication. The vertical structures of the transistors also allow the bit lines and storage units, such as capacitors, to be arranged on opposite sides of the transistors in the vertical direction (e.g., one above and on below the transistors), such that the process margin of the bit lines can be increased and the coupling capacitance between the bit lines and the storage units can be decreased.

Consistent with the scope of the present disclosure, according to some aspects of the present disclosure, the memory cell array having vertical transistors and the peripheral circuits of the memory cell array can be formed on different wafers and bonded together in a face-to-face manner. Thus, the thermal budget for fabricating the memory cell array does not affect the fabrication of the peripheral circuits. The stacked memory cell array and peripheral circuits can also reduce the chip size compared with the side-by-side arrangement, thereby improving the array efficiency. In some implementations, more than one memory cell array is stacked over one another using bonding techniques to further increase the array efficiency. In some implementations, the word lines and bit lines are disposed close to the bonding interface due to the vertically arranged transistors, which can be coupled to the peripheral circuits through a large number (e.g., millions) of parallel bonding contacts across the bonding interface can make direct, short-distance (e.g., micron-level) electrical connections between the memory cell array and peripheral circuits to increase the throughput and input/output (I/O) speed of the memory devices.

In some implementations, the vertical transistors disclosed herein include multi-gate transistors (e.g., gate-all-around (GAA) transistors, tri-gate transistors, or double-gate transistors), which can have a larger gate control area to achieve better channel control with a smaller subthreshold swing. During the off state, since the channel is fully depleted, the leakage current of multi-gate transistors can be significantly reduced as well. Thus, using multi-gate transistors instead of planar transistors can achieve a much better speed (saturated drain current)/leakage current performance.

In some implementations, the vertical transistors disclosed herein include single-gate transistors (a.k.a. single-side gate transistors) in a mirror-symmetric arrangement with respect to adjacent transistors in the bit line direction as a result of splitting multi-gate transistors (e.g., double-gate transistors) using trench isolations extending along the word line direction. The mirror-symmetric single-gate transistors have a larger process window for word line, bit line, and transistor pitch reduction, compared to either conventional planar transistors or multi-gate vertical transistors, for example, with dual-side or all-around gates.

FIG. 1 illustrates a schematic view of a cross-section of a 3D memory device 100, according to some aspects of the present disclosure. 3D memory device 100 represents an example of a bonded chip. The components of 3D memory device 100 (e.g., memory cell array 110 and peripheral circuits 108) can be formed separately on different substrates and then jointed to form a bonded chip. 3D memory device 100 can include a first semiconductor structure 102 including the peripheral circuits 108 of a memory cell array. 3D memory device 100 can also include a second semiconductor structure 104 including the memory cell array 110. The peripheral circuits 108 (a.k.a. control and sensing circuits) can include any suitable digital, analog, and/or mixed-signal circuits used for facilitating the operations of the memory cell array. For example, the peripheral circuit 108 can include one or more of a page buffer, a decoder (e.g., a row decoder and a column decoder), a sense amplifier, a driver (e.g., a word line driver), an input/output (I/O) circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors). The peripheral circuits 108 in first semiconductor structure 102 use complementary metal-oxide-semiconductor (CMOS) technology, e.g., which can be implemented with logic processes (e.g., technology nodes of 90 nm, 65 nm, 60 nm, 45 nm, 32 nm, 28 nm, 22 nm, 20 nm, 16 nm, 14 nm, 10 nm, 7 nm, 5 nm, 3 nm, 2 nm, etc.), according to some implementations.

As shown in FIG. 1, 3D memory device 100 can also include first semiconductor structure 102 including an array of memory cells (memory cell array 110) that can use transistors as the switch and selecting devices. In some implementations, the memory cell array 110 includes an array of DRAM cells. For ease of description, a DRAM cell array may be used as an example for describing the memory cell array in the present disclosure. But it is understood that the memory cell array 110 is not limited to DRAM cell array and may include any other suitable types of memory cell arrays that can use transistors as the switch and selecting devices, such as PCM cell array, static random-access memory (SRAM) cell array, FRAM cell array, resistive memory cell array, magnetic memory cell array, spin transfer torque (STT) memory cell array, to name a few, or any combination thereof.

Second semiconductor structure 104 can be a DRAM device in which memory cells are provided in the form of an array of DRAM cells. In some implementations, each DRAM cell includes a capacitor for storing a bit of data as a positive or negative electrical charge as well as one or more transistors (a.k.a. pass transistors) that control (e.g., switch and selecting) access to it. In some implementations, each DRAM cell is a one-transistor, one-capacitor (1T1C) cell. Since transistors always leak a small amount of charge, the capacitors will slowly discharge, causing information stored in them to drain. As such, a DRAM cell has to be refreshed to retain data, for example, by the peripheral circuit 108 in first semiconductor structure 102, according to some implementations.

As shown in FIG. 1, 3D memory device 100 further includes a bonding interface 106 vertically between (in the vertical direction, e.g., the z-direction in FIG. 1) first semiconductor structure 102 and second semiconductor structure 104. First and second semiconductor structures 102 and 104 can be fabricated separately (and in parallel in some implementations) such that the thermal budget of fabricating one of first and second semiconductor structures 102 and 104 does not limit the processes of fabricating another one of first and second semiconductor structures 102 and 104. Moreover, a large number of interconnects (e.g., bonding contacts) can be formed through bonding interface 106 to make direct, short-distance (e.g., micron-level) electrical connections between first semiconductor structure 102 and second semiconductor structure 104, as opposed to the long-distance (e.g., millimeter or centimeter-level) chip-to-chip data bus on the circuit board, such as printed circuit board (PCB), thereby eliminating chip interface delay and achieving high-speed I/O throughput with reduced power consumption. Data transfer between the memory cell array 110 in second semiconductor structure 104 and the peripheral circuits 108 in first semiconductor structure 102 can be performed through the interconnects (e.g., bonding contacts) across bonding interface 106. By vertically integrating first and second semiconductor structures 102 and 104, the chip size can be reduced, and the memory cell density can be increased.

Figure 2:
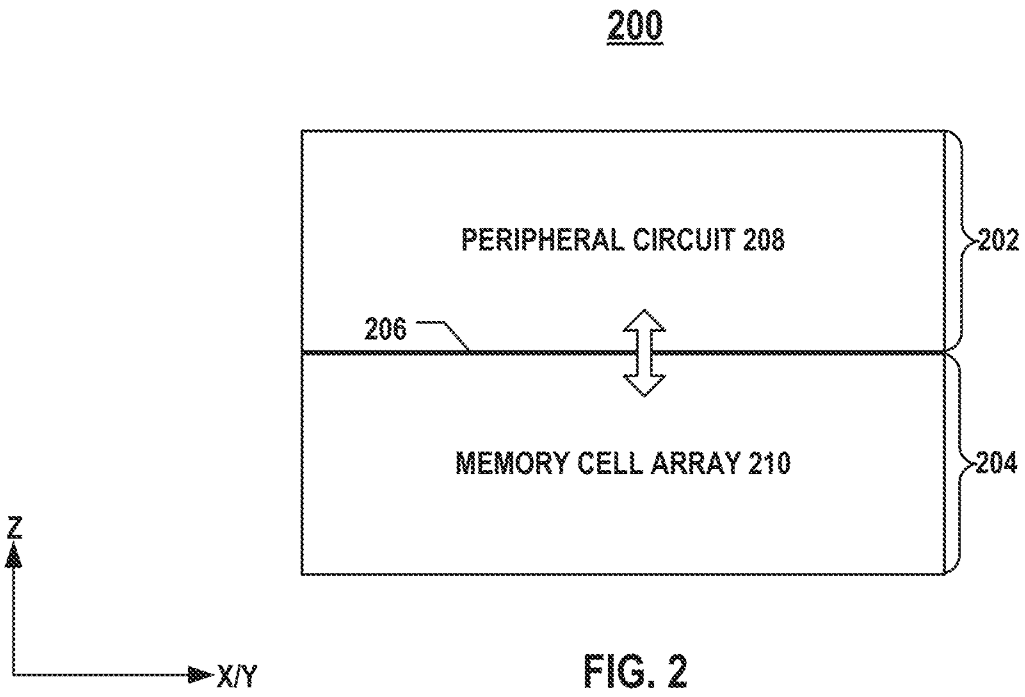
FIG. 2 illustrates a schematic view of a cross-section of another 3D memory device, according to some aspects of the present disclosure.

It is understood that the relative positions of stacked first and second semiconductor structures 102 and 104 are not limited. FIG. 2 illustrates a schematic view of a cross-section of another exemplary 3D memory device 200, according to some implementations. Different from 3D memory device 100 in FIG. 1, in which second semiconductor structure 104 including the memory cell array is above first semiconductor structure 102 including the peripheral circuits 108, in 3D memory device 200 in FIG. 2, first semiconductor structure 202 including the peripheral circuit 208 is above second semiconductor structure 204 including the memory cell array 210. Nevertheless, bonding interface 206 is formed vertically between first semiconductor structure 202 and second semiconductor structure 204 in 3D memory device 200, and first semiconductor structure 202 and second semiconductor structure 204 are jointed vertically through bonding (e.g., hybrid bonding) according to some implementations. Hybrid bonding, also known as "metal/dielectric hybrid bonding," is a direct bonding technology (e.g., forming bonding between surfaces without using intermediate layers, such as solder or adhesives) and can obtain metal-metal (e.g., copper-to-copper) bonding and dielectric-dielectric (e.g., silicon oxide-to-silicon oxide) bonding simultaneously. Data transfer between the memory cell array 210 in second semiconductor structure 204 and the peripheral circuits 208 in first semiconductor structure 202 can be performed through the interconnects (e.g., bonding contacts) across bonding interface 206.

It is noted that x, y, and z axes are included in FIGS. 1 and 2 to further illustrate the spatial relationship of the components in 3D memory devices 100 and 200. The substrate of the 3D memory device includes two lateral surfaces extending laterally in the x-y plane: a top surface on the front side of the wafer on which the semiconductor devices can be formed, and a bottom surface on the backside opposite to the front side of the wafer. The z-axis is perpendicular to both the x and y axes. As used herein, whether one component (e.g., a layer or a device) is "on," "above," or "below" another component (e.g., a layer or a device) of the 3D memory device is determined relative to the substrate of the 3D memory device in the z-direction (the vertical direction perpendicular to the x-y plane, e.g., the thickness direction of the substrate) when the substrate is positioned in the lowest plane of the 3D memory device in the z-direction. The same notion for describing the spatial relationships is applied throughout the present disclosure.

Figure 3:
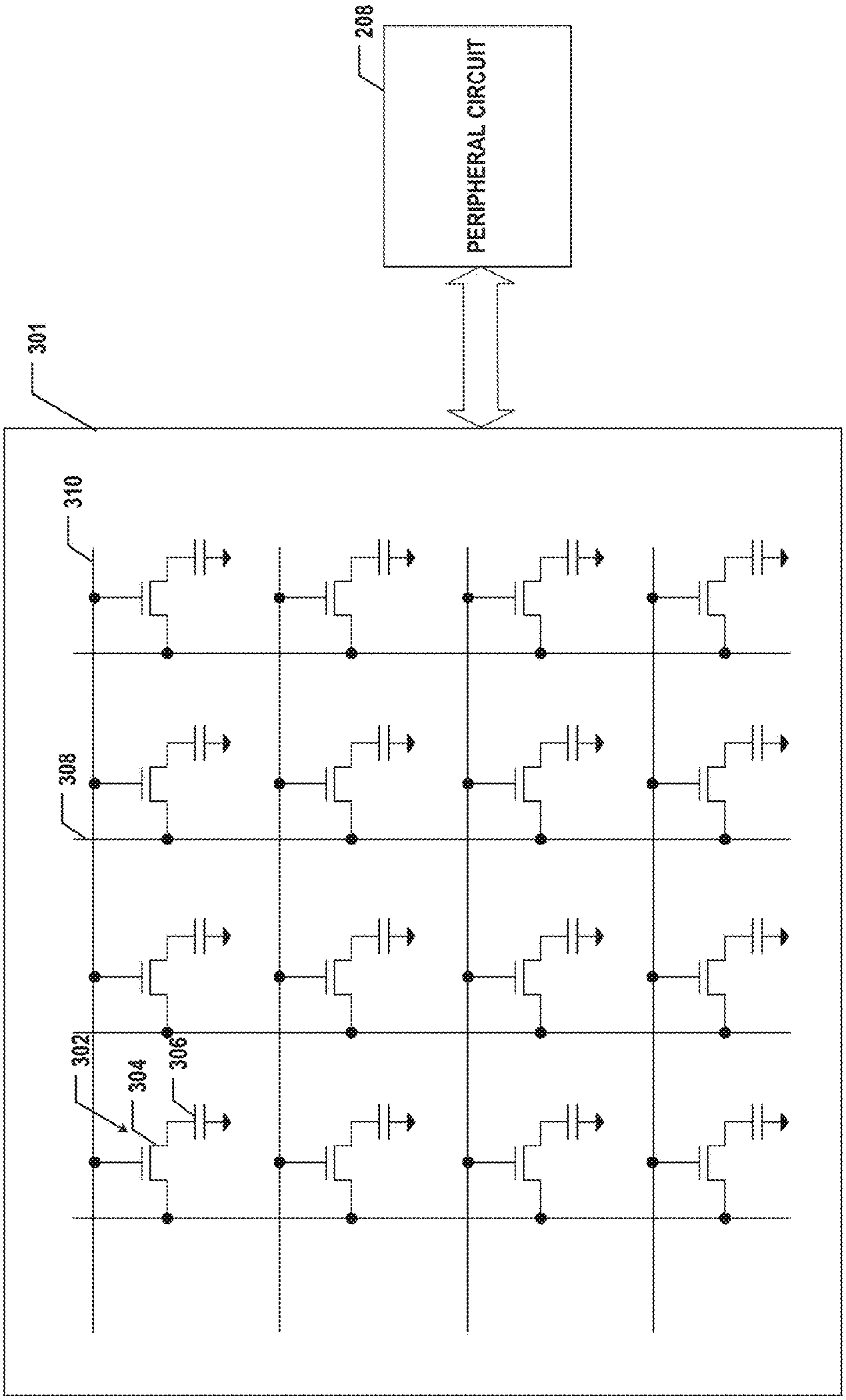
FIG. 3 illustrates a schematic diagram of a memory device including peripheral circuits and an array of memory cells each having a vertical transistor, according to some aspects of the present disclosure.

FIG. 3 illustrates a schematic diagram of a memory device 300 including peripheral circuits 208 and an array of memory cells 302 each having a vertical transistor 304, according to some aspects of the present disclosure. Memory device 300 can include a memory cell array 301 and peripheral circuits 208 coupled to memory cell array 301. 3D memory devices 100 and 200 may be examples of memory device 300 in which memory cell array 301 and peripheral circuits 208 may be included in second and first semiconductor structures 104/204 and 102/202, respectively. In some implementations, memory cell array 301 is a DRAM cell array with storage units 306 that are capacitors for storing charge as the binary information stored by the respective DRAM cell. In some implementations, memory cell array 301 is a PCM cell array with storage units 306 made from PCM elements (e.g., including chalcogenide alloys) for storing binary information of the respective PCM cell based on the different resistivities of the PCM element in the amorphous phase and the crystalline phase. In some implementations, memory cell array 301 is a FRAM cell array with storage units/capacitors 306 that are ferroelectric capacitors for storing binary information of the respective FRAM cell based on the switch between two polarization states of ferroelectric materials under an external electric field.

As shown in FIG. 3, memory cells 302 can be arranged in a two-dimensional (2D) array having rows and columns. Memory device 300 can include word lines 310 coupling peripheral circuits 208 and memory cell array 301 for controlling the switch of vertical transistors 304 in memory cells 302 located in a row, as well as bit lines 308 coupling peripheral circuits 208 and memory cell array 301 for sending data to and/or receiving data from memory cells 302 located in a column. That is, each word line 310 is coupled to a respective row of memory cells 302, and each bit line is coupled to a respective column of memory cells 302.

In some implementations as shown in FIG. 3, each memory cell 302 is a DRAM cell including a vertical transistor 304 and a capacitor 306. The gate of vertical transistor 304 may be coupled to word line 310, one of the source and the drain of vertical transistor 304 may be coupled to bit line 308, the other one of the source and the drain of vertical transistor 304 may be coupled to one electrode of capacitor 306, and the other electrode of capacitor 306 may be coupled to the ground.

Peripheral circuits 208 can be coupled to memory cell array 301 through bit lines 308, word lines 310, and any other suitable metal wirings. Peripheral circuits 208 can include any suitable circuits for facilitating the operations of memory cell array 301 by applying and sensing voltage signals and/or current signals through word lines 310 and bit lines 308 to and from each memory cell 302. Peripheral circuits 208 can include various types of peripheral circuits formed using CMOS technologies.

Figure 4A:
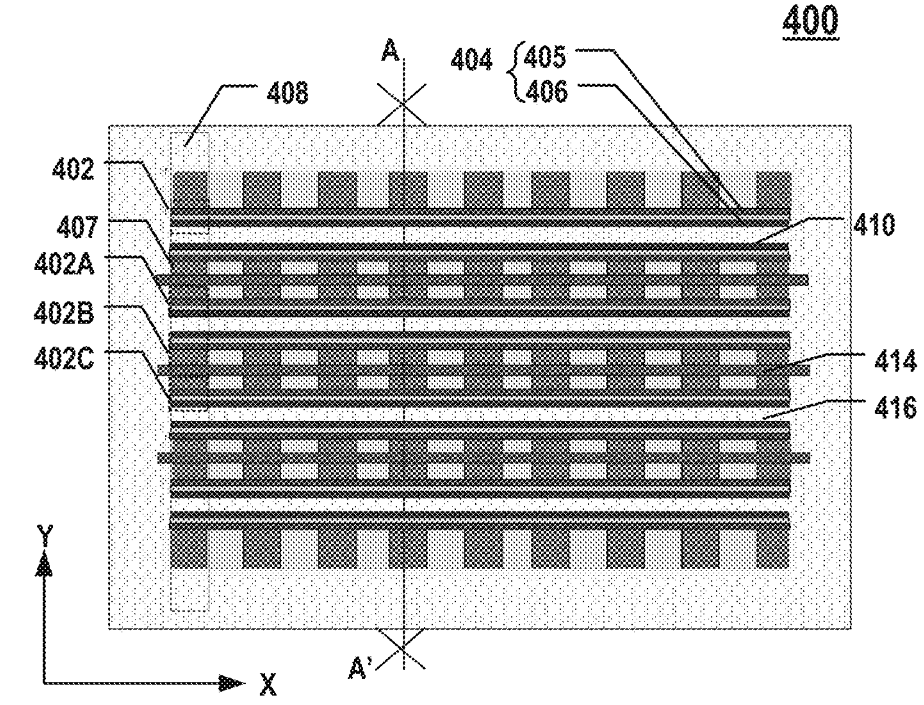
FIG. 4A illustrates a plan view of an array of memory cells each including a vertical transistor in a memory device, according to some aspects of the present disclosure.
Figure 4B:
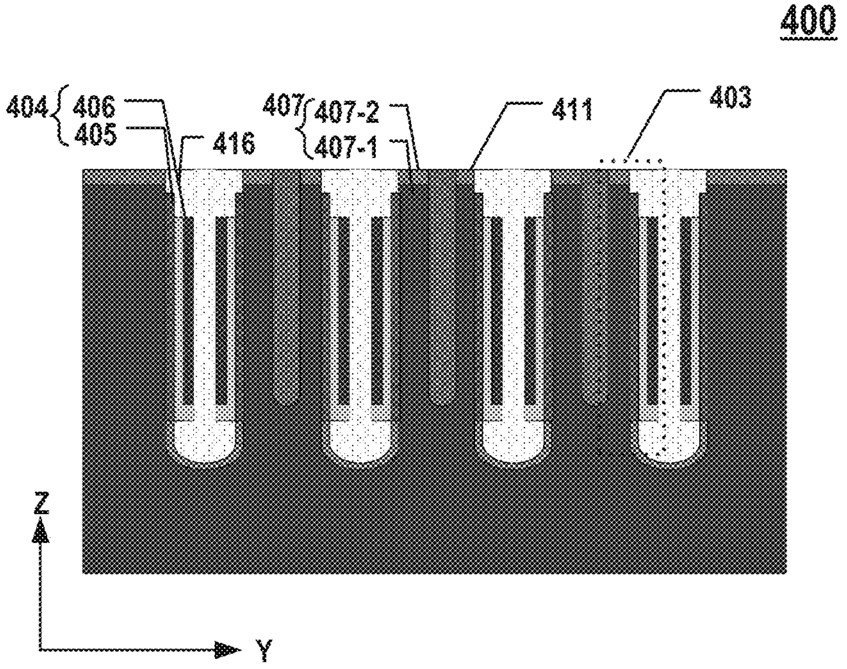
FIG. 4B illustrates a side view of a cross-section of a 3D memory device including vertical transistors, according to some aspects of the present disclosure.

According to some aspects of the present disclosure, the vertical transistors of memory cells in a memory device (e.g., 3D memory device 200) are single-gate transistors, and the gate dielectrics of vertical transistors in the word line direction are continuous. For example, FIG. 4A illustrates a plan view of an array of memory cells 402 each including a vertical transistor in a memory device 400, and FIG. 4B illustrates a cross-section view along line AA' of FIG. 4A, according to some aspects of the present disclosure. As shown in FIG. 4A, memory device 400 can include a plurality of word lines 410 each extending in a first lateral direction (the x-direction, referred to as the word line direction). Memory device 400 can also include a plurality of bit lines 408 each extending in a second lateral direction perpendicular to the first lateral direction (the y-direction, referred to as the bit line direction).

Memory cells 402 can be formed at the intersections of word lines 410 and bit lines 408. In some implementations, each memory cell 402 includes a vertical transistor (e.g., vertical transistor 304 in FIG. 3) having a semiconductor body 407 and a gate structure 404. Semiconductor body 407 can extend in a substrate in a vertical direction (the z-direction, as shown in FIG. 4B) perpendicular to the first and second lateral directions. Semiconductor body 407 can have a first lateral dimension along the first lateral direction (e.g., the x-direction), and have a second lateral dimension along the second lateral direction (e.g., the y-direction). The first lateral dimensions and second lateral dimensions of different semiconductor bodies 407 are essentially the same (with errors within a margin of ±10%) along the x-direction and y-direction, respectively. The vertical transistor can be a single-gate transistor in which gate structure 404 is in contact with a single side (e.g., one of four sides in FIG. 4A) of semiconductor body 407 (the active region in which channels are formed). As shown in FIG. 4A and FIG. 4B, the vertical transistor is a single-gate transistor in which gate structure 404 abuts one side of semiconductor body 407 in the bit line direction (the y-direction). Gate structure 404 does not surround and contact the other three sides of semiconductor body 407, according to some implementations. Gate structure 404 can include a gate dielectric 405, and a gate electrode 406 in contact with gate dielectric 405. In some implementations, gate dielectric 405 is laterally between gate electrode 406 and an isolating structure 416 in the bit line direction (the y-direction). As described above, gate electrode 406 may be part of word line 410, and word line 410 may be an extension of gate electrode 406. That is, gate electrodes 406 of adjacent vertical transistors in the word line direction (the x-direction) are continuous, e.g., parts of a continuous conductive layer having gate electrodes 406 (e.g., portions of word line 410) to abut vertical transistors in the same row on the same side. As shown in FIG. 4A, gate dielectrics 405 of adjacent vertical transistors in the word line direction are continuous, e.g., parts of a continuous dielectric layer having gate dielectrics 405 and extending in the word line direction. Gate structures 404 can be thus viewed as parts of a continuous structure extending in the word line direction at which the continuous structure abut vertical transistors in the same row on the same side.

As shown in FIG. 4A, two adjacent vertical transistors of memory cells (e.g., 402A and 402B, or 402B and 402C) in the bit line direction (they-direction) are mirror-symmetric to one another, according to some implementations. As described below with respect to the fabrication process, semiconductor bodies 407 of each pair of two adjacent vertical transistors of memory cells (e.g., 402A and 402B, or 402B and 402C) in the bit line direction (the y-direction) can be formed by separating them apart using an isolating structure 416 or a spacer 414 extending in the word line direction (the x-direction) and in parallel with word lines 410. Isolating structure 416 and word lines 410 can be disposed in an interleaved manner in the bit line direction. In some implementations, isolating structure 416 is formed in the middle of the two gate structures 404 such that the resulting pair of gate structures are mirror-symmetric to one another with respect to isolating structure 416. The pair of vertical transistors having semiconductor bodies 407 are also mirror-symmetric to one another when the respective gate structures 404 are mirror-symmetric to one another with respect to isolating structure 416.

FIG. 4B illustrates a side view of a cross-section of memory device 400 including vertical transistors, according to some aspects of the present disclosure. Memory device 400 may include single-gate vertical transistors in which conductive structures abut a single side of semiconductor bodies in the plan view. It is understood that FIG. 4B is for illustrative purposes only and may not necessarily reflect the actual device structure (e.g., interconnections) in practice.

In some implementations, memory device 400 includes an array of memory cells 402 each including a vertical transistor 403. Each memory cell 402 can be a 1T1C cell consisting of one transistor and one capacitor. It is understood that memory cells 402 may be of any suitable configurations, such as 2T1C cell, 3T1C cell, etc.

Vertical transistor 403 can be a MOSFET used to switch a respective memory cell 402. In some implementations, vertical transistor 403 includes a semiconductor body 407 (e.g., the active region in which a channel can form) extending vertically (in the z-direction), and a gate structure 404 in contact with one side of semiconductor body 407 in the bit line direction (the y-direction). Semiconductor body 407 can have a cuboid shape or a cylinder shape, and gate structure 404 can abut a single side of semiconductor body 407 in the plan view, as shown in FIG. 4A.

As shown in FIG. 4A and FIG. 4B, in some implementations, semiconductor body 407 has two ends (the upper end and lower end) in the vertical direction (the z-direction), and at least one end (e.g., the upper end in FIGS. 4A and 4B) extends beyond gate dielectric 405 in the vertical direction (the z-direction). In some implementations, one end (e.g., the upper end in FIG. 4B) of semiconductor body 407 is flush with the respective end (e.g., the upper end in FIG. 4B) of gate dielectric 405. In some implementations, both ends (the upper end and lower end) of semiconductor body 407 extend beyond gate electrode 406, respectively, in the vertical direction (the z-direction). That is, semiconductor body 407 can have a larger vertical dimension (e.g., the depth) than that of gate electrode 406 (e.g., in the z-direction), and neither the upper end nor the lower end of semiconductor body 407 is flush with the respective end of gate electrode 406. Thus, short circuits between bit lines 408 and word lines/gate electrodes 410 can be avoided. Vertical transistor 403 can further include a source and a drain (both referred to as 411 as their locations may be interchangeable) disposed at the two ends (the upper end and lower end) of semiconductor body 407, respectively, in the vertical direction (the z-direction). In some implementations, one of source and drain 411 (e.g., at the upper end in FIG. 4B) is coupled to a capacitor (not shown), and the other one of source and drain 411 is coupled to bit line 408.

In some implementations, as shown in FIG. 4B, semiconductor body 407 includes semiconductor materials 407-1 and doped semiconductor materials 407-2. Semiconductor materials 407-1 may include single crystalline silicon, polysilicon, amorphous silicon, Ge, any other semiconductor materials, or any combinations thereof. In one example, semiconductor body 407 may include single crystalline silicon. Semiconductor materials 407-2 may include silicon doped with N-type dopants (e.g., P or As) or P-type dopants (e.g., B or Ga) at a desired doping level and be used for forming source or drain 411. In some implementations, a silicide layer, such as a metal silicide layer, is formed between source and drain 411 and bit line 408 or gate electrode 406 to reduce the contact resistance. In some implementations, gate dielectric 405 includes dielectric materials, such as silicon oxide, silicon nitride, or high-k dielectrics including, but not limited to, $Al_2O_3$, $HfO_2$, $Ta_2O_5$, $ZrO_2$, $TiO_2$, or any combination thereof. In some implementations, gate electrode 406 includes conductive materials including, but not limited to W, Co, Cu, Al, Ti, TiN, TaN, polysilicon, silicides, or any combination thereof. In some implementations, gate electrode 406 includes multiple conductive layers, such as a W layer over a TiN layer. In one example, gate structure 404 may be a "gate oxide/gate poly" gate in which gate dielectric 405 includes silicon oxide and gate electrode 406 includes doped polysilicon. In another example, gate structure 404 may be a high-k metal gate (HKMG) in which gate dielectric 405 includes a high-k dielectric and gate electrode 406 includes a metal.

As described above, since gate electrode 406 may be part of a word line or extend in the word line direction as a word line, as shown in FIG. 4A, memory device 400 can also include a plurality of word lines each extending in the word line direction (the x-direction). Each word line 410 can be coupled to a row of memory cells 402. That is, bit line 408 and word line 410 can extend in two perpendicular lateral directions, and semiconductor body 407 of vertical transistor 403 can extend in the vertical direction perpendicular to the two lateral directions in which bit line 408 and word line 410 extend. Word lines 410 are in contact with word line contacts (not shown), according to some implementations. In some implementations, word lines 410 include conductive materials including, but not limited to W, Co, Cu, Al, Ti, TiN, TaN, polysilicon, silicides, or any combination thereof. In some implementations, word line 410 includes multiple conductive layers, such as a W layer over a TiN layer, as shown in FIG. 4A.

As shown in FIG. 4B, vertical transistor 403 extends vertically through and contacts word lines 410, and source or drain of vertical transistor 403 at the lower end thereof (not shown) is in contact with bit line 408 (or bit line contact if any), according to some implementations. Accordingly, word lines 410 and bit lines 408 can be disposed in different planes in the vertical direction due to the vertical arrangement of vertical transistor 403, which simplifies the routing of word lines 410 and bit lines 408. In some implementations, bit lines 408 are disposed vertically between bonding layer (not shown) and word lines 410, and word lines 410 are disposed vertically between bit lines 408 and capacitors (not shown). Word lines 410 can be coupled to peripheral circuits through word line contacts (not shown). Similarly, bit lines 408 can also be coupled to peripheral circuits.

As shown in FIG. 4A and FIG. 4B, vertical transistors 403 can be arranged in a mirror-symmetric manner to increase the density of memory cells 402 in the bit line direction (the y-direction). As shown in FIG. 4B, two adjacent vertical transistors 403 in the bit line direction are mirror-symmetric to one another with respect to an isolating structure 416, according to some implementations. That is, memory device 400 can include a plurality of isolating structures 416 each extending in the word line direction (the x-direction) in parallel with word lines 410 and disposed between semiconductor bodies 407 of two adjacent rows of vertical transistors 403. In some implementations, the rows of vertical transistors 403 separated by isolating structures 416 are mirror-symmetric to one another with respect to isolating structure 416. Isolating structure 416 can be formed with dielectric materials including, but not limited to, silicon oxide, silicon nitride, silicon oxynitride, low-k dielectrics, or any combination thereof. It is understood that isolating structure 416 may include an airgap each disposed laterally between adjacent semiconductor bodies 407. As described below with respect to the fabrication process, airgaps may be formed due to the relatively small pitches of vertical transistors 403 in the bit line direction (e.g., the y-direction). On the other hand, the relatively large dielectric constant of air in airgaps (e.g., about 4 times the dielectric constant of silicon oxide) can improve the insulation effect between vertical transistors 403 (and rows of memory cells 402) compared with some dielectrics (e.g., silicon oxide). Similarly, in some implementations, airgaps are formed laterally between word lines/gate electrodes 406 in the bit line direction as well, depending on the pitches of word lines/gate electrodes 406 in the bit line direction.

Figure 4C:
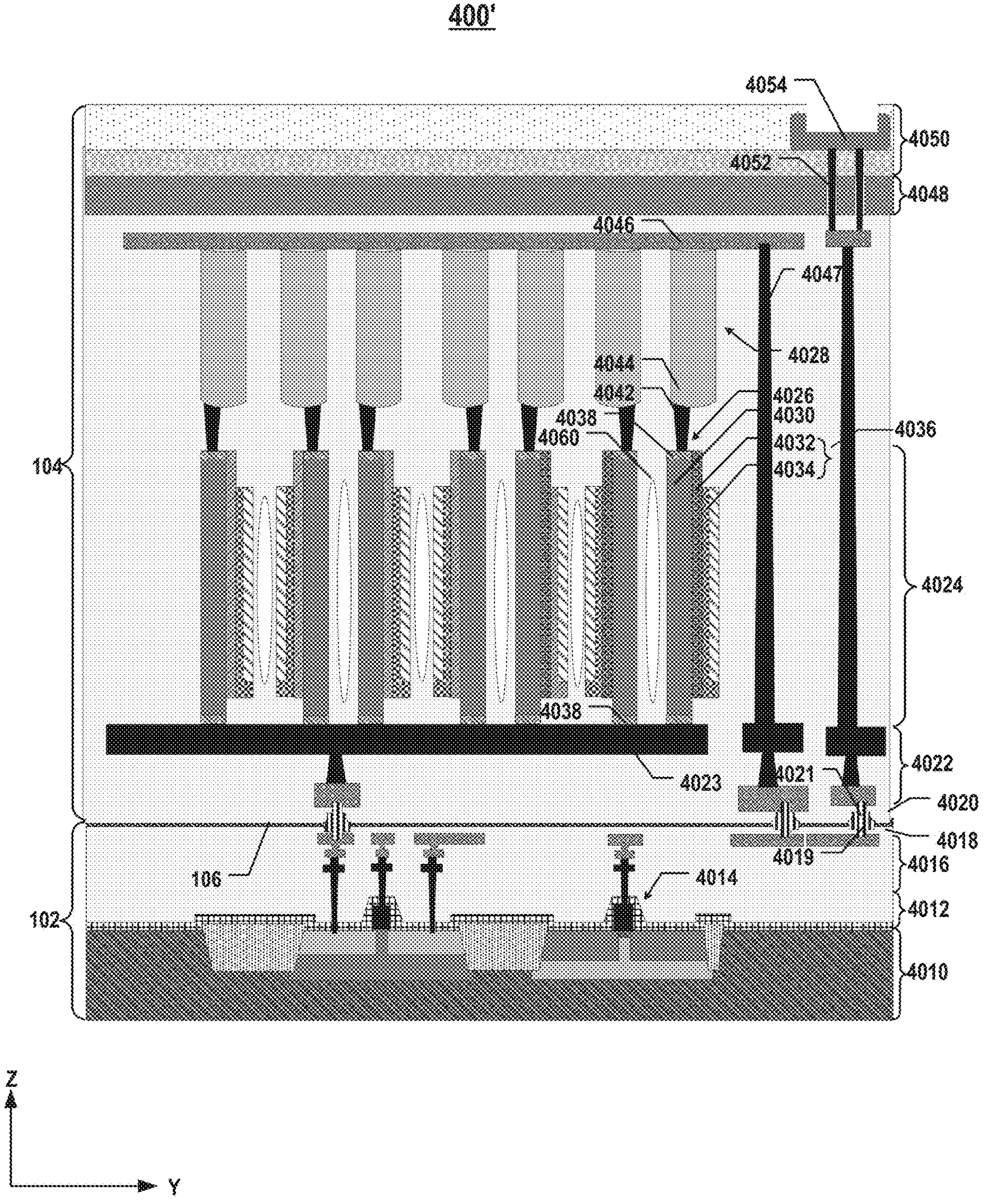
FIG. 4C illustrates a side view of a cross-section of yet another 3D memory device including vertical transistors, according to some aspects of the present disclosure.

FIG. 4C illustrates a side view of a cross-section of yet another 3D memory device 400' including vertical transistors, according to some aspects of the present disclosure. 3D memory device 400' may be one example of memory device including single-gate vertical transistors in which gate structures abut a single side of semiconductor bodies in the plan view. It is understood that FIG. 4C is for illustrative purposes only and may not necessarily reflect the actual device structure (e.g., interconnections) in practice. As one example of 3D memory device 100 described above with respect to FIG. 1, 3D memory device 400' is a bonded chip including first semiconductor structure 102 and second semiconductor structure 104 stacked over first semiconductor structure 102. First and second semiconductor structures 102 and 104 are jointed at bonding interface 106 therebetween, according to some implementations. As shown in FIG. 4C, first semiconductor structure 102 can include a substrate 4010, which can include silicon (e.g., single crystalline silicon, c-Si), SiGe, GaAs, Ge, SOI, or any other suitable materials.

First semiconductor structure 102 can include peripheral circuits 4012 on substrate 4010. In some implementations, peripheral circuits 4012 include a plurality of transistors 4014 (e.g., planar transistors and/or 3D transistors). Trench isolations (e.g., shallow trench isolations (STIs)) and doped regions (e.g., wells, sources, and drains of transistors 4014) can be formed on or in substrate 4010 as well.

In some implementations, first semiconductor structure 102 further includes an interconnect layer 4016 above peripheral circuits 4012 to transfer electrical signals to and from peripheral circuits 4012. Interconnect layer 4016 can include a plurality of interconnects (also referred to herein as "contacts"), including lateral interconnect lines and VIA contacts. Interconnect layer 4016 can further include one or more ILD layers in which the interconnect lines and via contacts can form. That is, interconnect layer 4016 can include interconnect lines and via contacts in multiple ILD layers. In some implementations, peripheral circuits 4012 are coupled to one another through the interconnects in interconnect layer 4016. The interconnects in interconnect layer 4016 can include conductive materials including, but not limited to, W, Co, Cu, Al, doped silicon, silicides, or any combination thereof. The ILD layers can be formed with dielectric materials including, but not limited to, silicon oxide, silicon nitride, silicon oxynitride, low-k dielectrics, or any combination thereof.

As shown in FIG. 4C, first semiconductor structure 102 can further include a bonding layer 4018 at bonding interface 106 and above interconnect layer 4016 and peripheral circuits 4012. Bonding layer 4018 can include a plurality of bonding contacts 4019. Bonding contacts 4019 can include conductive materials, such as Cu. The remaining area of bonding layer 4018 can be formed with dielectric materials, such as silicon oxide. Bonding contacts 4019 and surrounding dielectrics in bonding layer 4018 can be used for hybrid bonding. Similarly, as shown in FIG. 4C, second semiconductor structure 104 can also include a bonding layer 4020 at bonding interface 106 and above bonding layer 4018 of first semiconductor structure 102. Bonding layer 4020 can include a plurality of bonding contacts 4021. Bonding contacts 4021 can include conductive materials, such as Cu. The remaining area of bonding layer 4020 can be formed with dielectric materials, such as silicon oxide. Bonding contacts 4021 and surrounding dielectrics in bonding layer 4020 can be used for hybrid bonding. Bonding contacts 4021 are in contact with bonding contacts 4019 at bonding interface 106, according to some implementations.

Second semiconductor structure 104 can be bonded on top of first semiconductor structure 102 in a face-to-face manner at bonding interface 106. In some implementations, bonding interface 106 is disposed between bonding layers 4020 and 4018 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some implementations, bonding interface 106 is the place at which bonding layers 4020 and 4018 are met and bonded. In practice, bonding interface 106 can be a layer with a certain thickness that includes the top surface of bonding layer 4018 of first semiconductor structure 102 and the bottom surface of bonding layer 4020 of second semiconductor structure 104.

In some implementations, second semiconductor structure 104 further includes an interconnect layer 4022 including bit lines 4023 above bonding layer 4020 to transfer electrical signals. Interconnect layer 4022 can include a plurality of interconnects, such as MEOL interconnects and BEOL interconnects. In some implementations, the interconnects in interconnect layer 4022 also include local interconnects, such as bit lines 4023 and word line contacts (not shown). Interconnect layer 4022 can further include one or more ILD layers in which the interconnect lines and via contacts can form. The interconnects in interconnect layer 4022 can include conductive materials including, but not limited to, W, Co, Cu, Al, doped silicon, silicides, or any combination thereof. The ILD layers can be formed with dielectric materials including, but not limited to, silicon oxide, silicon nitride, silicon oxynitride, low-k dielectrics, or any combination thereof. In some implementations, peripheral circuits 4012 include a word line driver/row decoder coupled to the word line contacts in interconnect layer 4022 through bonding contacts 4021 and 4019 in bonding layers 4020 and 4018 and interconnect layer 4016. In some implementations, peripheral circuits 4012 include a bit line driver/column decoder coupled to bit lines 4023 and bit line contacts (if any) in interconnect layer 4022 through bonding contacts 4021 and 4019 in bonding layers 4020 and 4018 and interconnect layer 4016.

In some implementations, second semiconductor structure 104 includes a DRAM device in which memory cells are provided in the form of an array of DRAM cells 4024 above interconnect layer 4022 and bonding layer 4020. That is, interconnect layer 4022 including bit lines 4023 can be disposed between bonding layer 4020 and array of DRAM cells 4024. It is understood that the cross-section of 3D memory device 400' in FIG. 4C may be made along the bit line direction (the y-direction), and one bit line 4023 in interconnect layer 4022 extending laterally in the y-direction may be coupled to a column of DRAM cells 4024.

Each DRAM cell 4024 can include a vertical transistor 4026 (e.g., an example of vertical transistors 403 in FIG. 4B) and capacitor 4028 (e.g., an example of storage unit 306 in FIG. 3) coupled to the vertical transistor 4026. DRAM cell 4024 can be a 1T1C cell consisting of one transistor and one capacitor. It is understood that DRAM cell 4024 may be of any suitable configurations, such as 2T1C cell, 3T1C cell, etc.

Vertical transistor 4026 can be a MOSFET used to switch a respective DRAM cell 4024. In some implementations, vertical transistor 4026 includes a semiconductor body 4030 (i.e., the active region in which a channel can form) extending vertically (in the z-direction), and a gate structure 4036 in contact with one side of semiconductor body 4030 in the bit line direction (the y-direction). In a single-gate vertical transistor, semiconductor body 4030 can have a cuboid shape or a cylinder shape, and gate structure 4036 can abut a single side of semiconductor body 4030. Gate structure 4036 includes a gate electrode 4034 and a gate dielectric 4032 laterally between gate electrode 4034 and semiconductor body 4030 in the bit line direction, according to some implementations. In some implementations, gate dielectric 4032 abuts one side of semiconductor body 4030, and gate electrode 4034 abuts gate dielectric 4032.

As shown in FIG. 4C, in some implementations, semiconductor body 4030 has two ends (the upper end and lower end) in the vertical direction (the z-direction), and at least one end (e.g., the lower end in FIG. 4C) extends beyond gate dielectric 4032 in the vertical direction (the z-direction) into ILD layers. In some implementations, one end (e.g., the upper end in FIG. 4C) of semiconductor body 4030 is flush with the respective end of gate dielectric 4032. In some implementations, both ends (the upper end and lower end) of semiconductor body 4030 extend beyond gate electrode 4034, respectively, in the vertical direction (the z-direction) into ILD layers. That is, semiconductor body 4030 can have a larger vertical dimension (e.g., the depth) than that of gate electrode 4034 (e.g., in the z-direction), and neither the upper end nor the lower end of semiconductor body 4030 is flush with the respective end of gate electrode 4034. Thus, short circuits between bit lines 4023 and word lines/gate electrodes 4034 or between word lines/gate electrodes 4034 and capacitors 4028 can be avoided. Vertical transistor 4026 can further include a source and a drain (both referred to as 4038 as their locations may be interchangeable) disposed at the two ends (the upper end and lower end) of semiconductor body 4030, respectively, in the vertical direction (the z-direction). In some implementations, one of source and drain 4038 is coupled to capacitor 4028, and the other one of source and drain 4038 is coupled to bit line 4023.

In some implementations, semiconductor body 4030 includes semiconductor materials, such as single crystalline silicon, polysilicon, amorphous silicon, Ge, any other semiconductor materials, or any combinations thereof. In one example, semiconductor body 4030 may include single crystalline silicon. Source and drain 4038 can be doped with N-type dopants (e.g., P or As) or P-type dopants (e.g., B or Ga) at a desired doping level. In some implementations, a silicide layer, such as a metal silicide layer, is formed between source and drain 4038 and bit line 4023 or first electrode 4042 to reduce the contact resistance. In some implementations, gate dielectric 4032 includes dielectric materials, such as silicon oxide, silicon nitride, or high-k dielectrics including, but not limited to, $Al_2O_3$, $HfO_2$, $Ta_2O_5$, $ZrO_2$, $TiO_2$, or any combination thereof. In some implementations, gate electrode 4034 includes conductive materials including, but not limited to W, Co, Cu, Al, TiN, TaN, polysilicon, silicides, or any combination thereof. In some implementations, gate electrode 4034 includes multiple conductive layers, such as a W layer over a TiN layer. In one example, gate structure 4036 may be a "gate oxide/gate poly" gate in which gate dielectric 4032 includes silicon oxide and gate electrode 4034 includes doped polysilicon. In another example, gate structure 4036 may be an HKMG in which gate dielectric 4032 includes a high-k dielectric and gate electrode 4034 includes a metal.

Gate electrode 4034 may be part of a word line or extend in the word line direction (e.g., the x-direction) as a word line, second semiconductor structure 104 of 3D memory device 400' can also include a plurality of word lines each extending in the word line direction (the x-direction). Each word line 4034 can be coupled to a row of DRAM cells 4024. That is, bit line 4023 and word line 4034 can extend in two perpendicular lateral directions, and semiconductor body 4030 of vertical transistor 4026 can extend in the vertical direction perpendicular to the two lateral directions in which bit line 4023 and word line 4034 extend. Word lines 4034 are in contact with word line contacts (not shown), according to some implementations. In some implementations, word lines 4034 include conductive materials including, but not limited to W, Co, Cu, Al, TiN, TaN, polysilicon, silicides, or any combination thereof. In some implementations, word line 4034 includes multiple conductive layers, such as a W layer over a TiN layer.

As shown in FIG. 4C, vertical transistor 4026 extends vertically through and contacts word lines 4034, and source or drain 4038 of vertical transistor 4026 at the lower end thereof is in contact with bit line 4023 (or bit line contact if any), according to some implementations. Accordingly, word lines 4034 and bit lines 4023 can be disposed in different planes in the vertical direction due to the vertical arrangement of vertical transistor 4026, which simplifies the routing of word lines 4034 and bit lines 4023. In some implementations, bit lines 4023 are disposed vertically between bonding layer 4020 and word lines 4034, and word lines 4034 are disposed vertically between bit lines 4023 and capacitors 4028. Word lines 4034 can be coupled to peripheral circuits 4012 in first semiconductor structure 102 through word line contacts (not shown) in interconnect layer 4022, bonding contacts 4021 and 4019 in bonding layers 4020 and 4018, and the interconnects in interconnect layer 4016. Similarly, bit lines 4023 in interconnect layer 4022 can be coupled to peripheral circuits 4012 in first semiconductor structure 102 through bonding contacts 4021 and 4019 in bonding layers 4020 and 4018 and the interconnects in interconnect layer 4016.

As described above with respect to FIG. 4A and FIG. 4B, vertical transistors 4026 can be arranged in a mirror-symmetric manner to increase the density of DRAM cells 4024 in the bit line direction (the y-direction). As shown in FIG. 4C, two adjacent vertical transistors 4026 in the bit line direction are mirror-symmetric to one another with respect to a trench isolation 4060, according to some implementations. That is, second semiconductor structure 104 can include a plurality of trench isolations 4060 each extending in the word line direction (the x-direction) in parallel with word lines 4034 and disposed between semiconductor bodies 4030 of two adjacent rows of vertical transistors 4026. In some implementations, the rows of vertical transistors 4026 separated by trench isolation 4060 are mirror-symmetric to one another with respect to trench isolation 4060. Trench isolation 4060 can be formed with dielectric materials including, but not limited to, silicon oxide, silicon nitride, silicon oxynitride, low-k dielectrics, or any combination thereof. It is understood that trench isolation 4060 may include an airgap each disposed laterally between adjacent semiconductor bodies 4030. As described below with respect to the fabrication process, airgaps may be formed due to the relatively small pitches of vertical transistors 4026 in the bit line direction (e.g., the y-direction). On the other hand, the relatively large dielectric constant of air in airgaps (e.g., about 4 times the dielectric constant of silicon oxide) can improve the insulation effect between vertical transistors 4026 (and rows of DRAM cells 4024) compared with some dielectrics (e.g., silicon oxide). Similarly, in some implementations, airgaps are formed laterally between word lines/gate electrodes 4034 in the bit line direction as well, depending on the pitches of word lines/gate electrodes 4034 in the bit line direction.

As shown in FIG. 4C, in some implementations, capacitor 4028 includes a first electrode 4042 above and in contact with source or drain 4038 of vertical transistor 4026, e.g., the upper end of semiconductor body 4030. Capacitor 4028 can also include a capacitor dielectric 4044 above and in contact with first electrode 4042, and a second electrode 4046 above and in contact with capacitor dielectric 4044. That is, capacitor 4028 can be a vertical capacitor in which electrodes 4042 and 4046 and capacitor dielectric 4044 are stacked vertically (in the z-direction), and capacitor dielectric 4044 can be sandwiched between electrodes 4042 and 4046. In some implementations, each first electrode 4042 is coupled to source or drain 4038 of a respective vertical transistor 4026 in the same DRAM cell, while all second electrodes 4046 are parts of a common plate coupled to the ground, e.g., a common ground. As shown in FIG. 4C, second semiconductor structure 104 can further include a capacitor contact 4047 in contact with the common plate of second electrodes 4046 for coupling second electrodes 4046 of capacitor 4028 to peripheral circuits 4012 or to the ground directly. In some implementations, the ILD layer in which capacitors 4028 are formed has the same dielectric material as the two ILD layers into which semiconductor body 4030 extends, such as silicon oxide.

It is understood that the structure and configuration of capacitor 4028 are not limited to the example in FIG. 4C and may include any suitable structure and configuration, such as a planar capacitor, a stack capacitor, a multi-fins capacitor, a cylinder capacitor, a trench capacitor, or a substrate-plate capacitor. In some implementations, capacitor dielectric 4044 includes dielectric materials, such as silicon oxide, silicon nitride, or high-k dielectrics including, but not limited to, $Al_2O_3$, $HfO_2$, $Ta_2O_5$, $ZrO_2$, $TiO_2$, or any combination thereof. It is understood that in some examples, capacitor 4028 may be a ferroelectric capacitor used in a FRAM cell, and capacitor dielectric 4044 may be replaced by a ferroelectric layer having ferroelectric materials, such as (PZT or SBT. In some implementations, electrodes 4042 and 4046 include conductive materials including, but not limited to W, Co, Cu, Al, TiN, TaN, polysilicon, silicides, or any combination thereof.

As shown in FIG. 4C, vertical transistor 4026 extends vertically through and contacts word lines 4034, source or drain 4038 of vertical transistor 4026 at the lower end thereof is in contact with bit line 4023, and source or drain 4038 of vertical transistor 4026 at the upper end thereof is in contact with electrode 4042 of capacitor 4028, according to some implementations. That is, bit line 4023 and capacitor 4028 can be disposed in different planes in the vertical direction and coupled to opposite ends of vertical transistor 4026 of DRAM cell 4024 in the vertical direction due to the vertical arrangement of vertical transistor 4026. In some implementations, bit line 4023 and capacitor 4028 are disposed on opposite sides of vertical transistor 4026 in the vertical direction, which simplifies the routing of bit lines 4023 and reduces the coupling capacitance between bit lines 4023 and capacitors 4028 compared with conventional DRAM cells in which the bit lines and capacitors are disposed on the same side of the planar transistors.

As shown in FIG. 4C, in some implementations, vertical transistors 4026 are disposed vertically between capacitors 4028 and bonding interface 106. That is, vertical transistors 4026 can be arranged closer to peripheral circuits 4012 of first semiconductor structure 102 and bonding interface 106 than capacitors 4028. Since bit lines 4023 and capacitors 4028 are coupled to opposite ends of vertical transistors 4026, as described above, bit lines 4023 (as part of interconnect layer 4022) are disposed vertically between vertical transistors 4026 and bonding interface 106, according to some implementations. As a result, interconnect layer 4022 including bit lines 4023 can be arranged close to bonding interface 106 to reduce the interconnect routing distance and complexity.

In some implementations, second semiconductor structure 104 further includes a substrate 4048 disposed above DRAM cells 4024. As described below with respect to the fabrication process, substrate 4048 can be part of a carrier wafer. It is understood that in some examples, substrate 4048 may not be included in second semiconductor structure 104.

As shown in FIG. 4C, second semiconductor structure 104 can further include a pad-out interconnect layer 4050 above substrate 4048 and DRAM cells 4024. Pad-out interconnect layer 4050 can include interconnects, e.g., contact pads 4054, in one or more ILD layers. Pad-out interconnect layer 4050 and interconnect layer 4022 can be formed on opposite sides of DRAM cells 4024. Capacitors 4028 are disposed vertically between vertical transistors 4026 and pad-out interconnect layer 4050, according to some implementations. In some implementations, the interconnects in pad-out interconnect layer 4050 can transfer electrical signals between 3D memory device 400' and outside circuits, e.g., for pad-out purposes. In some implementations, second semiconductor structure 104 further includes one or more contacts 4052 extending through substrate 4048 and part of pad-out interconnect layer 4050 to couple pad-out interconnect layer 4050 to DRAM cells 4024 and interconnect layer 4022. As a result, peripheral circuits 4012 can be coupled to DRAM cells 4024 through interconnect layers 4016 and 4022 as well as bonding layers 4020 and 4018, and peripheral circuits 4012 and DRAM cells 4024 can be coupled to outside circuits through contacts 4052 and pad-out interconnect layer 4050. Contact pads 4054 and contacts 4052 can include conductive materials including, but not limited to, W, Co, Cu, Al, silicides, or any combination thereof. In one example, contact pad 4054 may include Al, and contact 4052 may include W. In some implementations, contact 4052 includes a via surrounded by a dielectric spacer (e.g., having silicon oxide) to electrically separate the via from substrate 4048. Depending on the thickness of substrate 4048, contact 4052 can be an ILV having a depth in the submicron-level (e.g., between 10 nm and 1 μm), or a TSV having a depth in the micron- or tens micron-level (e.g., between 1 μm and 100 μm).

Although not shown, it is understood that the pad-out of 3D memory devices is not limited to from second semiconductor structure 104 having DRAM cells 4024 as shown in FIG. 4C and may be from first semiconductor structure 102 having peripheral circuit 4012. Although not shown, it is also understood that the airgaps between word lines 4034 and/or between semiconductor bodies 4030 may be partially or fully filled with dielectrics. Although not shown, it is further understood that more than one array of DRAM cells 4024 may be stacked over one another to vertically scale up the number of DRAM cells 4024.

Figure 6:
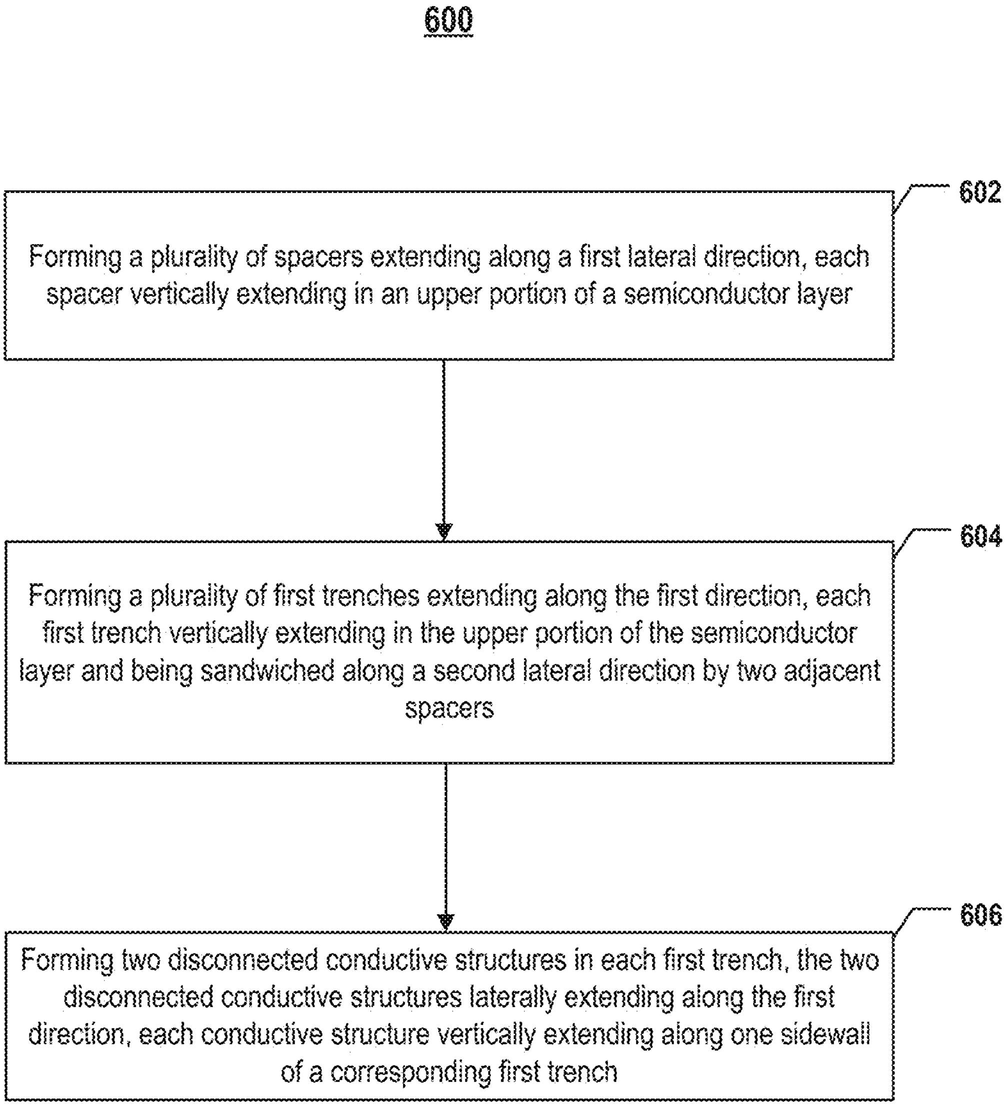
FIG. 6 illustrates a flowchart of a method for forming an array of memory cells each including a vertical transistor, according to some aspects of the present disclosure.

FIG. 6 illustrates a flowchart of a method 600 for forming an array of memory cells each including a vertical transistor, according to some aspects of the present disclosure. At operation 602 in FIG. 6, a plurality of spacers are formed. The plurality of spacers extend along a first lateral direction, and each spacer vertically extends in an upper portion of a semiconductor layer. The semiconductor layer can include a substrate, a first dielectric layer on the substrate, and a second dielectric layer on the first dielectric layer. In some implementations, to form the plurality of spacers, the upper portion of the semiconductor layer is etched in a first lateral direction to form a plurality of grooves, and a sacrificial layer is then deposited to fill the plurality of grooves and to form the plurality of spacers.

Figure 5A:
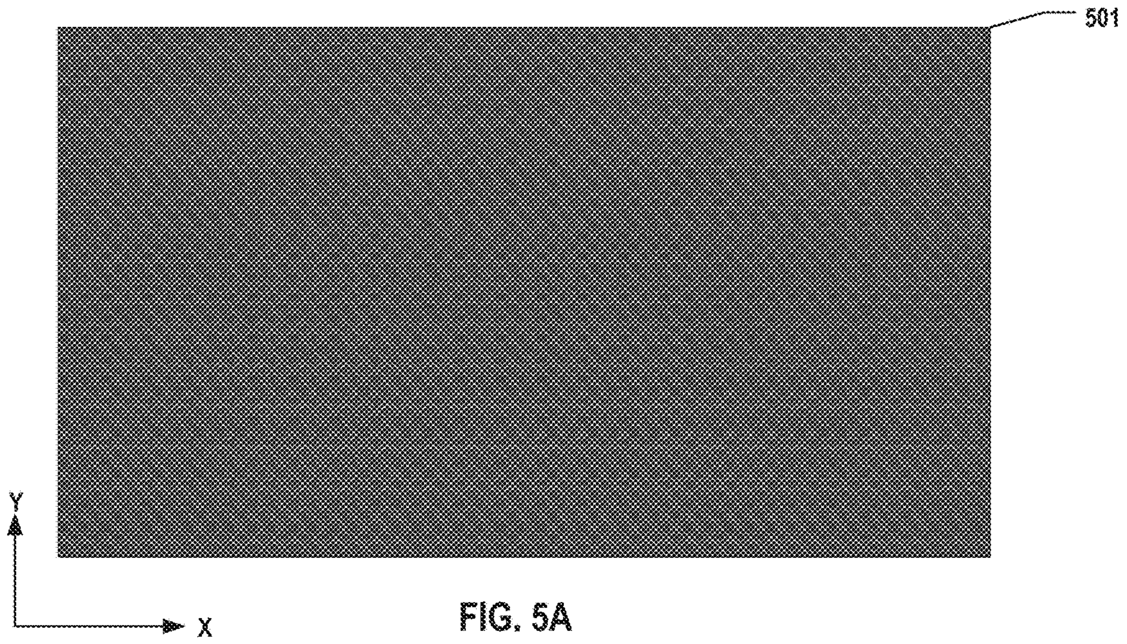
FIGS. 5A-5J and 5A'-5J' illustrate a fabrication process for forming a 3D memory device including vertical transistors, according to some aspects of the present disclosure.
Figure 5A:
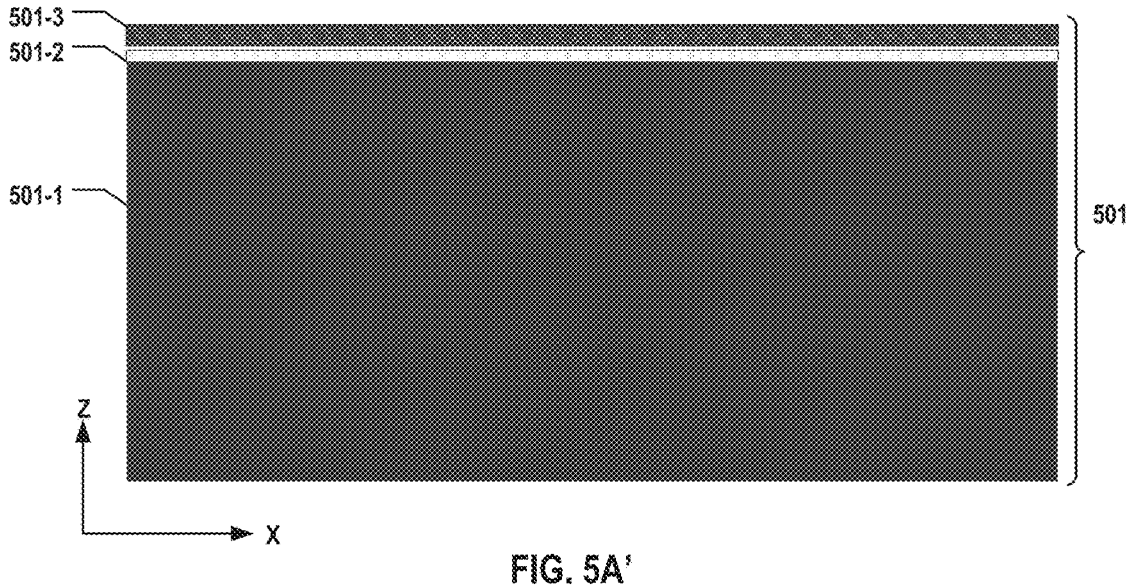

FIGS. 5A and 5A' show a semiconductor layer 501, including substrate 501-1, first dielectric layer 501-2 on top of the substrate 501-1, and second dielectric layer 501-3 on top of the first dielectric layer 501-2. In some implementations, first dielectric layer 501-2 and second dielectric layer 501-3 are removed in subsequent processes, allowing the capacitor structure to be effectively connected to the source. FIG. 5A illustrates a plan view of semiconductor layer 501, while FIG. 5A' illustrates a side view of semiconductor layer 501. To form semiconductor layer 501, silicon oxide and silicon nitride are subsequently deposited onto silicon substrate 501-1 using one or more thin film deposition processes including, but not limited to, chemical vapor deposition (CVD), physical vapor deposition (PVD), atomic layer deposition (ALD), or any combination thereof. In some implementations, silicon oxide layer 501-2 is formed by oxidizing the top portion of silicon substrate 501-1 using dry oxidation and/or we oxidation, such as in situ steam generation (ISSG) oxidation process.

Figure 5B:
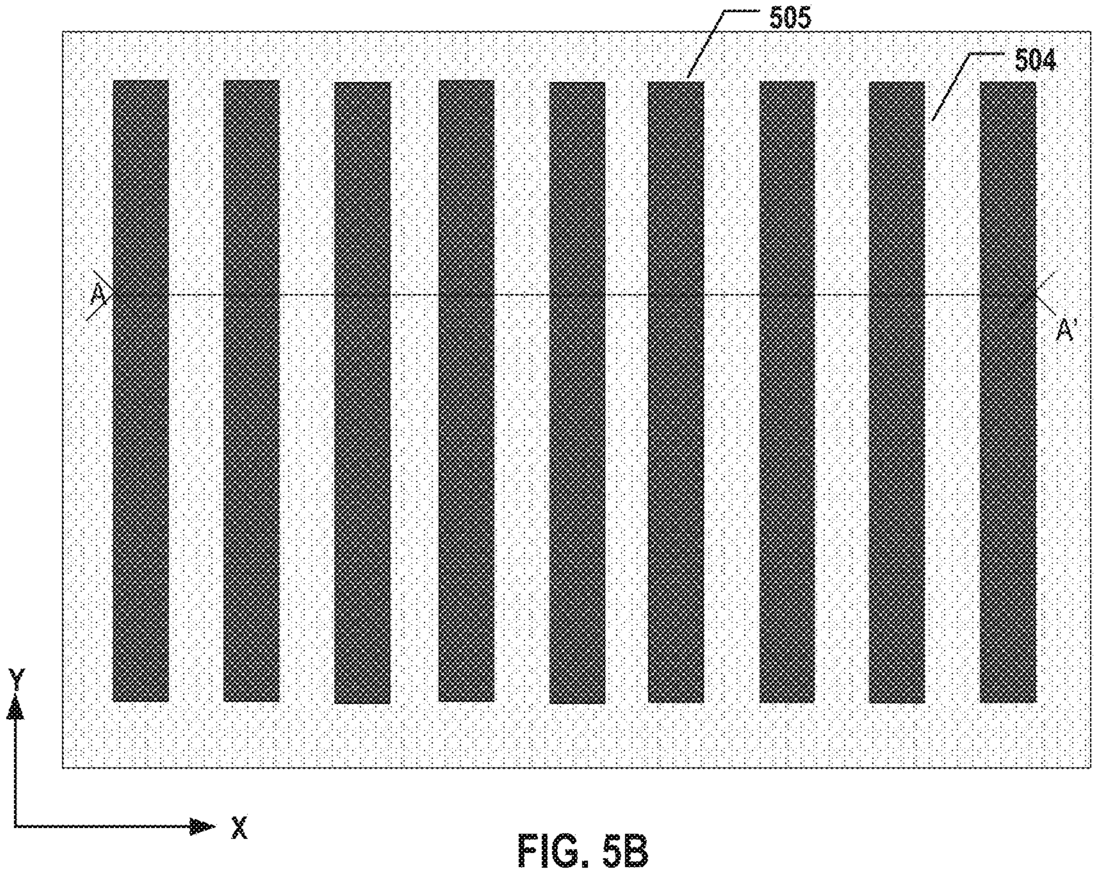
Figure 5B:
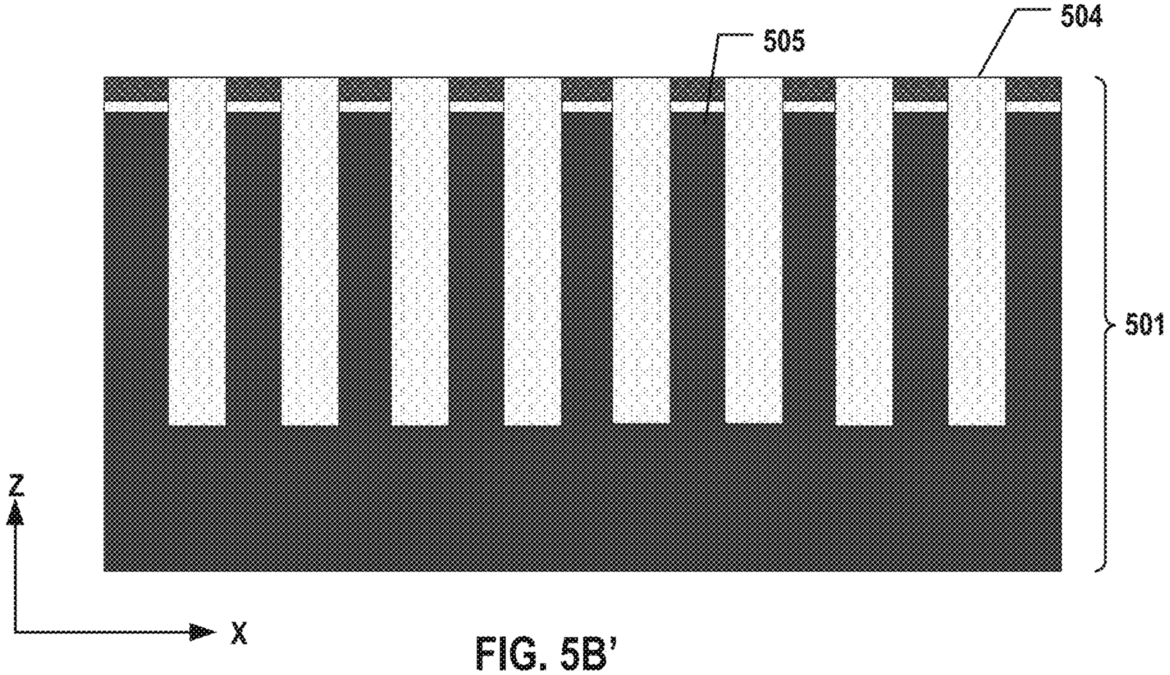

As illustrated in FIG. 5B and FIG. 5B', a plurality of parallel trenches are formed in the y-direction (e.g., the bit line direction) to form a plurality of parallel semiconductor walls 505 in the y-direction. In some implementations, a lithography process is performed to pattern trenches and semiconductor walls 505 using an etch mask (e.g., a photoresist mask and/or a hard mask), for example, based on the design of bit lines, and one or more dry etching and/or wet etching processes, such as RIE, are performed to etch trenches in semiconductor layer 501. Thus, semiconductor wall 505 extending vertically in semiconductor layer 501 can be formed. Since semiconductor walls 505 are formed by etching semiconductor layer 501, semiconductor walls 505 can have the same material as semiconductor layer 501. In some implementations, the plurality of parallel trenches are filled to form a plurality of parallel trench isolations 504 by depositing a third dielectric layer, such as silicon oxide, by using one or more thin film deposition processes including, but not limited to, CVD, PVD, ALD, or any combination thereof. In some implementations, a planarization process, such as CMP, is performed to remove the excess third dielectric layer that is deposited beyond the top surface of semiconductor layer 501. As a result, parallel semiconductor walls 505 can be separated by trench isolations 504. FIG. 5B and FIG. 5B' illustrate the plan view in the x-y plane) and the side view of a cross-section along the x-direction (the word line direction, e.g., along the AA' line), respectively.

Figure 5C:
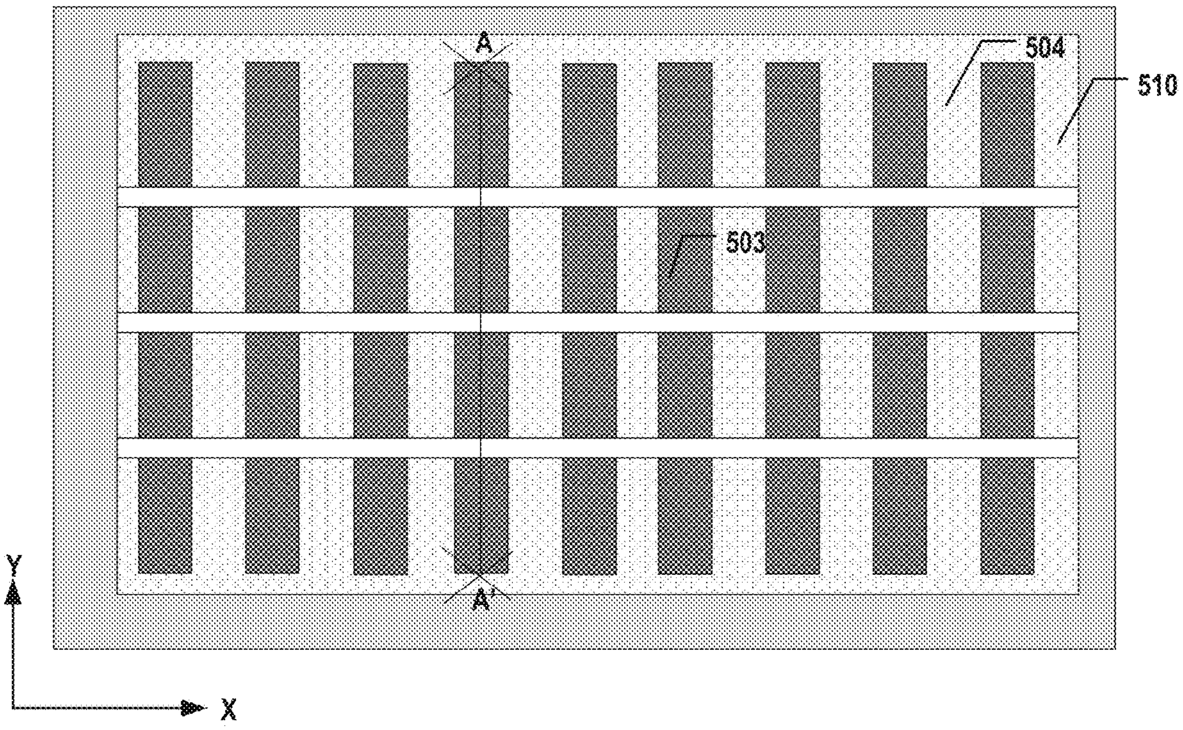
Figure 5C:
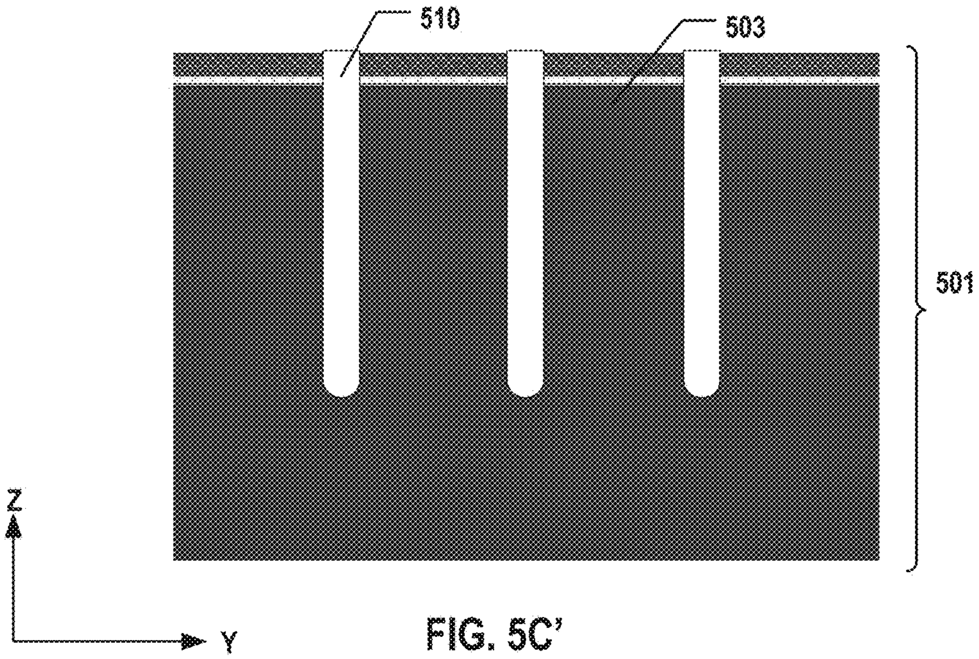

As illustrated in FIG. 5C and FIG. 5C', a plurality of parallel grooves 510 having a first depth are formed in the x-direction (e.g., the word line direction) to form an array of semiconductor pillars 503 each extending vertically in semiconductor layer 501. In some implementations, a lithography process is performed to pattern grooves 510 to be perpendicular to trench isolations 504 using an etch mask (e.g., a photoresist mask and/or a hard mask), for example, based on the design of word lines, and one or more dry etching and/or wet etching processes, such as RIE, are performed on semiconductor layer 501 and trench isolation 504 to etch grooves in semiconductor layer 501. As a result, semiconductor walls 505 (shown in FIG. 5B) can be cut by grooves 510 to form an array of semiconductor pillars 503 each extending vertically in semiconductor layer 501. Since semiconductor pillars 503 are formed by etching semiconductor layer 501, semiconductor pillars 503 can have the same materials as semiconductor layer 501. FIG. 5C illustrates the plan view in the x-y plane, and FIG. 5C' illustrates the side view of a cross-section along the y-direction (the bit line direction).

Figure 5D:
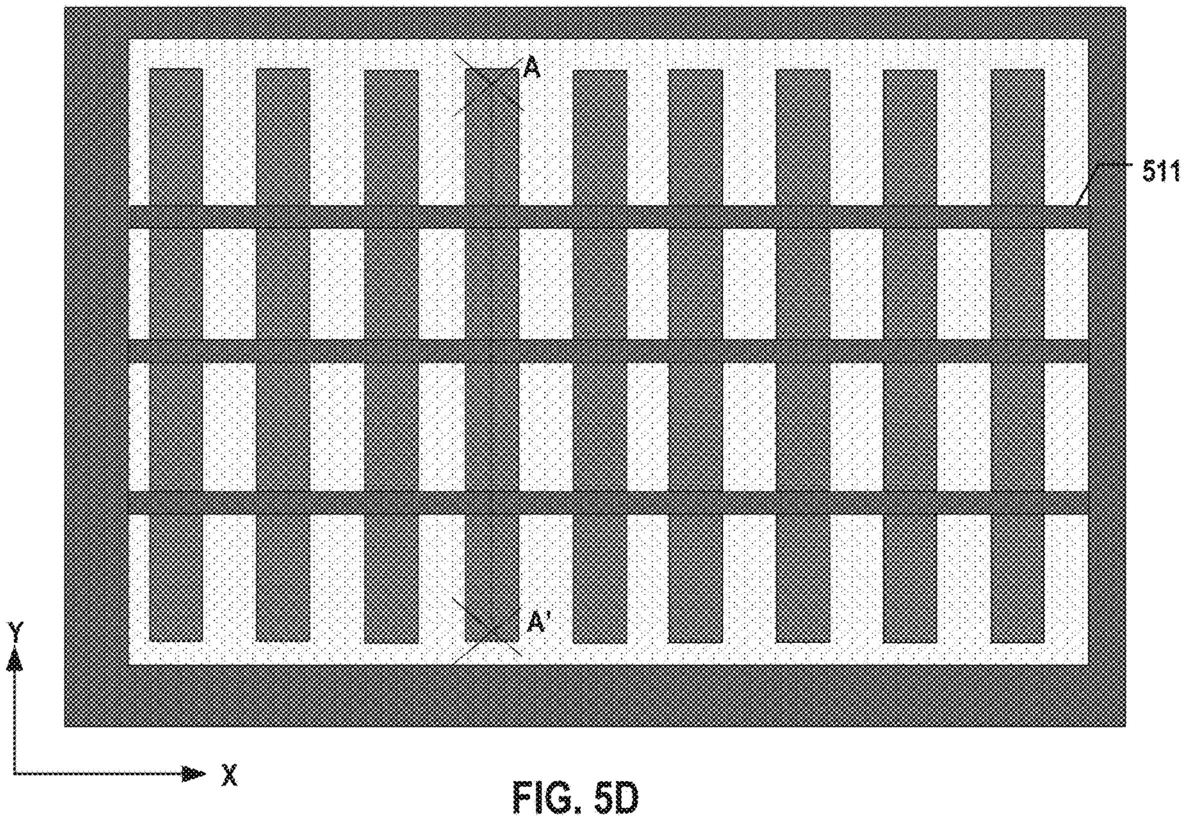
Figure 5D:
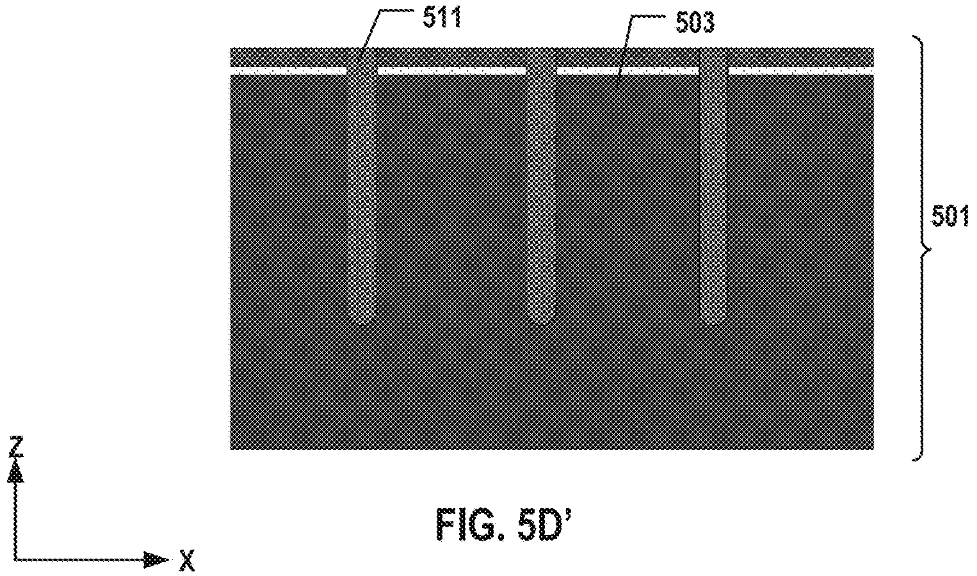

As illustrated in FIG. 5D and FIG. 5D', a sacrificial layer is deposited in the grooves 510 to form a plurality of spacers 511. The sacrificial layer may be deposited by using a dielectric, such as silicon oxide, to fill grooves 510, using one or more thin film deposition processes including, but not limited to, CVD, PVD, ALD, or any combination thereof. In some implementations, a planarization process, such as CMP, is performed to remove excess dielectric that is deposited beyond the top surface of semiconductor layer 501. FIG. 5D and FIG. 5D' illustrate the plan view in the x-y plane and the side view of a cross-section along the x-direction (the word line direction), respectively.

At operation 604 in FIG. 6, a plurality of first trenches are formed. The plurality of first trenches extend along the first lateral direction, and each first trench vertically extends in the upper portion of the semiconductor layer. In some implementations, to form the plurality of first trenches, the upper portion of the semiconductor layer is etched in the first lateral direction to form the plurality of first trenches that are sandwiched between two adjacent spacers. After forming the plurality of first trenches, the semiconductor pillars are divided by the plurality of first trenches to form a plurality of semiconductor bodies.

Figure 5E:
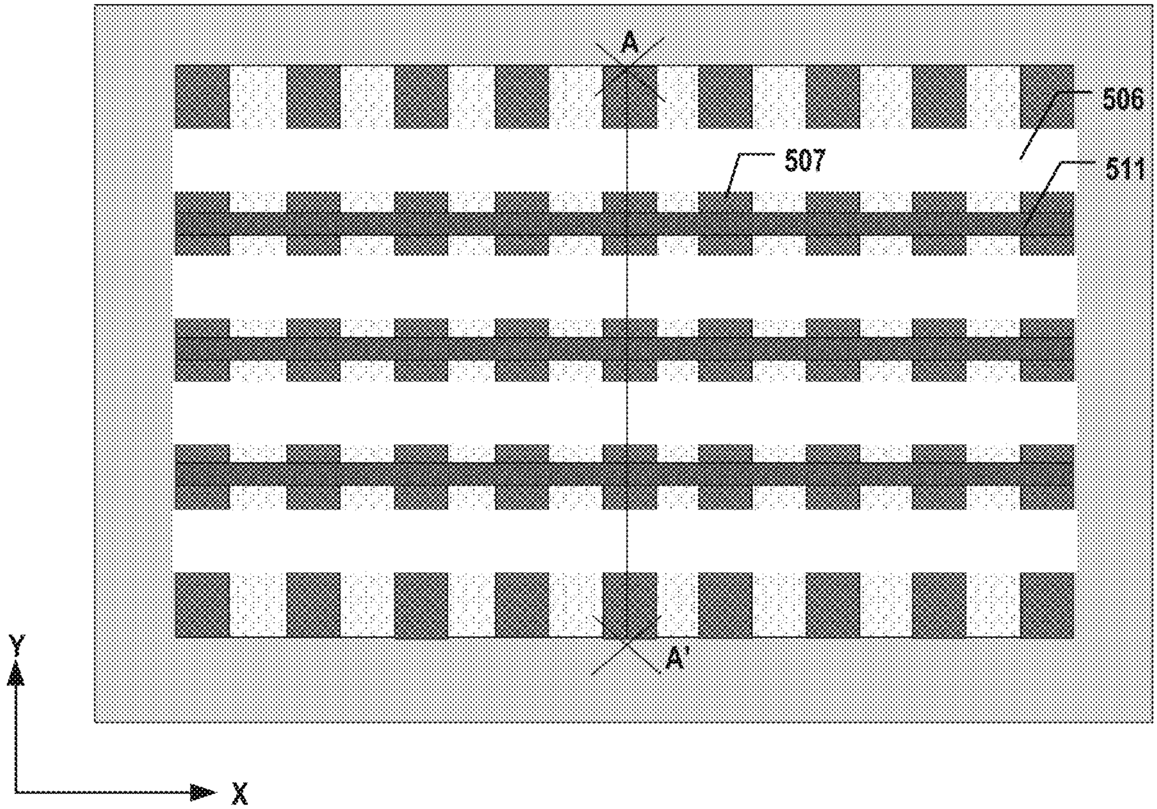
Figure 5E:
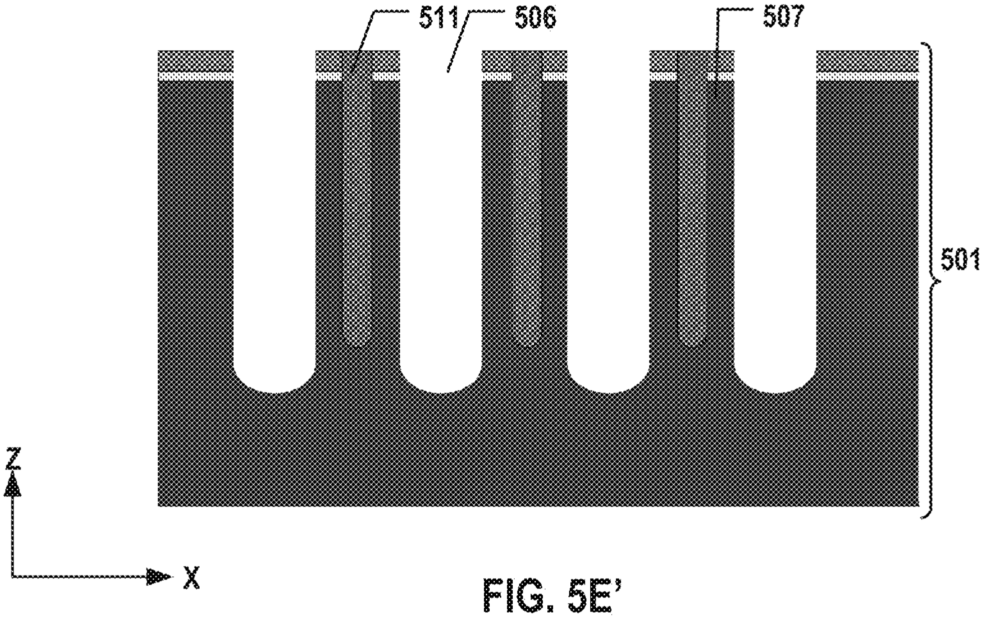

As illustrated in FIG. 5E and FIG. 5E', a plurality of first trenches 506 having a second depth are formed in the x-direction (e.g., the word line direction) sandwiched between two spacers 511, and each first trench extends vertically in semiconductor layer 501 and cuts one semiconductor pillar into two semiconductor bodies 507. Each semiconductor body 507 extends in a vertical direction (e.g., the z-direction as shown in FIG. 5E'). Each semiconductor body 507 has a first lateral dimension along a first lateral direction (e.g., the x-direction), and a second lateral dimension along a second lateral direction (e.g., the y-direction). The first lateral dimensions and second lateral dimensions of different semiconductor bodies 507 are essentially the same (with errors within a margin of ±10%) along the x-direction and y-direction, respectively. In some implementations, a lithography process is performed to pattern first trenches 506 to be parallel with the spacers 511 and perpendicular to trench isolations 504 using an etch mask (e.g., a photoresist mask and/or a hard mask), for example, based on the design of word lines, and one or more dry etching and/or wet etching processes, such as RIE, are performed on semiconductor layer 501 and trench isolation 504 to etch first trenches in semiconductor layer 501. FIG. 5E illustrates the plan view in the x-y plane, and FIG. 5E' illustrates the side view of a cross-section along they-direction (the bit line direction).

At operation 606 of FIG. 6, two disconnected conductive structures are formed in each first trench. The two disconnected conductive structures laterally extend along the first lateral direction, and each conductive structure vertically extends along one sidewall of a corresponding first trench.

Figure 5F:
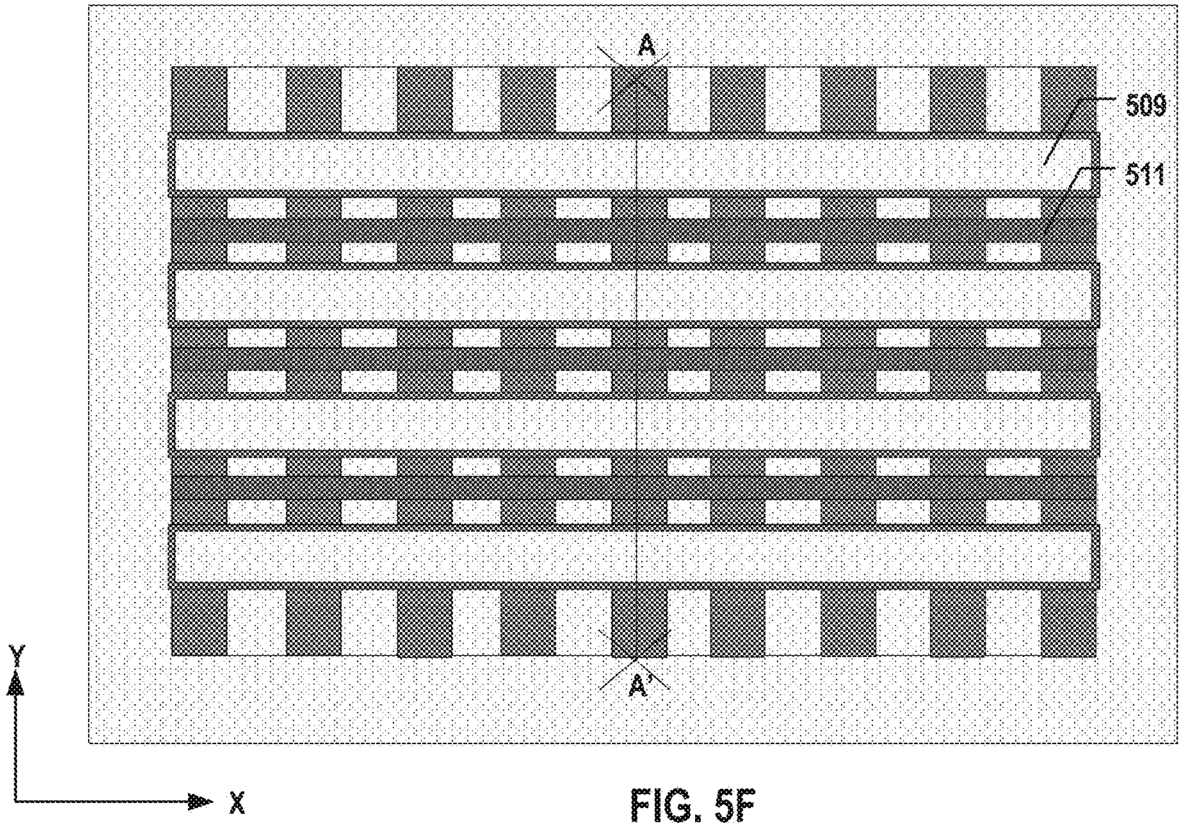
Figure 5F:
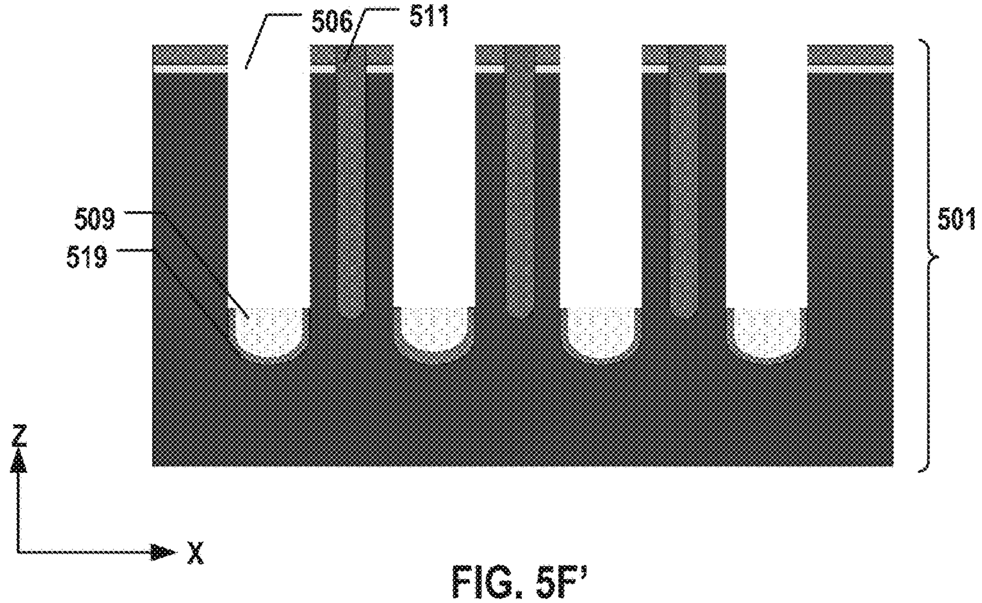

As illustrated in FIG. 5F and FIG. 5F', a dielectric layer 509 is formed at the bottom of first trench 506, for example, by depositing a dielectric, such as silicon oxide, to fill first trench 506, using one or more thin film deposition processes including, but not limited to, CVD, PVD, ALD, or any combination thereof. In some implementations, a dielectric layer 519 is deposited on sidewalls of each first trench 506 to partially fill each first trench 506, followed by depositing dielectric layer 509 to fully fill each first trench 506. In some implementations, dielectric layers 519 and 509 may be made from different materials, for example, silicon oxide and silicon nitride, respectively. In some implementations, dielectric layers 519 and 509 may be made from the same materials, for example, silicon oxide or silicon nitride. In some implementations, a planarization process, such as CMP, is performed to remove excess dielectric layer 509 that is deposited beyond the top surface of semiconductor layer 501. The dielectric layer 509 is then back-etched such that the dielectric layer 509 covers the bottom surface of each first trench 506. In some implementations, a lithography process is performed to back-etch dielectric layer 509 using an etch mask (e.g., a photoresist mask and/or a hard mask), or one or more dry etching and/or wet etching processes, such as RIE, are performed on dielectric layer 509 until the back-etching reaches a third depth. FIG. 5F illustrates the plan view in the x-y plane, and FIG. 5F' illustrates the side view of a cross-section along the y-direction (the bit line direction).

Figure 5G:
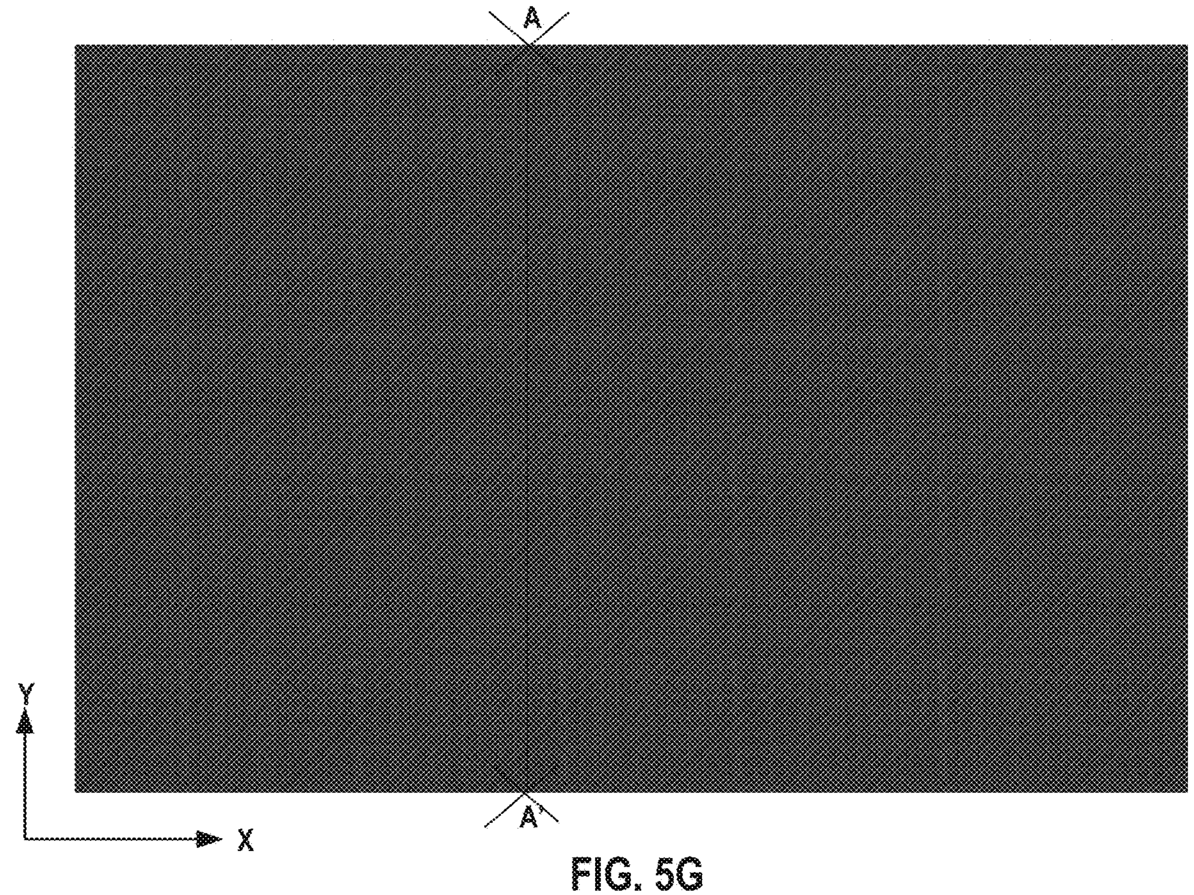
Figure 5G:
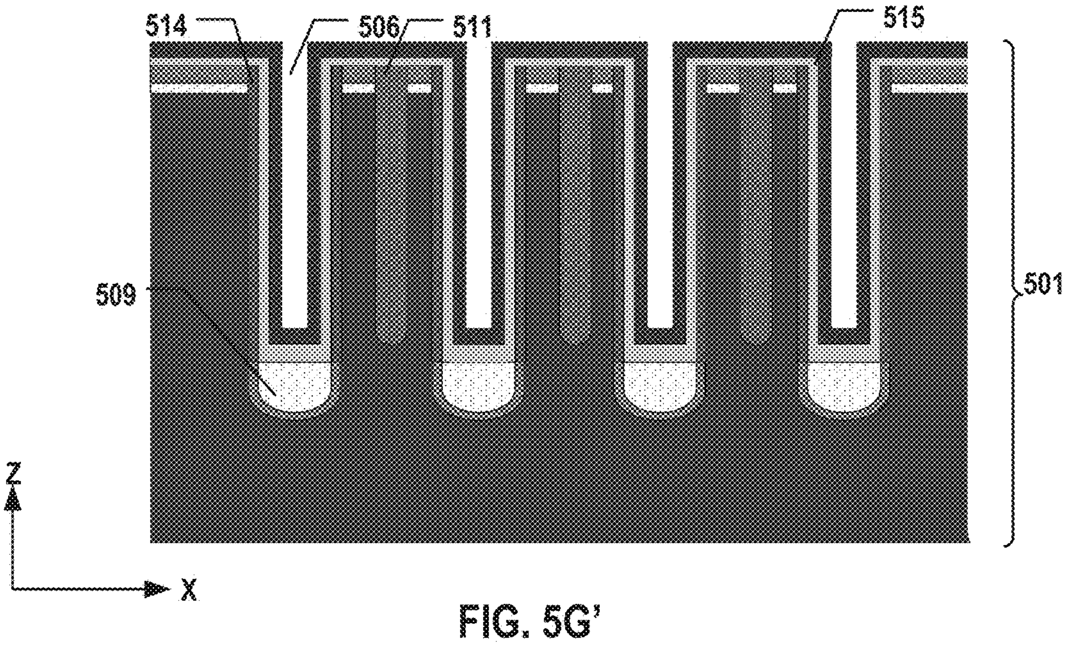

As illustrated in FIG. 5G and FIG. 5G', a gate dielectric layer 514 is formed in each first trench 506. Gate dielectric layer 514 can be parts of a continuous dielectric layer formed over the sidewalls of each row of semiconductor bodies 507. In some implementations, a wet oxidation and/or a dry oxidation process, such as in situ steam generation (ISSG) oxidation, is performed to form native oxide (e.g., silicon oxide) on the sidewalls of each first trench 506.

As illustrated in FIG. 5G and FIG. 5G', one or more conductive layers 515 are formed over gate dielectric layer 514 in first trenches 506. In some implementations, conductive layers 515 are formed by depositing one or more conductive materials, such as metal and/or metal compounds (e.g., W and TiN), over gate dielectric layer 514 using one or more thin film deposition processes including, but not limited to, CVD, PVD, ALD, or any combination thereof, to partially fill first trenches 506. For example, layers of TiN and W may be sequentially deposited to form conductive layers 515. A planarization process, e.g., CMP, can be performed to remove the excess conductive materials over the top surface of semiconductor layer 501.

Figure 5H:
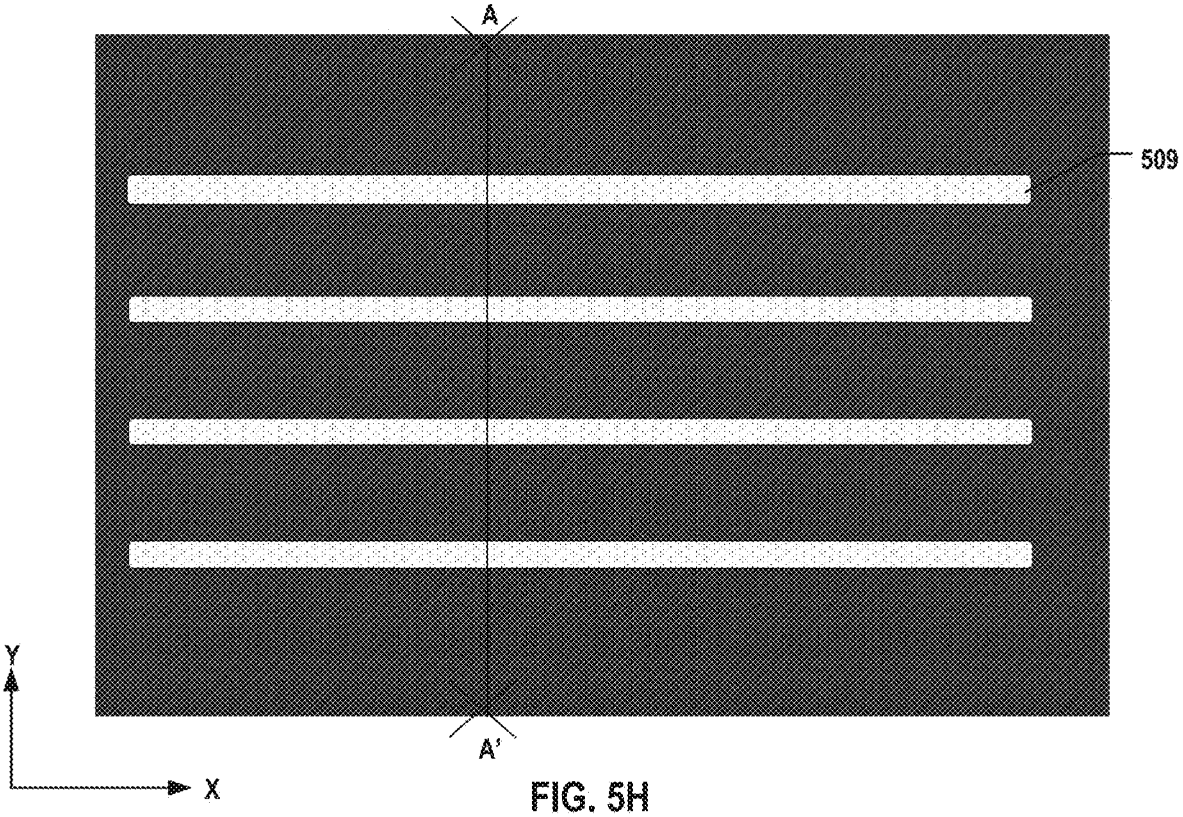
Figure 5H:
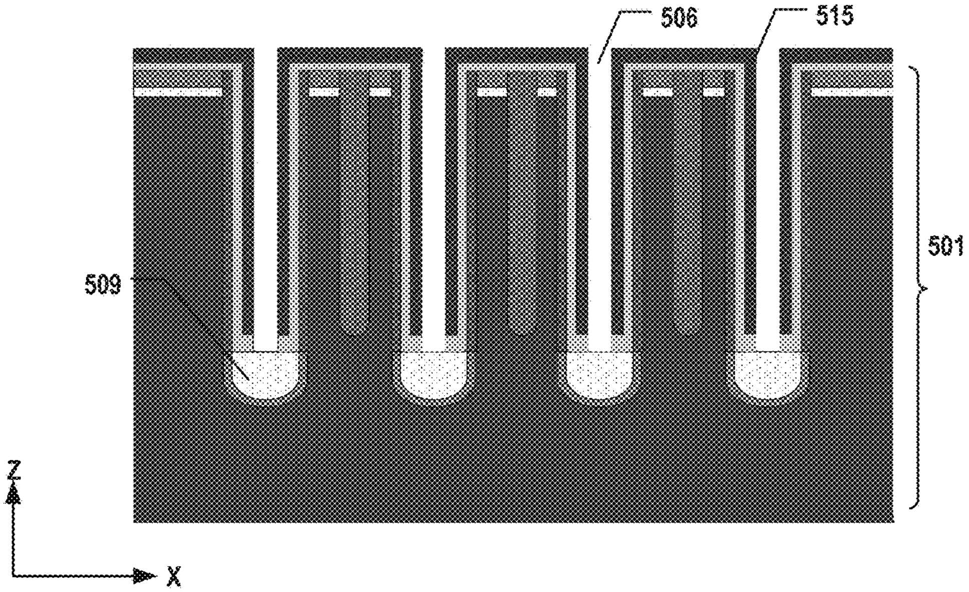

As illustrated in FIG. 5H and FIG. 5H', in some implementations, conductive layers 515 are etched back, for example, using a punch-down etch, dry etch, and/or wet etch (e.g., RIE), to form two disconnected conductive structures in each first trench 506. In some implementations, a bottom punch-down etching process is performed to each away some of the metals of conductive layer 515 at the bottom of the first trench until exposing dielectric layer 509 In some implementations, conductive layers 515 are etched back to form dents, such that the upper ends of conductive layers 515 are below the top surface of semiconductor bodies 507. In some implementations, as gate dielectric layer 514 is not etched, the upper ends of conductive layers 515 are below the upper ends of gate dielectric layer 514 as well, which are flush with the top surface of semiconductor bodies 507. As a result, etched-back conductive layers 515 can become word lines each extending in the word line direction (the x-direction), and parts of etched-back conductive layers 515 that are facing semiconductor bodies 507 can become gate electrodes. Gate structures each including a respective gate dielectric layer 514 and a respective gate electrode (e.g., part of conductive layer 515) over gate dielectric layer 514 can be formed thereby.

Figure 5I:
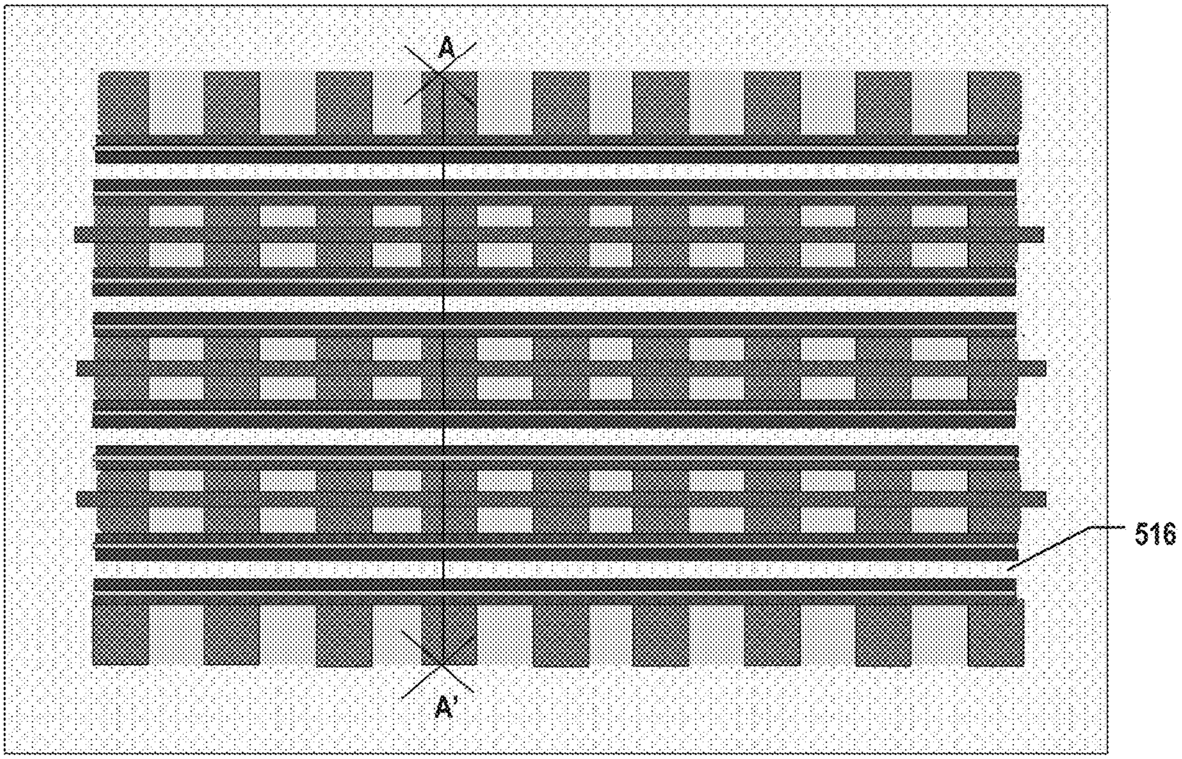
Figure 5I:
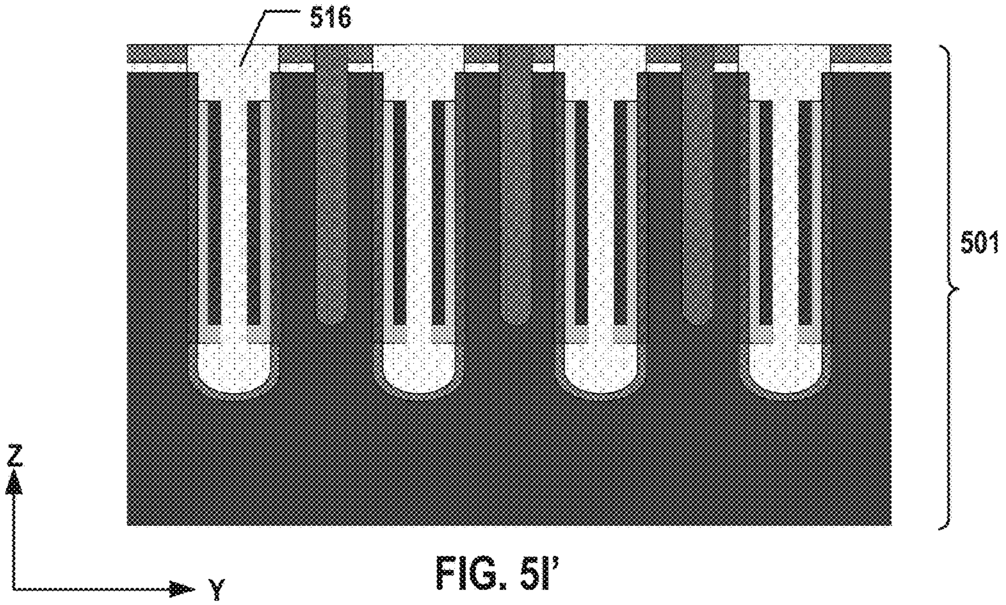

In some implementations, as shown in FIGS. 5I and 5I', a dielectric layer 516 is formed in the remaining space of first trenches 506 as well as the dents resulting from etching back of conductive layers 515, for example, by depositing a dielectric, such as silicon oxide, using one or more thin film deposition processes including, but not limited to, CVD, PVD, ALD, or any combination thereof. It is understood that depending on the pitches of the word lines (e.g., the dimension of first trenches 506), airgaps may be formed in dielectric layer 516.

Figure 5J:
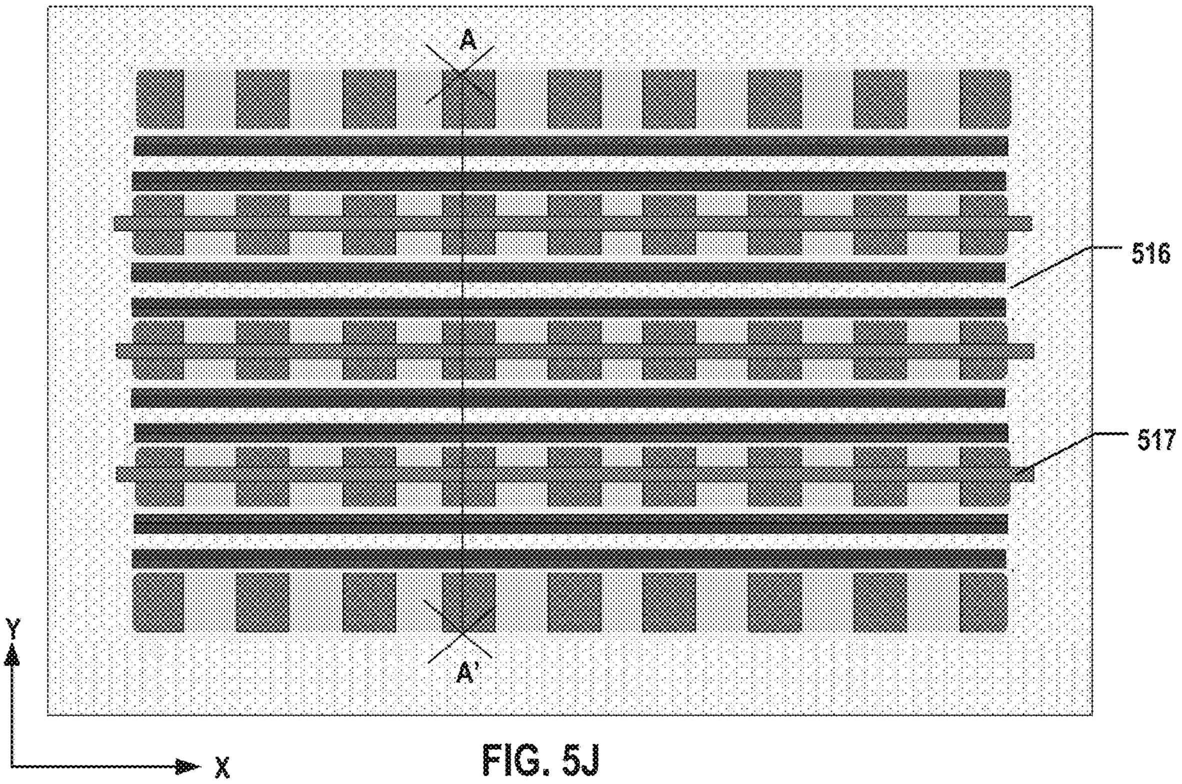
Figure 5J:
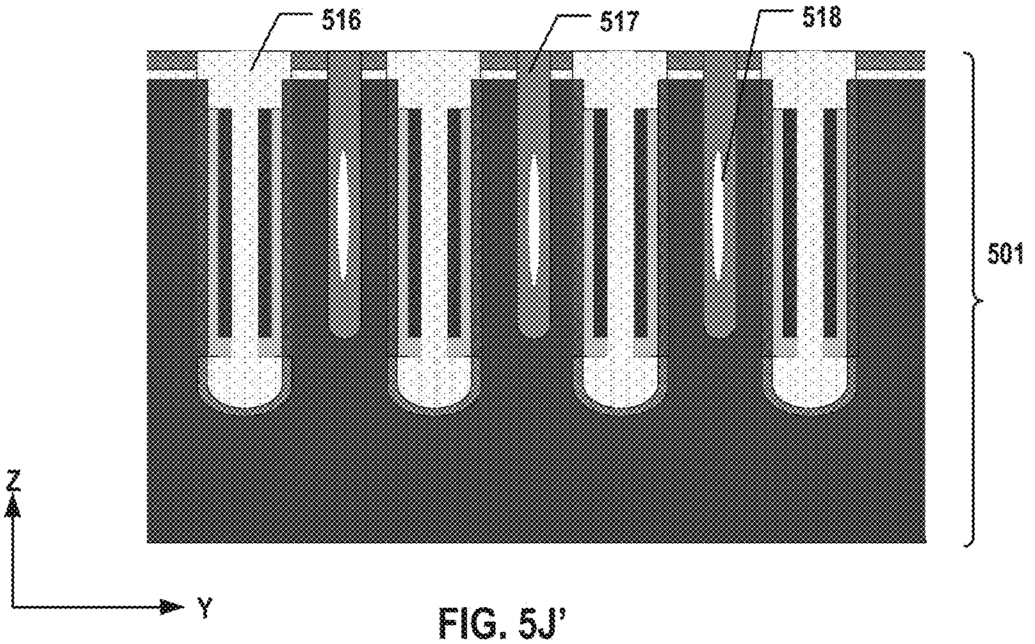

In some implementations, as shown in FIG. 5J and FIG. 5J', the sacrificial layer in spacer 511 is removed to form second trenches, and a dielectric layer or a metal shielding layer is deposited to fill the second trenches. In some implementations, a lithography process is performed to remove the sacrificial layer inside spacers 511 using an etch mask (e.g., a photoresist mask and/or a hard mask), and one or more dry etching and/or wet etching processes, such as RIE, are performed on spacer 511 to etch away the sacrificial layer and to form the second trenches. Second trench isolations 517 are formed in second trenches, for example, by depositing a dielectric layer, such as silicon oxide, to fill second trenches, using one or more thin film deposition processes including, but not limited to, CVD, PVD, ALD, or any combination thereof. A planarization process can be performed to remove excess dielectric over the top surface of semiconductor layer 501. It is understood that depending on the pitches of the semiconductor bodies 507 (e.g., the dimension of second trenches), airgaps 518 may be formed in second trench isolations 517.

Figure 8:
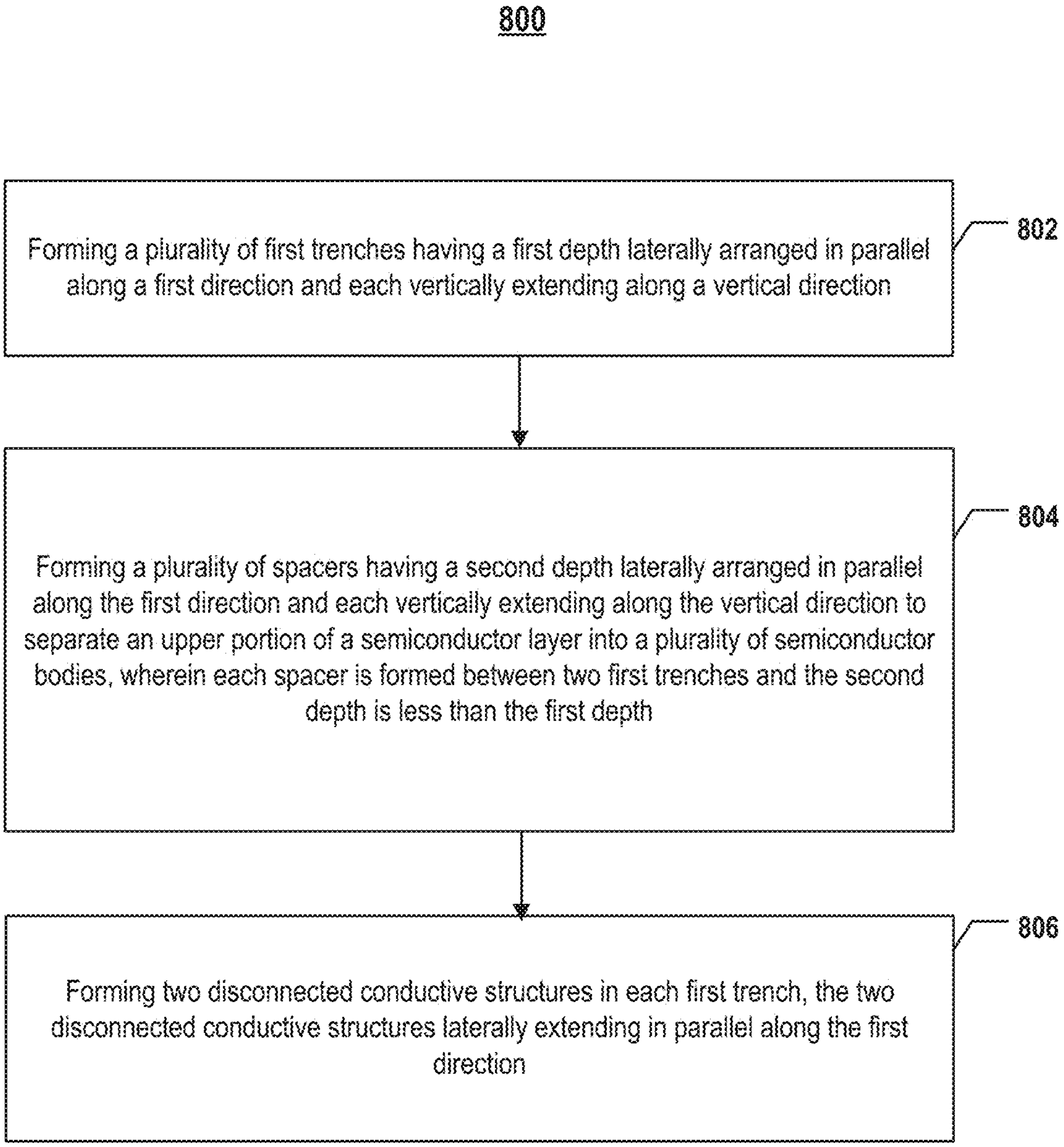
FIG. 8 illustrates a flowchart of another method for forming an array of memory cells each including a vertical transistor, according to some aspects of the present disclosure.

FIG. 8 illustrates a flowchart of a method 800 for forming an array of memory cells each including a vertical transistor, according to some aspects of the present disclosure. At operation 802 in FIG. 8, a plurality of first trenches are formed. The plurality of first trenches extend along a first lateral direction, and each first trench vertically extends in an upper portion of a semiconductor layer. The semiconductor layer can include a substrate, a first dielectric layer on the substrate, and a second dielectric layer on the first dielectric layer. In some implementations, to form the plurality of first trenches, the upper portion of the semiconductor layer is etched in a first lateral direction.

Figure 7A:
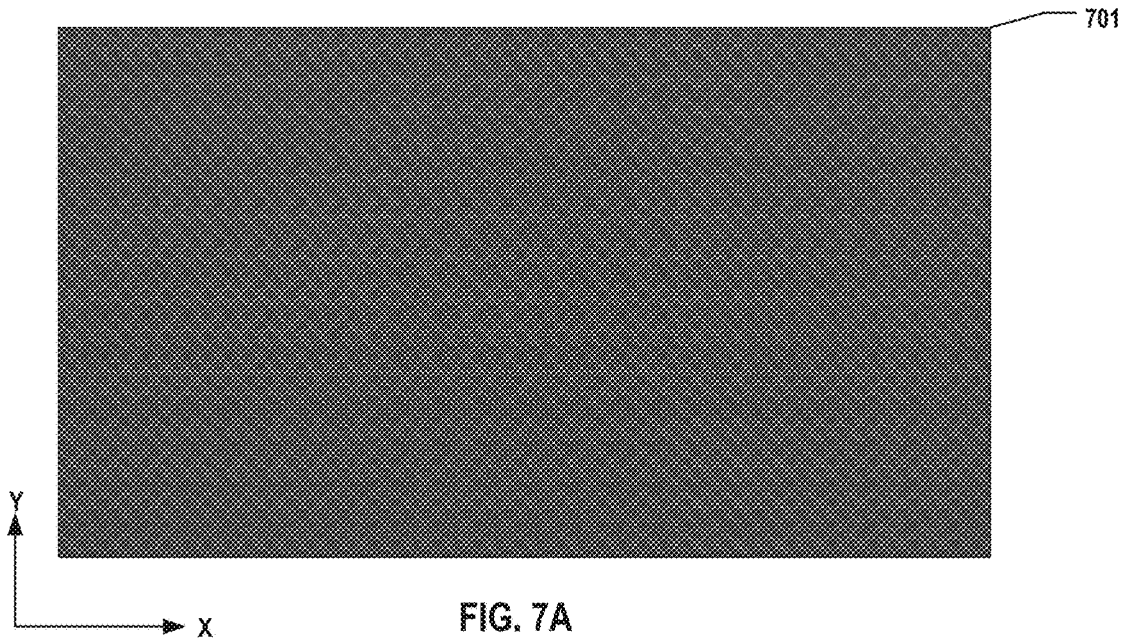
FIGS. 7A-7J and 7A'-7J' illustrate another fabrication process for forming a 3D memory device including vertical transistors, according to some aspects of the present disclosure.
Figure 7A:
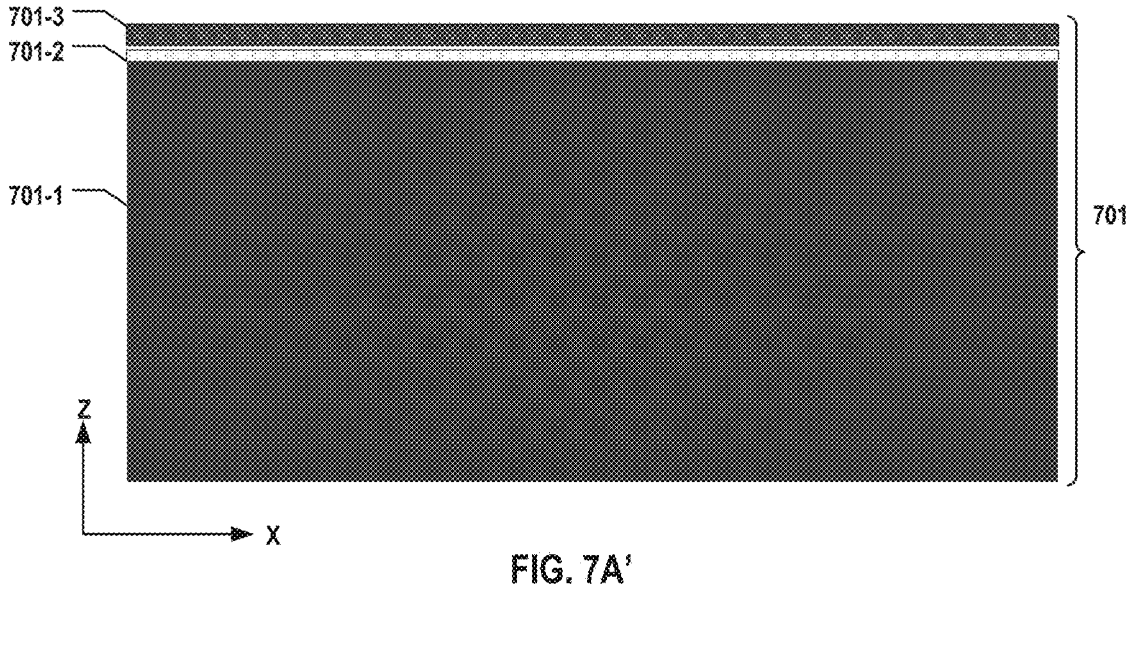

FIG. 7A and FIG. 7A' show a semiconductor layer 701, including substrate 701-1, first dielectric layer 701-2 on top of the substrate 701-1, and second dielectric layer 701-3 on top of the first dielectric layer 701-2. In some implementations, first dielectric layer 701-2 and second dielectric layer 701-3 are removed in subsequent processes, allowing the capacitor structure to be effectively connected to the source. FIG. 7A illustrates a plan view of semiconductor layer 701, while FIG. 7A' illustrates a side view of semiconductor layer 701. To form semiconductor layer 701, silicon oxide and silicon nitride are subsequently deposited onto silicon substrate 701-1 using one or more thin film deposition processes including, but not limited to, chemical vapor deposition (CVD), physical vapor deposition (PVD), atomic layer deposition (ALD), or any combination thereof. In some implementations, silicon oxide layer 701-2 is formed by oxidizing the top portion of silicon substrate 701-1 using dry oxidation and/or we oxidation, such as in situ steam generation (ISSG) oxidation process.

Figure 7B:
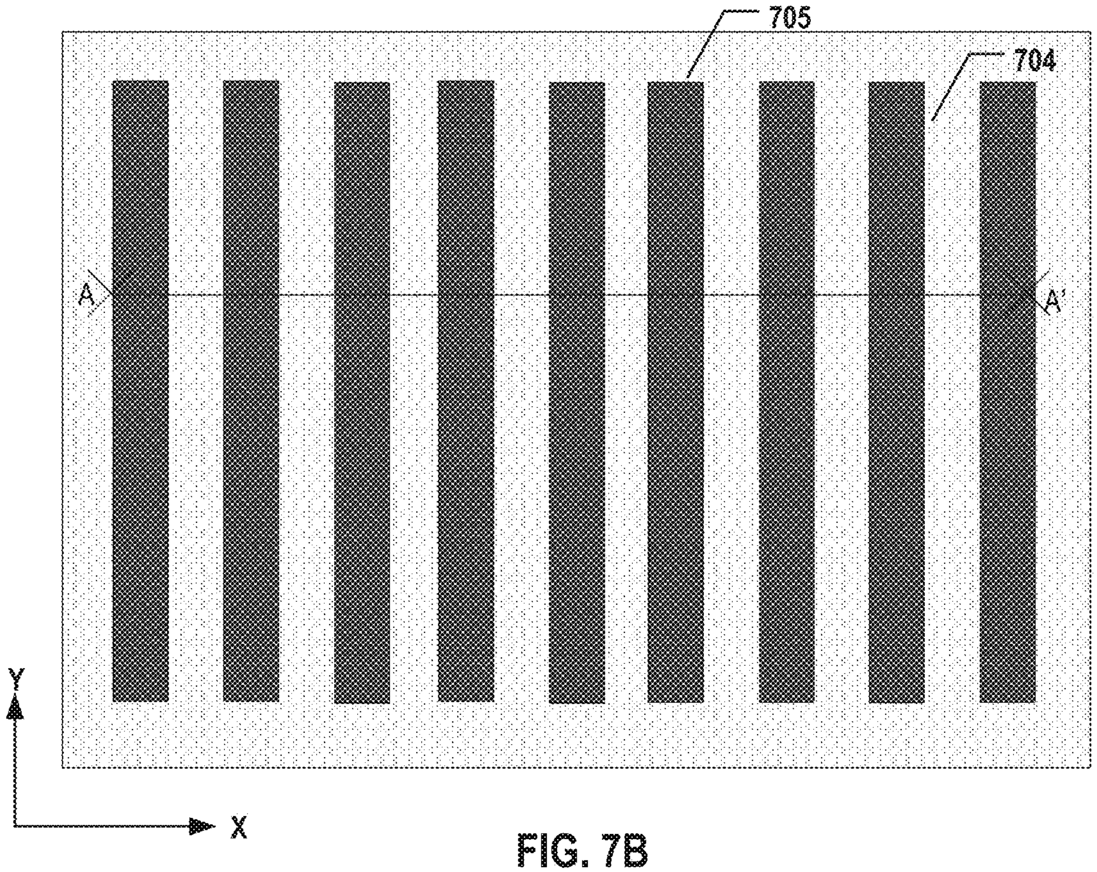
Figure 7B:
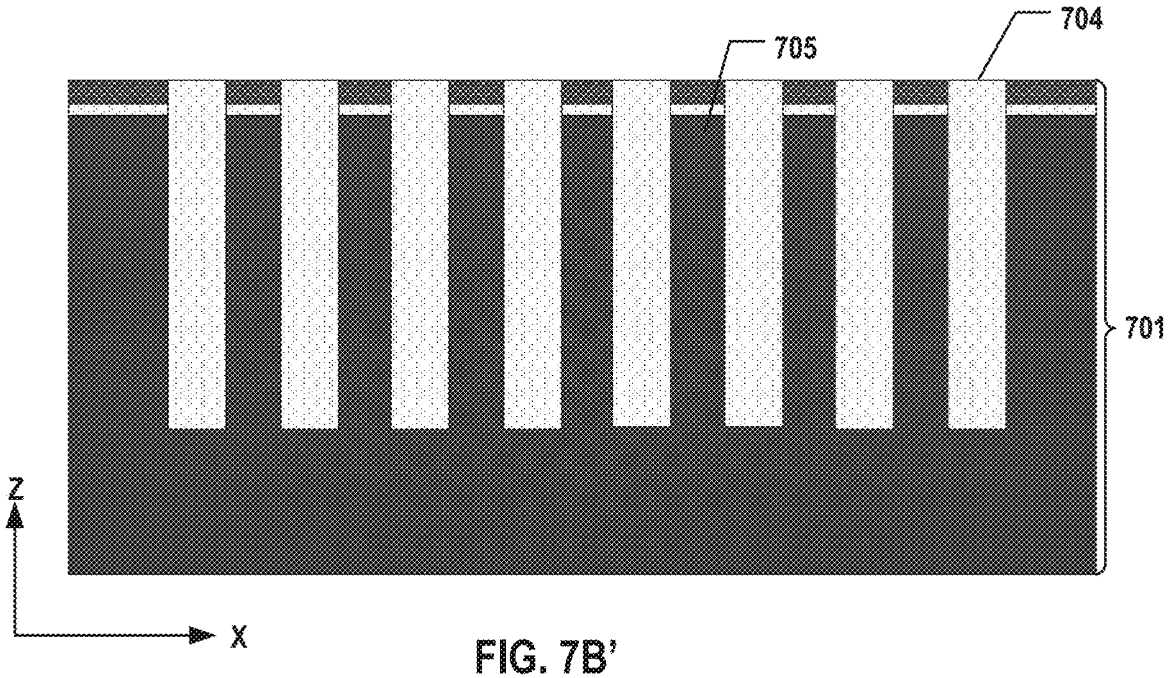

As illustrated in FIG. 7B and FIG. 7B', a plurality of parallel trenches are formed in the y-direction (e.g., the bit line direction) to form a plurality of parallel semiconductor walls 705 in the y-direction. In some implementations, a lithography process is performed to pattern trenches and semiconductor walls 705 using an etch mask (e.g., a photoresist mask and/or a hard mask), for example, based on the design of bit lines, and one or more dry etching and/or wet etching processes, such as RIE, are performed to etch trenches in semiconductor layer 701. Thus, semiconductor wall 705 extending vertically in semiconductor layer 701 can be formed. Since semiconductor walls 705 are formed by etching semiconductor layer 701, semiconductor walls 705 can have the same material as semiconductor layer 701. In some implementations, the plurality of parallel trenches are filled to form a plurality of parallel trench isolations 704 by depositing a third dielectric layer, such as silicon oxide, by using one or more thin film deposition processes including, but not limited to, CVD, PVD, ALD, or any combination thereof. In some implementations, a planarization process, such as CMP, is performed to remove the excess third dielectric layer that is deposited beyond the top surface of semiconductor layer 701. As a result, parallel semiconductor walls 705 can be separated by trench isolations 704. FIG. 7B and FIG. 7B' illustrate the plan view in the x-y plane) and the side view of a cross-section along the x-direction (the word line direction, e.g., along the AA' line), respectively.

Figure 7C:
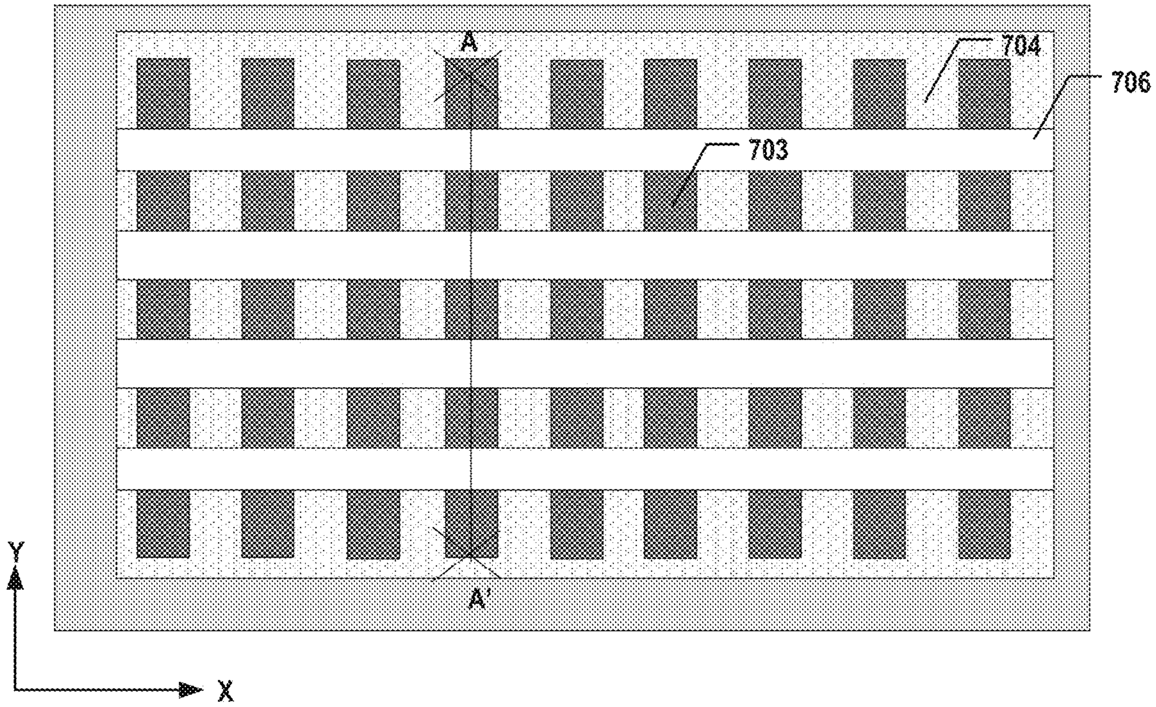
Figure 7C:
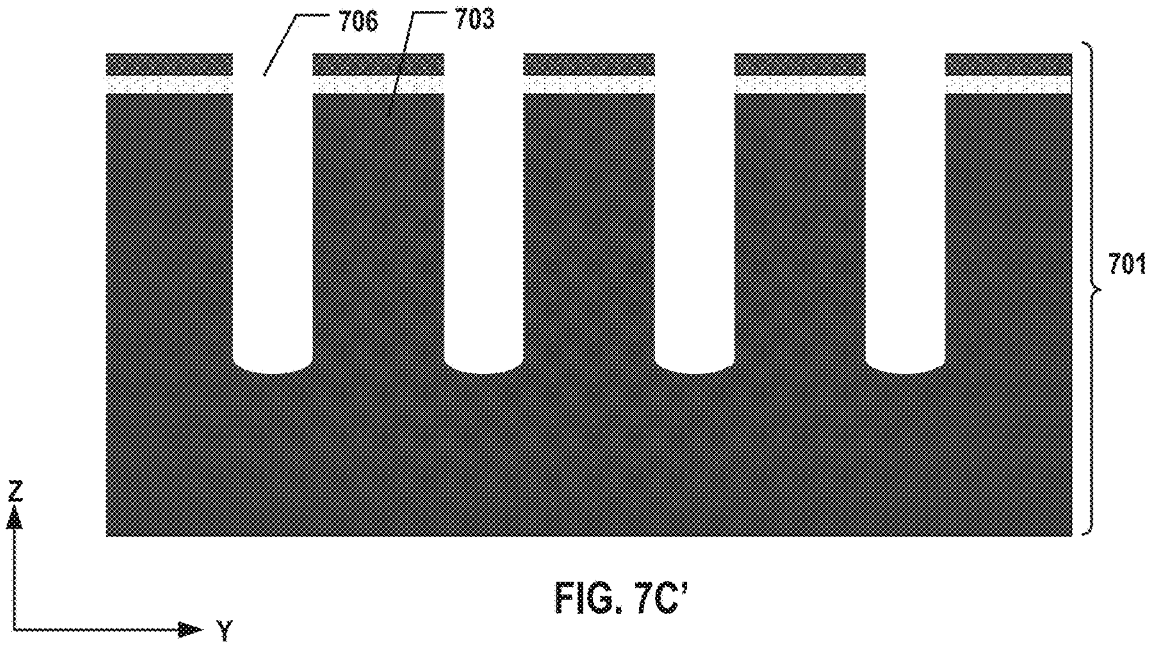

As illustrated in FIG. 7C and FIG. 7C', a plurality of first trenches 706 having a second depth are formed in the x-direction (e.g., the word line direction) to form an array of semiconductor pillars 703 each extending vertically in semiconductor layer 701. In some implementations, a lithography process is performed to pattern first trenches 706 to be perpendicular to trench isolations 704 using an etch mask (e.g., a photoresist mask and/or a hard mask), for example, based on the design of word lines, and one or more dry etching and/or wet etching processes, such as RIE, are performed on semiconductor layer 701 and trench isolation 704 to etch first trenches 706 in semiconductor layer 701. As a result, semiconductor walls 705 (shown in FIG. 7B) can be cut by first trenches 706 to form an array of semiconductor pillars 703 each extending vertically in semiconductor layer 701. Since semiconductor pillars 703 are formed by etching semiconductor layer 701, semiconductor pillars 703 can have the same materials as semiconductor layer 701. FIG. 7C illustrates the plan view in the x-y plane, and FIG. 7C' illustrates the side view of a cross-section along the y-direction (the bit line direction).

Figure 7D:
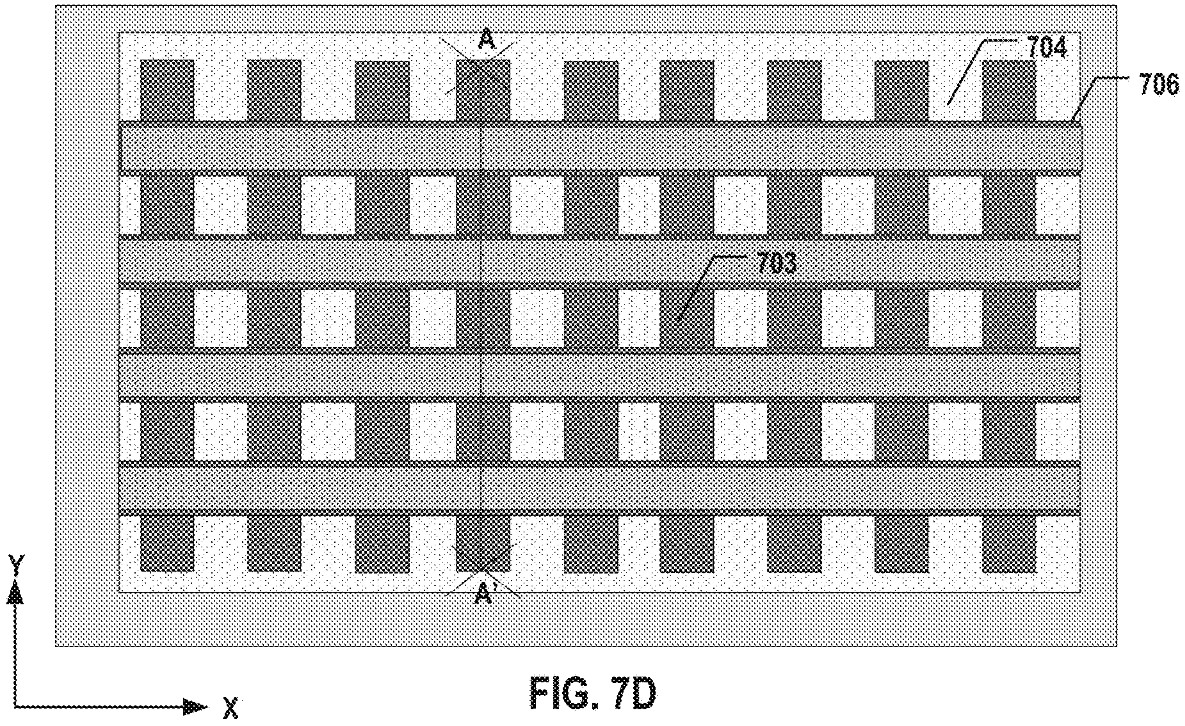
Figure 7D:
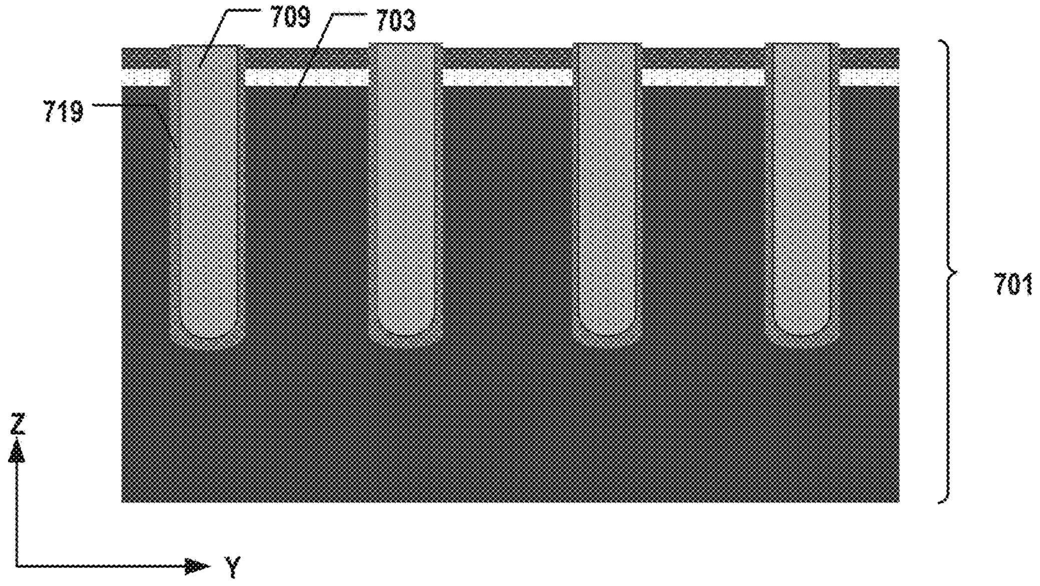

As illustrated in FIG. 7D and FIG. 7D', a dielectric layer 709 is formed in each first trench 706, for example, by depositing a dielectric, such as silicon oxide, to fill first trench 706, using one or more thin film deposition processes including, but not limited to, CVD, PVD, ALD, or any combination thereof. In some implementations, a dielectric layer 719 is deposited on the sidewalls of each first trench 706 to partially fill each first trench 706, followed by depositing dielectric layer 709 to fully fill each first trench 706. In some implementations, dielectric layers 719 and 709 may be made from different materials, for example, silicon oxide and silicon nitride, respectively. In some implementations, dielectric layers 719 and 709 may be made from the same materials, for example, silicon oxide or silicon nitride. In some implementations, a planarization process, such as CMP, is performed to remove excess dielectric layer 709 that is deposited beyond the top surface of semiconductor layer 701.

At operation 804 in FIG. 8, a plurality of spacers are formed. The plurality of spacers extend along the first lateral direction, and each spacer vertically extends in the upper portion of the semiconductor layer. In some implementations, to form the plurality of spacers, the upper portion of the semiconductor layer is etched in the first lateral direction to form a plurality of grooves that are sandwiched between two adjacent first trenches. The plurality of grooves are subsequently filled with a sacrificial layer to form a plurality of spacers.

Figure 7E:
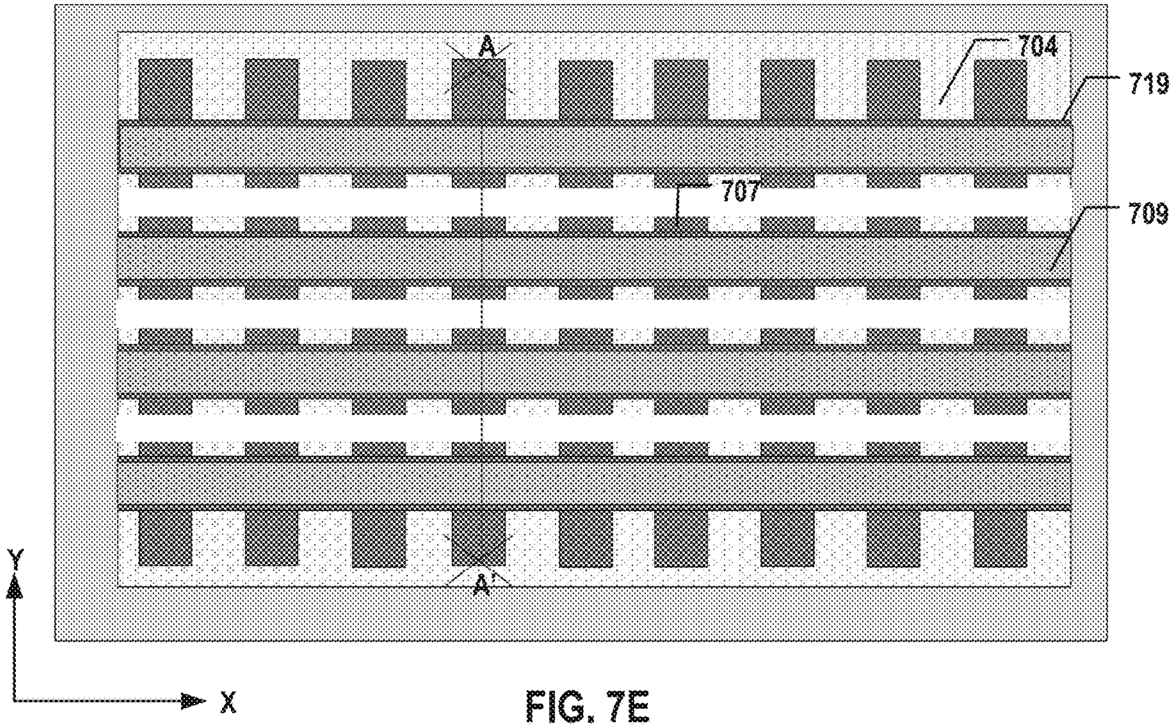
Figure 7E:
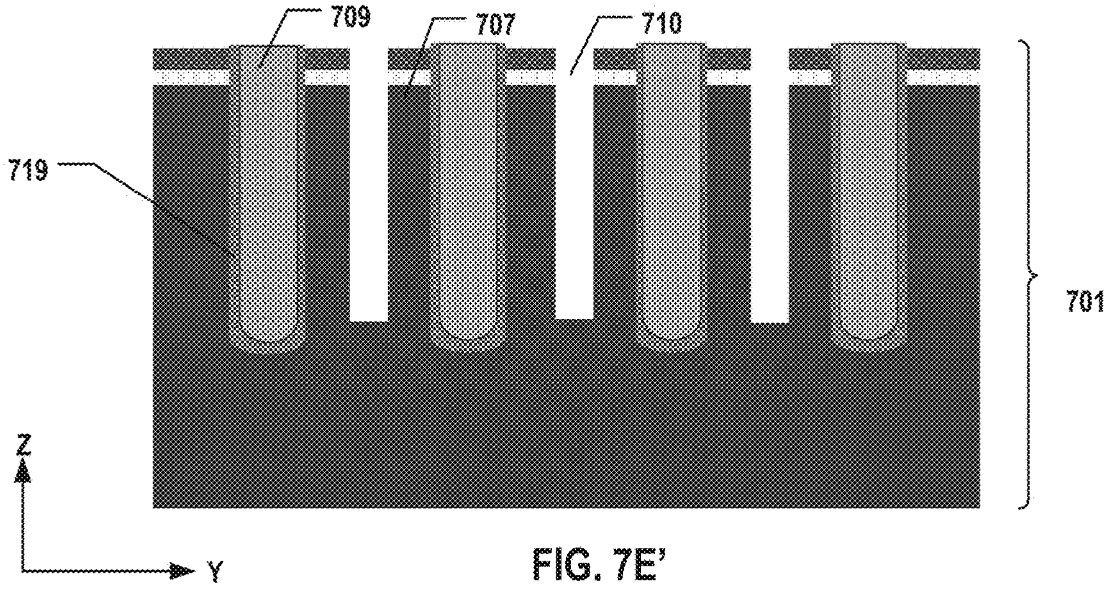

As illustrated in FIG. 7E and FIG. 7E', a plurality of parallel grooves 710 having a first depth are formed in the x-direction (e.g., the word line direction), and each groove extends vertically in semiconductor layer 701 and cuts one semiconductor pillar 703 into two semiconductor bodies 707. Each semiconductor body 707 extends in a vertical direction (e.g., the z-direction as shown in FIG. 7E'). Each semiconductor body 707 has a first lateral dimension along a first lateral direction (e.g., the x-direction), and a second lateral dimension along a second lateral direction (e.g., the y-direction). The first lateral dimensions and second lateral dimensions of different semiconductor bodies 707 are essentially the same (with errors within a margin of ±10%) along the x-direction and y-direction, respectively. In some implementations, a lithography process is performed to pattern grooves 710 to be perpendicular to trench isolations 704 using an etch mask (e.g., a photoresist mask and/or a hard mask), for example, based on the design of word lines, and one or more dry etching and/or wet etching processes, such as RIE, are performed on semiconductor layer 701 and trench isolation 704 to etch grooves in semiconductor layer 701. FIG. 7E illustrates the plan view in the x-y plane, and FIG. 7E' illustrates the side view of a cross-section along the y-direction (the bit line direction).

Figure 7F:
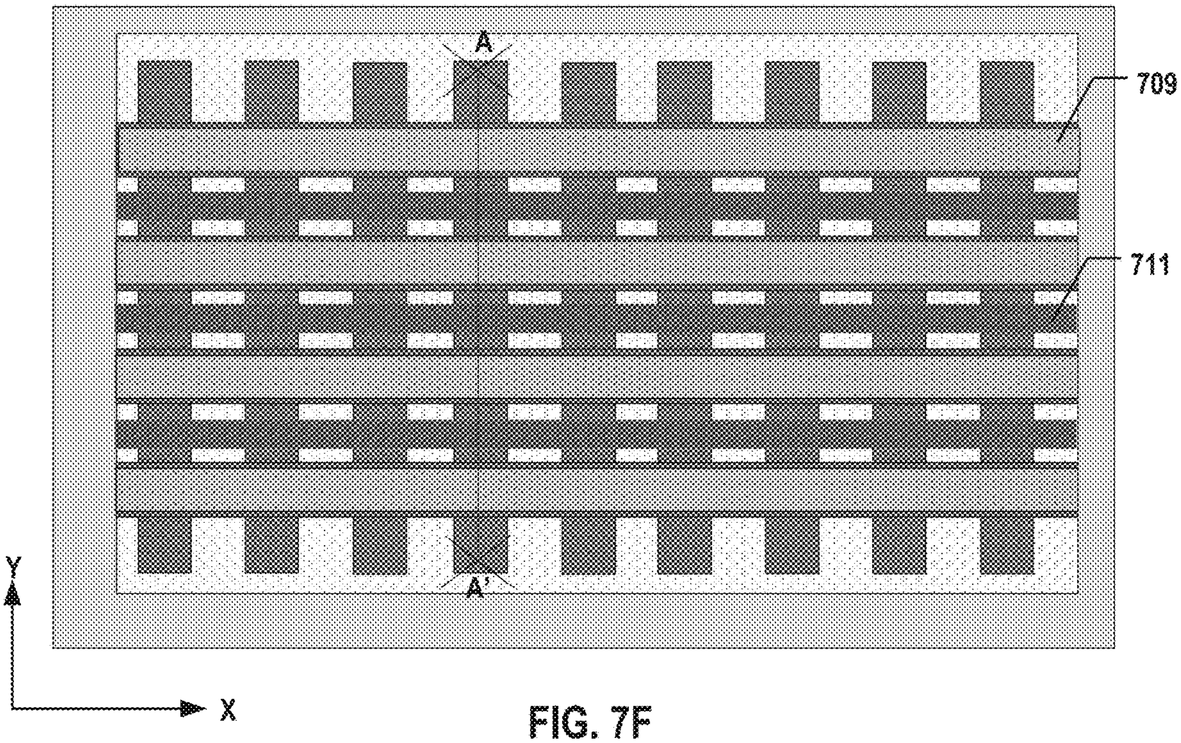
Figure 7F:
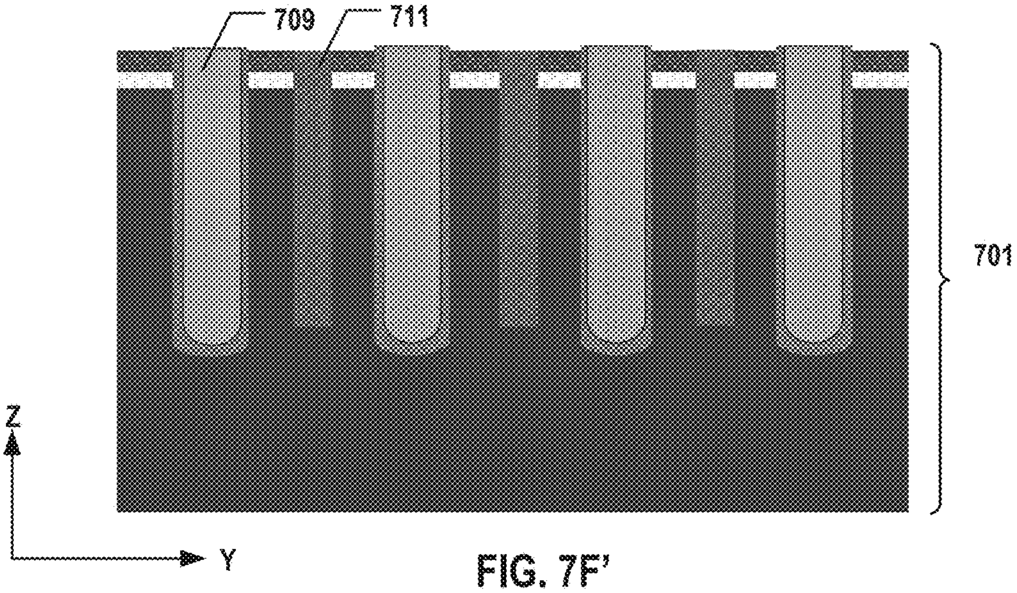

As illustrated in FIG. 7F and FIG. 7F', the plurality of parallel grooves 710 are filled with a sacrificial layer to form a plurality of spacers 711. The sacrificial layer may be deposited by using a dielectric, such as silicon oxide, to fill grooves 710, using one or more thin film deposition processes including, but not limited to, CVD, PVD, ALD, or any combination thereof. In some implementations, a planarization process, such as CMP, is performed to remove excess dielectric that is deposited beyond the top surface of semiconductor layer 701. FIG. 7F and FIG. 7F' illustrate the plan view in the x-y plane and the side view of a cross-section along the x-direction (the word line direction), respectively.

At operation 806 of FIG. 8, two disconnected conductive structures are formed in each first trench. The two disconnected conductive structures laterally extend along the first lateral direction, and each conductive structure vertically extends along one sidewall of a corresponding first trench.

Figure 7G:
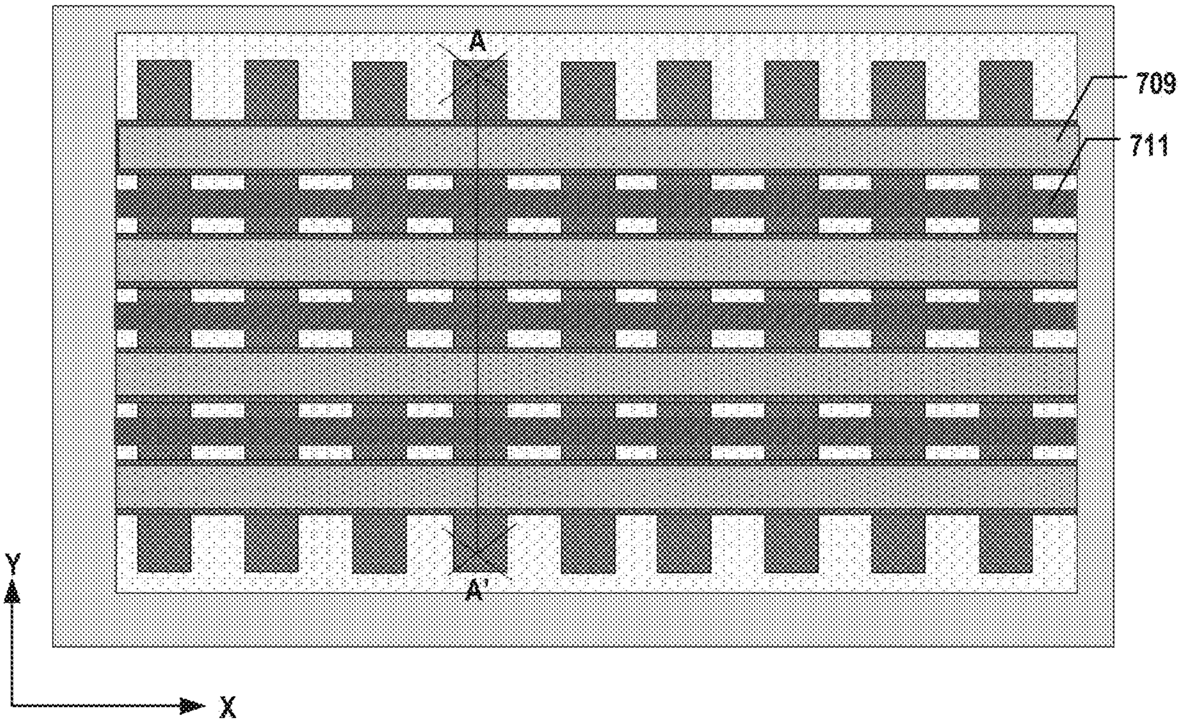
Figure 7G:
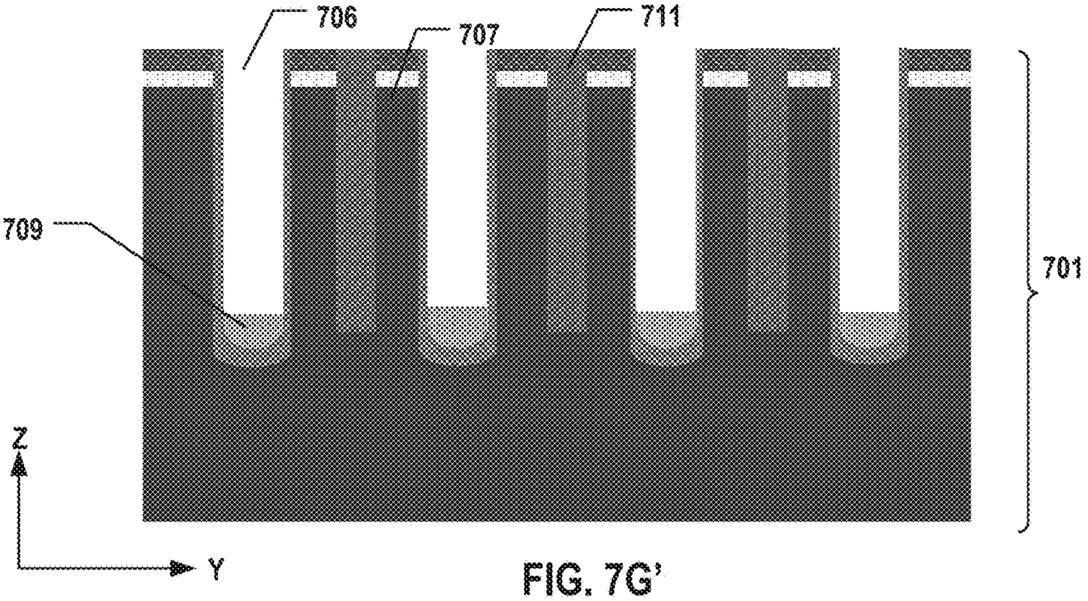

As illustrated in FIG. 7G and FIG. 7G', dielectric layer 709 is back-etched such that the dielectric layer 709 covers the bottom surface of each first trench 706. In some implementations, a lithography process is performed to back-etch dielectric layer 709 using an etch mask (e.g., a photoresist mask and/or a hard mask), or one or more dry etching and/or wet etching processes, such as RIE, are performed on dielectric layer 709 until the back-etching reaches a third depth. FIG. 7F illustrates the plan view in the x-y plane, and FIG. 7F' illustrates the side view of a cross-section along the y-direction (the bit line direction).

Figure 7H:
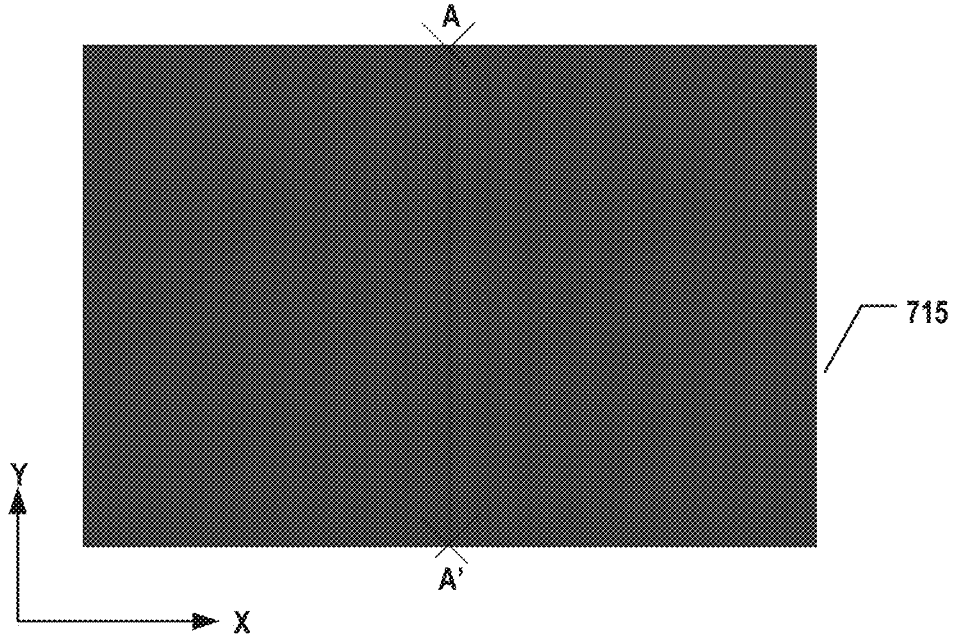
Figure 7H:
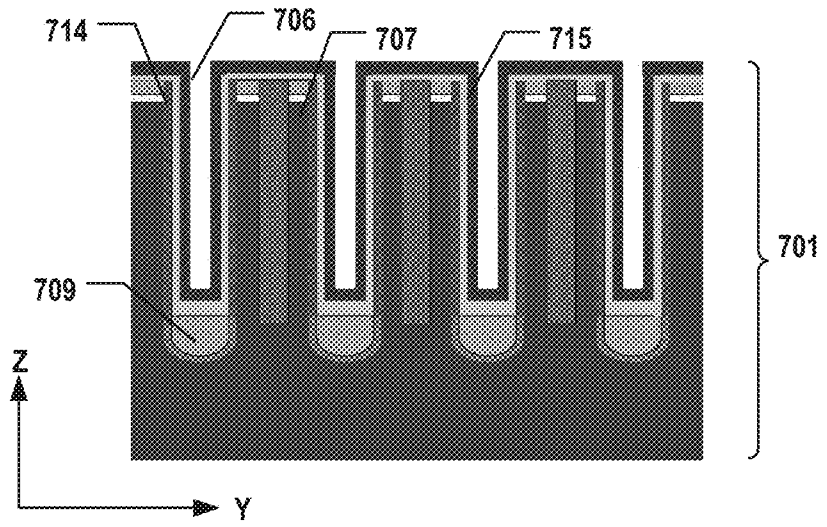

As illustrated in FIG. 7H and FIG. 7H', a gate dielectric layer 714 is formed in each first trench 706. Gate dielectric layer 714 can be parts of a continuous dielectric layer formed over the sidewalls of each row of semiconductor bodies 707. In some implementations, a wet oxidation and/or a dry oxidation process, such as in situ steam generation (ISSG) oxidation, is performed to form native oxide (e.g., silicon oxide) on the sidewalls of each first trench 706. Then, one or more conductive layers 715 are formed over gate dielectric layer 714 in first trenches 706. In some implementations, conductive layers 715 are formed by depositing one or more conductive materials, such as metal and/or metal compounds (e.g., W and TiN), over gate dielectric layer 714 using one or more thin film deposition processes including, but not limited to, CVD, PVD, ALD, or any combination thereof, to partially fill first trenches 706. For example, layers of TiN and W may be sequentially deposited to form conductive layers 715. A planarization process, e.g., CMP, can be performed to remove the excess conductive materials over the top surface of semiconductor layer 701.

Figure 7I:
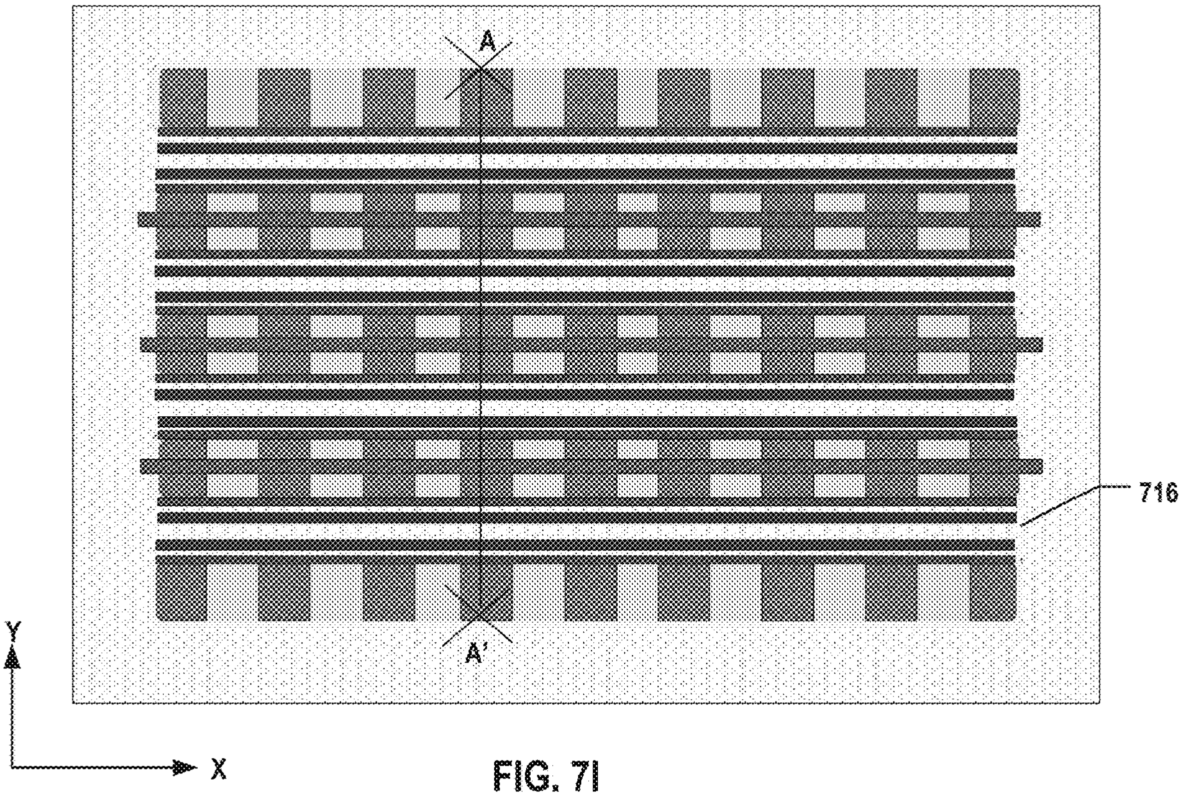
Figure 7I:
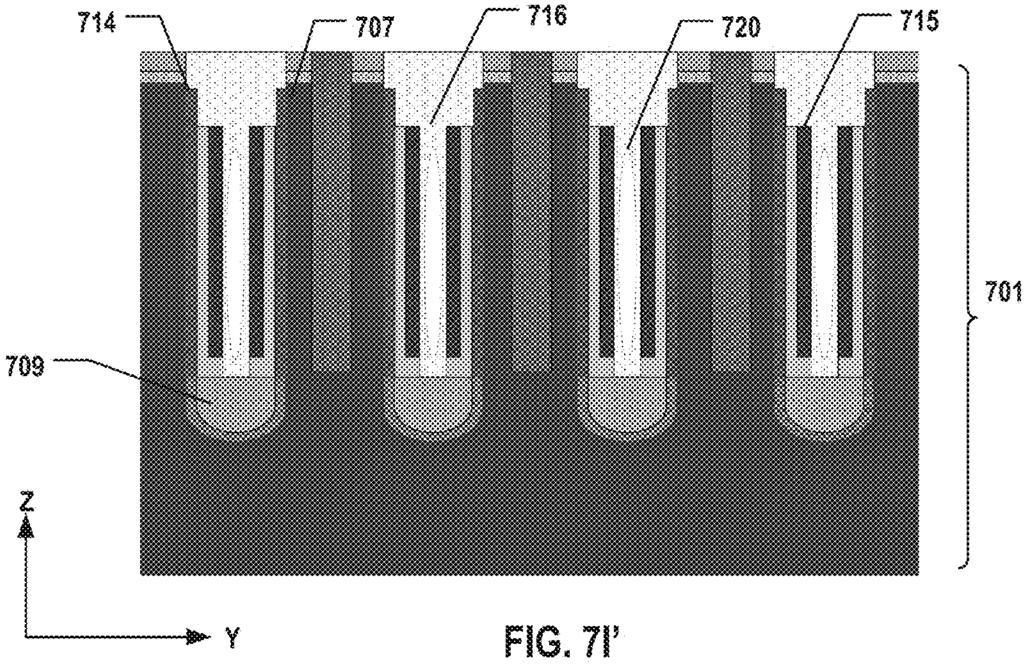

As illustrated in FIG. 7I and FIG. 7I', in some implementations, conductive layers 715 are etched back, for example, using a punch-down etch, dry etch, and/or wet etch (e.g., RIE), to form two disconnected conductive structures in each first trench 706. In some implementations, a bottom punch-down etching process is performed to each away some of the metals of conductive layer 715 at the bottom of the first trench until exposing dielectric layer 709. In some implementations, conductive layers 715 are etched back to form dents, such that the upper ends of conductive layers 715 are below the top surface of semiconductor bodies 707. In some implementations, as gate dielectric layer 714 is not etched, the upper ends of conductive layers 715 are below the upper ends of gate dielectric layer 714. As a result, etched-back conductive layers 715 can become word lines each extending in the word line direction (the x-direction), and parts of etched-back conductive layers 715 that are facing semiconductor bodies 707 can become gate electrodes. Gate structures each including a respective gate dielectric layer 714 and a respective gate electrode (e.g., part of conductive layer 715) over gate dielectric layer 714 can be formed thereby.

In some implementations, as shown in FIG. 7I and FIG. 7I', a dielectric layer 716 is formed in the remaining space of first trenches 706 as well as the dents resulting from etching back of conductive layers 715, for example, by depositing a dielectric, such as silicon oxide, using one or more thin film deposition processes including, but not limited to, CVD, PVD, ALD, or any combination thereof. It is understood that depending on the pitches of the word lines (e.g., the dimension of first trenches 706), airgaps 720 may be formed in dielectric layer 716.

Figure 7J:
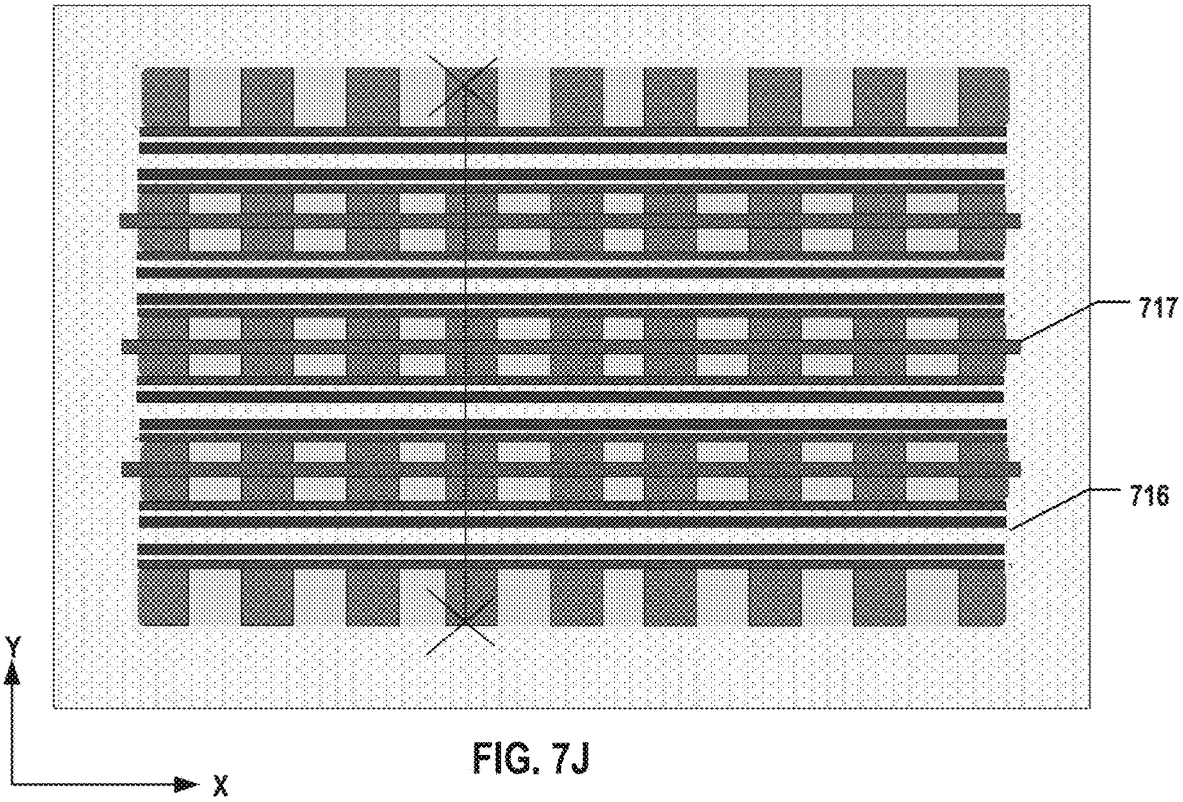
Figure 7J:
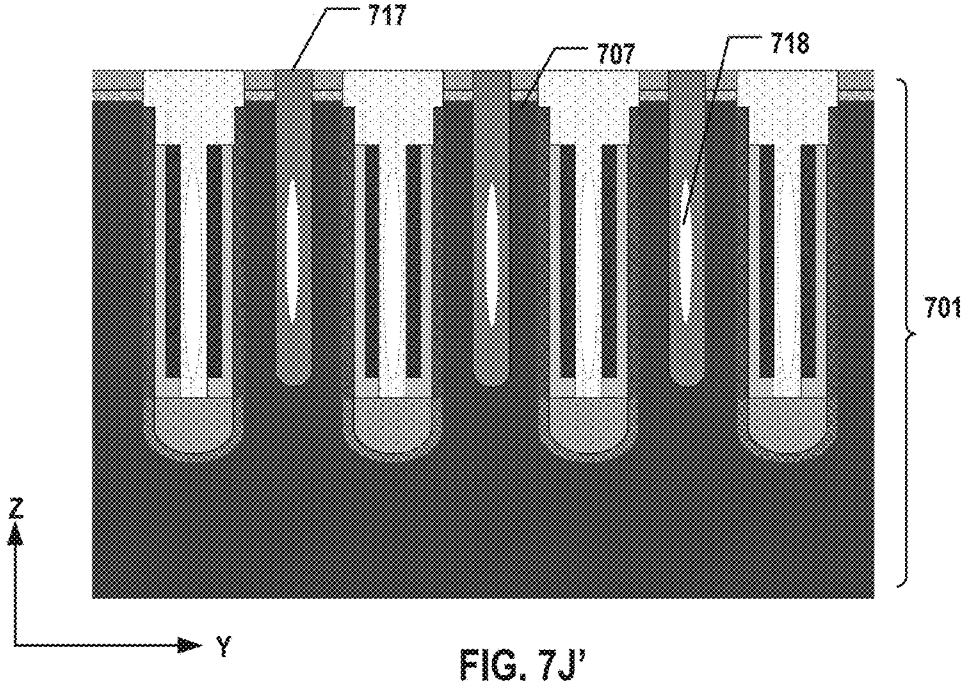

In some implementations, as shown in FIG. 7J and FIG. 7J', the sacrificial layer in spacers 711 (as shown in FIG. 7F') is removed to form second trenches, and a dielectric layer is deposited to fill the second trenches. In some implementations, a lithography process is performed to remove sacrificial layer inside spacers 711 using an etch mask (e.g., a photoresist mask and/or a hard mask), and one or more dry etching and/or wet etching processes, such as RIE, are performed on spacers 711 to etch away the sacrificial layer and to form the second trenches. Second trench isolations 717 are formed in second trenches, for example, by depositing a dielectric layer, such as silicon oxide, to fill second trenches, using one or more thin film deposition processes including, but not limited to, CVD, PVD, ALD, or any combination thereof. A planarization process can be performed to remove excess dielectric over the top surface of semiconductor layer 701. It is understood that depending on the pitches of the semiconductor bodies 707 (e.g., the dimension of second trenches), airgaps 718 may be formed in second trench isolations 717.

Figure 10:
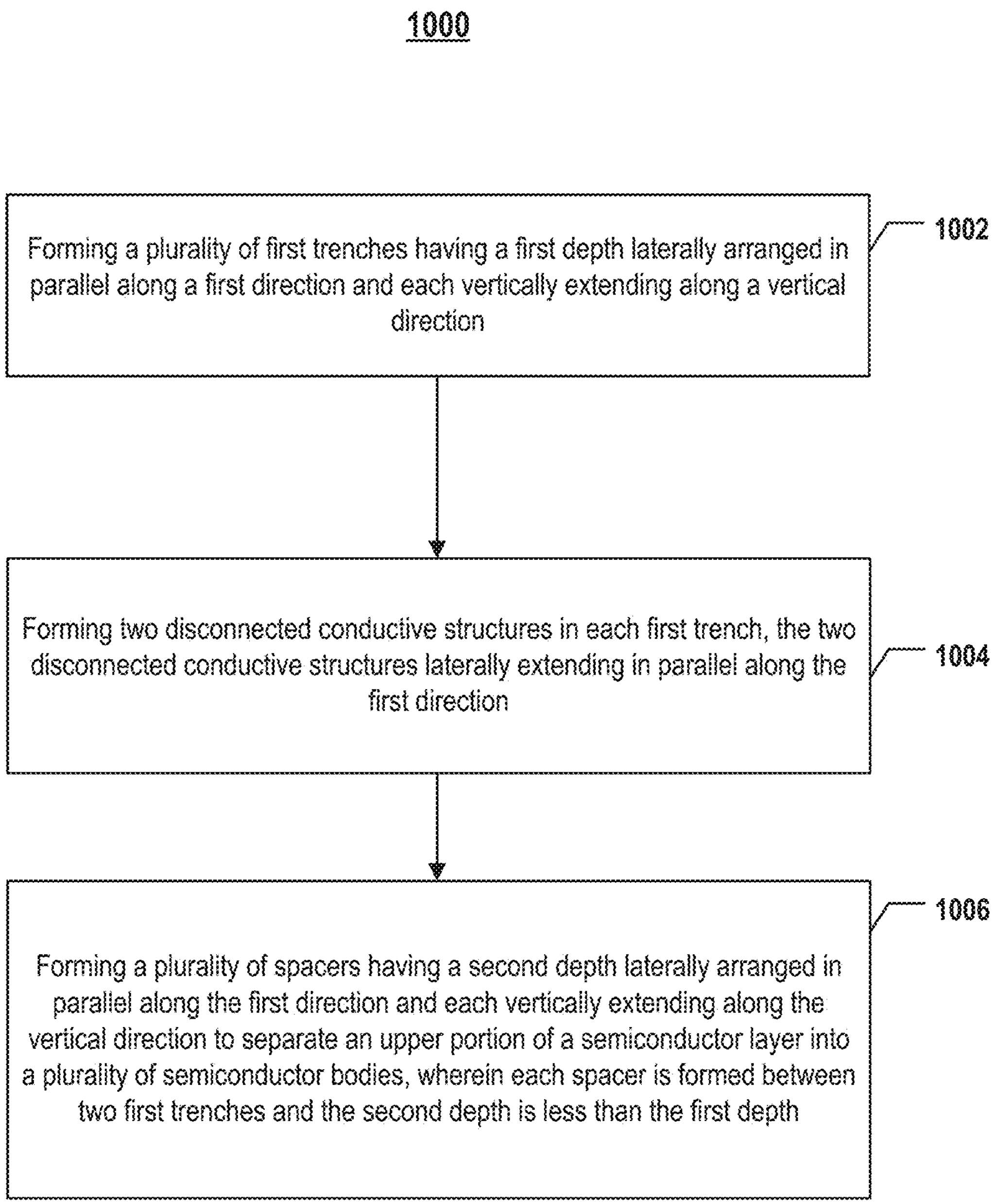
FIG. 10 illustrates a flowchart of still another method for forming an array of memory cells each including a vertical transistor, according to some aspects of the present disclosure.

FIG. 10 illustrates a flowchart of a method 1000 for forming an array of memory cells each including a vertical transistor, according to some aspects of the present disclosure. At operation 1002 in FIG. 10, a plurality of first trenches are formed. The plurality of first trenches extend along a first lateral direction, and each first trench vertically extends in an upper portion of a semiconductor layer. The semiconductor layer can include a substrate, a first dielectric layer on the substrate, and a second dielectric layer on the first dielectric layer. In some implementations, to form the plurality of first trenches, the upper portion of the semiconductor layer is etched in a first lateral direction.

Figure 9A:
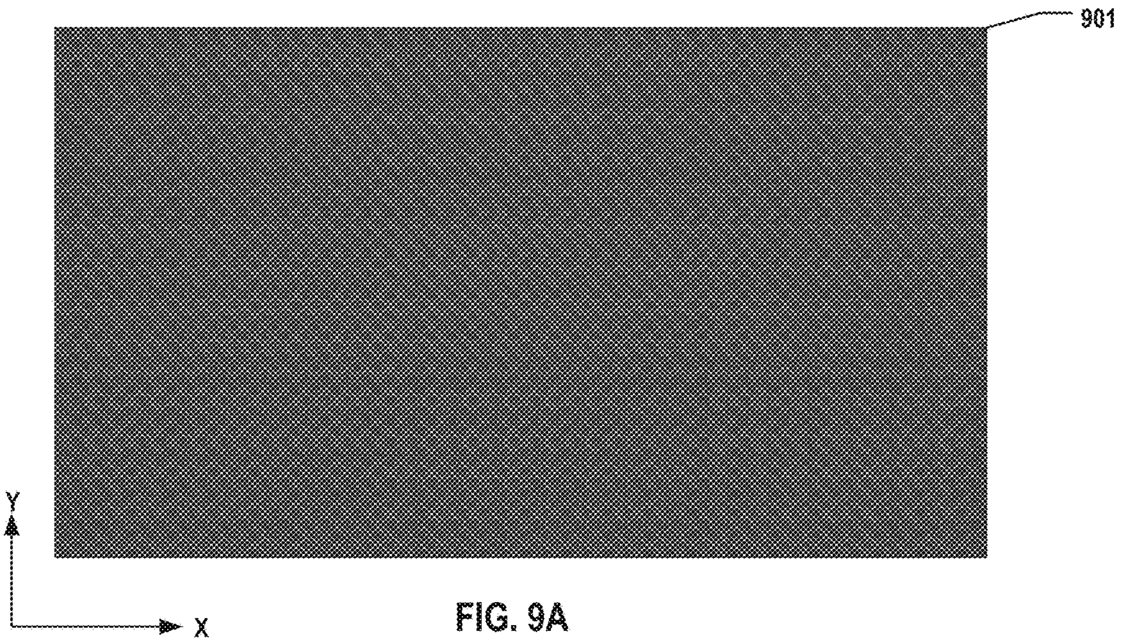
FIGS. 9A-9I and 9A'-9I' illustrate still another fabrication process for forming a 3D memory device including vertical transistors, according to some aspects of the present disclosure.
Figure 9A:
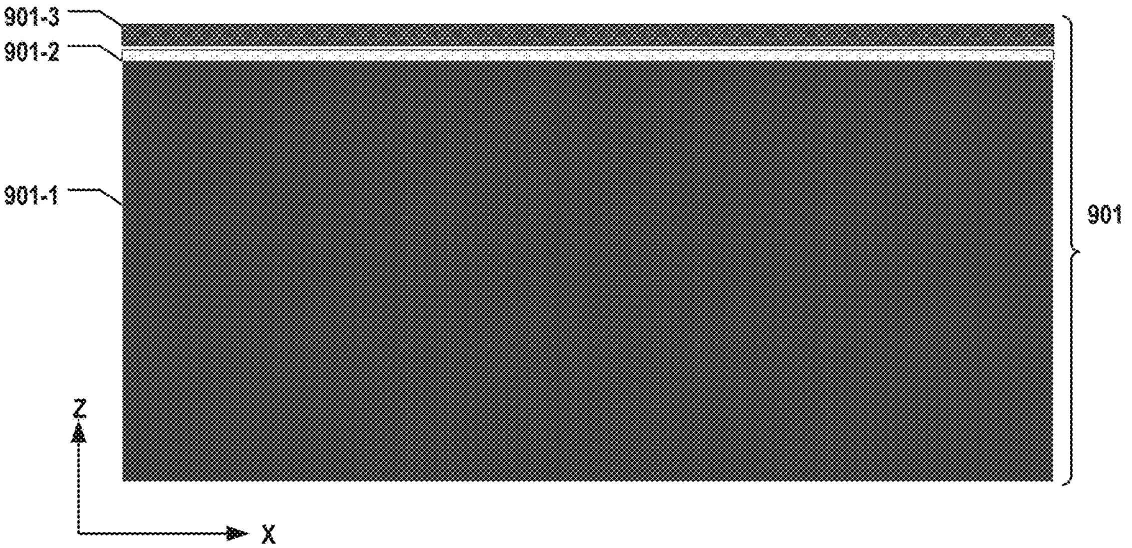

FIG. 9A and FIG. 9A' show a semiconductor layer 901, including substrate 901-1, first dielectric layer 901-2 on top of the substrate 901-1, and second dielectric layer 901-3 on top of the first dielectric layer 901-2. In some implementations, first dielectric layer 901-2 and second dielectric layer 901-3 are removed in subsequent processes, allowing the capacitor structure to be effectively connected to the source. FIG. 9A illustrates a plan view of semiconductor layer 901, while FIG. 9A' illustrates a side view of semiconductor layer 901. To form semiconductor layer 901, silicon oxide and silicon nitride are subsequently deposited onto silicon substrate 901-1 using one or more thin film deposition processes including, but not limited to, chemical vapor deposition (CVD), physical vapor deposition (PVD), atomic layer deposition (ALD), or any combination thereof. In some implementations, silicon oxide layer 901-2 is formed by oxidizing the top portion of silicon substrate 901-1 using dry oxidation and/or we oxidation, such as in situ steam generation (ISSG) oxidation process.

Figure 9B:
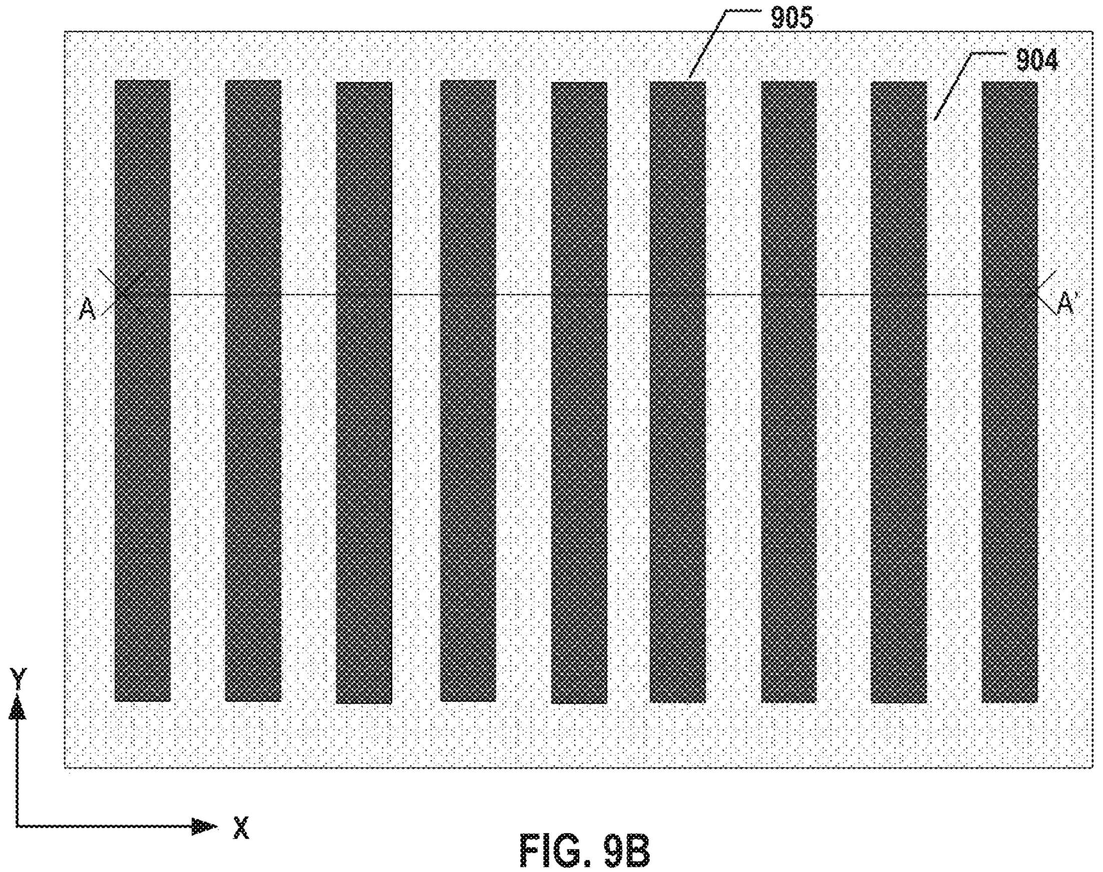
Figure 9B:
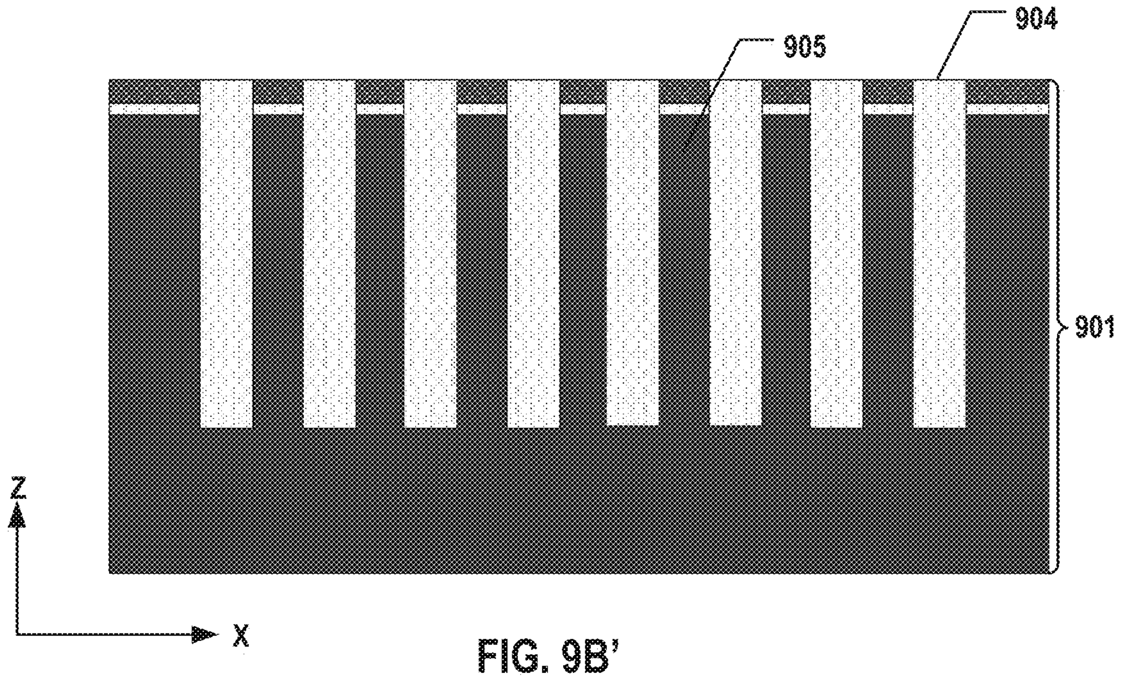

As illustrated in FIG. 9B and FIG. 9B', a plurality of parallel trenches are formed in the y-direction (e.g., the bit line direction) to form a plurality of parallel semiconductor walls 905 in the y-direction. In some implementations, a lithography process is performed to pattern trenches and semiconductor walls 905 using an etch mask (e.g., a photoresist mask and/or a hard mask), for example, based on the design of bit lines, and one or more dry etching and/or wet etching processes, such as RIE, are performed to etch trenches in semiconductor layer 901. Thus, semiconductor wall 905 extending vertically in semiconductor layer 901 can be formed. Since semiconductor walls 905 are formed by etching semiconductor layer 901, semiconductor walls 905 can have the same materials as semiconductor layer 901. In some implementations, the plurality of parallel trenches are filled to form a plurality of parallel trench isolations 904 by depositing a third dielectric layer, such as silicon oxide, by using one or more thin film deposition processes including, but not limited to, CVD, PVD, ALD, or any combination thereof. In some implementations, a planarization process, such as CMP, is performed to remove the excess third dielectric layer that is deposited beyond the top surface of semiconductor layer 901. As a result, parallel semiconductor walls 905 can be separated by trench isolations 904. FIG. 9B and FIG. 9B' illustrate the plan view in the x-y plane) and the side view of a cross-section along the x-direction (the word line direction, e.g., along the AA' line), respectively.

Figure 9C:
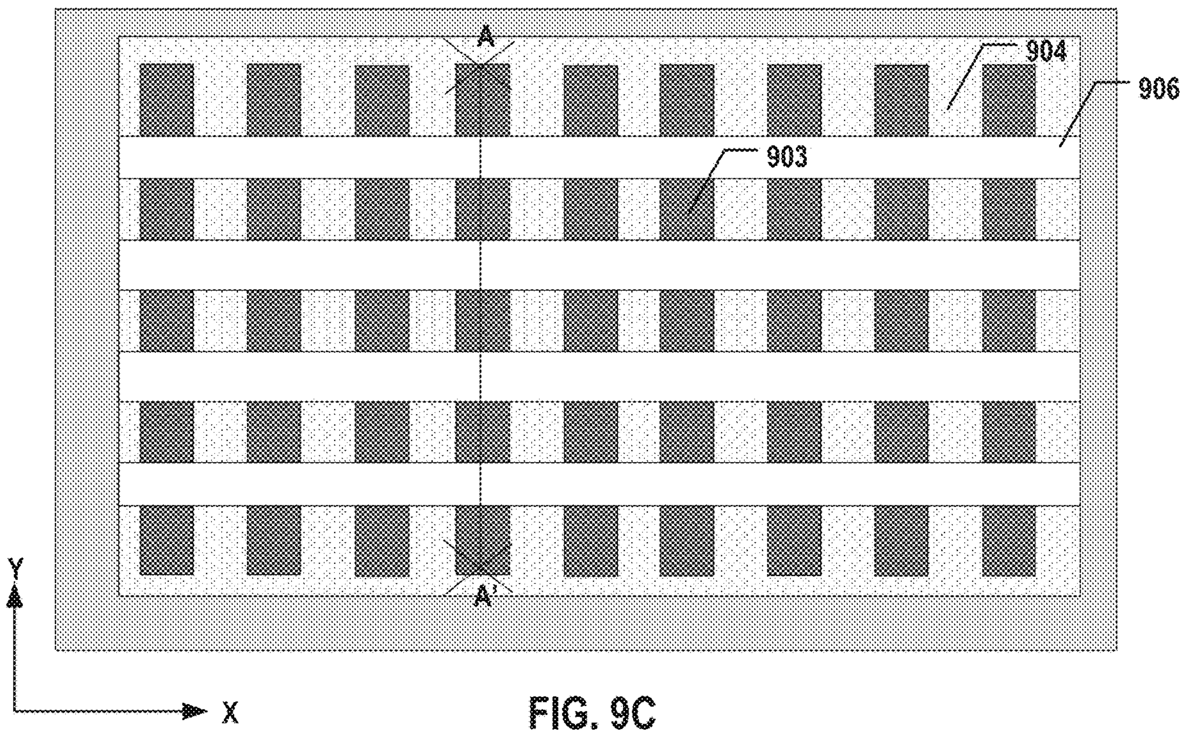
Figure 9C:
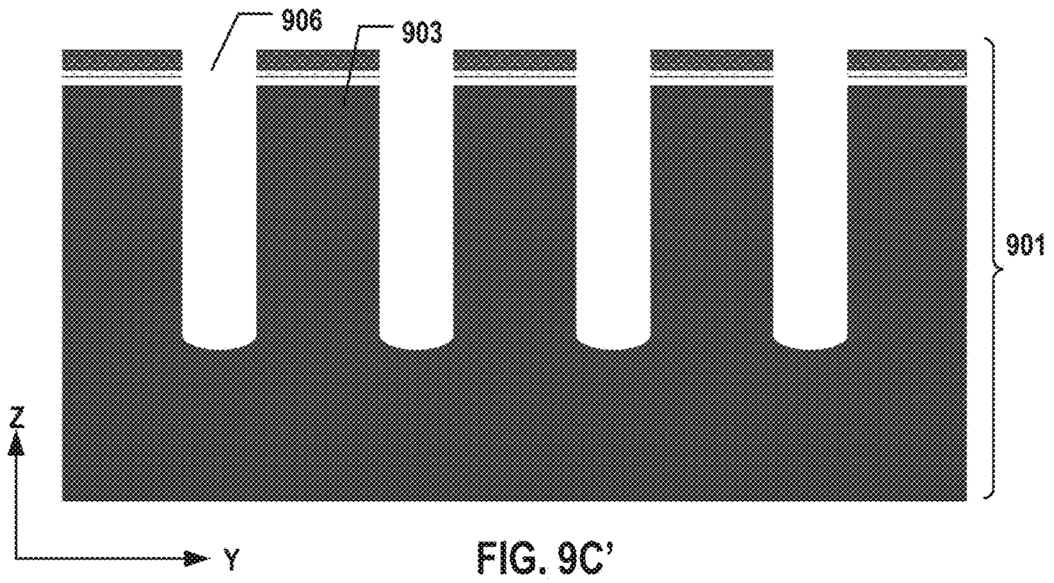

As illustrated in FIG. 9C and FIG. 9C', a plurality of first trenches 906 having a second depth are formed in the x-direction (e.g., the word line direction) to form an array of semiconductor pillars 903 each extending vertically in semiconductor layer 901. In some implementations, a lithography process is performed to pattern first trenches 906 to be perpendicular to trench isolations 904 using an etch mask (e.g., a photoresist mask and/or a hard mask), for example, based on the design of word lines, and one or more dry etching and/or wet etching processes, such as RIE, are performed on semiconductor layer 901 and trench isolation 904 to etch first trenches 906 in semiconductor layer 901. As a result, semiconductor walls 905 (shown in FIG. 9B) can be cut by first trenches 906 to form an array of semiconductor pillars 903 each extending vertically in semiconductor layer 901. Since semiconductor pillars 903 are formed by etching semiconductor layer 901, semiconductor pillars 903 can have the same materials as semiconductor layer 901. FIG. 9C illustrates the plan view in the x-y plane, and FIG. 9C' illustrates the side view of a cross-section along the y-direction (the bit line direction).

Figure 9D:
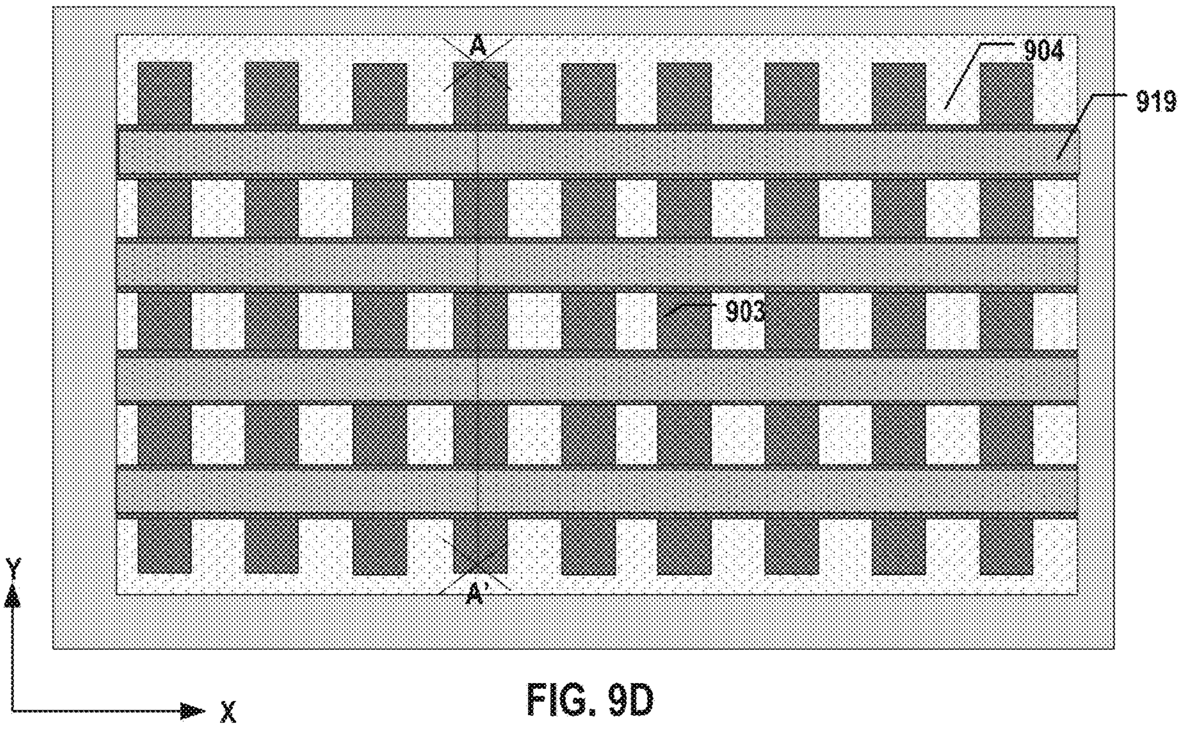
Figure 9D:
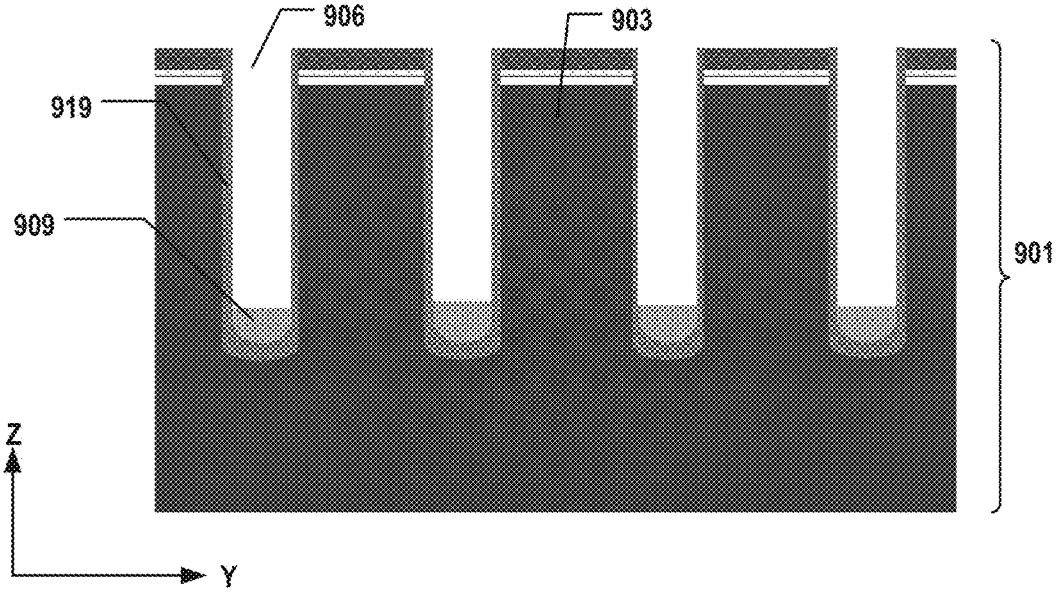

As illustrated in FIG. 9D and FIG. 9D', a dielectric layer 909 is formed in each first trench 906, for example, by depositing a dielectric, such as silicon oxide, to fill first trench 906, using one or more thin film deposition processes including, but not limited to, CVD, PVD, ALD, or any combination thereof. In some implementations, a dielectric layer 919 is deposited on the sidewalls of each first trench 906 to partially fill each first trench 906, followed by depositing dielectric layer 909 to fully fill each first trench 906. In some implementations, dielectric layers 919 and 909 may be made from different materials, for example, silicon oxide and silicon nitride, respectively. In some implementations, dielectric layers 919 and 909 may be made from the same materials, for example, silicon oxide or silicon nitride. In some implementations, a planarization process, such as CMP, is performed to remove excess dielectric layer 909 that is deposited beyond the top surface of semiconductor layer 901. Then, dielectric layer 909 is back-etched such that the dielectric layer 909 covers the bottom surface of each first trench 906. In some implementations, a lithography process is performed to back-etch dielectric layer 909 using an etch mask (e.g., a photoresist mask and/or a hard mask), or one or more dry etching and/or wet etching processes, such as RIE, are performed on dielectric layer 909 until the back-etching reaches a third depth. FIG. 9D illustrates the plan view in the x-y plane, and FIG. 9D' illustrates the side view of a cross-section along the y-direction (the bit line direction).

At operation 1004 of FIG. 10, two disconnected conductive structures are formed in each first trench. The two disconnected conductive structures laterally extend along the first lateral direction, and each conductive structure vertically extends along one sidewall of a corresponding first trench.

Figure 9E:
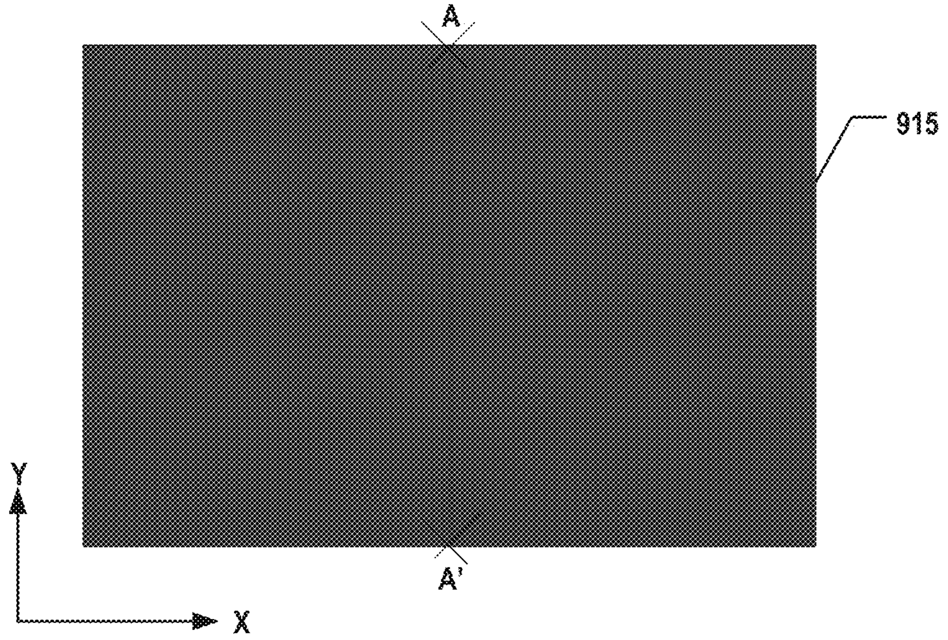
Figure 9E:
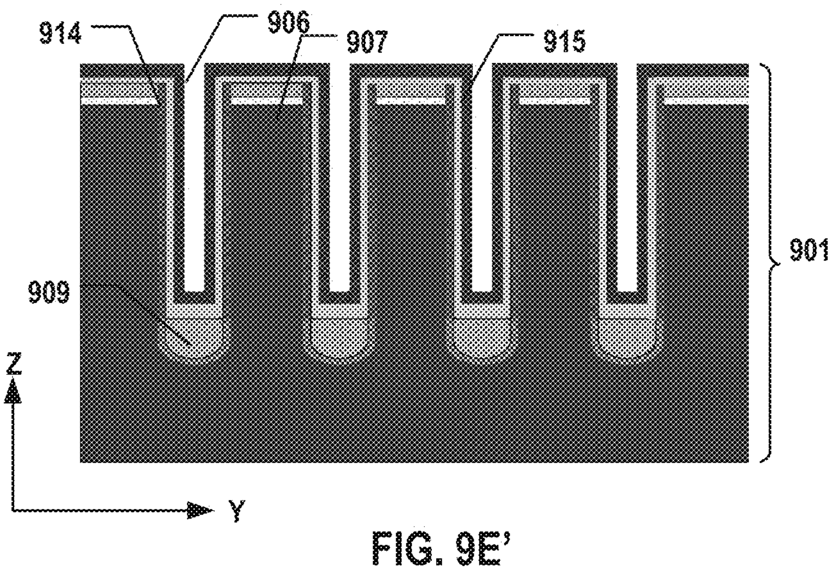

As illustrated in FIG. 9E and FIG. 9E', a gate dielectric layer 914 is formed in each first trench 906. Gate dielectric layer 914 can be parts of a continuous dielectric layer formed over the sidewalls of each row of semiconductor bodies 907. Each semiconductor body 907 extends in a vertical direction (e.g., the z-direction as shown in FIG. 9E'). Each semiconductor body 907 has a first lateral dimension along a first lateral direction (e.g., the x-direction), and have a second lateral dimension along a second lateral direction (e.g., the y-direction). The first lateral dimensions and second lateral dimensions of different semiconductor bodies 907 are essentially the same (with errors within a margin of ±10%) along the x-direction and y-direction, respectively. In some implementations, a wet oxidation and/or a dry oxidation process, such as in situ steam generation (ISSG) oxidation, is performed to form native oxide (e.g., silicon oxide) on the sidewalls of each first trench 906. Then, one or more conductive layers 915 are formed over gate dielectric layer 914 in first trenches 906. In some implementations, conductive layers 915 are formed by depositing one or more conductive materials, such as metal and/or metal compounds (e.g., W and TiN), over gate dielectric layer 914 using one or more thin film deposition processes including, but not limited to, CVD, PVD, ALD, or any combination thereof, to partially fill first trenches 906. For example, layers of TiN and W may be sequentially deposited to form conductive layers 915. A planarization process, e.g., CMP, can be performed to remove the excess conductive materials over the top surface of semiconductor layer 901.

Figure 9F:
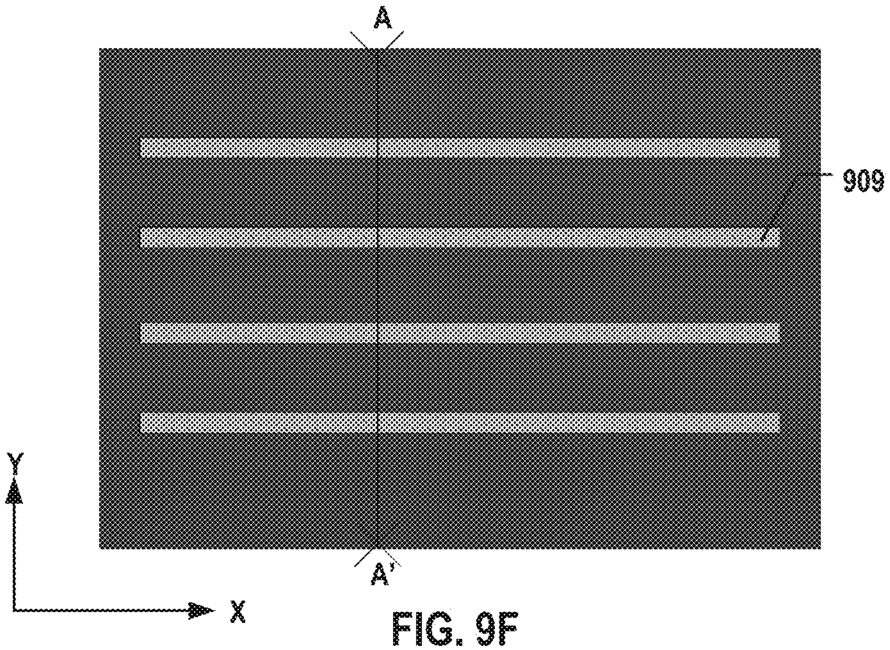
Figure 9F:
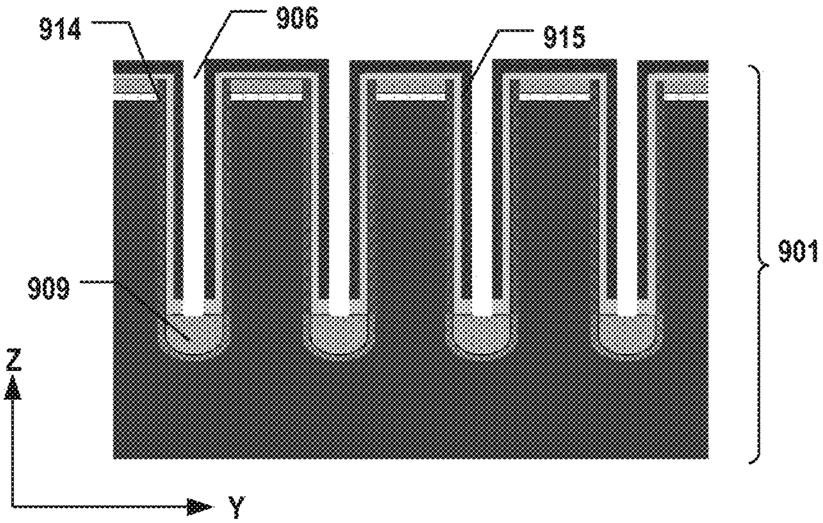

As illustrated in FIG. 9F and FIG. 9F', in some implementations, conductive layers 915 are etched back, for example, using a punch-down etch, dry etch, and/or wet etch (e.g., RIE), to form two disconnected conductive structures in each first trench 906. In some implementations, a bottom punch-down etching process is performed to each away some of the metals of conductive layer 915 at the bottom of the first trench until exposing dielectric layer 909. In some implementations, conductive layers 915 are etched back to form dents, such that the upper ends of conductive layers 915 are below the top surface of semiconductor bodies 907. In some implementations, as gate dielectric layer 914 is not etched, the upper ends of conductive layers 915 are below the upper ends of gate dielectric layer 914. As a result, etched-back conductive layers 915 can become word lines each extending in the word line direction (the x-direction), and parts of etched-back conductive layers 915 that are facing semiconductor bodies 907 can become gate electrodes. Gate structures each including a respective gate dielectric layer 914 and a respective gate electrode (e.g., part of conductive layer 715) over gate dielectric layer 914 can be formed thereby.

Figure 9G:
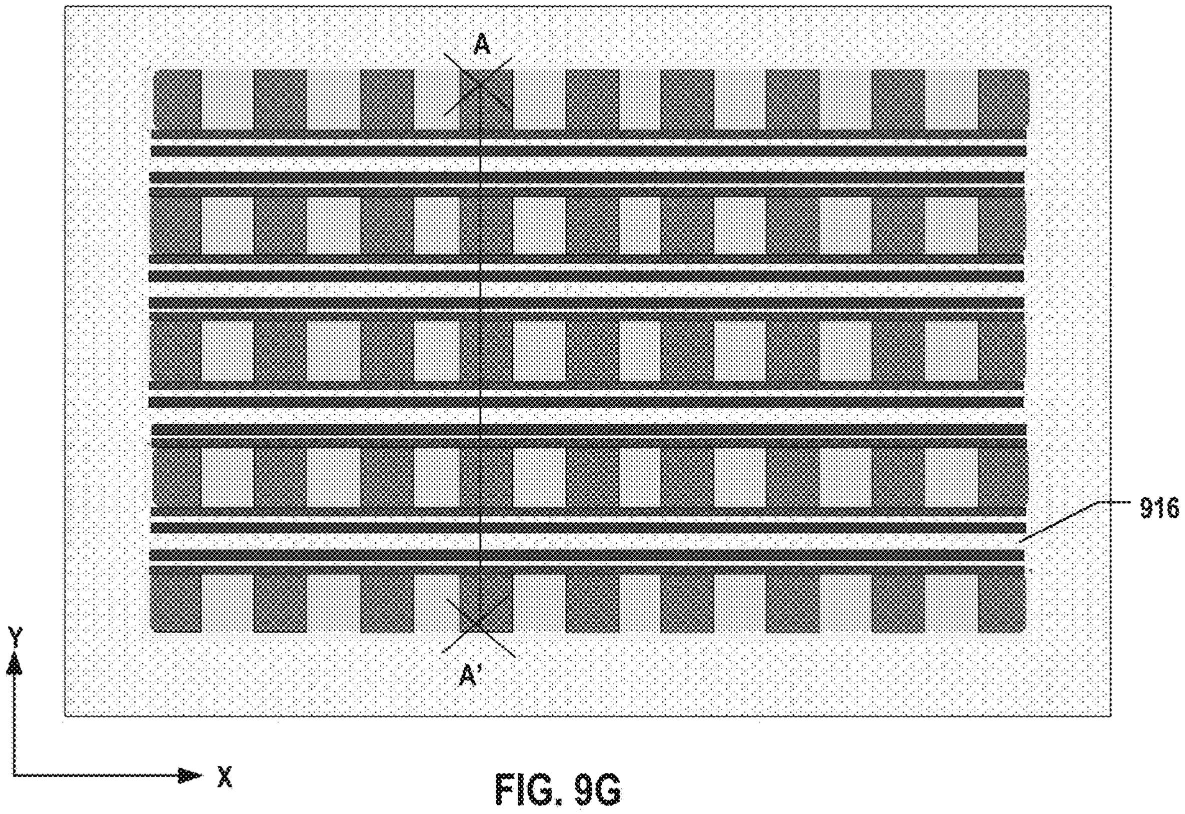
Figure 9G:
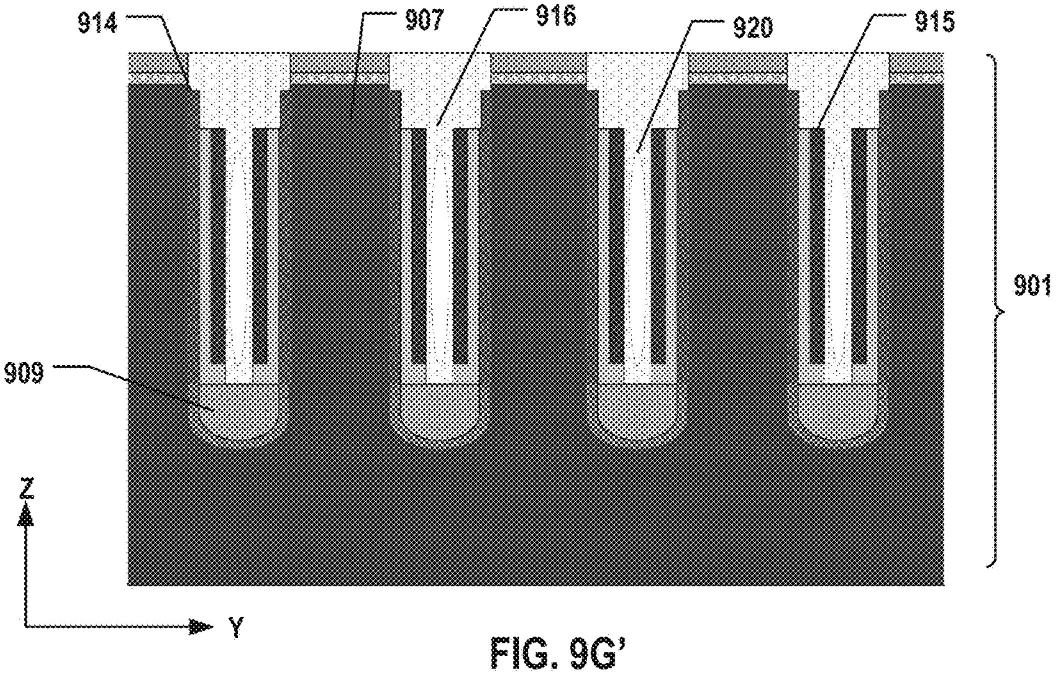

In some implementations, as shown in FIG. 9G and FIG. 9G', a dielectric layer 916 is formed in the remaining space of first trenches 706 as well as the dents resulting from etching back of conductive layers 915, for example, by depositing a dielectric, such as silicon oxide, using one or more thin film deposition processes including, but not limited to, CVD, PVD, ALD, or any combination thereof. It is understood that depending on the pitches of the word lines (e.g., the dimension of first trenches 906), airgaps 920 may be formed in dielectric layer 916.

At operation 1006 in FIG. 10, a plurality of spacers are formed. The plurality of spacers extend along the first lateral direction, and each spacer vertically extends in the upper portion of the semiconductor layer.

Figure 9H:
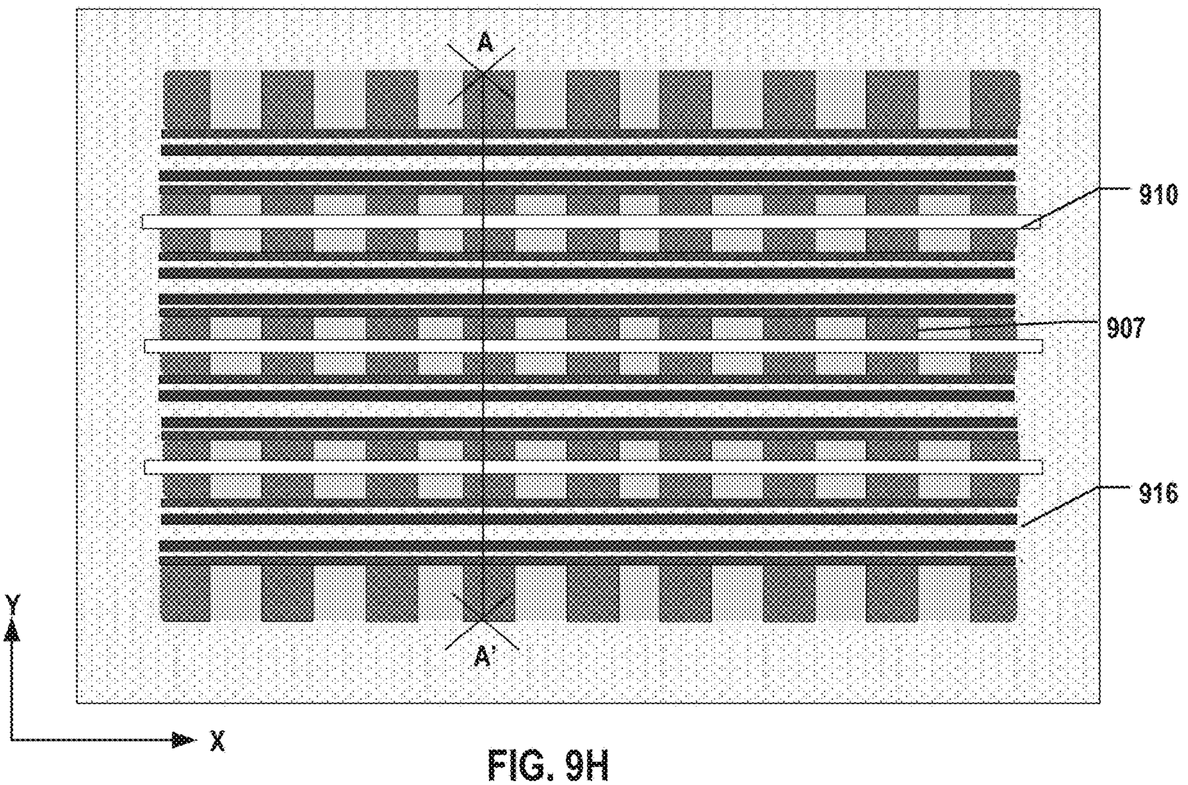
Figure 9H:
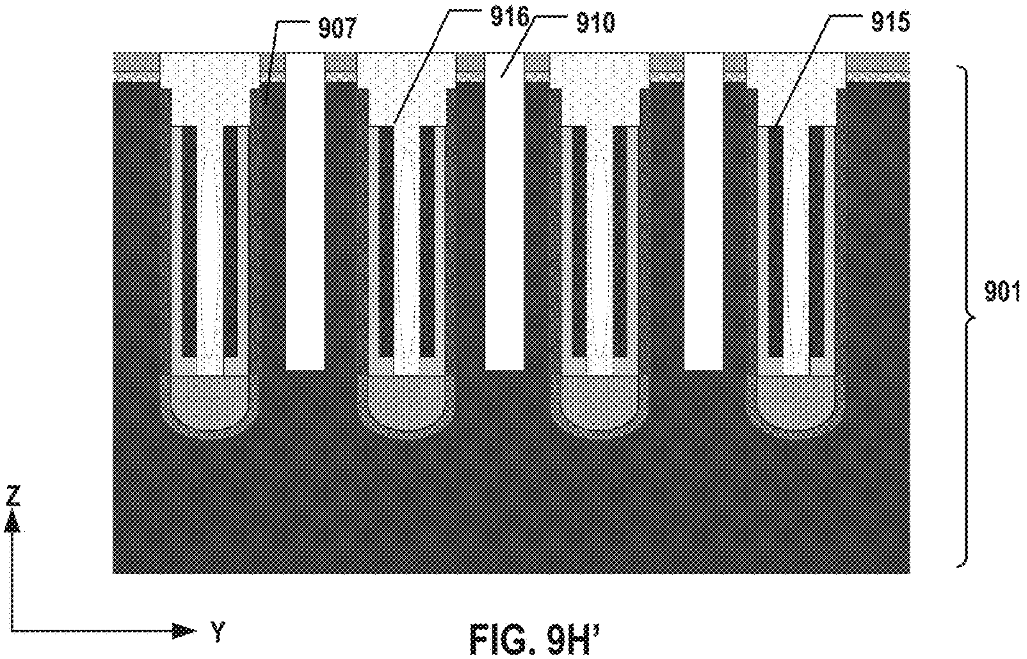

As illustrated in FIG. 9H and FIG. 9H', a plurality of parallel grooves 910 having a first depth are formed in the x-direction (e.g., the word line direction), and each groove extends vertically in semiconductor layer 901 and cuts one semiconductor pillar 903 into two semiconductor bodies 907. In some implementations, a lithography process is performed to pattern grooves 910 to be perpendicular to trench isolations 904 using an etch mask (e.g., a photoresist mask and/or a hard mask), for example, based on the design of word lines, and one or more dry etching and/or wet etching processes, such as RIE, are performed on semiconductor layer 901 and trench isolation 904 to etch grooves in semiconductor layer 901. FIG. 9H illustrates the plan view in the x-y plane, and FIG. 9H' illustrates the side view of a cross-section along the y-direction (the bit line direction).

Figure 9I:
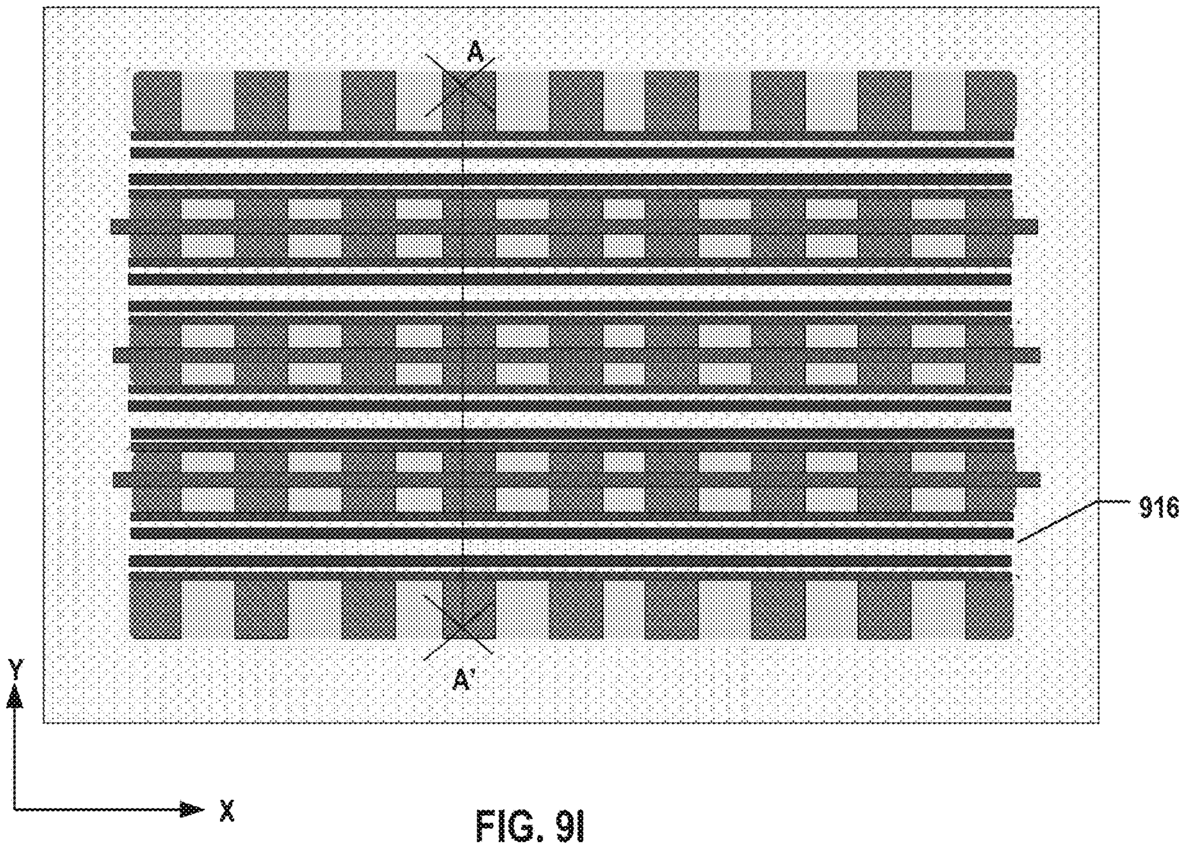
Figure 9I:
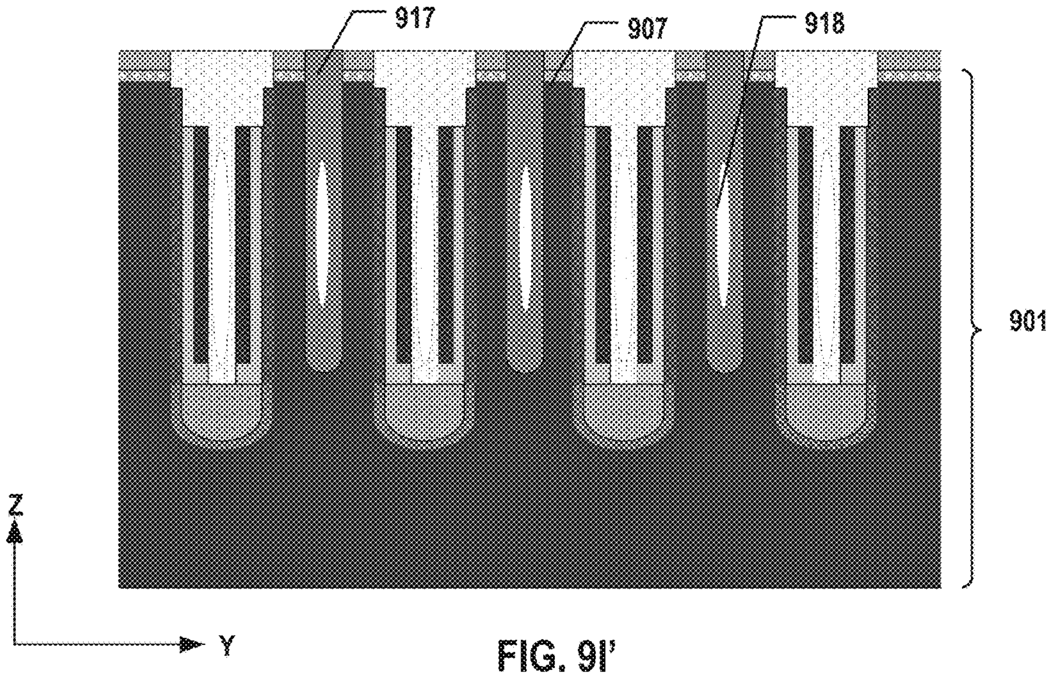

In some implementations, as shown in FIG. 9I and FIG. 9I', a dielectric layer is deposited to fill the grooves 910. In some implementations, second trench isolations 917 are formed in grooves, for example, by depositing a dielectric layer, such as silicon oxide, to fill grooves 910, using one or more thin film deposition processes including, but not limited to, CVD, PVD, ALD, or any combination thereof. A planarization process can be performed to remove excess dielectric over the top surface of semiconductor layer 901. It is understood that depending on the pitches of the semiconductor bodies 907 (e.g., the dimension of grooves), airgaps 918 may be formed in second trench isolations 917.

Figure 12:
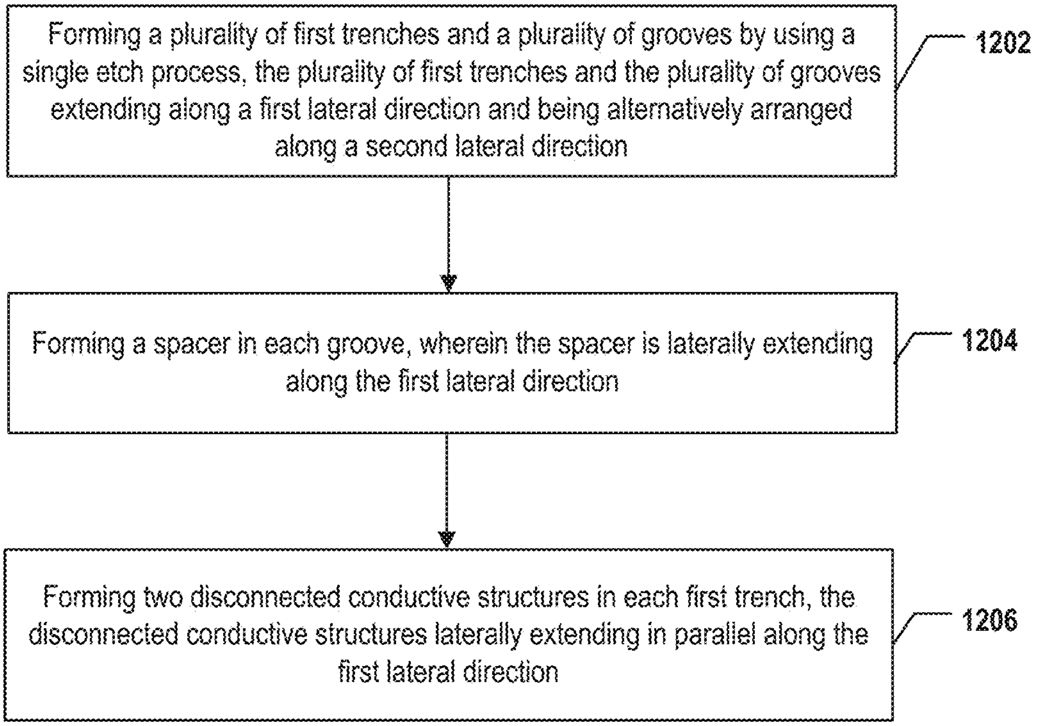
FIG. 12 illustrates a flowchart of still another method for forming an array of memory cells each including a vertical transistor, according to some aspects of the present disclosure.

FIG. 12 illustrates a flowchart of a method 1200 for forming an array of memory cells each including a vertical transistor, according to some aspects of the present disclosure. At operation 1202 in FIG. 12, a plurality of first trenches and a plurality of grooves are formed in a semiconductor layer by using a single etch process. The plurality of first trenches and the plurality of grooves extend along a first lateral direction, and each first trench and groove vertically extend in an upper portion of a semiconductor layer. The plurality of first trenches and the plurality of grooves are alternatively arranged along a second lateral direction. The semiconductor layer can include a substrate, a first dielectric layer on the substrate, and a second dielectric layer on the first dielectric layer.

Figure 11A:
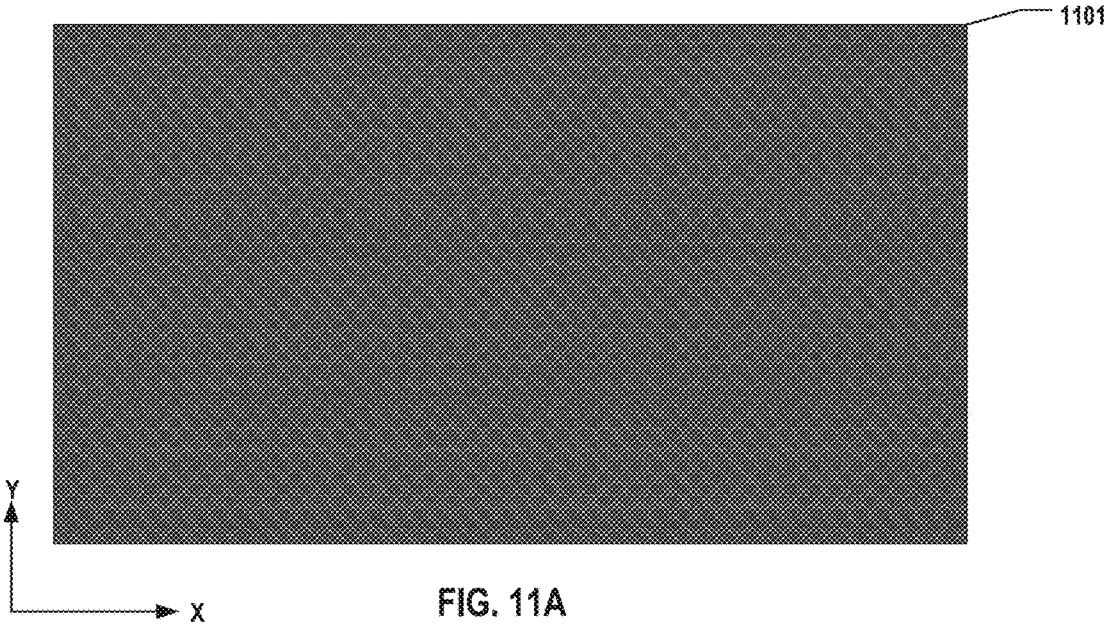
FIGS. 11A-11I and 11A'-11I' illustrate still another fabrication process for forming a 3D memory device including vertical transistors, according to some aspects of the present disclosure.
Figure 11A:
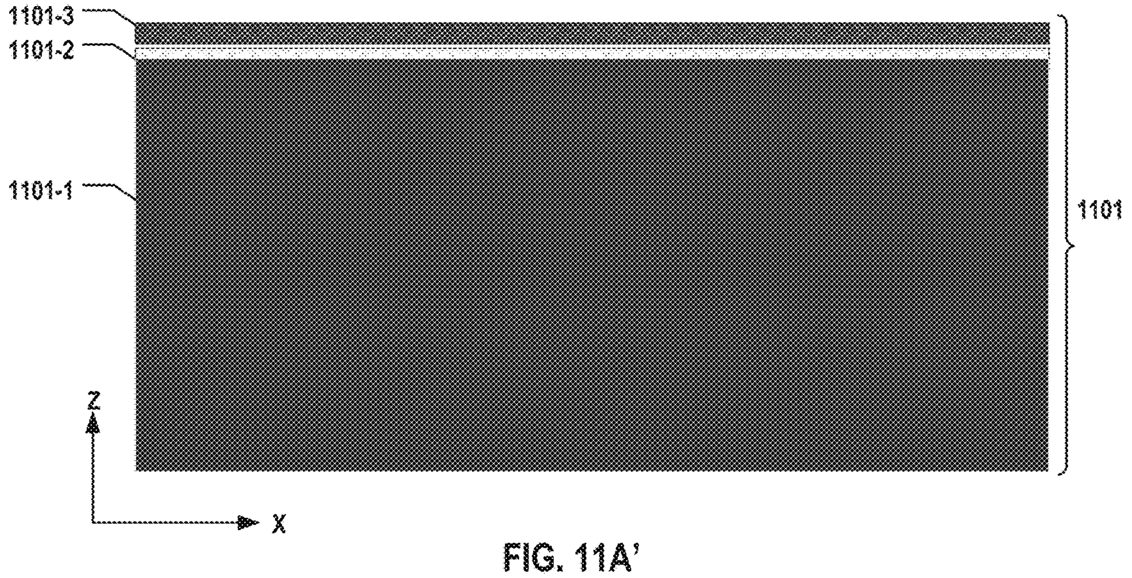

FIG. 11A and FIG. 11A' show a semiconductor layer 1101, including substrate 1101-1, first dielectric layer 1101-2 on top of the substrate 1101-1, and second dielectric layer 1101-3 on top of the first dielectric layer 1101-2. In some implementations, first dielectric layer 1101-2 and second dielectric layer 1101-3 are removed in subsequent processes, allowing the capacitor structure to be effectively connected to the source. FIG. 11A illustrates a plan view of semiconductor layer 1101, while FIG. 11A' illustrates a side view of semiconductor layer 1101. To form semiconductor layer 1101, silicon oxide and silicon nitride are subsequently deposited onto silicon substrate 1101-1 using one or more thin film deposition processes including, but not limited to, chemical vapor deposition (CVD), physical vapor deposition (PVD), atomic layer deposition (ALD), or any combination thereof. In some implementations, silicon oxide layer 1101-2 is formed by oxidizing the top portion of silicon substrate 1101-1 using dry oxidation and/or we oxidation, such as in situ steam generation (ISSG) oxidation process.

Figure 11B:
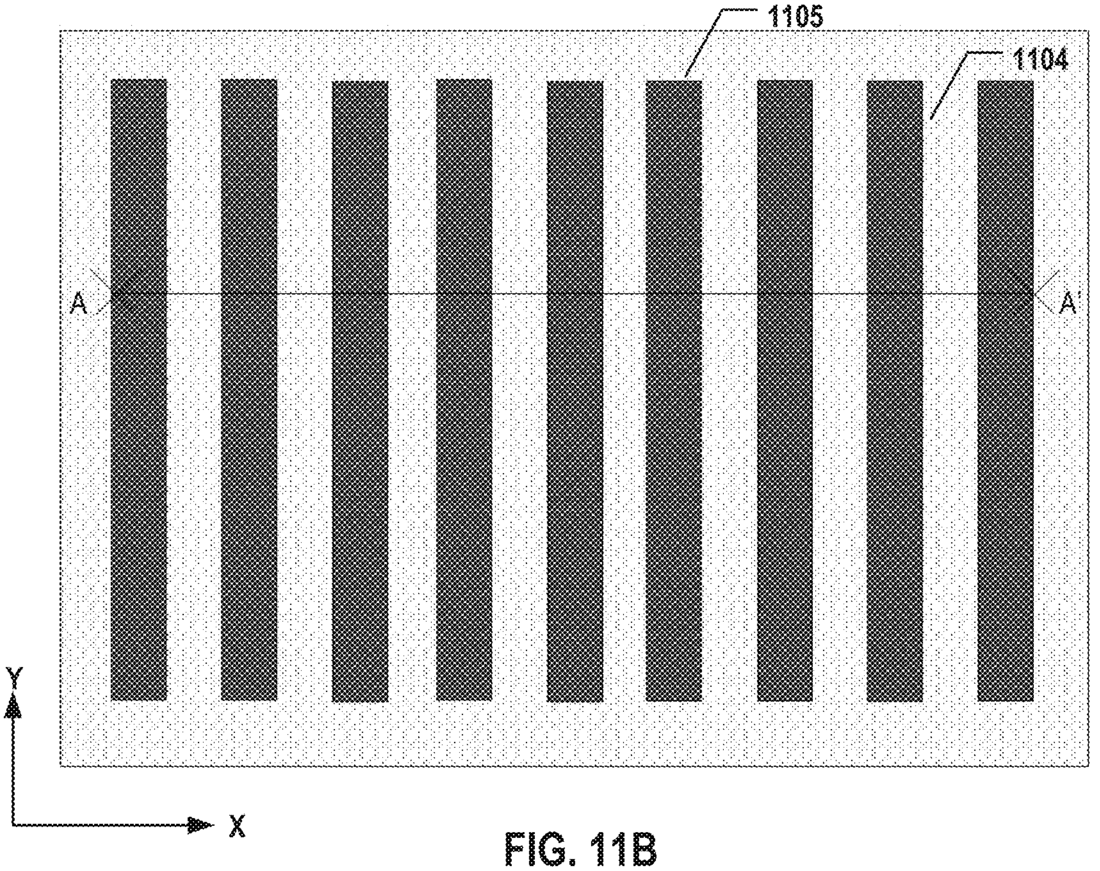
Figure 11B:
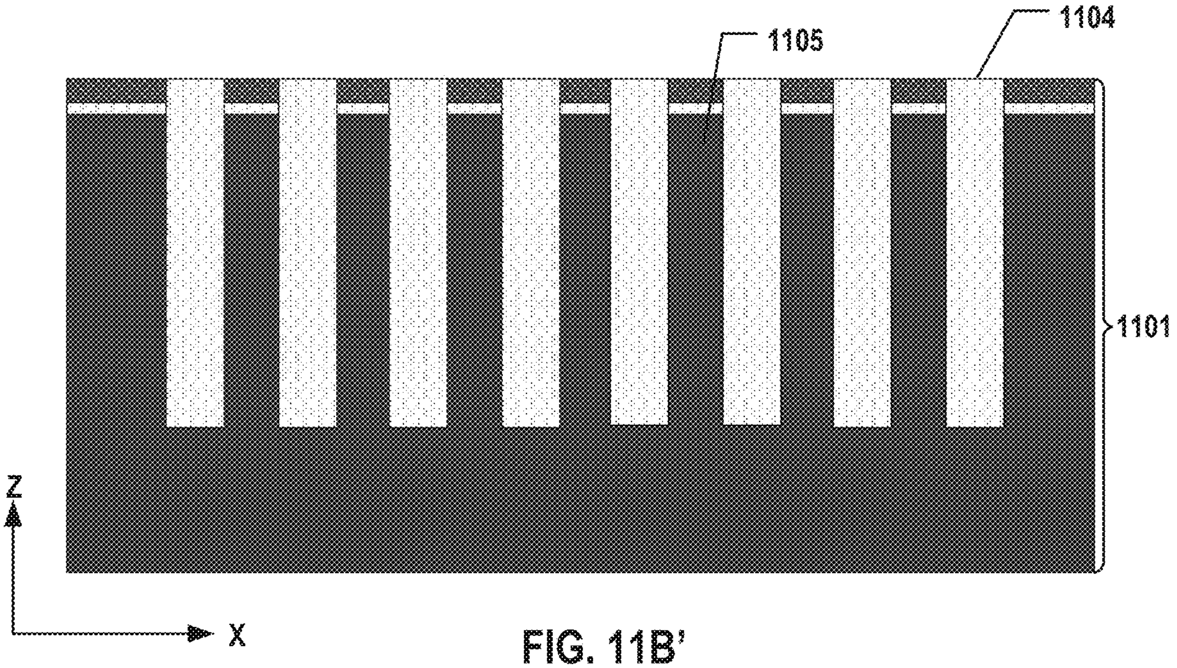

As illustrated in FIG. 11B and FIG. 11B', a plurality of parallel trenches are formed in the y-direction (e.g., the bit line direction) to form a plurality of parallel semiconductor walls 1105 in the y-direction. In some implementations, a lithography process is performed to pattern trenches and semiconductor walls 1105 using an etch mask (e.g., a photoresist mask and/or a hard mask), for example, based on the design of bit lines, and one or more dry etching and/or wet etching processes, such as RIE, are performed to etch trenches in semiconductor layer 1101. Thus, semiconductor wall 1105 extending vertically in semiconductor layer 1101 can be formed. Since semiconductor walls 1105 are formed by etching semiconductor layer 1101, semiconductor walls 1105 can have the same materials as semiconductor layer 1101. In some implementations, the plurality of parallel trenches are filled to form a plurality of parallel trench isolations 1104 by depositing a third dielectric layer, such as silicon oxide, by using one or more thin film deposition processes including, but not limited to, CVD, PVD, ALD, or any combination thereof. In some implementations, a planarization process, such as CMP, is performed to remove the excess third dielectric layer that is deposited beyond the top surface of semiconductor layer 1101. As a result, parallel semiconductor walls 1105 can be separated by trench isolations 1104. FIG. 11B and FIG. 11B' illustrate the plan view in the x-y plane and the side view of a cross-section along the x-direction (the word line direction, e.g., along the AA' line), respectively.

Figure 11C:
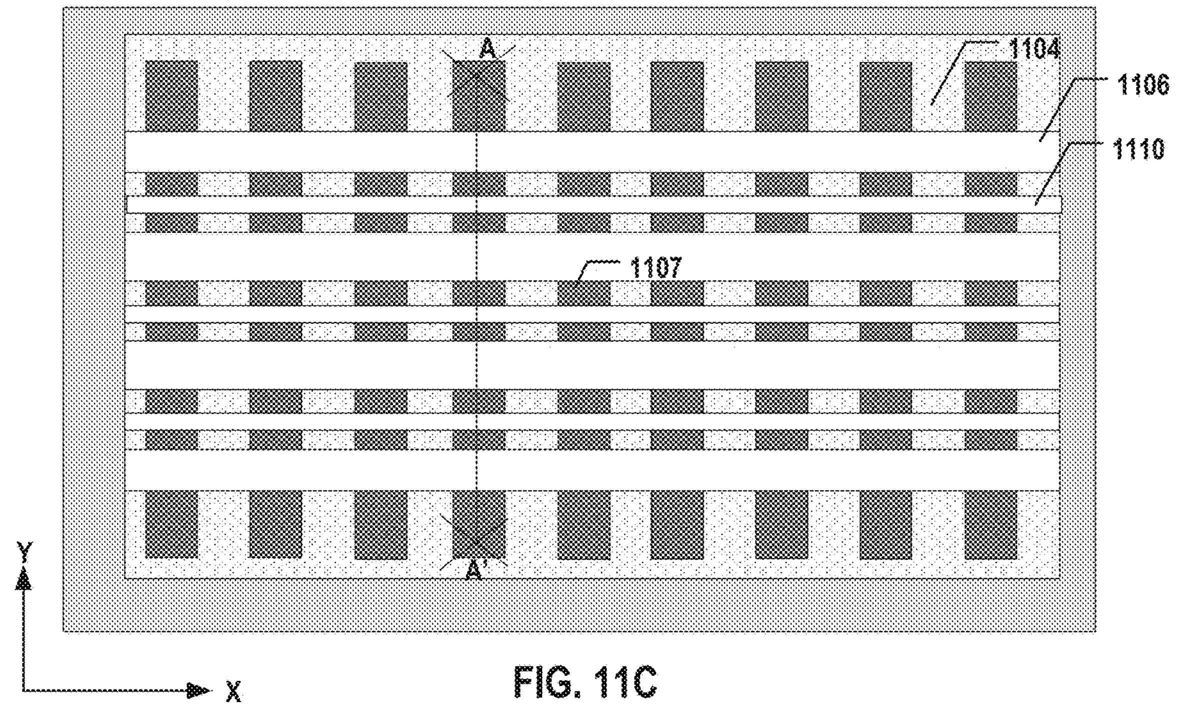
Figure 11C:
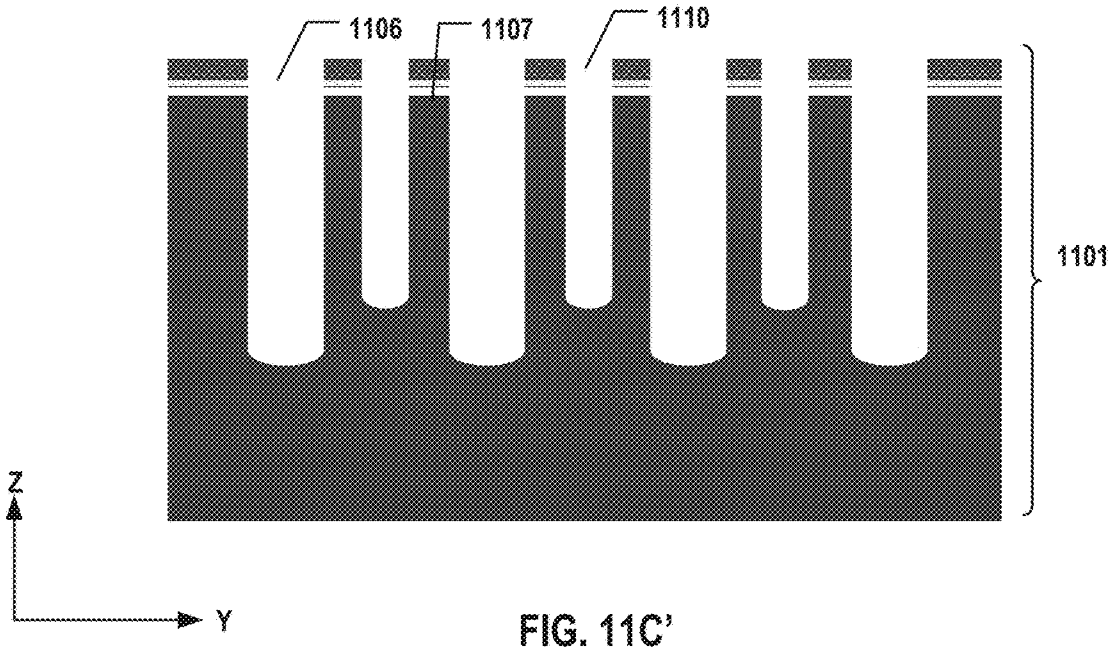

As illustrated in FIG. 11C and FIG. 11C', a plurality of grooves 1110 having a first depth and a plurality of first trenches 1106 having a second depth and are formed in the x-direction (e.g., the word line direction) by using a single etching process such as Self-Aligned Double Pattern (SADP) process to form an array of semiconductor bodies 1107 each extending vertically in semiconductor layer 1101. Each semiconductor body 1107 extends in a vertical direction (e.g., the z-direction as shown in FIG. 11C'). Each semiconductor body 1107 has a first lateral dimension along a first lateral direction (e.g., the x-direction), and a second lateral dimension along a second lateral direction (e.g., the y-direction). The first lateral dimensions and second lateral dimensions of different semiconductor bodies 1107 are essentially the same (with errors within a margin of ±10%) along the x-direction and y-direction, respectively. In some implementations, the first depth is smaller than the second depth. In some implementations, each groove has a third lateral dimension along the second lateral direction (e.g., bit-line direction), each first trench has a fourth lateral dimension along the second lateral direction (e.g., bit-line direction), and the third lateral dimension is smaller than the fourth lateral dimension. In some implementations, a lithography process is performed to pattern first trenches 1106 and grooves 1110 to be perpendicular to trench isolations 1104 using an etch mask (e.g., a photoresist mask and/or a hard mask), for example, based on the design of word lines, and one or more dry etching and/or wet etching processes, such as RIE, are performed on semiconductor layer 1101 and trench isolation 1104 to etch first trenches 1106 and grooves 1110 in semiconductor layer 1101. As a result, semiconductor walls 1105 (shown in FIG. 11B) can be cut by first trenches 1106 and grooves 1110 to form an array of semiconductor bodies 1107 each extending vertically in semiconductor layer 1101. Since semiconductor bodies 1107 are formed by etching semiconductor layer 1101, semiconductor bodies 1107 can have the same materials as semiconductor layer 1101. FIG. 11C illustrates the plan view in the x-y plane, and FIG. 11C' illustrates the side view of a cross-section along the y-direction (the bit line direction).

At operation 1204 in FIG. 12, a plurality of spacers are formed. The plurality of spacers extend along the first lateral direction, and each spacer vertically extends in the upper portion of the semiconductor layer.

Figure 11D:
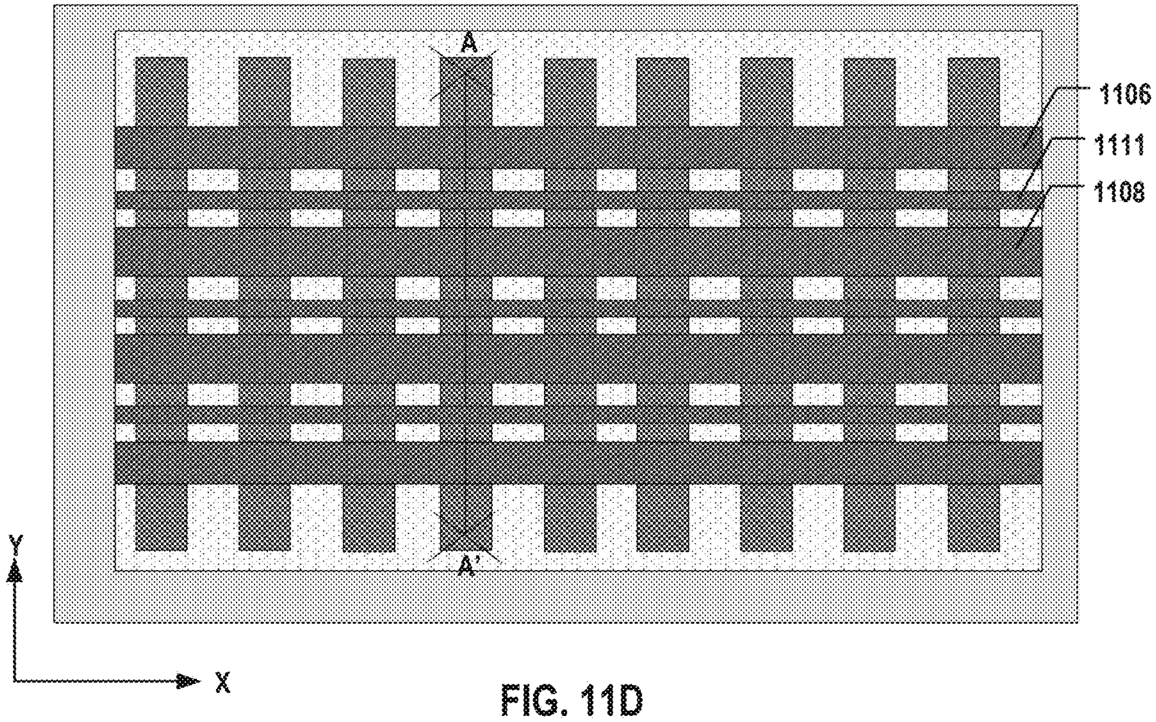
Figure 11D:
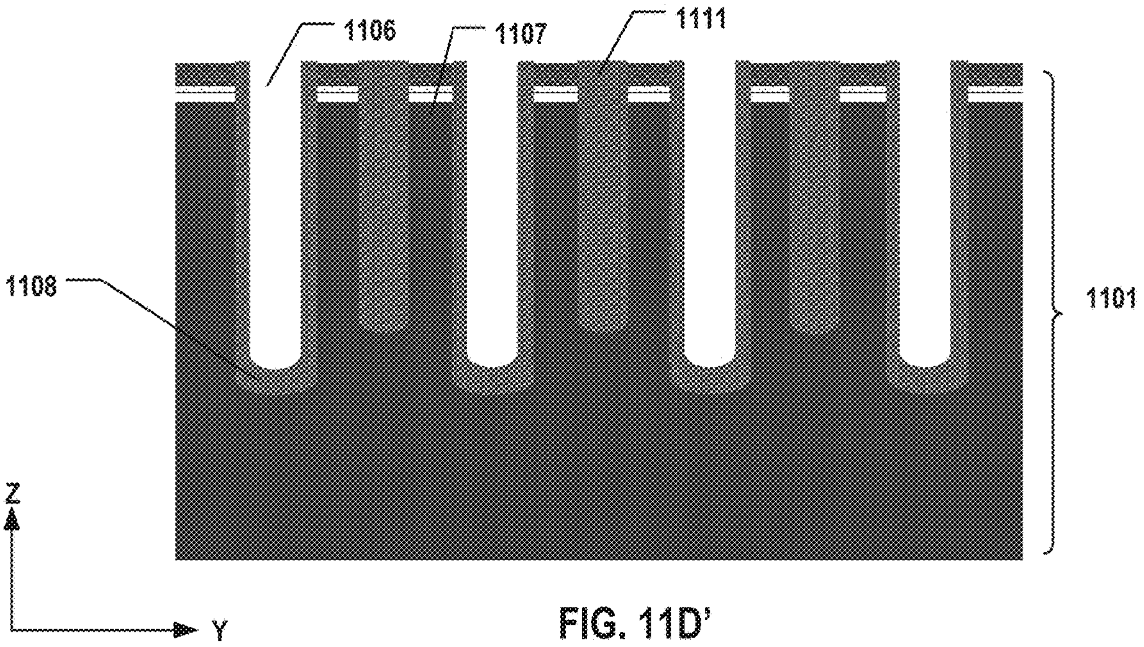

As illustrated in FIG. 11D and FIG. 11D', in some implementations, a sacrificial layer 1108 is formed in each first trench 1106 and each groove 1110, for example, by depositing a dielectric, such as silicon oxide, to partially fill each first trench 1106 and fully fill each groove 1110, using one or more thin film deposition processes including, but not limited to, CVD, PVD, ALD, or any combination thereof. In some implementations, a dielectric layer 1119 is deposited on the sidewalls of each first trench 1106 to partially fill each first trench 1106. In some implementations, each groove 1110 is fully filled with the sacrificial layer to form a plurality of spacers 1111. In some implementations, partially filling the first trenches 1106 and fully filling the grooves 1110 are performed in a single deposition process. In some implementations, a planarization process, such as CMP, is performed to remove the excess sacrificial layer that is deposited beyond the top surface of semiconductor layer 1101.

At operation 1206 of FIG. 12, two disconnected conductive structures are formed in each first trench. The two disconnected conductive structures laterally extend along the first lateral direction, and each conductive structure vertically extends along one sidewall of a corresponding first trench.

Figure 11E:
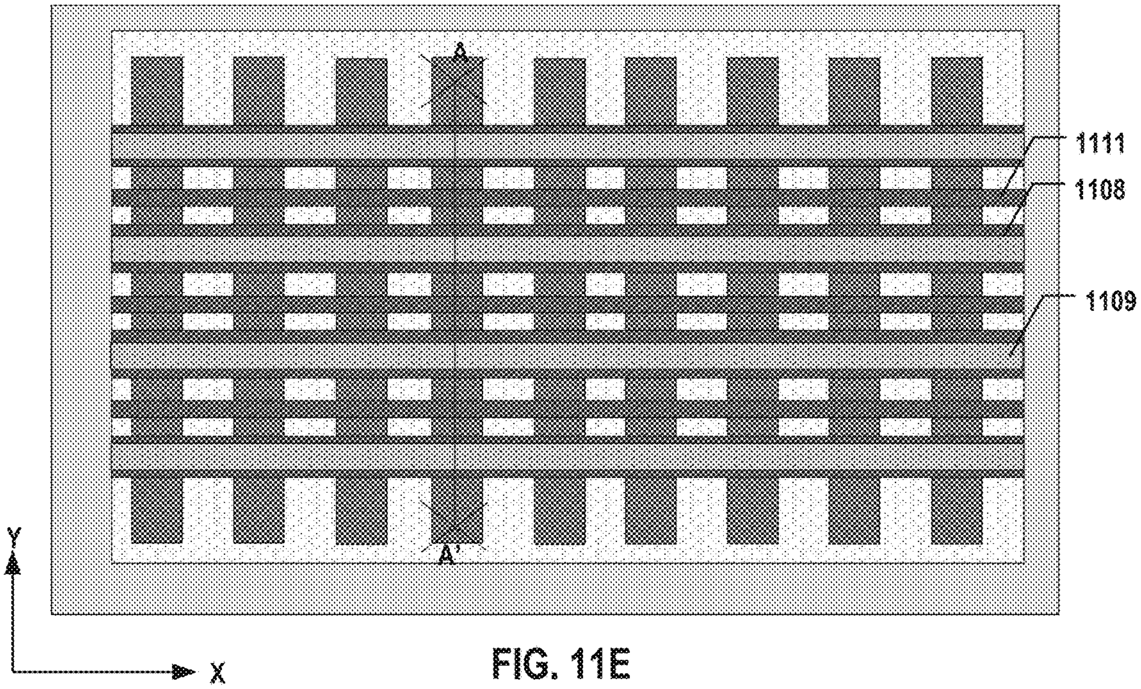
Figure 11E:
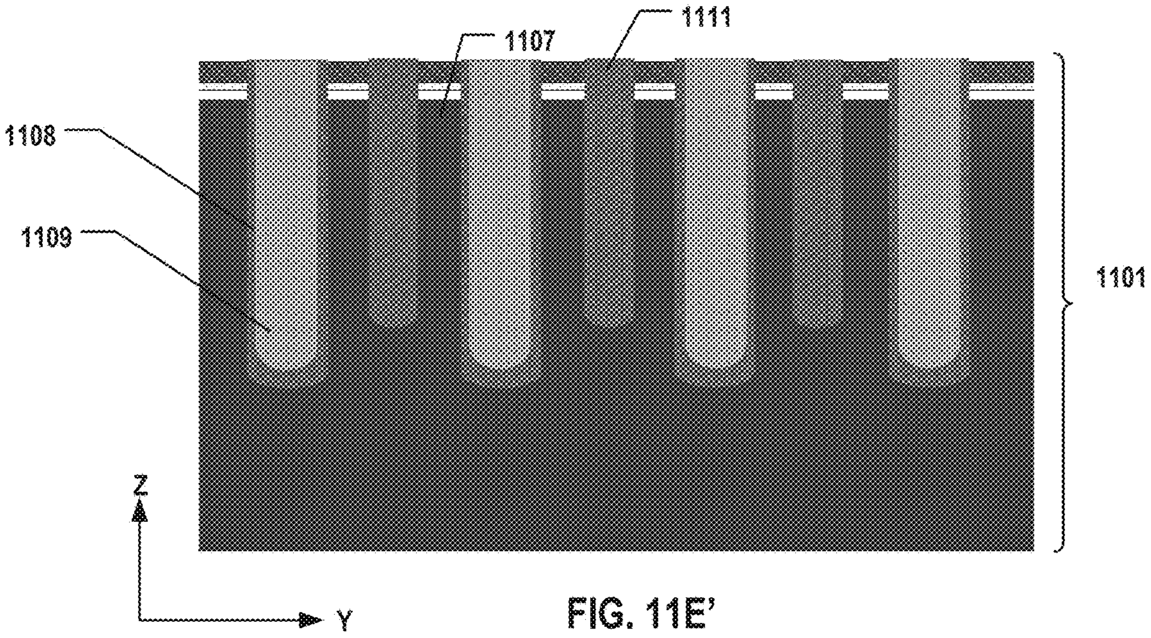

As illustrated in FIG. 11E and FIG. 11E', a dielectric layer 1109 is formed in each first trench 1106, for example, by depositing a dielectric, such as silicon oxide, to fill first trench 1106, using one or more thin film deposition processes including, but not limited to, CVD, PVD, ALD, or any combination thereof. In some implementations, a planarization process, such as CMP, is performed to remove excess dielectric layer 1109 that is deposited beyond the top surface of semiconductor layer 1101.

Figure 11F:
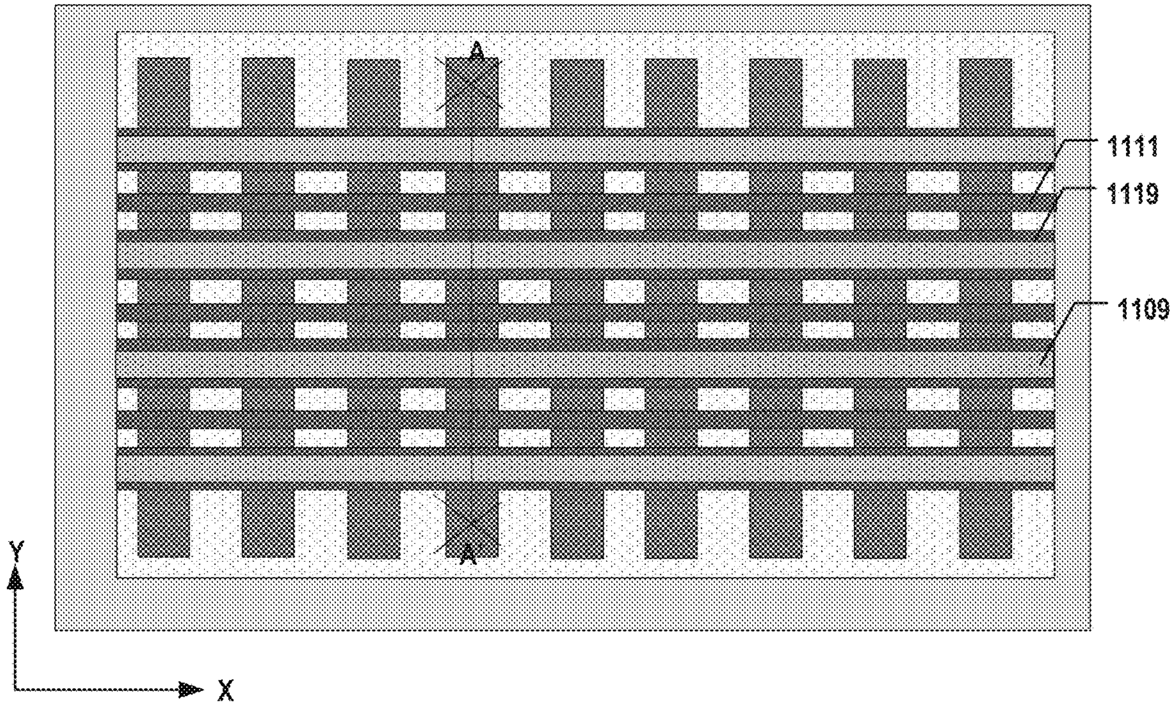
Figure 11F:
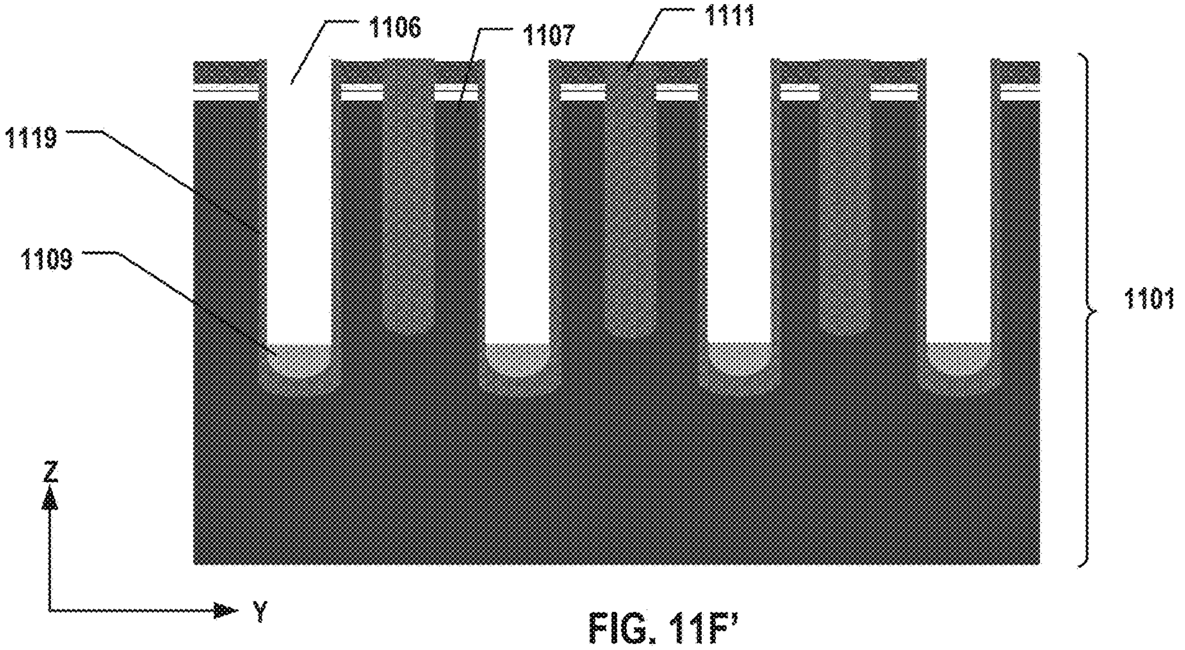

As illustrated in FIG. 11F and FIG. 11F', dielectric layer 1109 is back-etched such that the dielectric layer 1109 covers the bottom surface of each first trench 1106. In some implementations, a lithography process is performed to back-etch dielectric layer 1109 using an etch mask (e.g., a photoresist mask and/or a hard mask), or one or more dry etching and/or wet etching processes, such as RIE, are performed on dielectric layer 1109 until the back-etching reaches a third depth. FIG. 11F illustrates the plan view in the x-y plane, and FIG. 11F' illustrates the side view of a cross-section along the y-direction (the bit line direction).

Figure 11G:
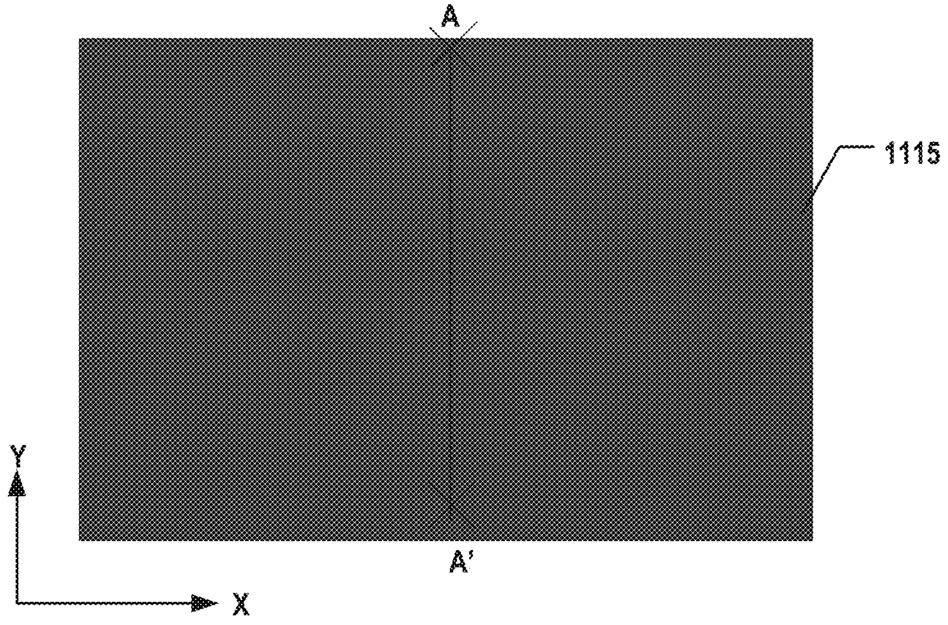
Figure 11G:
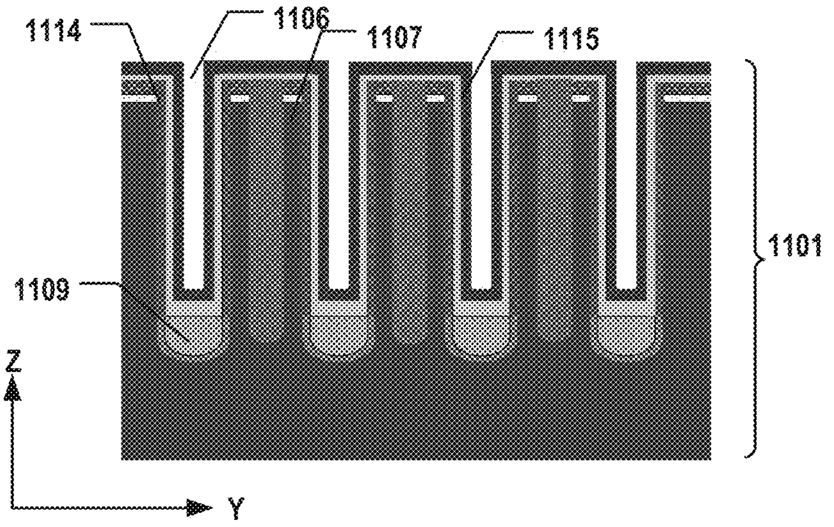

As illustrated in FIG. 11G and FIG. 11G', a gate dielectric layer 1114 is formed in each first trench 1106. Gate dielectric layer 1114 can be parts of a continuous dielectric layer formed over the sidewalls of each row of semiconductor bodies 1107. In some implementations, a wet oxidation and/or a dry oxidation process, such as in situ steam generation (ISSG) oxidation, is performed to form native oxide (e.g., silicon oxide) on the sidewalls of each first trench 1106. Then, one or more conductive layers 1115 are formed over gate dielectric layer 1114 in first trenches 1106. In some implementations, conductive layers 1115 are formed by depositing one or more conductive materials, such as metal and/or metal compounds (e.g., W and TiN), over gate dielectric layer 1114 using one or more thin film deposition processes including, but not limited to, CVD, PVD, ALD, or any combination thereof, to partially fill first trenches 1106. For example, layers of TiN and W may be sequentially deposited to form conductive layers 1115. A planarization process, e.g., CMP, can be performed to remove the excess conductive materials over the top surface of semiconductor layer 1101.

Figure 11H:
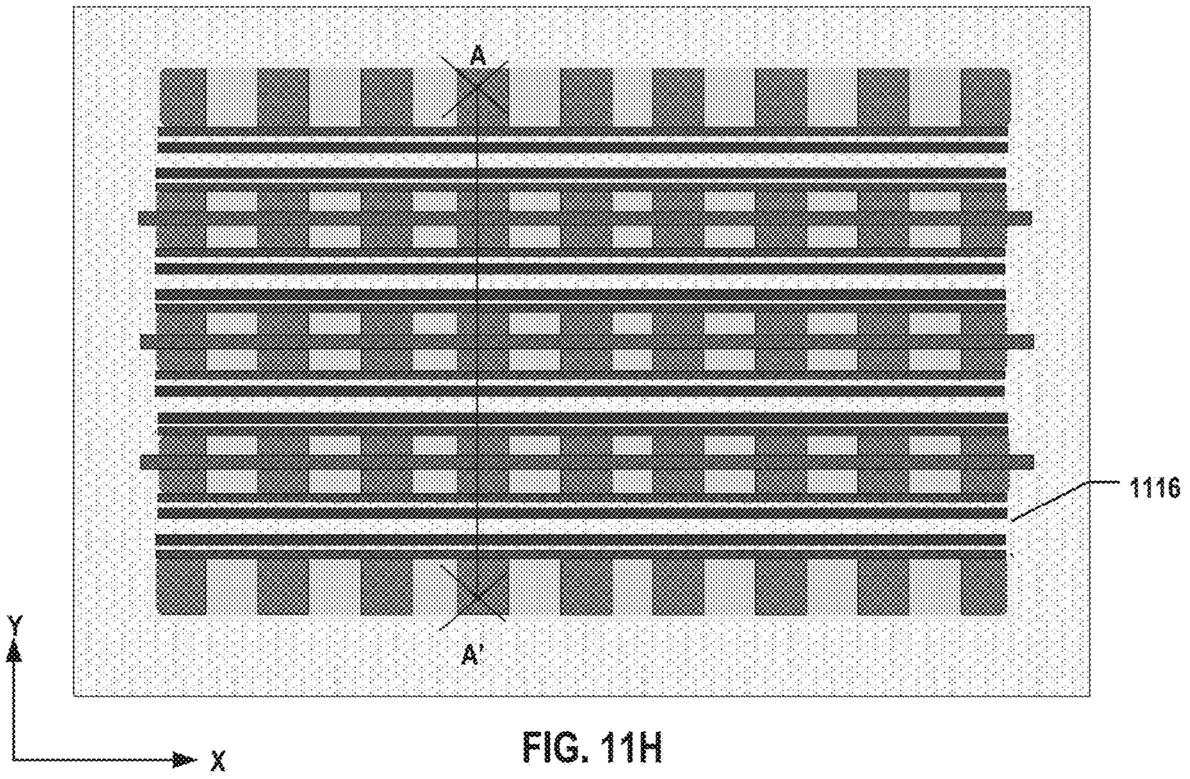
Figure 11H:
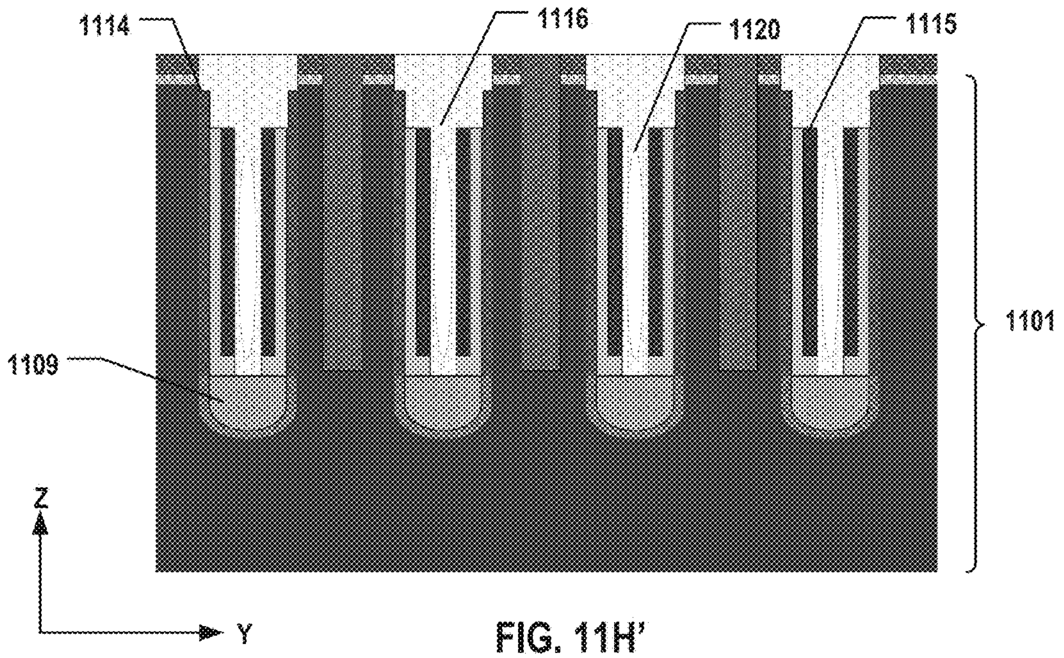

As illustrated in FIG. 11H and FIG. 11H', in some implementations, conductive layers 1115 are etched back, for example, using a punch-down etch, dry etch, and/or wet etch (e.g., RIE), to form two disconnected conductive structures in each first trench 1106. In some implementations, a bottom punch-down etching process is performed to each away some of the metals of conductive layer 1115 at the bottom of the first trench until exposing dielectric layer 1109. In some implementations, conductive layers 1115 are etched back to form dents, such that the upper ends of conductive layers 1115 are below the top surface of semiconductor bodies 1107. In some implementations, as gate dielectric layer 1114 is not etched, the upper ends of conductive layers 1115 are below the upper ends of gate dielectric layer 1114. As a result, etched-back conductive layers 1115 can become word lines each extending in the word line direction (the x-direction), and parts of etched-back conductive layers 1115 that are facing semiconductor bodies 1107 can become gate electrodes. Gate structures each including a respective gate dielectric layer 1114 and a respective gate electrode (e.g., part of conductive layer 1115) over gate dielectric layer 1114 can be formed thereby.

In some implementations, as shown in FIG. 11H and FIG. 11H', a dielectric layer 1116 is formed in the remaining space of first trenches 1106 as well as the dents resulting from etching back of conductive layers 1115, for example, by depositing a dielectric, such as silicon oxide, using one or more thin film deposition processes including, but not limited to, CVD, PVD, ALD, or any combination thereof. It is understood that depending on the pitches of the word lines (e.g., the dimension of first trenches 1106), airgaps 1120 may be formed in dielectric layer 1116.

Figure 11I:
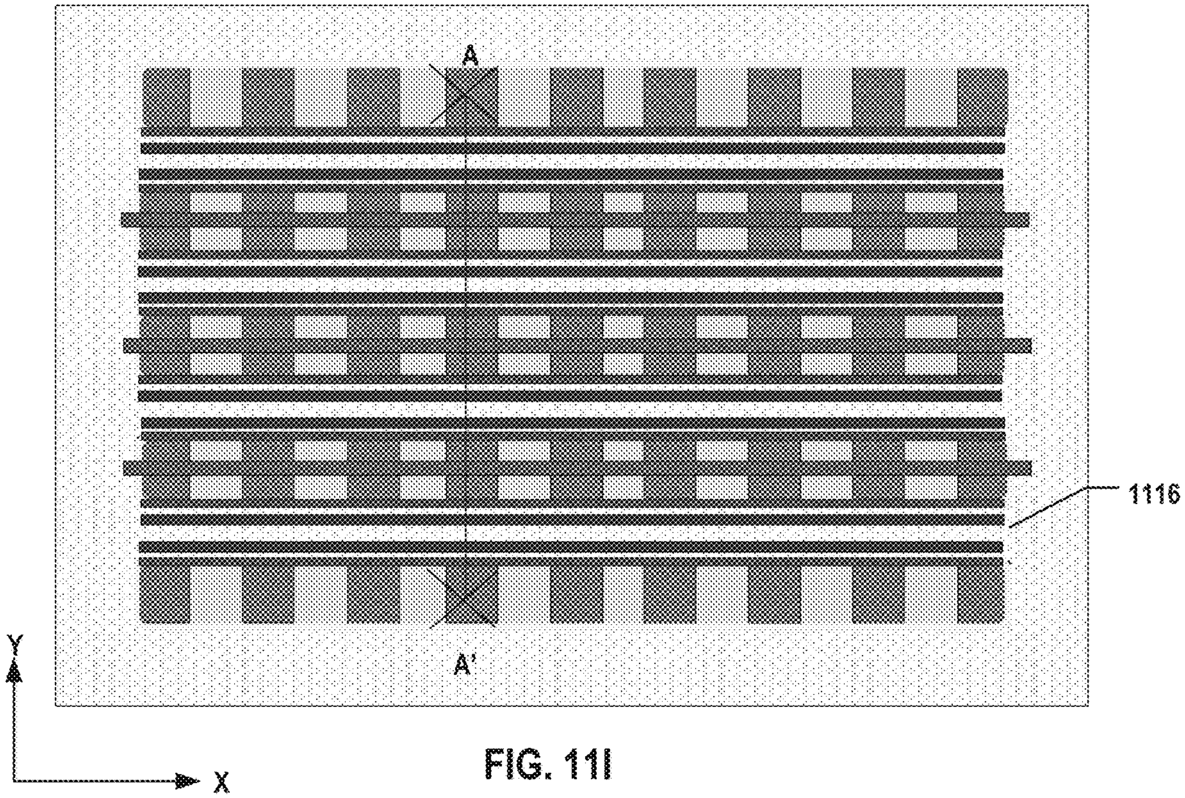
Figure 11I:
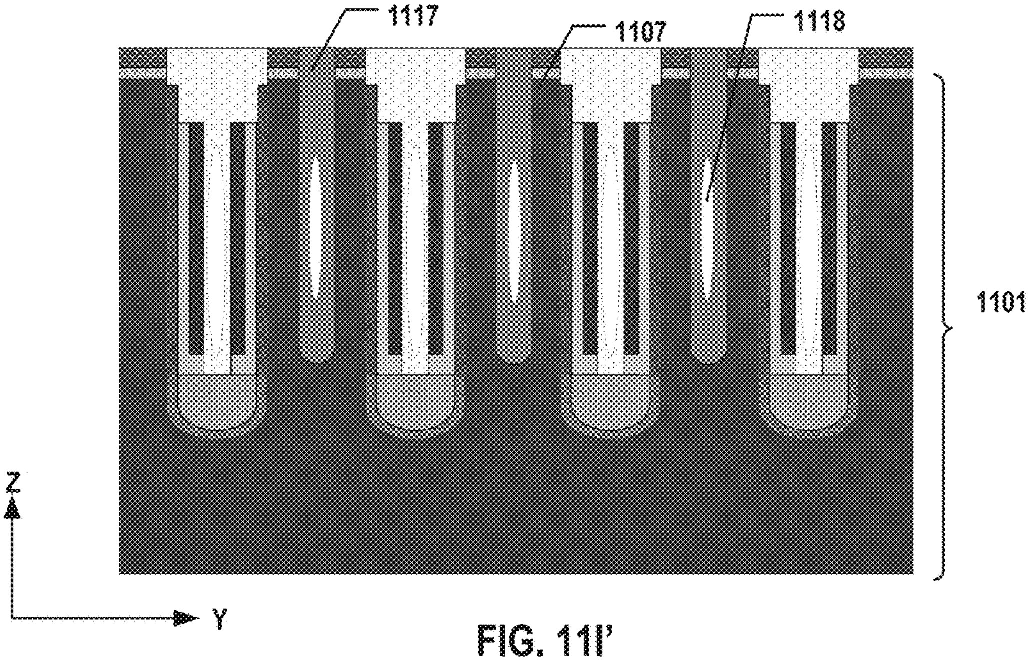

In some implementations, as shown in FIG. 11I and FIG. 11F, the sacrificial layer in spacers 1111 (as shown in FIG. 11F') is removed to form second trenches, and a dielectric layer is deposited to fill the second trenches. In some implementations, a lithography process is performed to remove the sacrificial layer inside spacers 1111 using an etch mask (e.g., a photoresist mask and/or a hard mask), and one or more dry etching and/or wet etching processes, such as RIE, are performed on spacers 1111 to etch away the sacrificial layer and to form the second trenches. Second trench isolations 1117 are formed in second trenches, for example, by depositing a dielectric layer, such as silicon oxide, to fill second trenches, using one or more thin film deposition processes including, but not limited to, CVD, PVD, ALD, or any combination thereof. A planarization process can be performed to remove excess dielectric over the top surface of semiconductor layer 1101. It is understood that depending on the pitches of the semiconductor bodies 1107 (e.g., the dimension of second trenches), airgaps 1118 may be formed in second trench isolations 1117.

Figure 14:
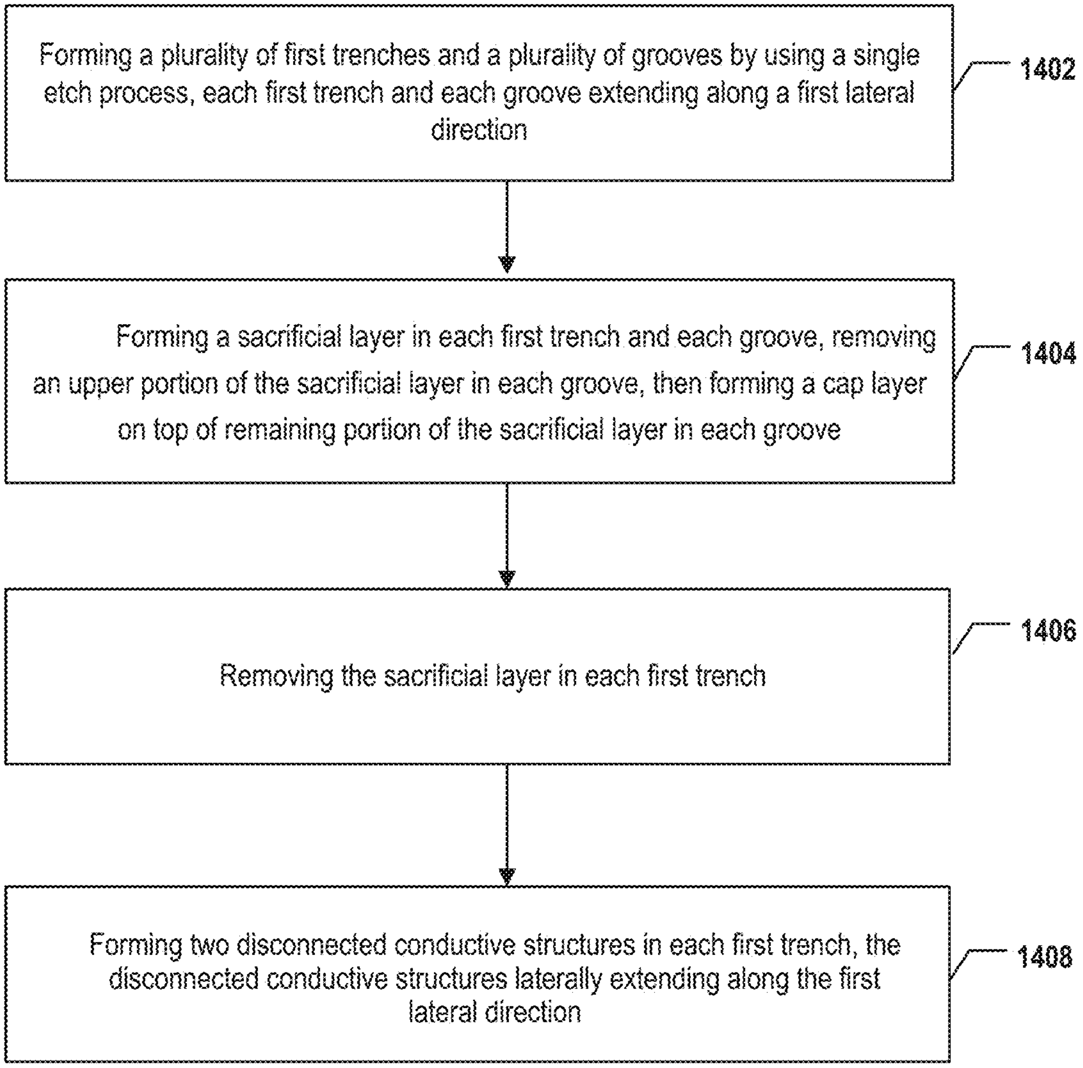
FIG. 14 illustrates a flowchart of still another method for forming an array of memory cells each including a vertical transistor, according to some aspects of the present disclosure.

FIG. 14 illustrates a flowchart of a method 1400 for forming an array of memory cells each including a vertical transistor, according to some aspects of the present disclosure. At operation 1402 in FIG. 14, a plurality of first trenches and a plurality of grooves are formed in a semiconductor layer by using a single etch process. The plurality of first trenches and the plurality of grooves extend along a first lateral direction, and each first trench and groove vertically extend in an upper portion of a semiconductor layer. The plurality of first trenches and the plurality of grooves are alternatively arranged along a second lateral direction. The semiconductor layer can include a substrate, a first dielectric layer on the substrate, and a second dielectric layer on the first dielectric layer.

Figure 13A:
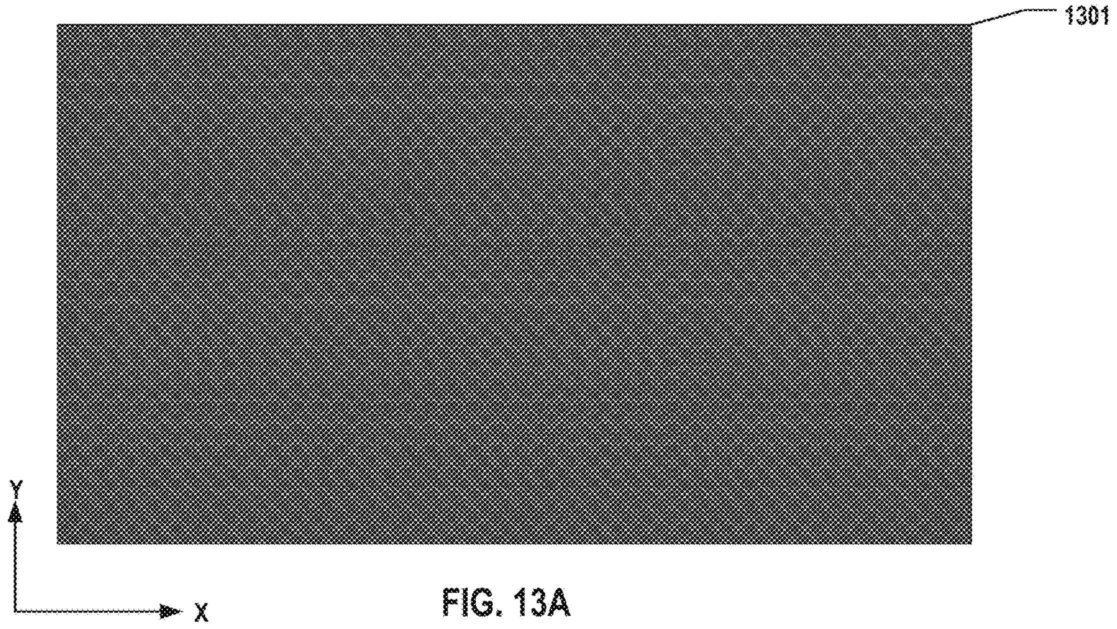
FIGS. 13A-13J and 13A'-13J' illustrate still another fabrication process for forming a 3D memory device including vertical transistors, according to some aspects of the present disclosure.
Figure 13A:

FIG. 13A and FIG. 13A' show a semiconductor layer 1301, including substrate 1301-1, first dielectric layer 1301-2 on top of substrate 1301-1, and second dielectric layer 1301-3 on top of the first dielectric layer 1301-2. In some implementations, first dielectric layer 1301-2 and second dielectric layer 1301-3 are removed in subsequent processes, allowing the capacitor structure to be effectively connected to the source. FIG. 13A illustrates a plan view of semiconductor layer 1301, while FIG. 13A' illustrates a side view of semiconductor layer 1301. To form semiconductor layer 1301, silicon oxide and silicon nitride are subsequently deposited onto silicon substrate 1301-1 using one or more thin film deposition processes including, but not limited to, chemical vapor deposition (CVD), physical vapor deposition (PVD), atomic layer deposition (ALD), or any combination thereof. In some implementations, silicon oxide layer 1301-2 is formed by oxidizing the top portion of silicon substrate 1301-1 using dry oxidation and/or we oxidation, such as in situ steam generation (ISSG) oxidation process.

Figure 13B:
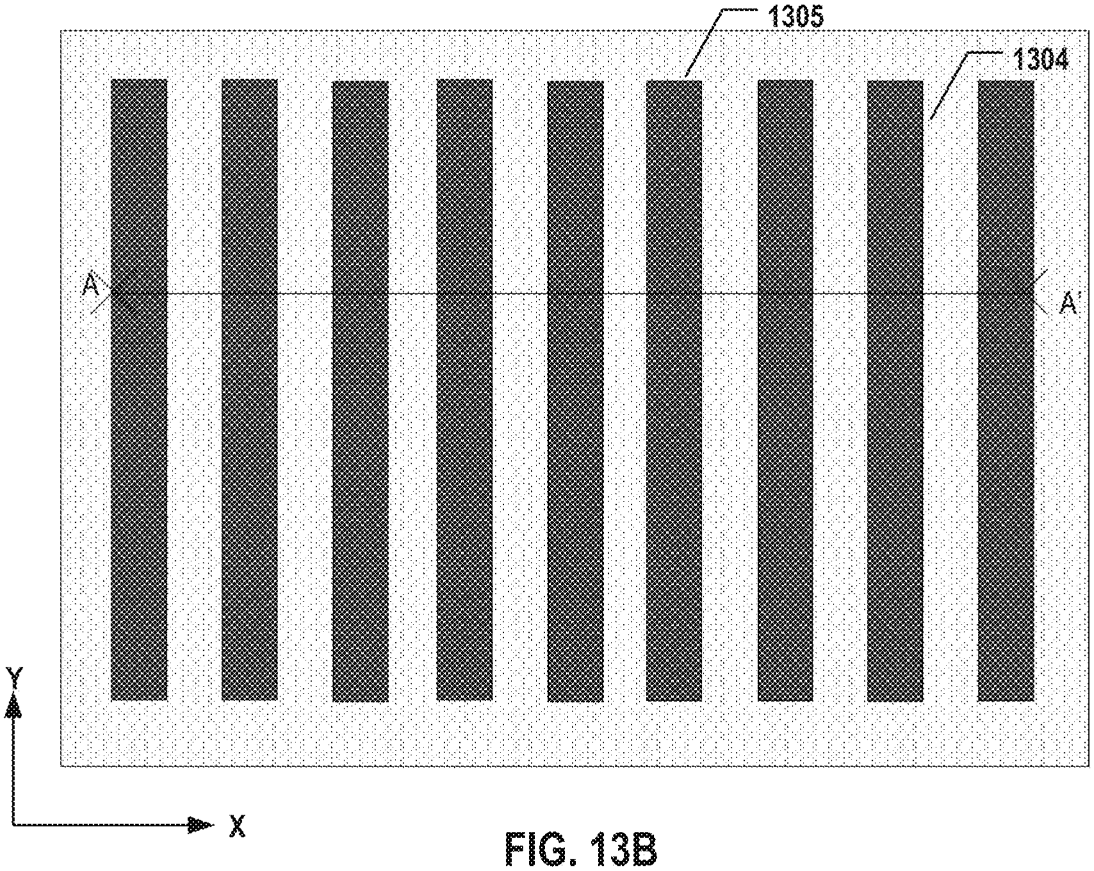
Figure 13B:
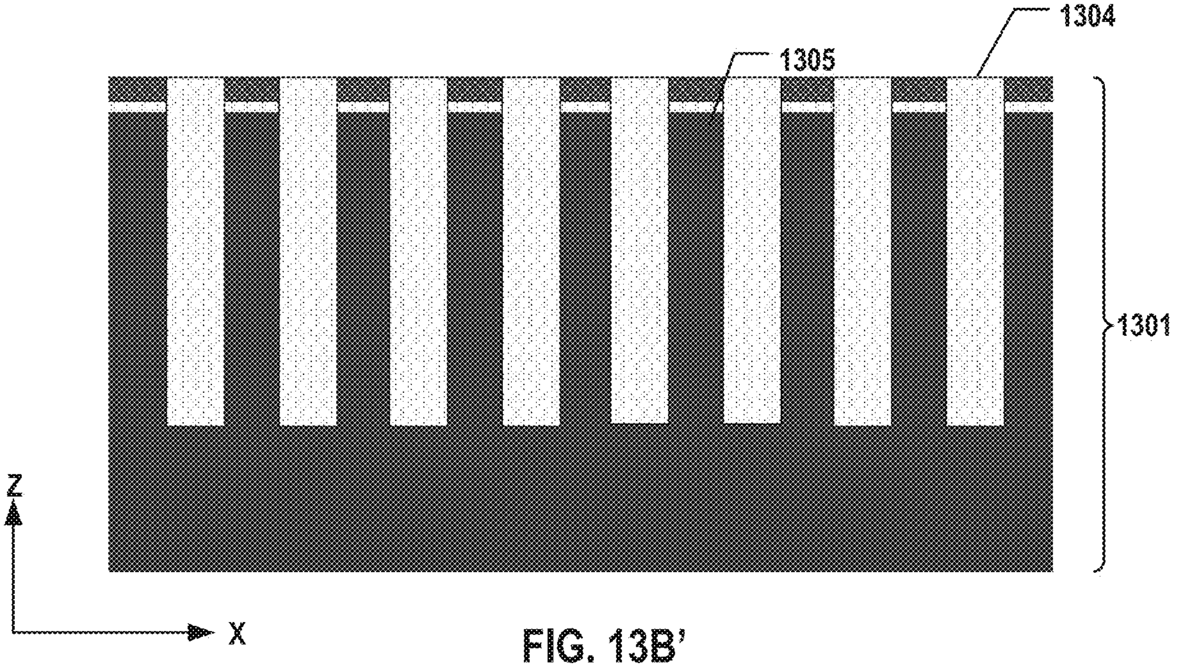

As illustrated in FIG. 13B and FIG. 13B', a plurality of parallel trenches are formed in the y-direction (e.g., the bit line direction) to form a plurality of parallel semiconductor walls 1305 in the y-direction. In some implementations, a lithography process is performed to pattern trenches and semiconductor walls 1305 using an etch mask (e.g., a photoresist mask and/or a hard mask), for example, based on the design of bit lines, and one or more dry etching and/or wet etching processes, such as RIE, are performed to etch trenches in semiconductor layer 1301. Thus, semiconductor wall 1305 extending vertically in semiconductor layer 1301 can be formed. Since semiconductor walls 1305 are formed by etching semiconductor layer 1301, semiconductor walls 1305 can have the same materials as semiconductor layer 1301. In some implementations, the plurality of parallel trenches are filled to form a plurality of parallel trench isolations 1304 by depositing a third dielectric layer, such as silicon oxide, by using one or more thin film deposition processes including, but not limited to, CVD, PVD, ALD, or any combination thereof. In some implementations, a planarization process, such as CMP, is performed to remove the excess third dielectric layer that is deposited beyond the top surface of semiconductor layer 1301. As a result, parallel semiconductor walls 1305 can be separated by trench isolations 1304. FIG. 13B and FIG. 13B' illustrate the plan view in the x-y plane) and the side view of a cross-section along the x-direction (the word line direction, e.g., along the AA' line), respectively.

Figure 13C:
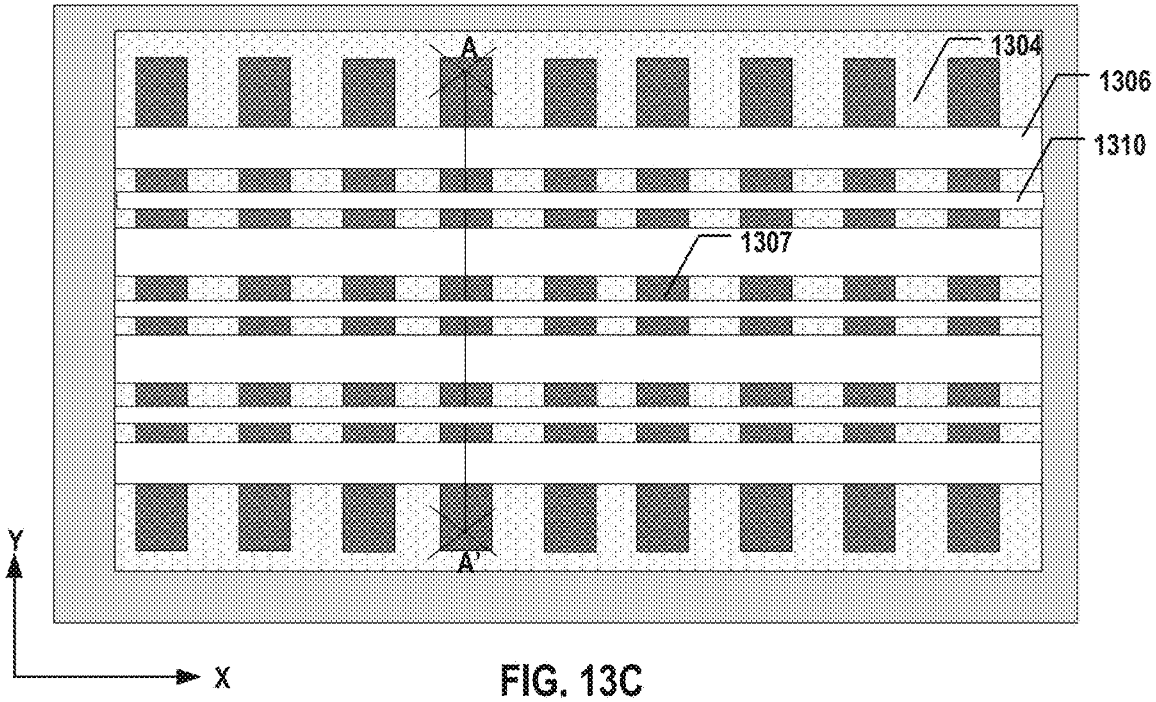
Figure 13C:
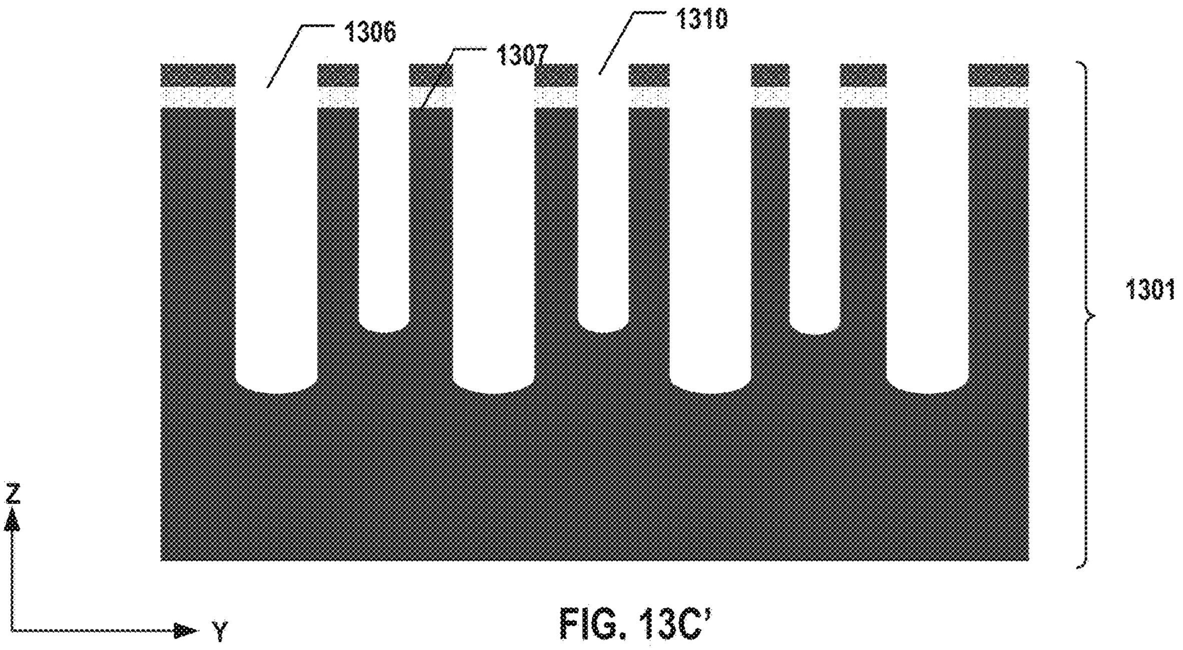

As illustrated in FIG. 13C and FIG. 13C', a plurality of grooves 1310 having a first depth and a plurality of first trenches 1306 having a second depth are formed in the x-direction (e.g., the word line direction) by using a single etching process such as Self-Aligned Double Pattern (SADP) process to form an array of semiconductor bodies 1307 each extending vertically in semiconductor layer 1301. Each semiconductor body 1307 extends in a vertical direction (e.g., the z-direction as shown in FIG. 13C'). Each semiconductor body 1307 has a first lateral dimension along a first lateral direction (e.g., the x-direction), and a second lateral dimension along a second lateral direction (e.g., the y-direction). The first lateral dimensions and second lateral dimensions of different semiconductor bodies 1307 are essentially the same (with errors within a margin of ±10%) along the x-direction and y-direction, respectively. In some implementations, the first depth is smaller than the second depth. In some implementations, each groove has a third lateral dimension along the second lateral direction (e.g., bit-line direction), each first trench has a fourth lateral dimension along the second lateral direction (e.g., bit-line direction), and the third lateral dimension is smaller than the fourth lateral dimension. In some implementations, a lithography process is performed to pattern first trenches 1306 and grooves 1310 to be perpendicular to trench isolations 1304 using an etch mask (e.g., a photoresist mask and/or a hard mask), for example, based on the design of word lines, and one or more dry etching and/or wet etching processes, such as RIE, are performed on semiconductor layer 1301 and trench isolation 1304 to etch first trenches 1306 and grooves 1310 in semiconductor layer 1301. As a result, semiconductor walls 1305 (shown in FIG. 13B) can be cut by first trenches 1306 and grooves 1310 to form an array of semiconductor bodies 1307 each extending vertically in semiconductor layer 1301. Since semiconductor bodies 1307 are formed by etching semiconductor layer 1301, semiconductor bodies 1307 can have the same materials as semiconductor layer 1301. FIG. 13C illustrates the plan view in the x-y plane, and FIG. 13C' illustrates the side view of a cross-section along the y-direction (the bit line direction).

At operation 1404 in FIG. 14, a sacrificial layer is formed in each first trench and each groove, an upper portion of the sacrificial layer in each groove is removed, and then a cap layer is formed on top of the remaining portion of the sacrificial layer in each groove.

Figure 13D:
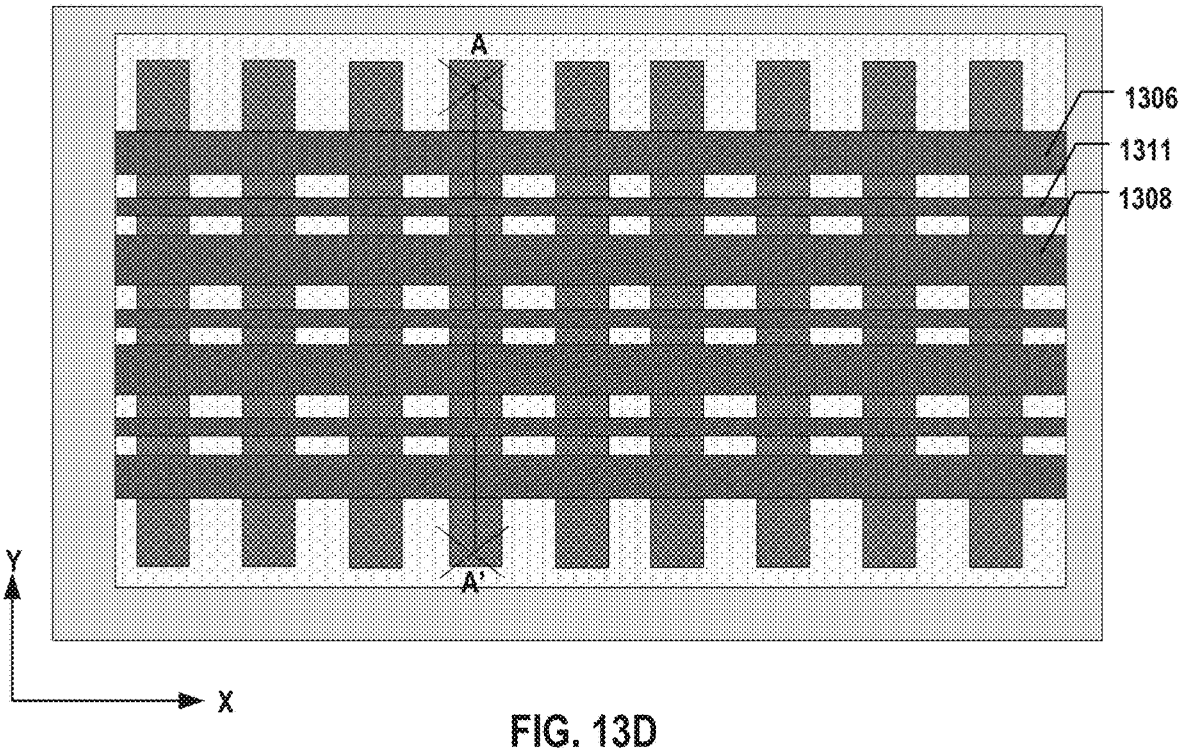
Figure 13D:
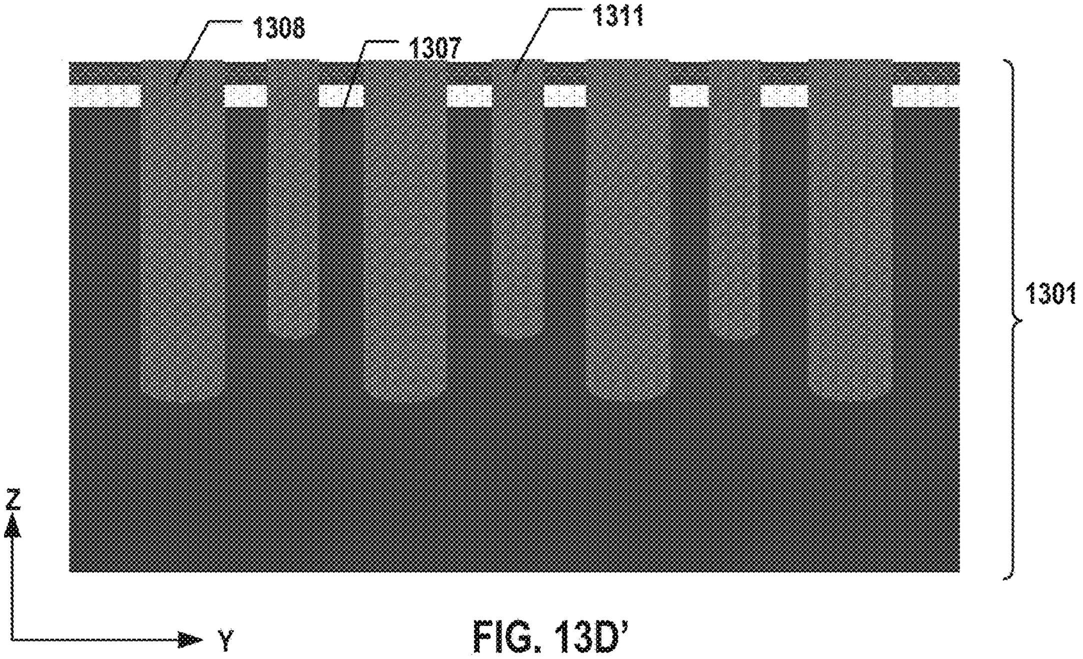

As illustrated in FIG. 13D and FIG. 13D', in some implementations, a sacrificial layer 1308 is formed in each first trench 1306 and each groove 1310, for example, by depositing a dielectric, such as silicon oxide, to fully fill each first trench 1306 and each groove 1310, using one or more thin film deposition processes including, but not limited to, CVD, PVD, ALD, or any combination thereof. In some implementations, sacrificial layer 1308 is formed in each first trench 1306 and fully fills each first trench 1306. In some implementations, each groove 1310 is fully filled with the sacrificial layer 1308 to form a plurality of spacers 1311. In some implementations, fully filling the first trenches 1306 and the grooves 1310 are performed in a single deposition process. In some implementations, a planarization process, such as CMP, is performed to remove the excess sacrificial layer that is deposited beyond the top surface of semiconductor layer 1301.

Figure 13E:
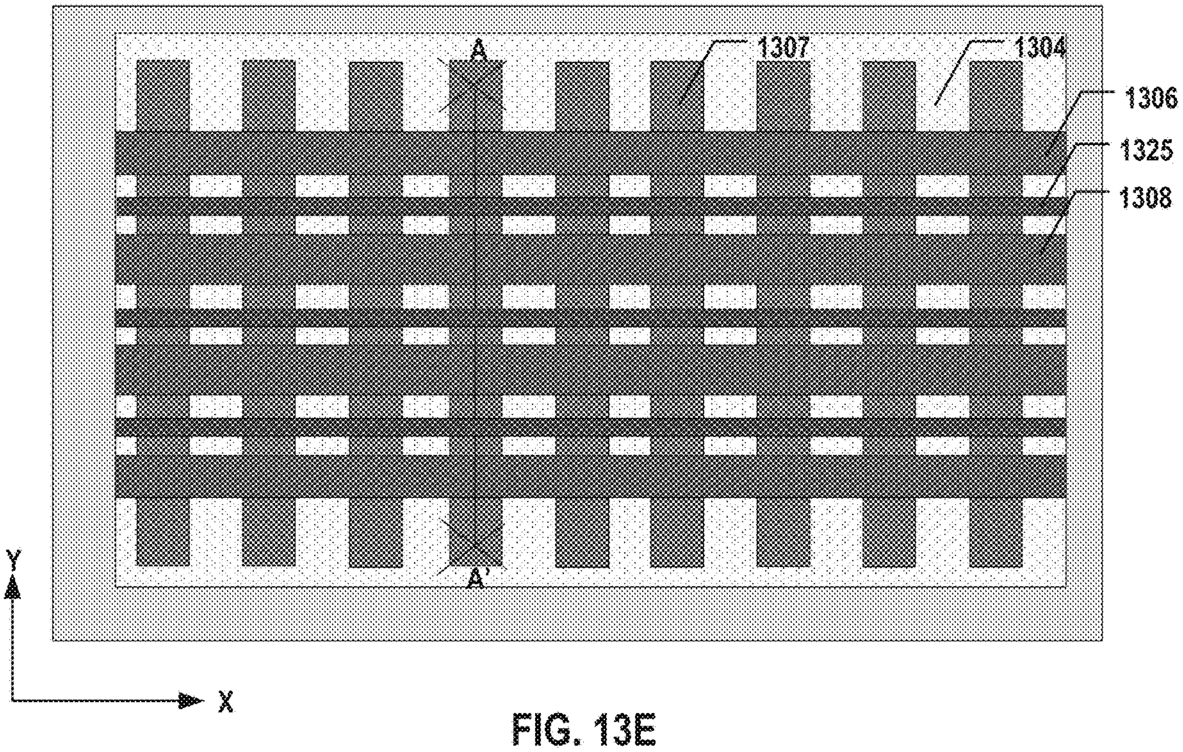
Figure 13E:
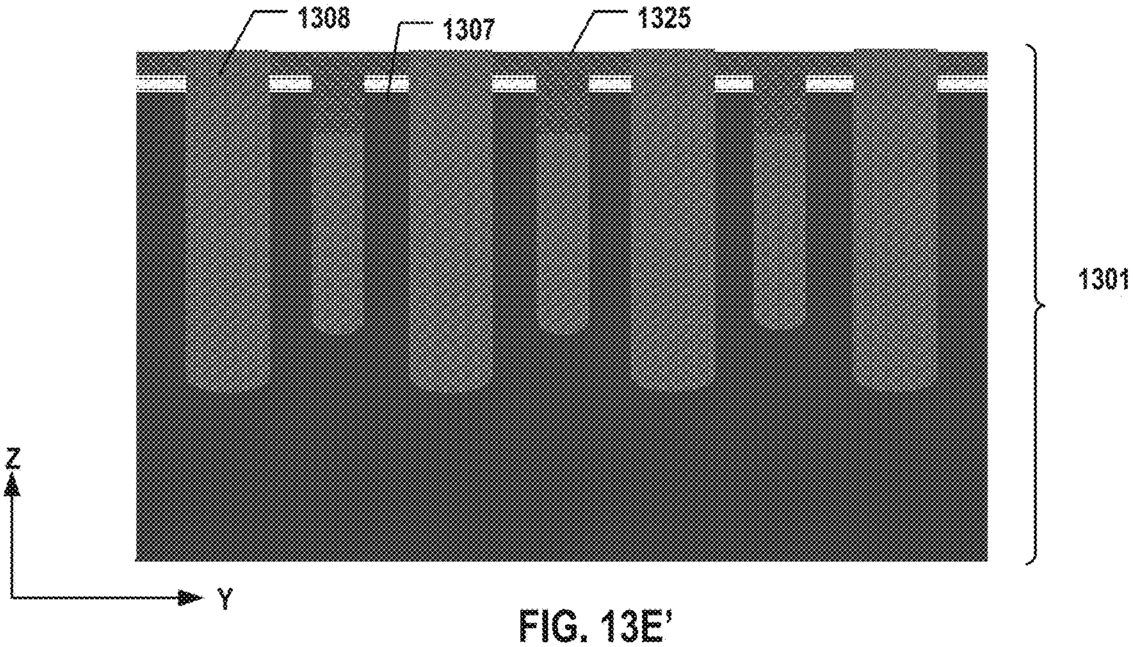

As illustrated in FIG. 13E and FIG. 13E', a cap layer 1325 is formed in grooves 1310. Sacrificial layer 1308 in first trenches 1306 is protected by depositing a protection layer (such as a photoresist or hard mask), while sacrificial layer 1308 in the upper portion of grooves 1310 is removed. In some implementations, a lithography process is performed to remove sacrificial layer 1308 inside spacers 1311 using an etch mask (e.g., a photoresist mask and/or a hard mask), and one or more dry etching and/or wet etching processes, such as RIE, are performed on spacers 1311 to etch away sacrificial layer 1308 in the upper portion of spacers 1311. Then, cap layer 1325 is deposited by using a dielectric, such as silicon nitride, using one or more thin film deposition processes including, but not limited to, CVD, PVD, ALD, or any combination thereof, to cover and protect the remaining sacrificial layer 1308 in grooves 1310.

At operation 1406 in FIG. 14, the sacrificial layer in each first trench is removed.

Figure 13F:
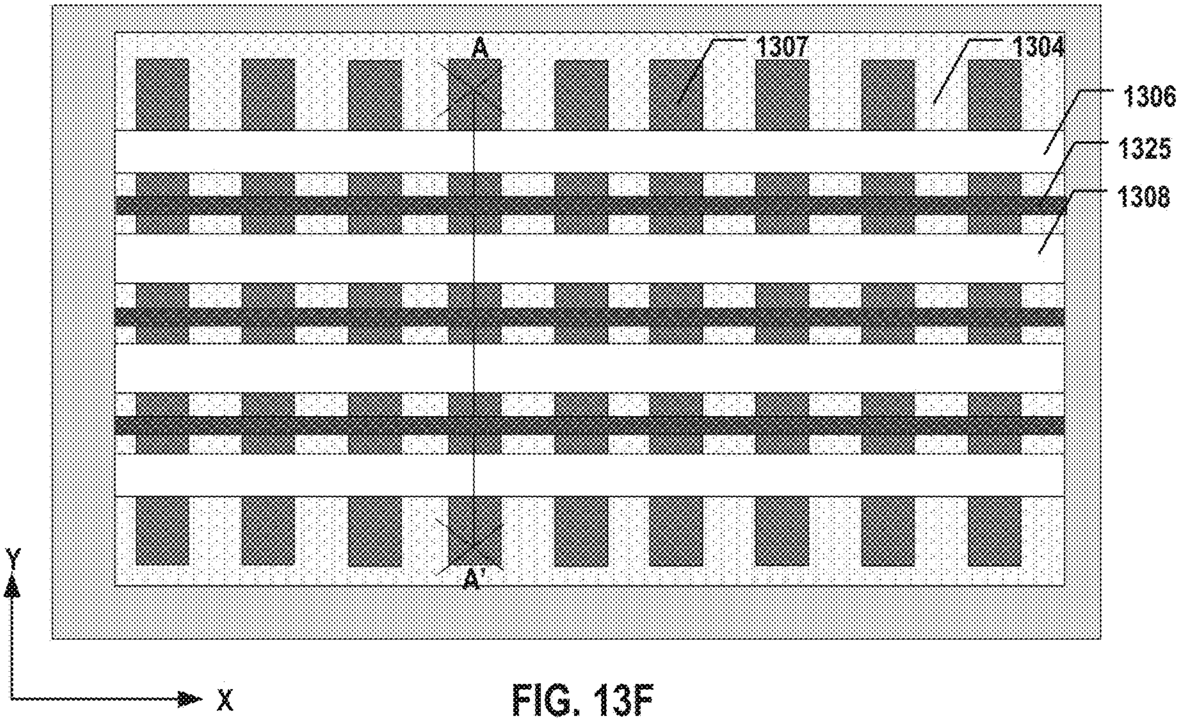
Figure 13F:
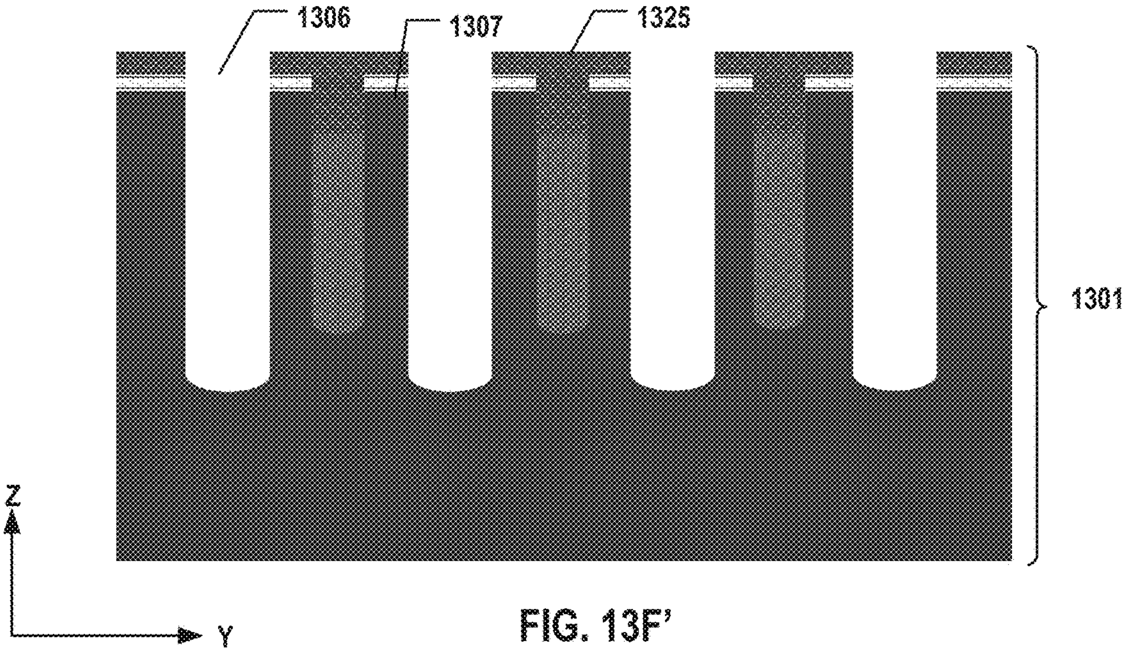

As illustrated in FIG. 13F and FIG. 13F', sacrificial layer 1308 in first trenches 1306 is removed. In some implementations, sacrificial layer 1308 in first trenches 1306 can be completely removed. To completely remove sacrificial layer 1308 in first trenches 1306, a lithography process is performed using an etch mask (e.g., a photoresist mask and/or a hard mask), or one or more dry etching and/or wet etching processes, such as RIE, are performed to etch away sacrificial layer 1308 in first trenches 1306.

At operation 1408 of FIG. 14, two disconnected conductive structures are formed in each first trench. The two disconnected conductive structures laterally extend along the first lateral direction, and each conductive structure vertically extends along one sidewall of a corresponding first trench.

Figure 13G:
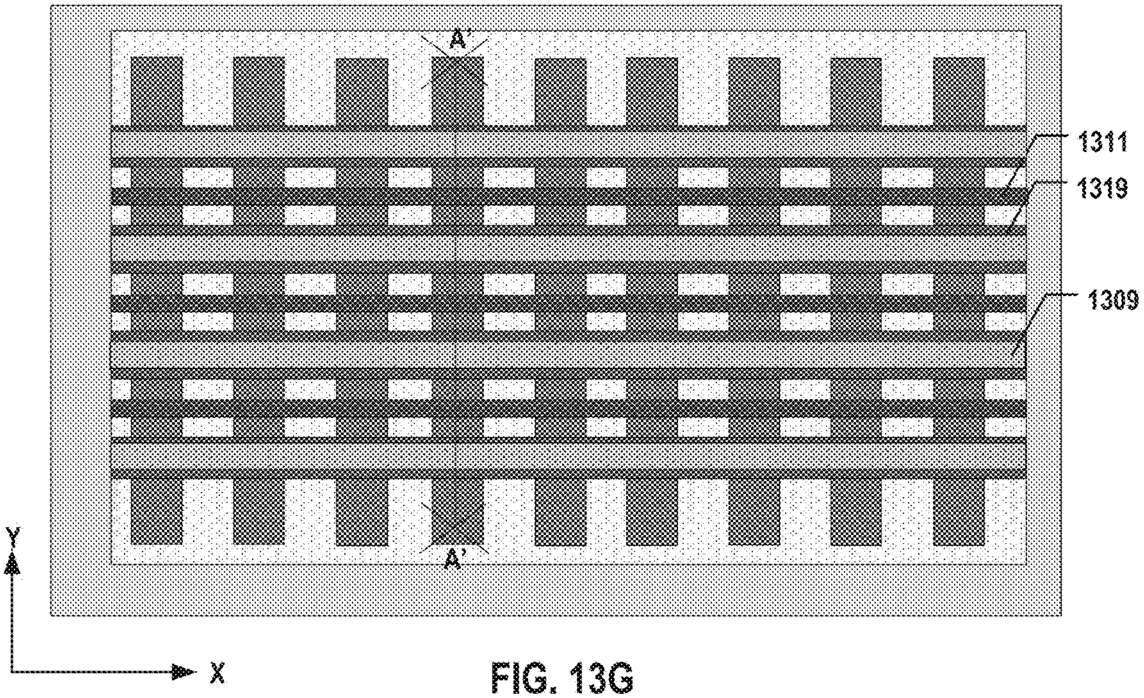
Figure 13G:
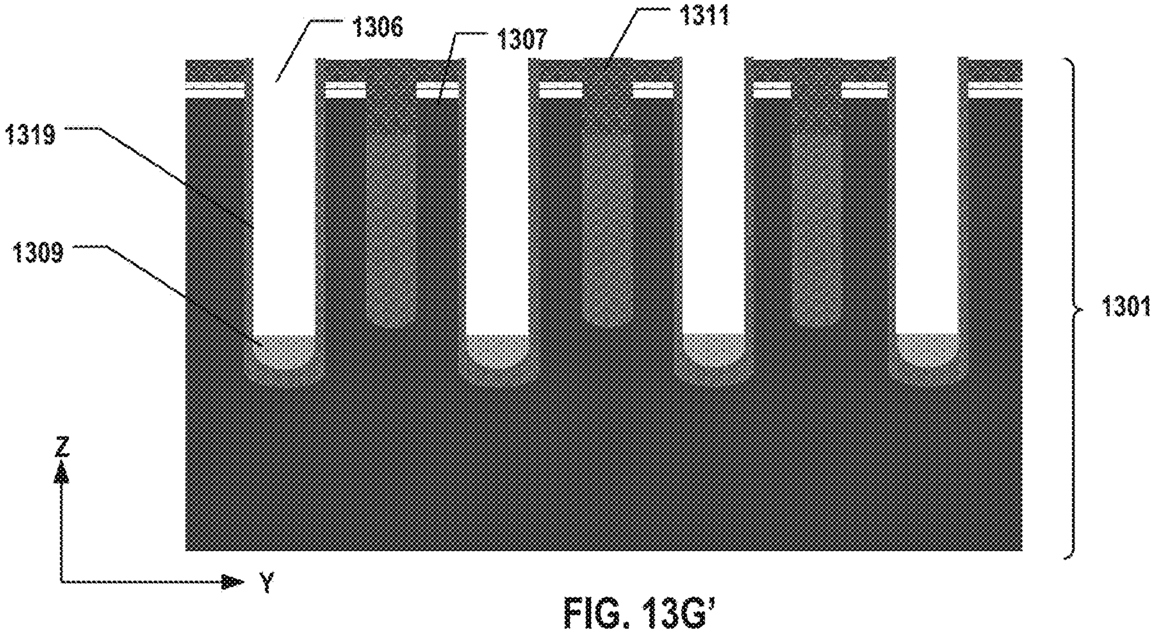

As illustrated in FIG. 13G and FIG. 13G', a dielectric layer 1309 is formed in each first trench 1306, for example, by depositing a dielectric, such as silicon oxide, to fill first trench 1306, using one or more thin film deposition processes including, but not limited to, CVD, PVD, ALD, or any combination thereof. In some implementations, a planarization process, such as CMP, is performed to remove excess dielectric layer 1309 that is deposited beyond the top surface of semiconductor layer 1301. In some implementations, before depositing dielectric layer 1309, a dielectric layer 1319 is deposited on the sidewalls of each first trench 1306 to partially fill each first trench 1306.

As illustrated in FIG. 13G and FIG. 13G', dielectric layer 1309 is back-etched such that the dielectric layer 1309 covers the bottom surface of each first trench 1306. In some implementations, a lithography process is performed to back-etch dielectric layer 1309 using an etch mask (e.g., a photoresist mask and/or a hard mask), or one or more dry etching and/or wet etching processes, such as RIE, are performed on dielectric layer 1309 until the back-etching reaches a third depth. FIG. 13G illustrates the plan view in the x-y plane, and FIG. 13G' illustrates the side view of a cross-section along the y-direction (the bit line direction).

Figure 13H:
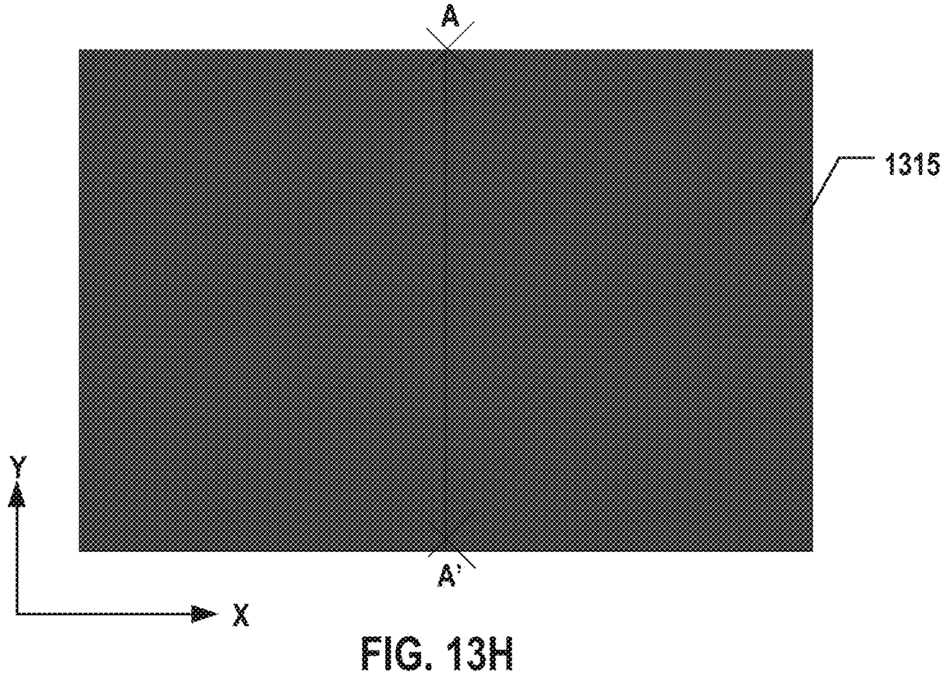
Figure 13H:
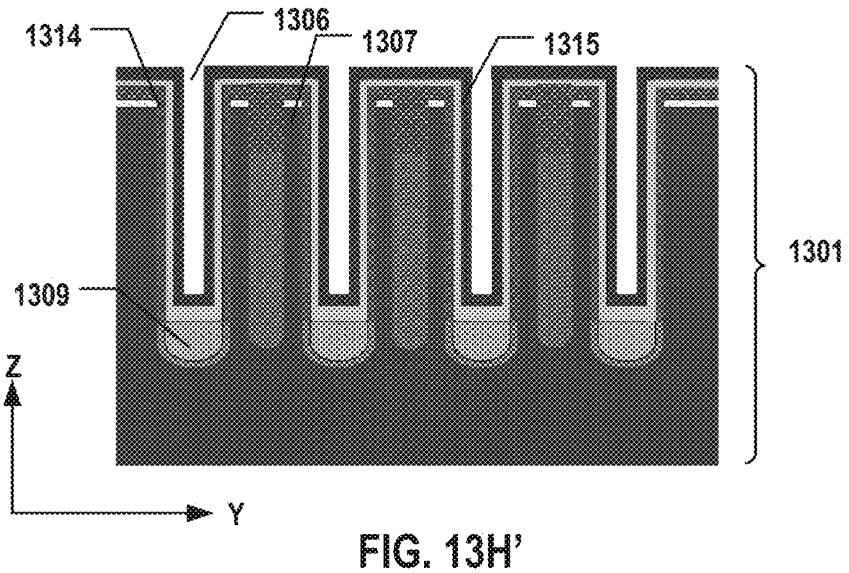

As illustrated in FIG. 13H and FIG. 13H', a gate dielectric layer 1314 is formed in each first trench 1306. Gate dielectric layer 1314 can be parts of a continuous dielectric layer formed over the sidewalls of each row of semiconductor bodies 1307. In some implementations, a wet oxidation and/or a dry oxidation process, such as in situ steam generation (ISSG) oxidation, is performed to form native oxide (e.g., silicon oxide) on the sidewalls of each first trench 1306. Then, one or more conductive layers 1315 are formed over gate dielectric layer 1314 in first trenches 1306. In some implementations, conductive layers 1315 are formed by depositing one or more conductive materials, such as metal and/or metal compounds (e.g., W and TiN), over gate dielectric layer 1314 using one or more thin film deposition processes including, but not limited to, CVD, PVD, ALD, or any combination thereof, to partially fill first trenches 1306. For example, layers of TiN and W may be sequentially deposited to form conductive layers 1315. A planarization process, e.g., CMP, can be performed to remove the excess conductive materials over the top surface of semiconductor layer 1301.

Figure 13I:
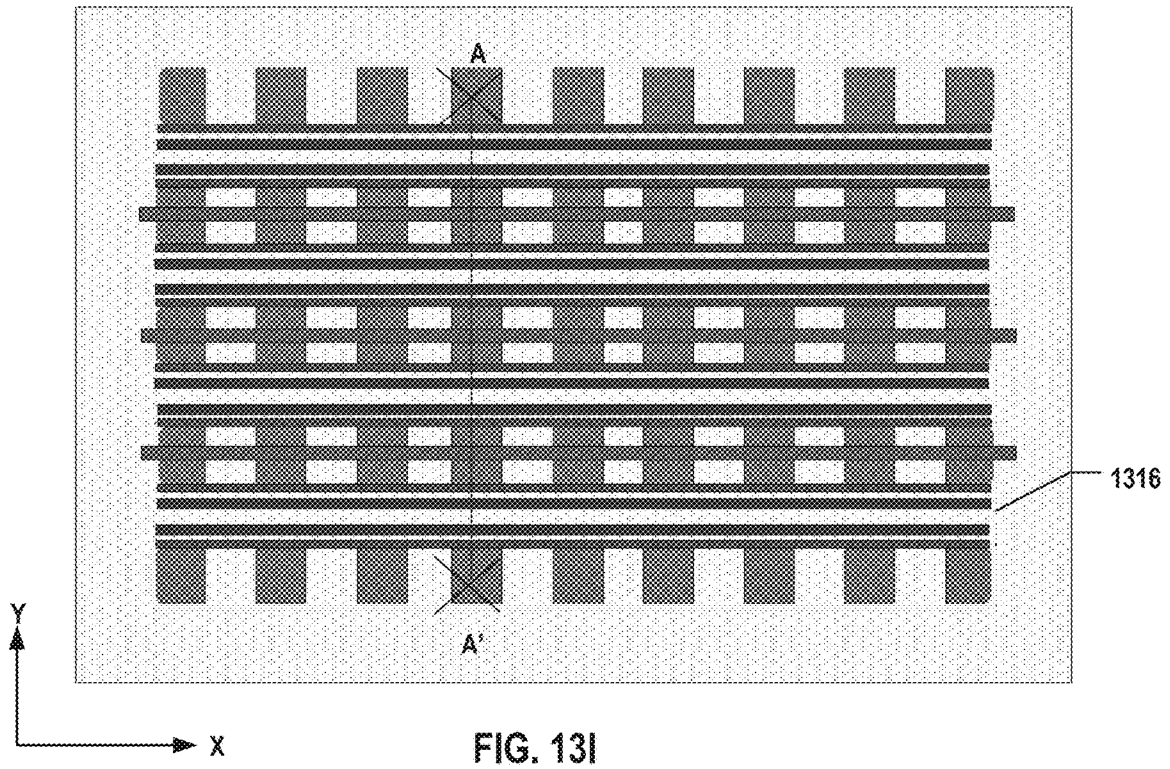
Figure 13I:
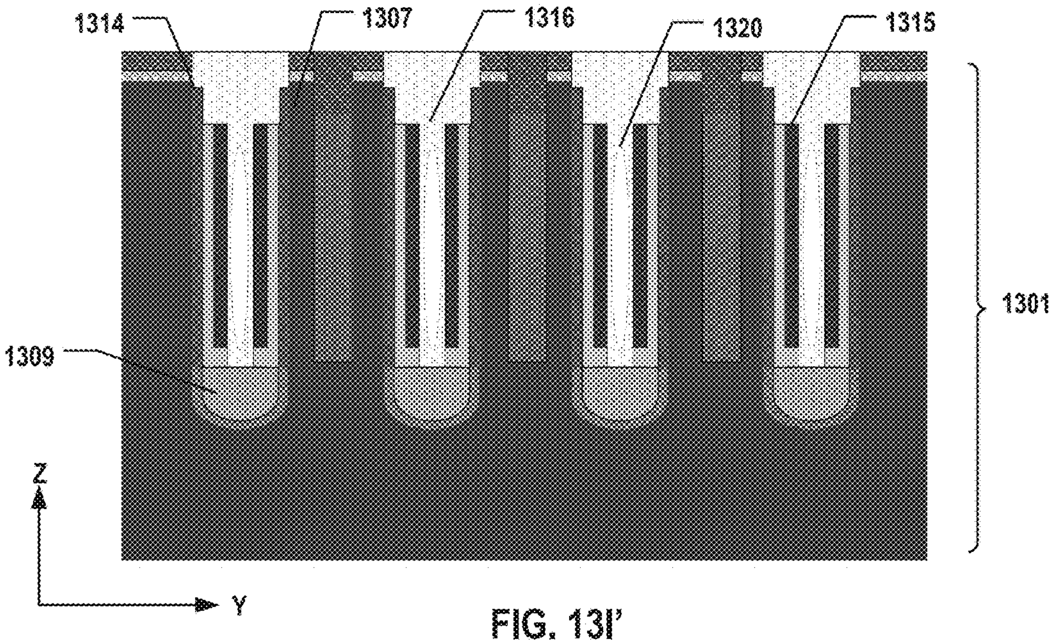

As illustrated in FIG. 13I and FIG. 13I', in some implementations, conductive layers 1315 are etched back, for example, using a punch-down etch, dry etch, and/or wet etch (e.g., RIE), to form two disconnected conductive structures in each first trench 1306. In some implementations, a bottom punch-down etching process is performed to each away some of the metals of conductive layer 1315 at the bottom of the first trench until exposing dielectric layer 1309. In some implementations, conductive layers 1315 are etched back to form dents, such that the upper ends of conductive layers 1315 are below the top surface of semiconductor bodies 1307. In some implementations, as gate dielectric layer 1314 is not etched, the upper ends of conductive layers 1315 are below the upper ends of gate dielectric layer 1314. As a result, etched-back conductive layers 1315 can become word lines each extending in the word line direction (the x-direction), and parts of etched-back conductive layers 1315 that are facing semiconductor bodies 1307 can become gate electrodes. Gate structures each including a respective gate dielectric layer 1314 and a respective gate electrode (e.g., part of conductive layer 1315) over gate dielectric layer 1314 can be formed thereby.

In some implementations, as shown in FIG. 13I and FIG. 13I', a dielectric layer 1316 is formed in the remaining space of first trenches 1306 as well as the dents resulted from etching back of conductive layers 1315, for example, by depositing a dielectric, such as silicon oxide, using one or more thin film deposition processes including, but not limited to, CVD, PVD, ALD, or any combination thereof. It is understood that depending on the pitches of the word lines (e.g., the dimension of first trenches 1306), airgaps 1320 may be formed in dielectric layer 1316.

Figure 13J:
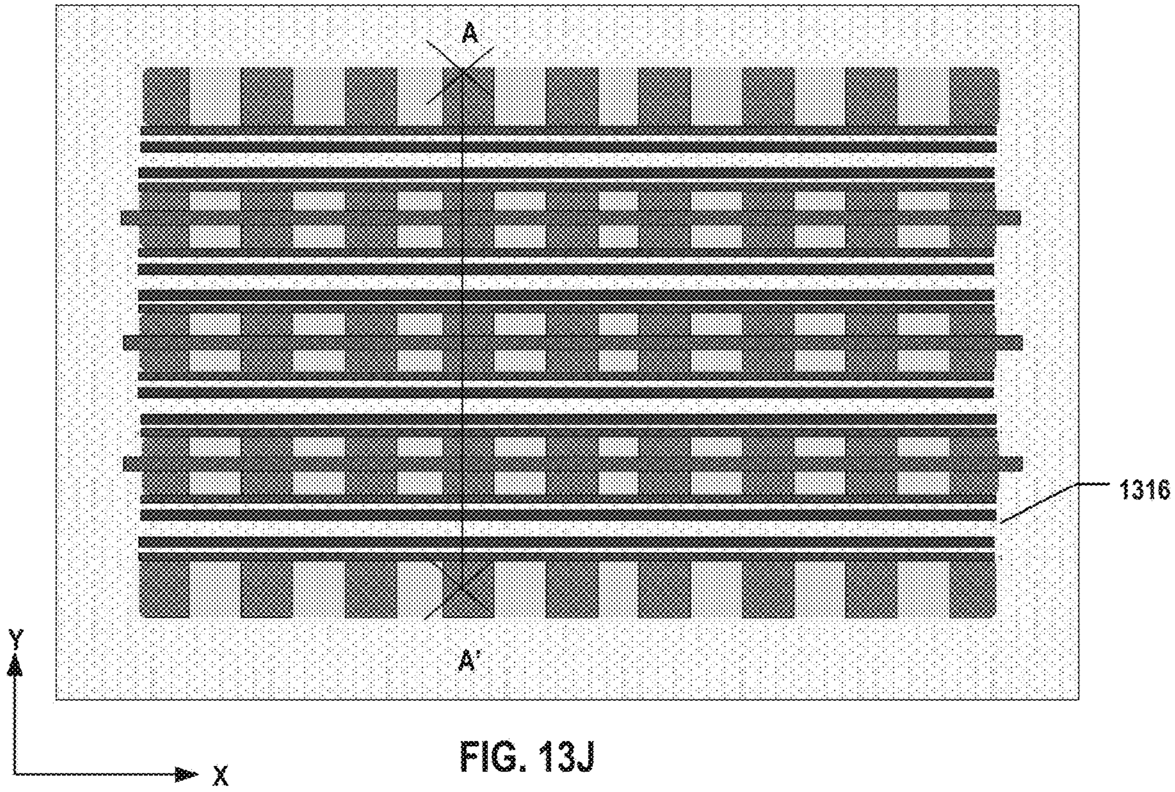
Figure 13J:
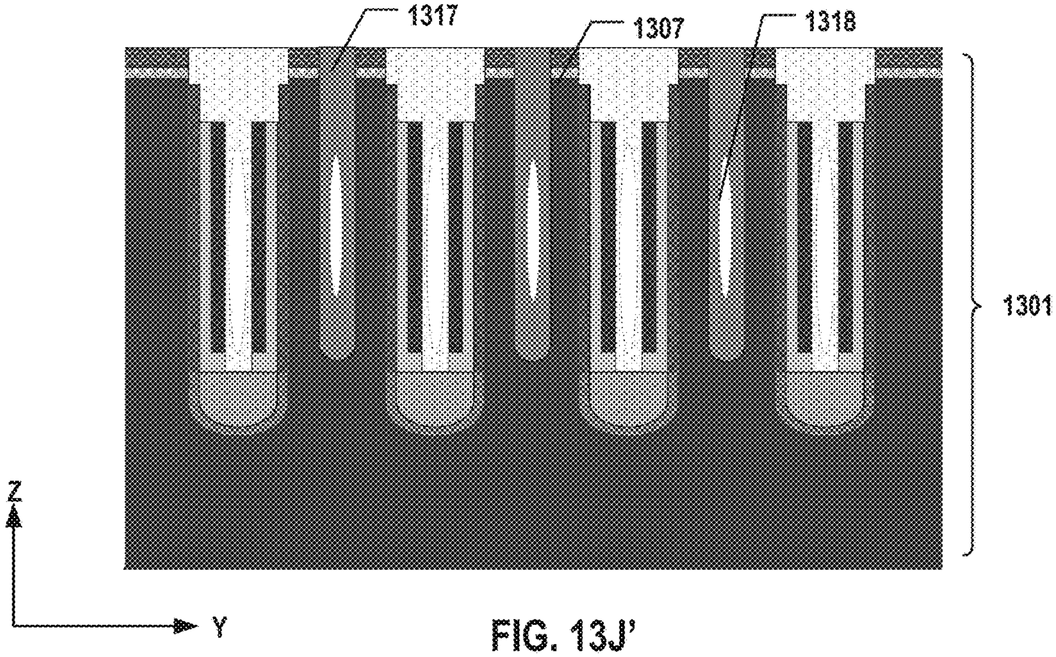

In some implementations, as shown in FIG. 13J and FIG. 13J', cap layer 1325 and sacrificial layer 1308 in spacers 1311 (as shown in FIG. 13D') are removed to form second trenches, and a dielectric layer is deposited to fill the second trenches. In some implementations, a lithography process is performed to remove cap layer 1325 and/or sacrificial layer inside spacers 1311 using an etch mask (e.g., a photoresist mask and/or a hard mask), and one or more dry etching and/or wet etching processes, such as ME, are performed on spacers 1311 to etch away cap layer 1325 and/or sacrificial layer 1308 and to form the second trenches. Second trench isolations 1317 are formed in second trenches, for example, by depositing a dielectric layer, such as silicon oxide, to fill second trenches, using one or more thin film deposition processes including, but not limited to, CVD, PVD, ALD, or any combination thereof. A planarization process can be performed to remove excess dielectric over the top surface of semiconductor layer 1301. It is understood that depending on the pitches of the semiconductor bodies 1307 (e.g., the dimension of second trenches), airgaps 1318 may be formed in second trench isolations 1317.

Figure 16:
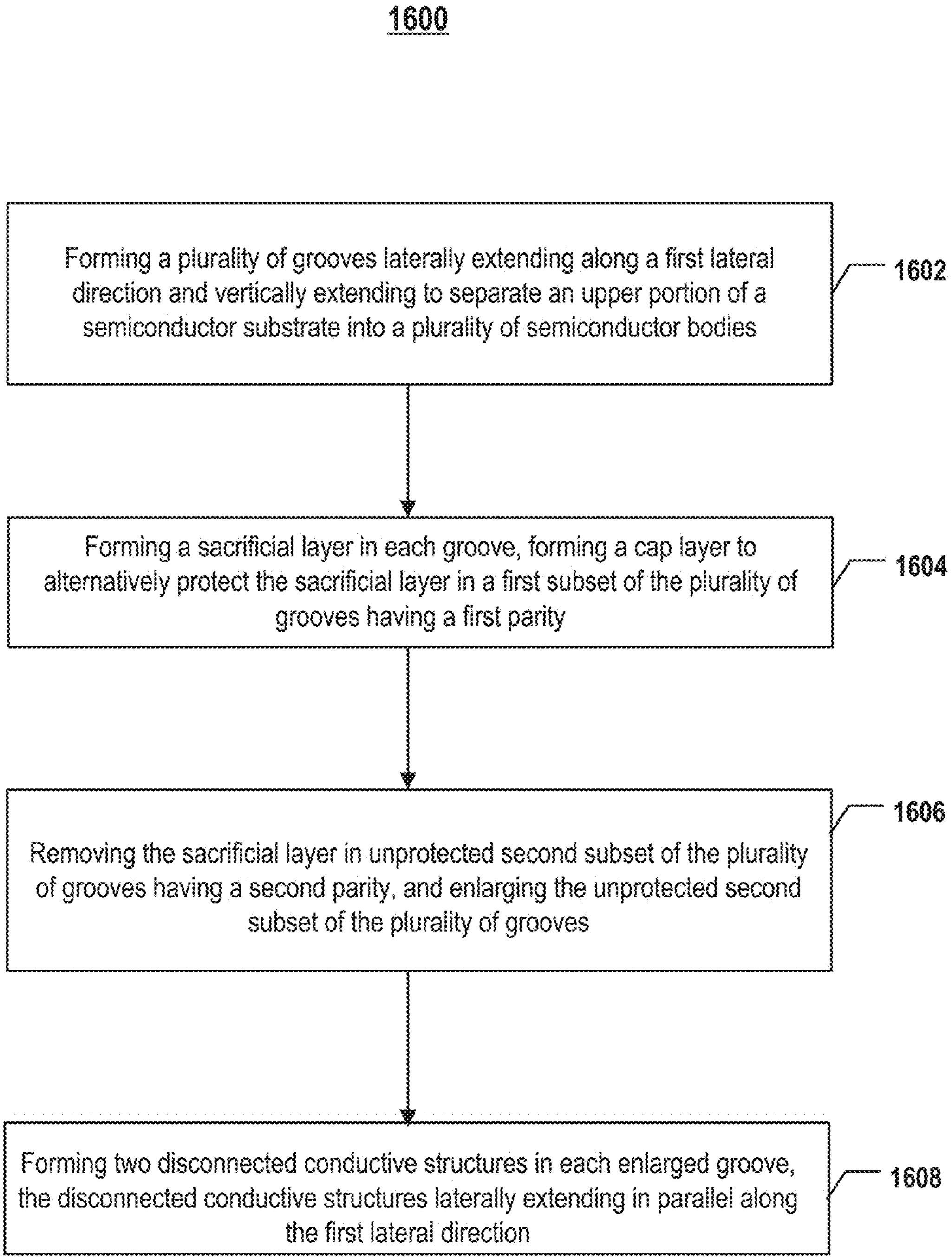
FIG. 16 illustrates a flowchart of yet another method for forming an array of memory cells each including a vertical transistor, according to some aspects of the present disclosure.

FIG. 16 illustrates a flowchart of a method 1600 for forming an array of memory cells each including a vertical transistor, according to some aspects of the present disclosure. At operation 1602 in FIG. 16, a plurality of grooves are formed in a semiconductor layer by using a single etch process. The plurality of grooves extend along a first lateral direction, and each groove vertically extends in an upper portion of a semiconductor layer. The plurality of grooves are arranged along a second lateral direction. The semiconductor layer can include a substrate, a first dielectric layer on the substrate, and a second dielectric layer on the first dielectric layer.

Figure 15A:
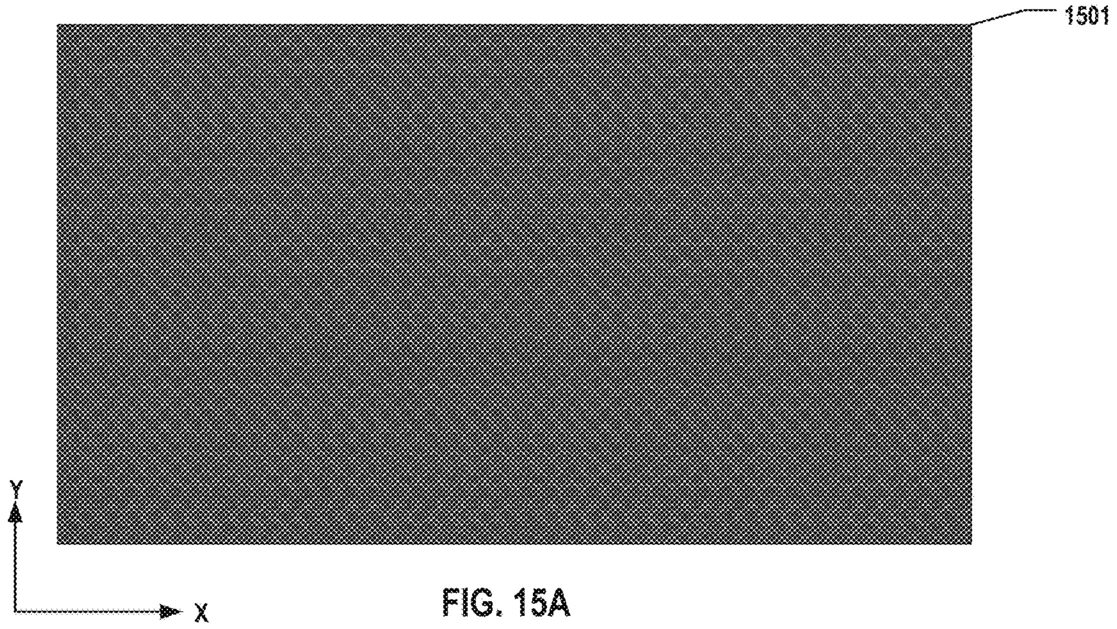
FIGS. 15A-15J and 15A'-15J' illustrate yet another fabrication process for forming a 3D memory device including vertical transistors, according to some aspects of the present disclosure.
Figure 15A:
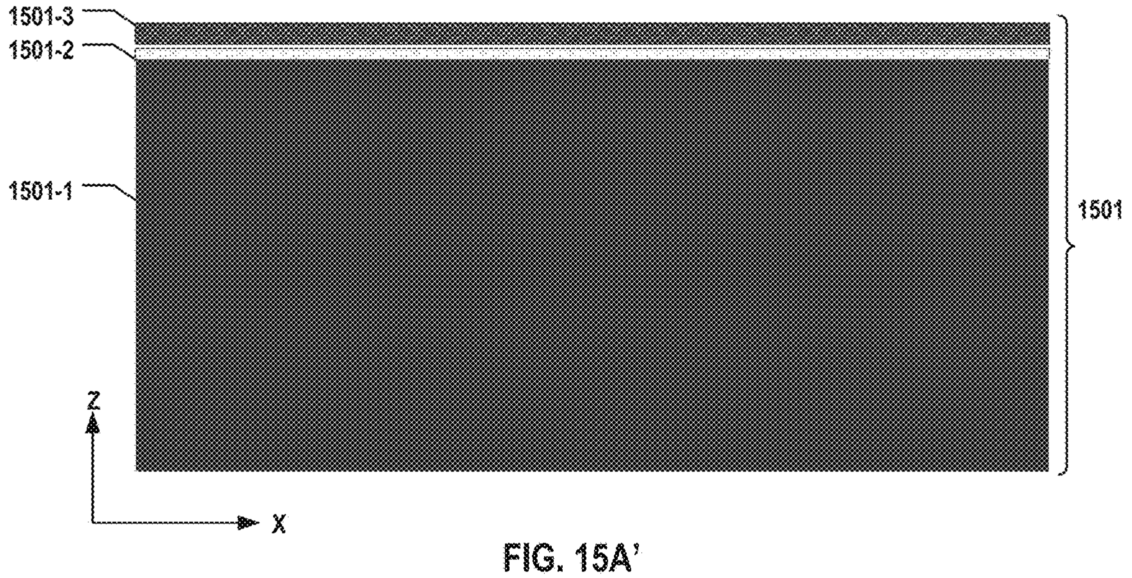

FIG. 15A and FIG. 15A' show a semiconductor layer 1501, including substrate 1501-1, first dielectric layer 1501-2 on top of the substrate 1501-1, and second dielectric layer 1501-3 on top of the first dielectric layer 1501-2. In some implementations, first dielectric layer 1501-2 and second dielectric layer 1501-3 are removed in subsequent processes, allowing the capacitor structure to be effectively connected to the source. FIG. 15A illustrates a plan view of semiconductor layer 1501, while FIG. 15A' illustrates a side view of semiconductor layer 1501. To form semiconductor layer 1501, silicon oxide and silicon nitride are subsequently deposited onto silicon substrate 1501-1 using one or more thin film deposition processes including, but not limited to, chemical vapor deposition (CVD), physical vapor deposition (PVD), atomic layer deposition (ALD), or any combination thereof. In some implementations, silicon oxide layer 1501-2 is formed by oxidizing the top portion of silicon substrate 1501-1 using dry oxidation and/or we oxidation, such as in situ steam generation (ISSG) oxidation process.

Figure 15B:
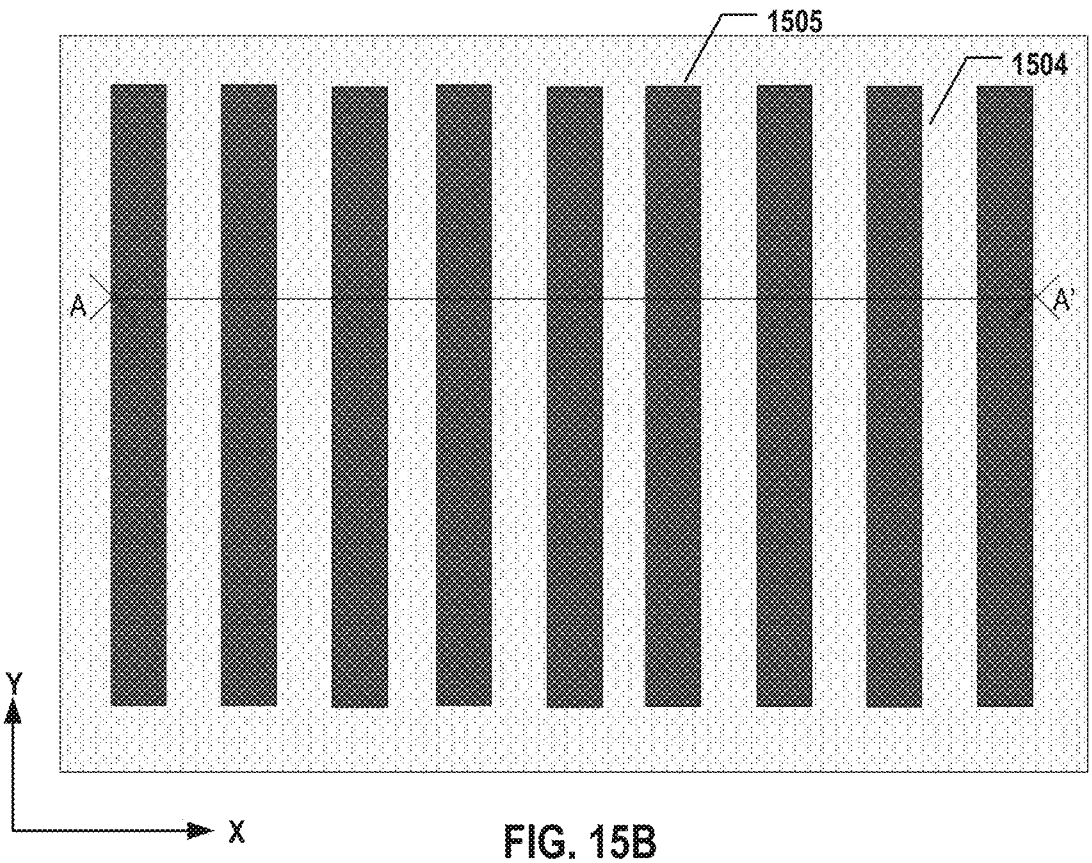
Figure 15B:
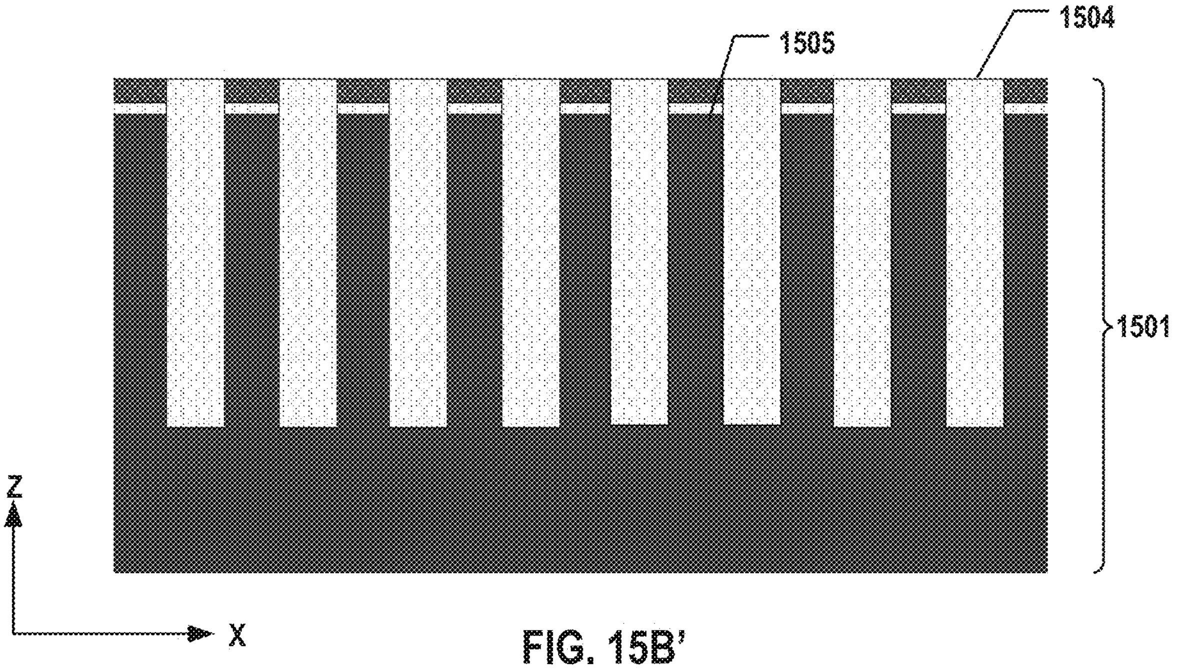

As illustrated in FIG. 15B and FIG. 15B', a plurality of parallel trenches are formed in the y-direction (e.g., the bit line direction) to form a plurality of parallel semiconductor walls 1505 in the y-direction. In some implementations, a lithography process is performed to pattern trenches and semiconductor walls 1505 using an etch mask (e.g., a photoresist mask and/or a hard mask), for example, based on the design of bit lines, and one or more dry etching and/or wet etching processes, such as RIE, are performed to etch trenches in semiconductor layer 1501. Thus, semiconductor wall 1505 extending vertically in semiconductor layer 1501 can be formed. Since semiconductor walls 1505 are formed by etching semiconductor layer 1501, semiconductor walls 1505 can have the same materials as semiconductor layer 1501. In some implementations, the plurality of parallel trenches are filled to form a plurality of parallel trench isolations 1504 by depositing a third dielectric layer, such as silicon oxide, by using one or more thin film deposition processes including, but not limited to, CVD, PVD, ALD, or any combination thereof. In some implementations, a planarization process, such as CMP, is performed to remove the excess third dielectric layer that is deposited beyond the top surface of semiconductor layer 1501. As a result, parallel semiconductor walls 1505 can be separated by trench isolations 1504. FIG. 15B and FIG. 15B' illustrate the plan view in the x-y plane) and the side view of a cross-section along the x-direction (the word line direction, e.g., along the AA' line), respectively.

Figure 15C:
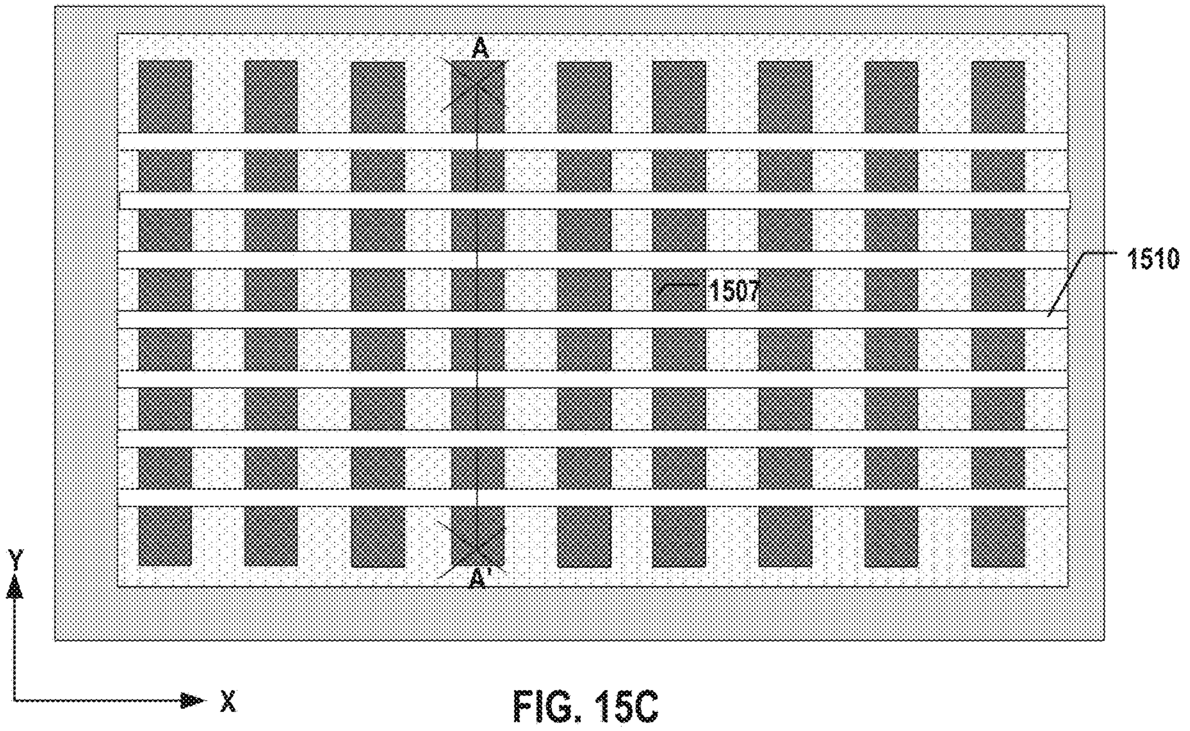
Figure 15C:
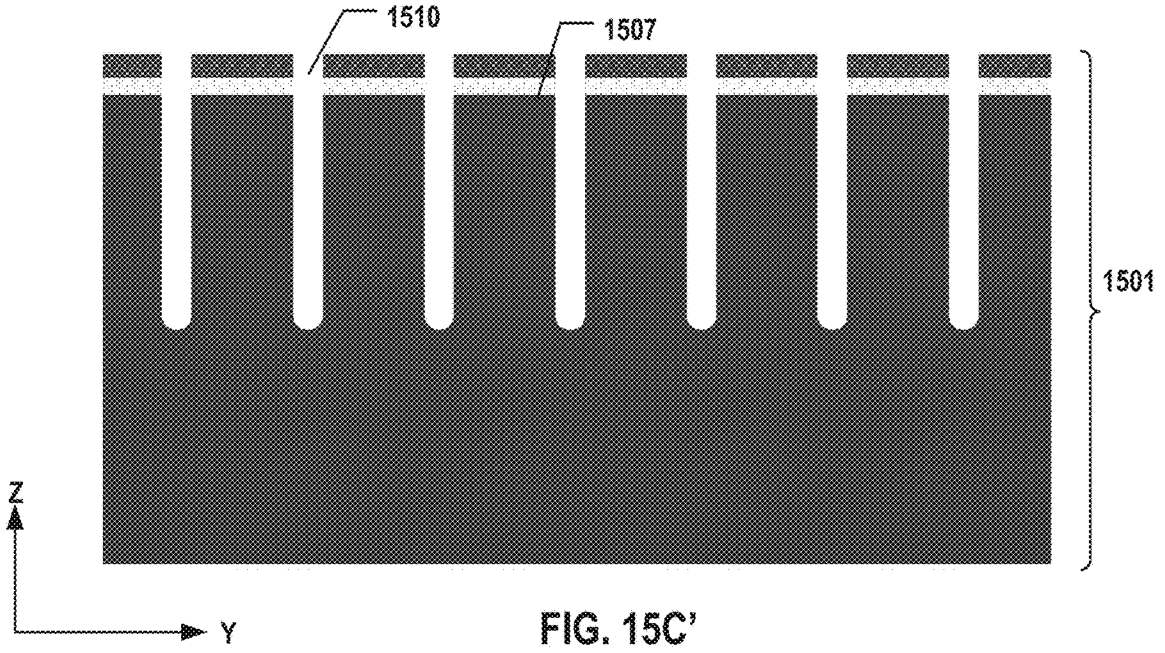

As illustrated in FIG. 15C and FIG. 15C', a plurality of grooves having a first depth and a first lateral dimension are formed in the x-direction (e.g., the word line direction) by using a single etching process such as Self-Aligned Double Pattern (SADP) process to form an array of semiconductor bodies 1507 each extending vertically in semiconductor layer 1501. Each semiconductor body 1507 extends in a vertical direction (e.g., the z-direction as shown in FIG. 15C'). Each semiconductor body 1507 has a first lateral dimension along a first lateral direction (e.g., the x-direction), and a second lateral dimension along a second lateral direction (e.g., the y-direction). The first lateral dimensions and second lateral dimensions of different semiconductor bodies 1507 are essentially the same (with errors within a margin of ±10%) along the x-direction and y-direction, respectively. In some implementations, a lithography process is performed to pattern grooves 1510 to be perpendicular to trench isolations 1504 using an etch mask (e.g., a photoresist mask and/or a hard mask), for example, based on the design of word lines, and one or more dry etching and/or wet etching processes, such as RIE, are performed on semiconductor layer 1501 and trench isolation 1504 to etch grooves 1510 in semiconductor layer 1501. As a result, semiconductor walls 1505 (shown in FIG. 15B) can be cut by grooves 1310 to form an array of semiconductor bodies 1507 each extending vertically in semiconductor layer 1501. Since semiconductor bodies 1507 are formed by etching semiconductor layer 1501, semiconductor bodies 1507 can have the same materials as semiconductor layer 1501. FIG. 15C illustrates the plan view in the x-y plane, and FIG. 15C' illustrates the side view of a cross-section along the y-direction (the bit line direction).

At operation 1604 in FIG. 16, a sacrificial layer is formed in each groove, and a cap layer is formed to alternatively protect the sacrificial layer in a first subset of the plurality of grooves having a first parity.

Figure 15D:
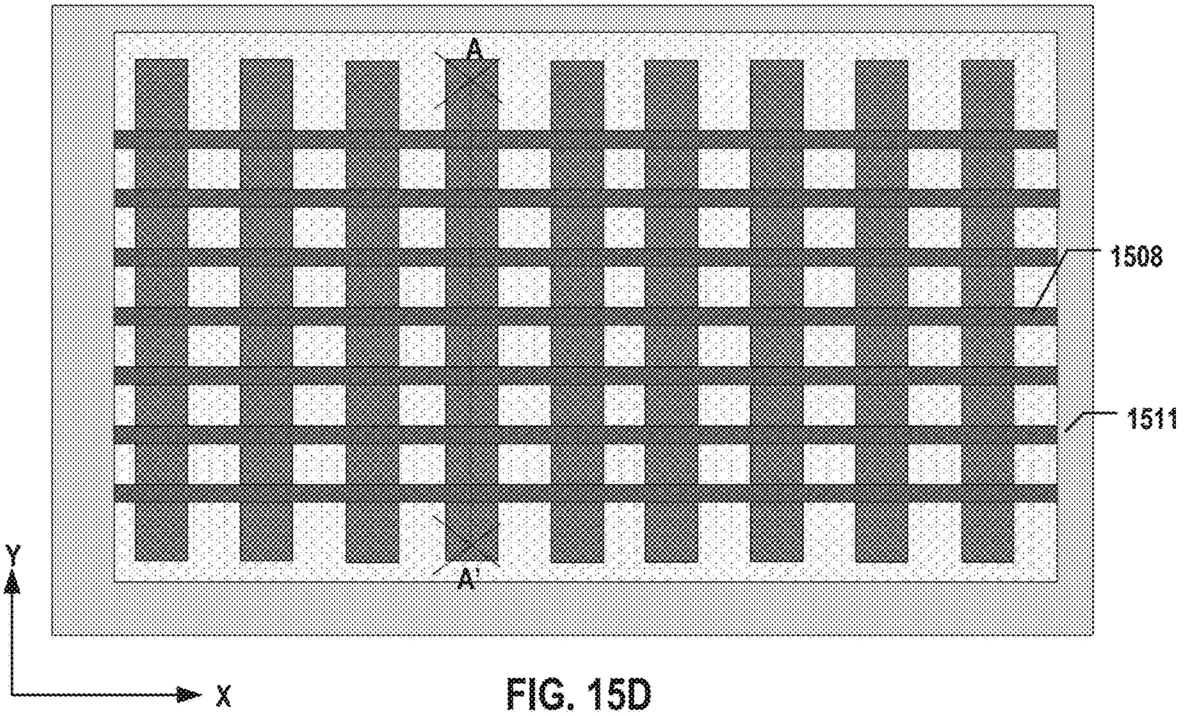
Figure 15D:
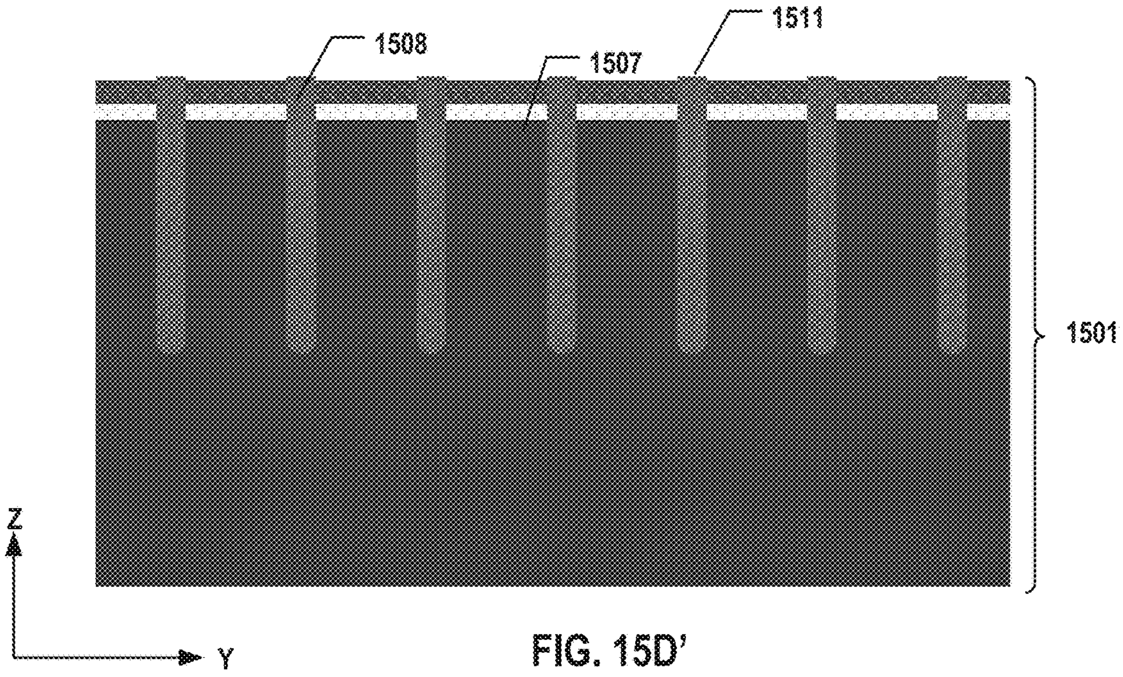

As illustrated in FIG. 15D and FIG. 15D', in some implementations, a sacrificial layer 1508 is formed in each groove 1510, for example, by depositing a dielectric, such as silicon oxide, to fully fill each groove 1510, using one or more thin film deposition processes including, but not limited to, CVD, PVD, ALD, or any combination thereof. In some implementations, each groove 1510 is fully filled with the sacrificial layer 1508 to form a plurality of spacers 1511. In some implementations, a planarization process, such as CMP, is performed to remove the excess sacrificial layer that is deposited beyond the top surface of semiconductor layer 1501.

Figure 15E:
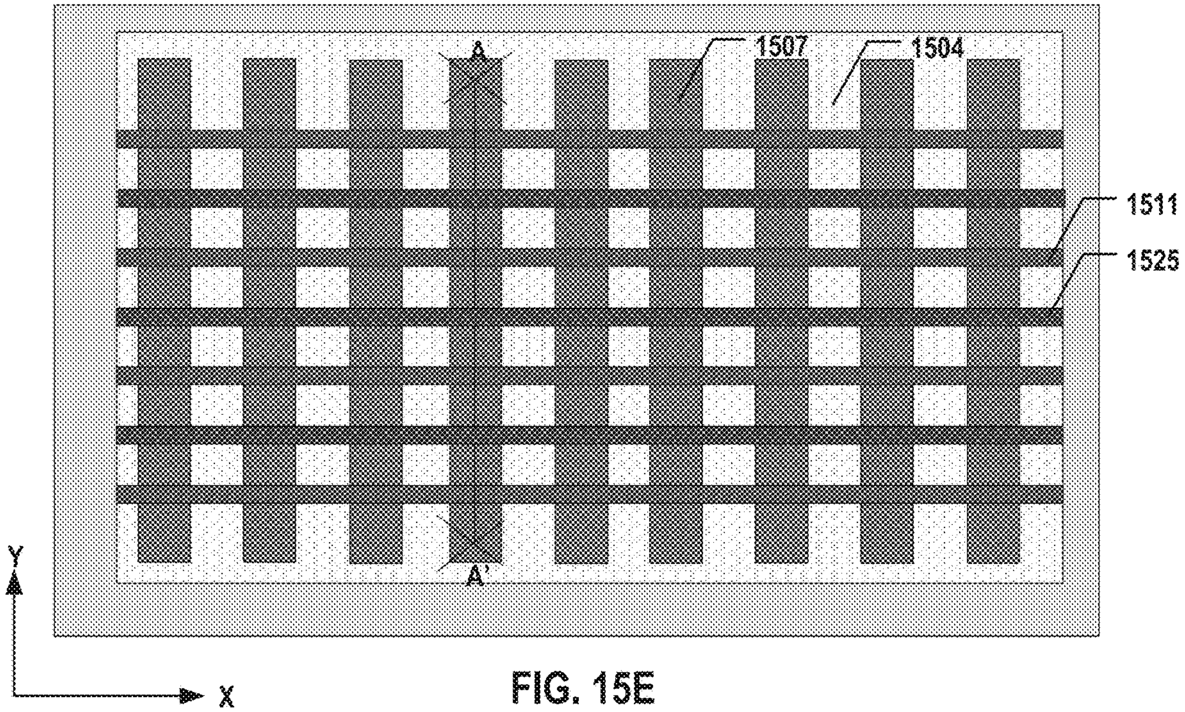
Figure 15E:
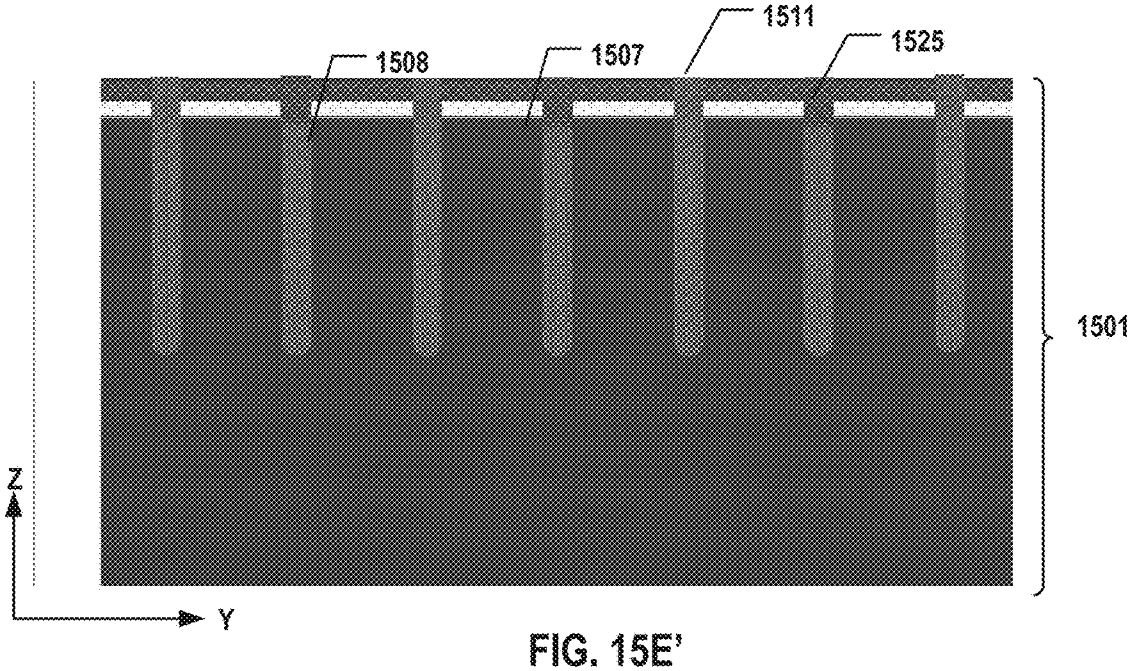

As illustrated in FIG. 15E and FIG. 15E', a cap layer 1525 is formed to alternatively cover sacrificial layer 1508 in a first subset of grooves 1510 having a first parity. In some implementations, a lithography process is performed to remove sacrificial layer 1508 in the upper portion of grooves 1510 having the first parity using an etch mask (e.g., a photoresist mask and/or a hard mask). In some implementations, one or more dry etching and/or wet etching processes, such as RIE, are performed on grooves 1510 having the first parity to etch away the sacrificial layer in the upper portion of spacers 1511. Then, the cap layer 1525 is deposited by using a dielectric, such as silicon nitride, using one or more thin film deposition processes including, but not limited to, CVD, PVD, ALD, or any combination thereof, to cover and protect the remaining sacrificial layer 1508 in grooves 1510 having the first parity.

At operation 1606 in FIG. 16, the sacrificial layer is an unprotected second subset of the plurality of grooves having a second parity is removed, and the unprotected second subset of the plurality of grooves are enlarged during removing the sacrificial layer.

Figure 15F:
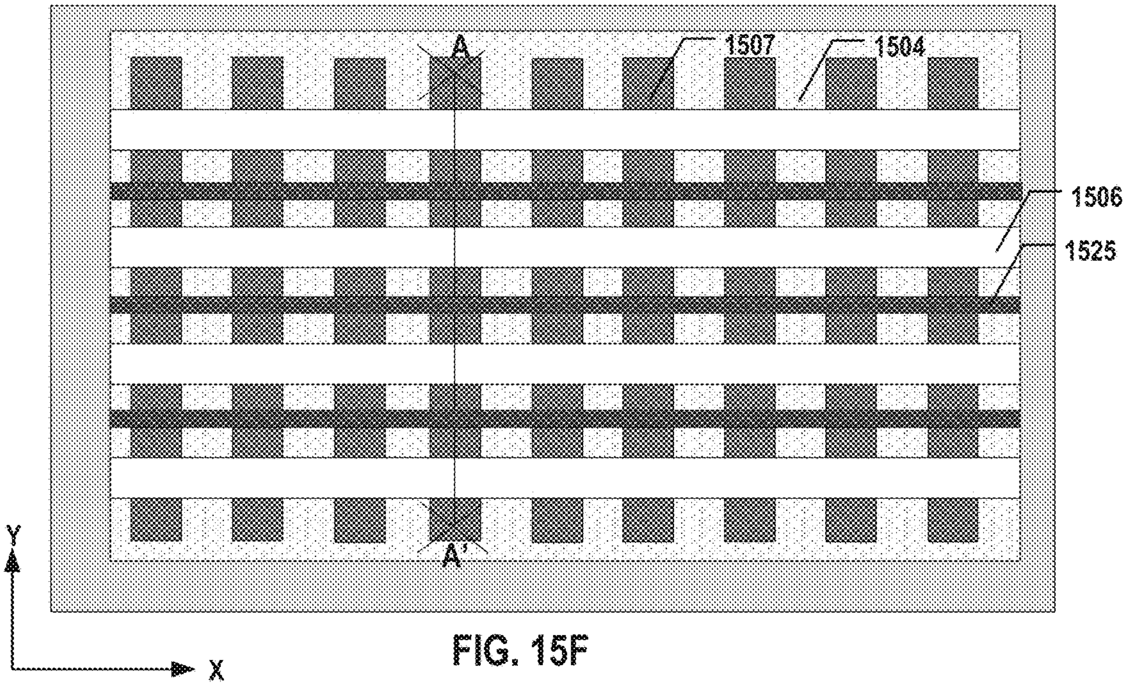
Figure 15F:
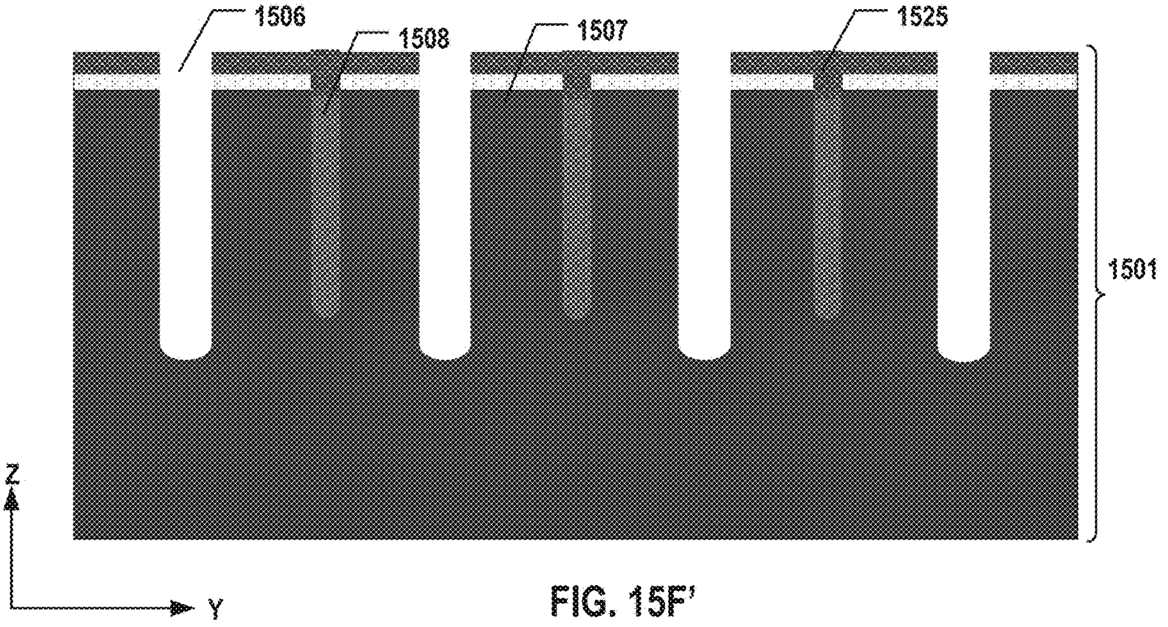

As illustrated in FIG. 15F and FIG. 15F', in some implementations, sacrificial layer 1508 in an unprotected second subset of the plurality of grooves 1510 having a second parity is completely removed. To completely remove sacrificial layer 1508 in grooves 1510 having the second parity, a lithography process is performed using an etch mask (e.g., a photoresist mask and/or a hard mask), or one or more dry etching and/or wet etching processes, such as RIE, are performed to etch away sacrificial layer 1508 in unprotected grooves 1510 having the second parity. In some implementations, during removing sacrificial layer 1508, the unprotected second subset of the plurality of grooves 1510 is enlarged and deepened to form a plurality of first trenches 1506 having a second depth and a second lateral dimension.

At operation 1608 of FIG. 16, two disconnected conductive structures are formed in each first trench. The two disconnected conductive structures laterally extend along the first lateral direction, and each conductive structure vertically extends along one sidewall of a corresponding first trench.

Figure 15G:
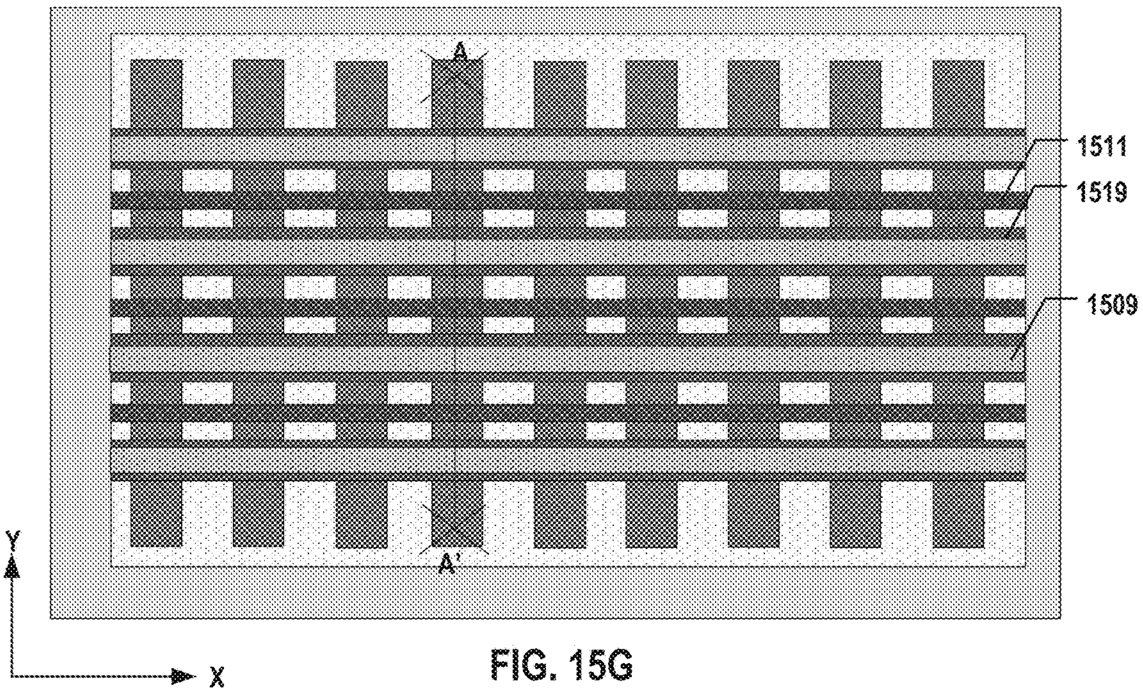
Figure 15G:
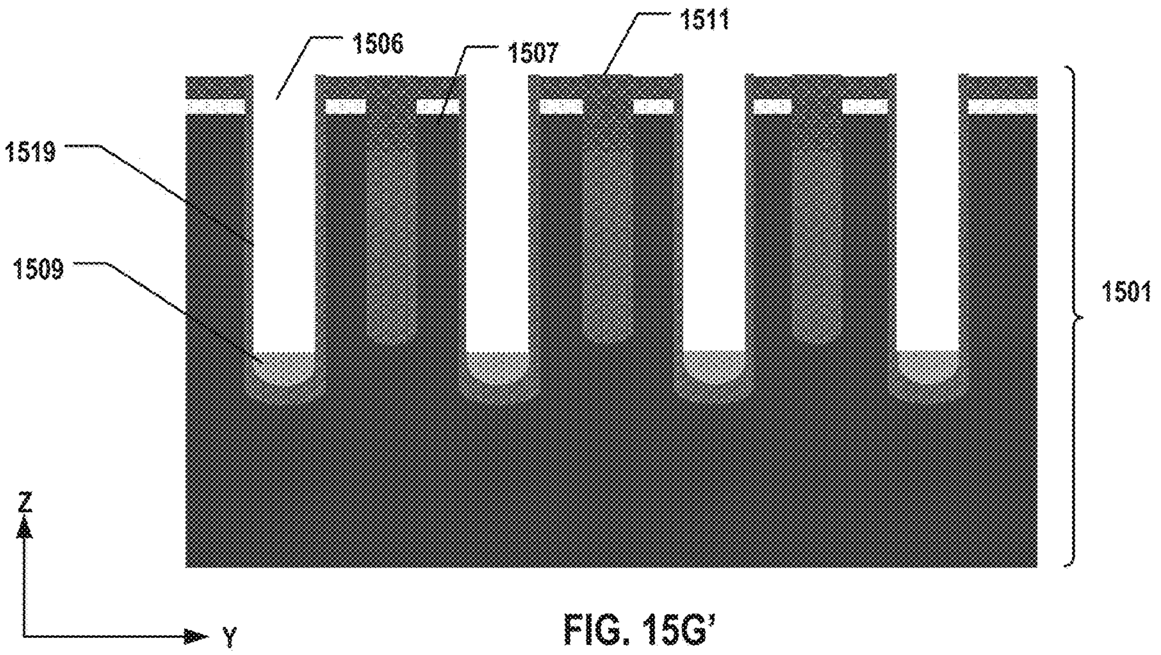

As illustrated in FIG. 15G and FIG. 15G', a dielectric layer 1509 is formed in each first trench 1506, for example, by depositing a dielectric, such as silicon oxide, to fill first trench 1506, using one or more thin film deposition processes including, but not limited to, CVD, PVD, ALD, or any combination thereof. In some implementations, a planarization process, such as CMP, is performed to remove excess dielectric layer 1509 that is deposited beyond the top surface of semiconductor layer 1501. In some implementations, before depositing dielectric layer 1509, a dielectric layer 1519 is deposited on the sidewalls of each first trench 1506 to partially fill each first trench 1506.

As illustrated in FIG. 15G and FIG. 15G', dielectric layer 1509 is back-etched such that the dielectric layer 1509 covers the bottom surface of each first trench 1506. In some implementations, a lithography process is performed to back-etch dielectric layer 1509 using an etch mask (e.g., a photoresist mask and/or a hard mask), or one or more dry etching and/or wet etching processes, such as RIE, are performed on dielectric layer 1509 until the back-etching reaches a third depth. FIG. 15G illustrates the plan view in the x-y plane, and FIG. 15G' illustrates the side view of a cross-section along the y-direction (the bit line direction).

At operation 1608 of FIG. 16, two disconnected conductive structures are formed in each first trench. The two disconnected conductive structures laterally extend along the first lateral direction, and each conductive structure vertically extends along one sidewall of a corresponding first trench.

Figure 15H:
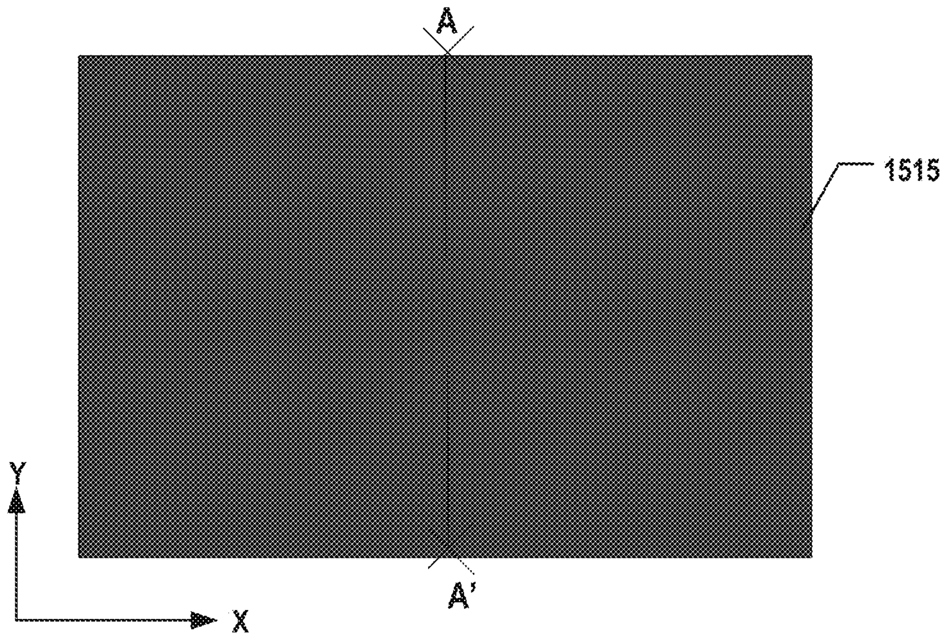
Figure 15H:
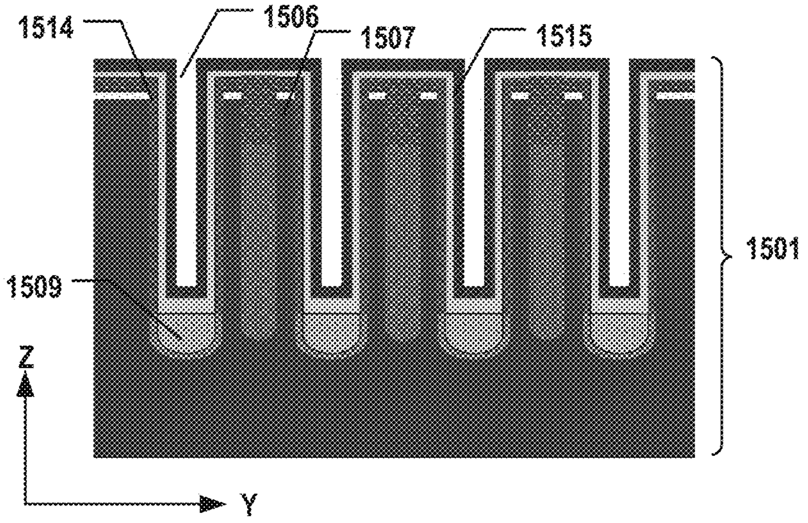

As illustrated in FIG. 15H and FIG. 15H', a gate dielectric layer 1514 is formed in each first trench 1506. Gate dielectric layer 1514 can be parts of a continuous dielectric layer formed over the sidewalls of each row of semiconductor bodies 1507. In some implementations, a wet oxidation and/or a dry oxidation process, such as in situ steam generation (ISSG) oxidation, is performed to form native oxide (e.g., silicon oxide) on the sidewalls of each first trench 1506. Then, one or more conductive layers 1515 are formed over gate dielectric layer 1514 in first trenches 1506. In some implementations, conductive layers 1515 are formed by depositing one or more conductive materials, such as metal and/or metal compounds (e.g., W and TiN), over gate dielectric layer 1514 using one or more thin film deposition processes including, but not limited to, CVD, PVD, ALD, or any combination thereof, to partially fill first trenches 1506. For example, layers of TiN and W may be sequentially deposited to form conductive layers 1515. A planarization process, e.g., CMP, can be performed to remove the excess conductive materials over the top surface of semiconductor layer 1501.

Figure 15I:
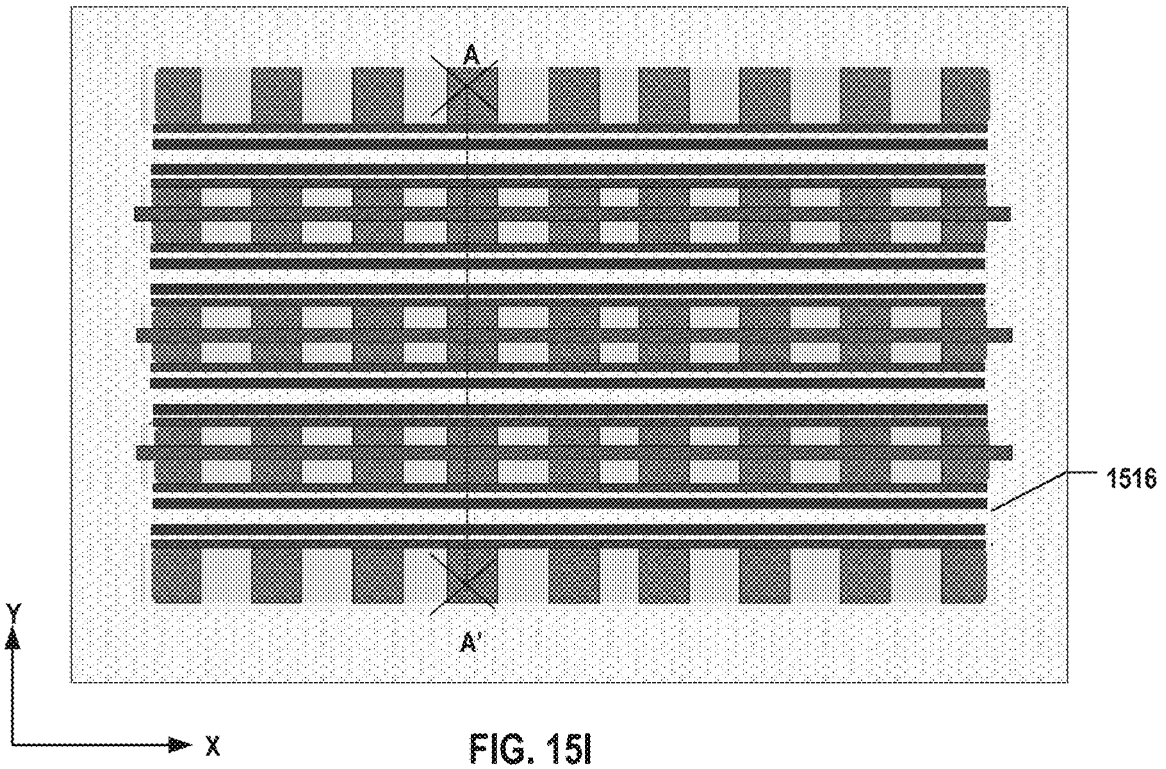
Figure 15I:
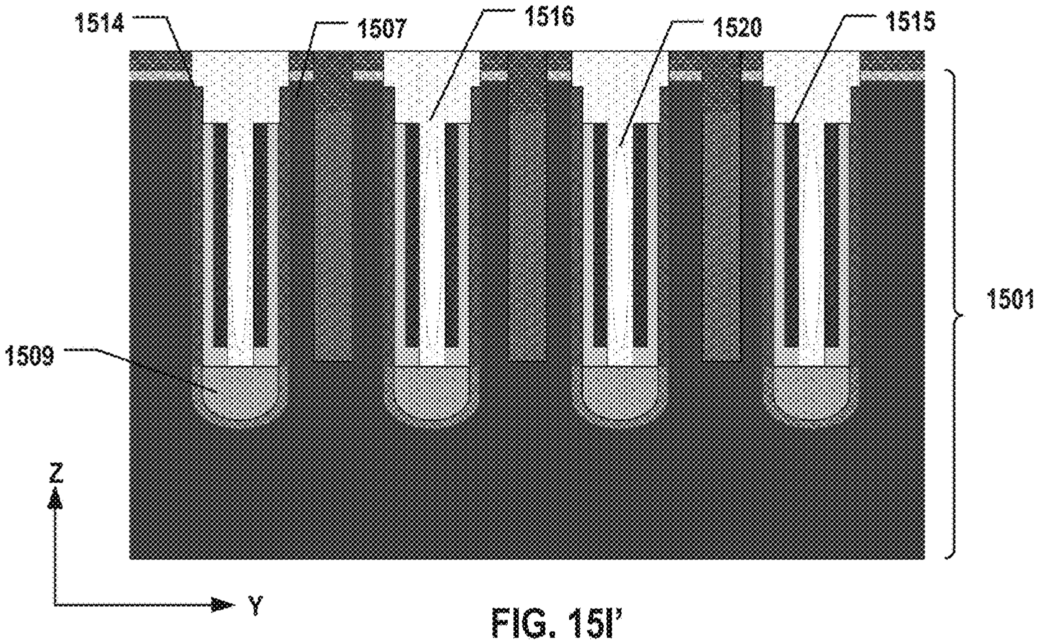

As illustrated in FIG. 15I and FIG. 15I', in some implementations, conductive layers 1515 are etched back, for example, using a punch-down etch, dry etch, and/or wet etch (e.g., RIE), to form two disconnected conductive structures in each first trench 1506. In some implementations, a bottom punch-down etching process is performed to each away some of the metals of conductive layer 1515 at the bottom of the first trench until exposing dielectric layer 1509. In some implementations, conductive layers 1515 are etched back to form dents, such that the upper ends of conductive layers 1515 are below the top surface of semiconductor bodies 1507. In some implementations, as gate dielectric layer 1514 is not etched, the upper ends of conductive layers 1515 are below the upper ends of gate dielectric layer 1514. As a result, etched-back conductive layers 1515 can become word lines each extending in the word line direction (the x-direction), and parts of etched-back conductive layers 1515 that are facing semiconductor bodies 1507 can become gate electrodes. Gate structures each including a respective gate dielectric layer 1514 and a respective gate electrode (e.g., part of conductive layer 1515) over gate dielectric layer 1514 can be formed thereby.

In some implementations, as shown in FIG. 15I and FIG. 15I', a dielectric layer 1516 is formed in the remaining space of first trenches 1506 as well as the dents resulted from etching back of conductive layers 1515, for example, by depositing a dielectric, such as silicon oxide, using one or more thin film deposition processes including, but not limited to, CVD, PVD, ALD, or any combination thereof. It is understood that depending on the pitches of the word lines (e.g., the dimension of first trenches 1506), airgaps 1520 may be formed in dielectric layer 1516.

Figure 15J:
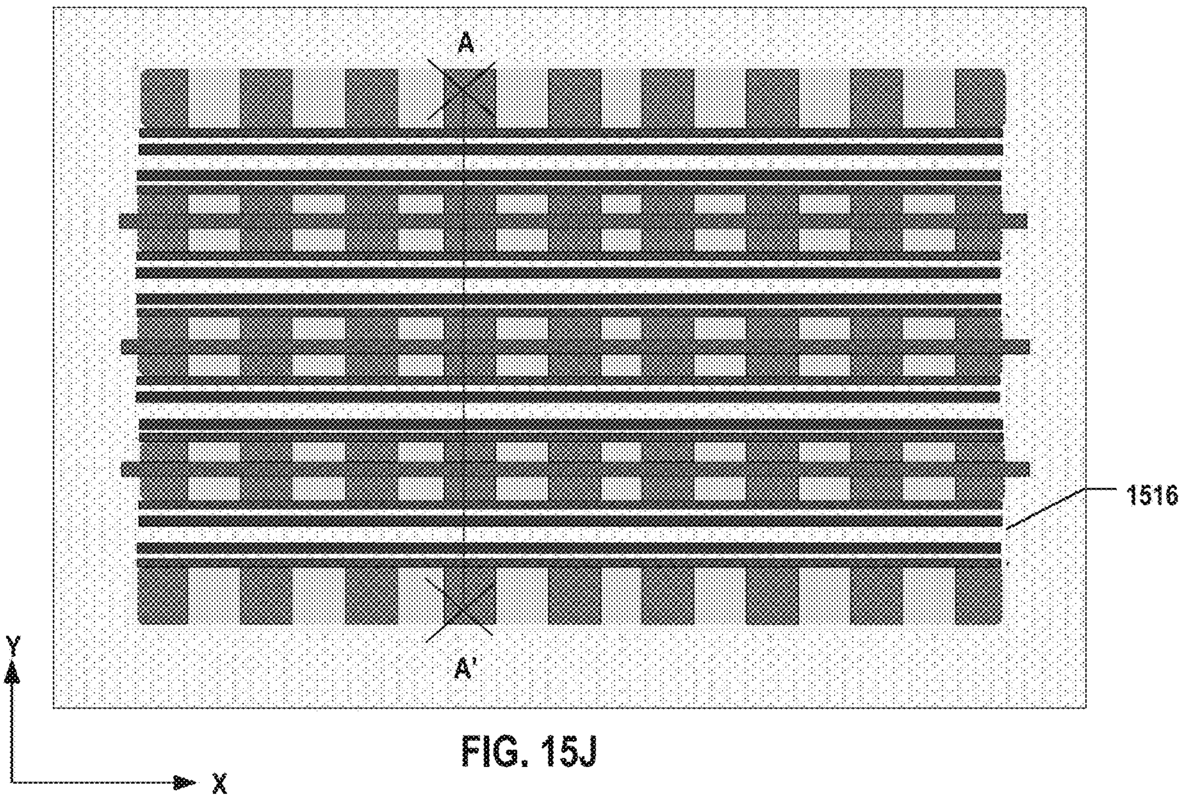
Figure 15J:
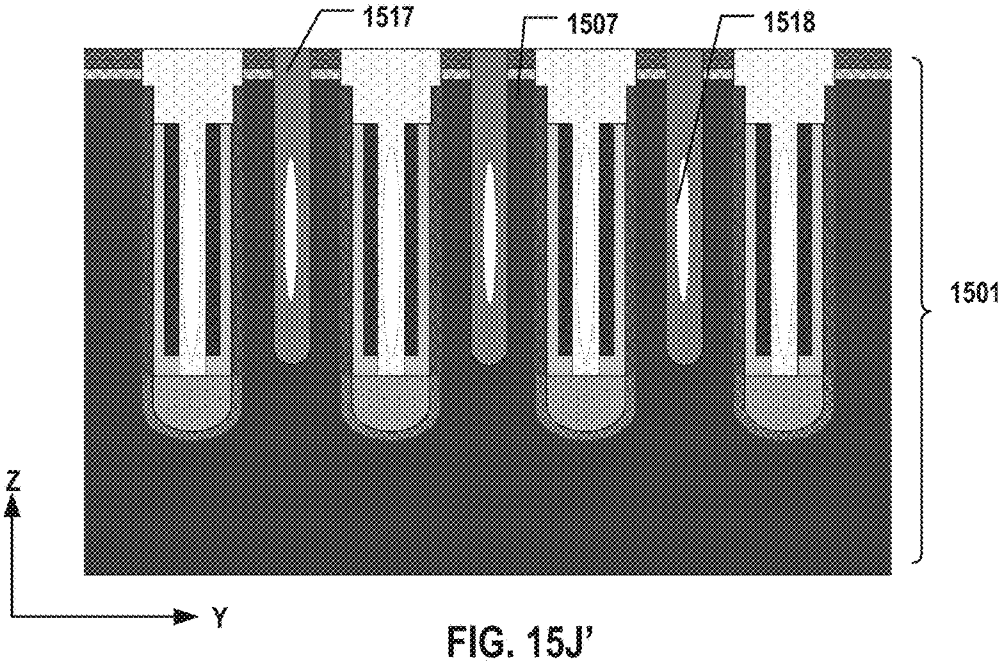

In some implementations, as shown in FIG. 15J and FIG. 15J', cap layer 1525 and the sacrificial layer in spacers 1511 (as shown in FIG. 15D') are removed to form second trenches, and a dielectric layer is deposited to fill the second trenches. In some implementations, a lithography process is performed to remove cap layer 1525 and/or sacrificial layer inside spacers 1511 using an etch mask (e.g., a photoresist mask and/or a hard mask), and one or more dry etching and/or wet etching processes, such as ME, are performed on spacers 1511 to etch away cap layer 1525 and/or the sacrificial layer and to form the second trenches. Second trench isolations 1517 are formed in second trenches, for example, by depositing a dielectric layer, such as silicon oxide, to fill second trenches, using one or more thin film deposition processes including, but not limited to, CVD, PVD, ALD, or any combination thereof. A planarization process can be performed to remove excess dielectric over the top surface of semiconductor layer 1501. It is understood that depending on the pitches of the semiconductor bodies 1507 (e.g., the dimension of second trenches), airgaps 1518 may be formed in second trench isolations 1517.

Figure 17:
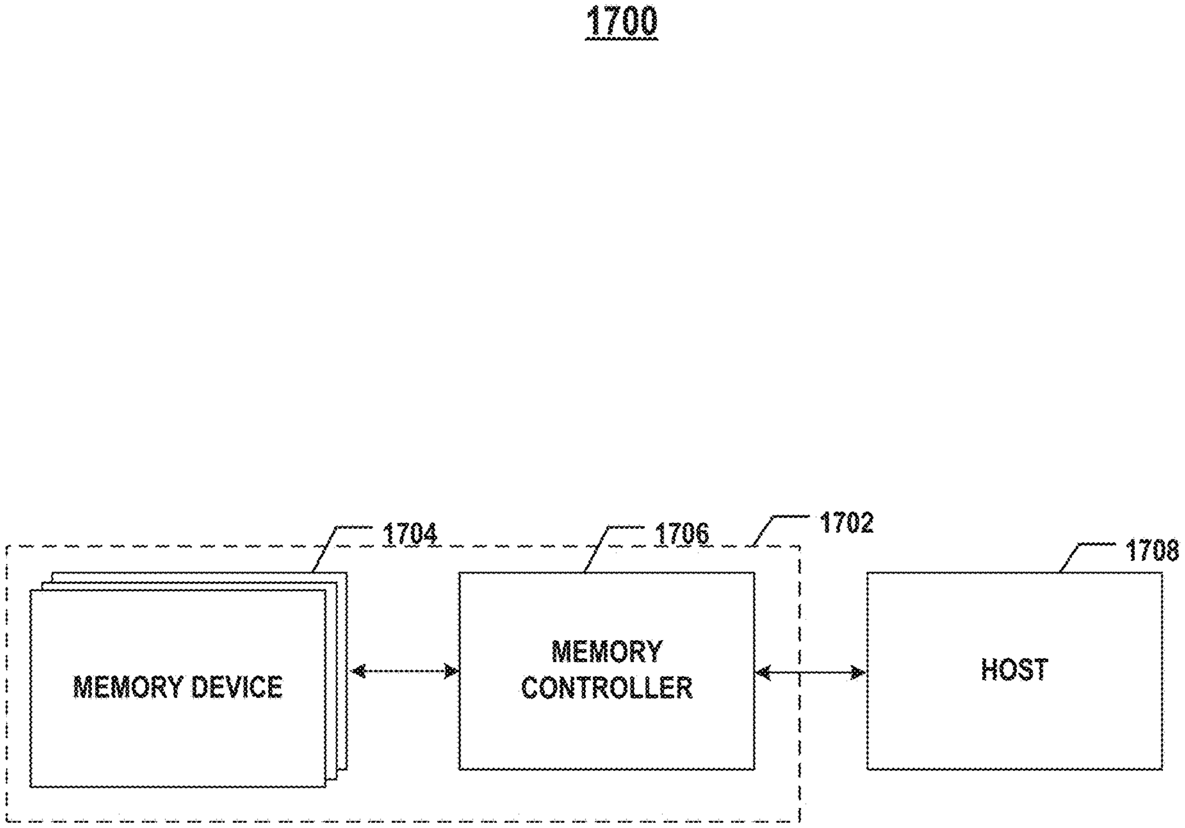
FIG. 17 illustrates a block diagram of an exemplary system having a memory device, according to some aspects of the present disclosure.

FIG. 17 illustrates a block diagram of a system 1700 having a memory device, according to some aspects of the present disclosure. System 1700 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 17, system 1700 can include a host 1708 and a memory system 1702 having one or more memory devices 1704 and a memory controller 1706. Host 1708 can be a processor of an electronic device, such as a central processing unit (CPU), or a system-on-chip (SoC), such as an application processor (AP). Host 1708 can be configured to send or receive the data to or from memory devices 1704.

Memory device 1704 can be any memory devices disclosed herein, such as 3D memory devices 100 and 200. In some implementations, memory device 1704 includes an array of memory cells each including a vertical transistor, as described above in detail.

Memory controller 1706 is coupled to memory device 1704 and host 1708 and is configured to control memory device 1704, according to some implementations. Memory controller 1706 can manage the data stored in memory device 1704 and communicate with host 1708. Memory controller 1706 can be configured to control operations of memory device 1704, such as read, write, and refresh operations. Memory controller 1706 can also be configured to manage various functions with respect to the data stored or to be stored in memory device 1704 including, but not limited to refresh and timing control, command/request translation, buffer and schedule, and power management. In some implementations, memory controller 1706 is further configured to determines the maximum memory capacity that the computer system can use, the number of memory banks, memory type and speed, memory particle data depth and data width, and other important parameters. Any other suitable functions may be performed by memory controller 1706 as well. Memory controller 1706 can communicate with an external device (e.g., host 1708) according to a particular communication protocol. For example, memory controller 1706 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A method for forming a semiconductor device, comprising:

forming a plurality of spacers extending along a first lateral direction, each spacer vertically extending in an upper portion of a semiconductor layer;

forming a plurality of first trenches extending along the first lateral direction, each first trench vertically extending in the upper portion of the semiconductor layer and being sandwiched, along a second lateral direction, by two adjacent spacers;

forming a bottom dielectric structure located in a lower portion of each of the first trenches by depositing a dielectric material in the plurality of first trenches; and forming two disconnected conductive structures on the bottom dielectric structure in each first trench, the two disconnected conductive structures laterally extending along the first lateral direction, each conductive structure vertically extending along one sidewall of the corresponding first trench.

2. The method of claim 1, wherein forming the plurality of spacers comprises forming each spacer having a first lateral dimension along the second lateral direction, forming the plurality of first trenches comprises forming each first trench having a second lateral dimension along the second lateral direction, the first lateral dimension being smaller than the second lateral dimension.

3. The method of claim 2, wherein forming the plurality of spacers comprises forming each spacer having a first depth along a vertical direction, forming the plurality of first trenches comprises forming each first trench having a second depth along the vertical direction, the first depth being smaller than the second depth.

4. The method of claim 3, further comprising:

before forming the plurality of first trenches, forming a plurality of second trenches laterally extending along the second lateral direction in the upper portion of the semiconductor layer, the second lateral direction being perpendicular to the first lateral direction.

5. A method for forming an array of memory cells, comprising:

forming a plurality of first trenches extending along a first lateral direction, each first trench vertically extending in an upper portion of a semiconductor layer;

forming a plurality of spacers extending along the first lateral direction, each spacer vertically extending in the upper portion of the semiconductor layer and being sandwiched, along a second lateral direction, by two adjacent first trenches;

forming a bottom dielectric structure located in a lower portion of each of the first trenches by depositing a dielectric material in the plurality of first trenches; and forming two disconnected conductive structures on the bottom dielectric structure in each first trench, the two disconnected conductive structures laterally extending along the first lateral direction, each conductive structure vertically extending along one sidewall of the corresponding first trench.

6. The method of claim 5, wherein forming the plurality of spacers comprises forming each spacer having a first lateral dimension along the second lateral direction, forming the plurality of first trenches comprises forming each first trench having a second lateral dimension along the second lateral direction, the first lateral dimension being smaller than the second lateral dimension.

7. The method of claim 6, wherein forming the plurality of spacers comprises forming each spacer having a first depth along a vertical direction, forming the plurality of first trenches comprises forming each first trench having a second depth along the vertical direction, the first depth being smaller than the second depth.

8. The method of claim 7, further comprising:

before forming the plurality of first trenches, forming a plurality of second trenches laterally extending along the second lateral direction in the upper portion of the semiconductor layer, the second lateral direction being perpendicular to the first lateral direction, wherein the plurality of first trenches and the plurality of second trenches sperate the upper portion of the semiconductor layer into a plurality of semiconductor pillars.

9. A method for forming a semiconductor device, comprising:

forming a plurality of spacers and a plurality of first trenches in an upper portion of a semiconductor layer, each spacer and each first trench laterally extending along a first lateral direction, wherein the plurality of first trenches and the plurality of spacers are alternatively arranged along a second lateral direction;

forming a gate dielectric layer in each first trench by oxidizing sidewalls of each first trench;

forming a bottom dielectric structure located in a lower portion of each of the first trenches by depositing a dielectric material in the plurality of first trenches;

forming two disconnected conductive structures on the bottom dielectric structure in each first trench, the two disconnected conductive structures each laterally extending along the first lateral direction and vertically covering the gate dielectric layer on one sidewall of the corresponding first trench respectively; and removing the plurality of spacers to form a plurality of second trenches.

10. The method of claim 9, wherein forming the plurality of spacers comprises forming each spacer having a first lateral dimension along the second lateral direction, forming the plurality of first trenches comprises forming each first trench having a second lateral dimension along the second lateral direction, the first lateral dimension being smaller than the second lateral dimension.

11. The method of claim 10, wherein forming the plurality of spacers comprises forming each spacer having a first depth along a vertical direction, forming the plurality of first trenches comprises forming each first trench having a second depth along the vertical direction, the first depth being smaller than the second depth.

12. The method of claim 11, further comprising:

before forming the plurality of first trenches, forming a plurality of second trenches laterally extending along the second lateral direction and arranged in parallel along the first lateral direction, each second trench vertically extending along the vertical direction, the second lateral direction being perpendicular to the first lateral direction.

13. The method of claim 12, wherein forming the plurality of spacers comprises:

forming a plurality of grooves laterally extending along the first lateral direction and arranged in parallel along the second lateral direction, each groove vertically extending along the vertical direction to separate the upper portion of the semiconductor layer into a plurality of semiconductor bodies; and filling the plurality of grooves by depositing a filling layer.

14. The method of claim 12, wherein forming the two disconnected conductive structures in each first trench comprises:

forming a continuous conductive structure inside each first trench covering sidewalls of each first trench; and removing a portion of a bottom of the continuous conductive structure to separate the continuous conductive structure into the two disconnected conductive structures in each first trench.

15. The method of claim 14, wherein before forming the continuous conductive structure in each first trench, the method comprises forming the gate dielectric layer by oxidizing sidewalls of each first trench.

16. The method of claim 15, wherein forming the bottom dielectric structure comprises:

depositing an initial dielectric structure in the plurality of first trenches; and removing an upper portion of the initial dielectric structure until reaching a third depth in each first trench to form the bottom dielectric structure located in a lower portion of the first trench, the third depth being smaller than the second depth and greater than the first depth.

17. The method of claim 16, wherein forming the continuous conductive structure in each first trench comprises:

forming a first conductive layer to cover the gate dielectric layer and the bottom dielectric structure; and forming a second conductive layer to cover the first conductive layer.

18. The method of claim 14, wherein removing the portion of the bottom of continuous conductive structure in each first trench comprises using a punch-down etch or a dry etching process to etch through the bottom of the continuous conductive structure.

19. The method of claim 13, further comprising forming an isolating structure extending along the first lateral direction between the disconnected conductive structures in each first trench.

20. The method of claim 19, wherein forming the isolating structure comprises forming an airgap embedded in the isolating structure.

* * * * *